(12) United States Patent
Rogers et al.

(10) Patent No.: US 7,557,367 B2
(45) Date of Patent: Jul. 7, 2009

(54) STRETCHABLE SEMICONDUCTOR ELEMENTS AND STRETCHABLE ELECTRICAL CIRCUITS

(75) Inventors: John A. Rogers, Champaign, IL (US); Dahl-Young Khang, Seoul (KR); Etienne Menard, Durham, NC (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 11/145,542

(22) Filed: Jun. 2, 2005

(65) Prior Publication Data

US 2006/0038182 A1 Feb. 23, 2006

Related U.S. Application Data

(60) Provisional application No. 60/577,077, filed on Jun. 4, 2004, provisional application No. 60/601,061, filed on Aug. 11, 2004, provisional application No. 60/650,305, filed on Feb. 4, 2005, provisional application No. 60/663,391, filed on Mar. 18, 2005, provisional application No. 60/677,617, filed on May 4, 2005.

(51) Int. Cl.
*H01L 29/72* (2006.01)

(52) U.S. Cl. .......................... 257/9; 257/40; 257/619; 439/67

(58) Field of Classification Search .................. 257/9, 257/40, 619; 439/67
See application file for complete search history.

(56) References Cited

U.S. PATENT DOCUMENTS

| | | | |
|---|---|---|---|
| 4,766,670 A * | 8/1988 | Gazdik et al. | .................. 29/830 |
| 5,545,291 A | 8/1996 | Smith et al. | |
| 5,772,905 A | 6/1998 | Chou | |
| 5,783,856 A | 7/1998 | Smith et al. | |
| 5,817,242 A | 10/1998 | Biebuyck et al. | |
| 5,824,186 A | 10/1998 | Smith et al. | |
| 5,904,545 A | 5/1999 | Smith et al. | |
| 6,225,149 B1 | 5/2001 | Gan et al. | |
| 6,274,508 B1 | 8/2001 | Jacobsen et al. | |
| 6,281,038 B1 | 8/2001 | Jacobsen et al. | |
| 6,291,896 B1 | 9/2001 | Smith | |

(Continued)

FOREIGN PATENT DOCUMENTS

| | | |
|---|---|---|
| JP | 2002092984 | 3/2002 |
| TW | 367570 | 8/1999 |
| TW | 494257 | 7/2002 |
| WO | WO 00/46854 | 8/2000 |
| WO | WO 00/49421 | 8/2000 |

(Continued)

OTHER PUBLICATIONS

Duan et al, "High performance thin-film transistors using semiconductor nanowires and nanoribbons", Nature, vol. 425, pp. 274-278, Sep. 2003.*

(Continued)

*Primary Examiner*—Edward Wojciechowicz
(74) *Attorney, Agent, or Firm*—Greenlee, Winner and Sullivan, P.C.

(57) ABSTRACT

The invention provides methods and devices for fabricating printable semiconductor elements and assembling printable semiconductor elements onto substrate surfaces. Methods, devices and device components of the present invention are capable of generating a wide range of flexible electronic and optoelectronic devices and arrays of devices on substrates comprising polymeric materials. The present invention also provides stretchable semiconductor structures and stretchable electronic devices capable of good performance in stretched configurations.

61 Claims, 73 Drawing Sheets

U.S. PATENT DOCUMENTS

| | | |
|---|---|---|
| 6,316,278 B1 | 11/2001 | Jacobsen et al. |
| 6,380,729 B1 | 4/2002 | Smith |
| 6,403,397 B1 | 6/2002 | Katz |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,623,579 B1 | 9/2003 | Smith et al. |
| 6,655,286 B2 | 12/2003 | Rogers |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,780,696 B1 | 8/2004 | Schatz |
| 6,816,380 B2 | 11/2004 | Credelle et al. |
| 6,844,673 B1 | 1/2005 | Bernkopf |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,949,206 B2 | 9/2005 | Whiteford |
| 7,169,669 B2 | 1/2007 | Blakers et al. |
| 7,195,733 B2 | 3/2007 | Rogers et al. |
| 2003/0006527 A1 | 1/2003 | Rabolt et al. |
| 2003/0178316 A1 | 9/2003 | Jacobs et al. |
| 2003/0227116 A1 | 12/2003 | Halik et al. |
| 2004/0005723 A1 | 1/2004 | Empedocles et al. |
| 2004/0026684 A1 | 2/2004 | Empedocles et al. |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0192082 A1* | 9/2004 | Wagner et al. ............... 439/67 |
| 2004/0206448 A1 | 10/2004 | Dubrow |
| 2004/0250950 A1 | 12/2004 | Dubrow |
| 2005/0038498 A1 | 2/2005 | Dubrow et al. |
| 2005/0238967 A1 | 10/2005 | Chinea et al. |
| 2006/0038182 A1 | 2/2006 | Rogers et al. |
| 2006/0127817 A1* | 6/2006 | Ramanujan et al. ......... 430/320 |
| 2006/0134893 A1 | 6/2006 | Savage et al. |
| 2006/0244105 A1* | 11/2006 | Forbes et al. ............... 257/619 |

FOREIGN PATENT DOCUMENTS

| | | |
|---|---|---|
| WO | WO 00/49658 | 8/2000 |
| WO | WO 00/55915 | 9/2000 |
| WO | WO 00/55916 | 9/2000 |
| WO | WO 01/33621 | 5/2001 |
| WO | WO 02/27701 | 4/2002 |
| WO | WO 02/43032 | 5/2002 |
| WO | WO 02/097708 | 12/2002 |
| WO | WO 02/097724 | 12/2002 |
| WO | WO 02/099068 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/094303 | 11/2004 |
| WO | WO 2004/100252 | 11/2004 |
| WO | WO 2004/105456 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |

OTHER PUBLICATIONS

Pan et al, "Nanobelts of Semiconducting Oxides", Science, vol. 291, pp. 1947-1949, Mar. 2001.*

Zaumseil et al, "Three-dimensional and Multilayer Noanstructures Formed by Nanotransfer Printing", vol. 3, No. 9, pp. 1223-1227, Jul. 2003.*

Chang et al. (1994) "Process Techniques," "Lithography," and "Device-Related Physics and Principles," In; *GaAs High-Speed Devices: Physics, Technology and Circuit Application*, John Wiley and Sons, New York, pp. 115-278.

Givargizov, E.I. (1991) "Applications," In; *Oriented Crystallization on Amorphous Substrates*, Plenum Press, New York, pp. 341-363.

Adachi et al. (1983) "Chemical Etching Characteristics of (001)GaAs," *J. Electrochem. Soc.* 130:2427-2435.

Adachi et al (1982) "Chemical Etching of . . . ," *J. Electrochem. Soc.* 129:1053-1062.

Alivisatos et al. (1996) "Semiconductor Clusters, Nanocrystals, and Quantum Dots," *Science* 271:933-937.

Alivisatos et al. (1998) "From Molecules to Materials: Current Trends and Future Directions," *Adv. Mater.* 10:1297-1336.

Ando et al. (2004) "Self-Aligned Self-Assembly Process for Fabricating Organic Thin-Film Transistors," *Appl. Phys. Lett.* 85:1849-1851.

Bao et al. (1999) "Printable Organic and Polymeric Semiconducting Materials and Devices," *J. Mater. Chem.* 9:1895-1904.

Bates, F.S. (1991) "Polymer-Polymer Phase Behavior," *Science* 251:898-905.

Battaglia et al. (2003) "Colloidal Two-Dimensional Systems: CdSe Quantum Shells and Wells," Angew. Chem. Int. Ed. 442:5035-5039.

Berg et al. (2003) "Tailored Micropatters Through Weak Polyelectrolyte Stamping," Langmuir 19:2231-2237.

Bernard et al. (1998) "Printing Patterns of Proteins," *Langmuir* 14(9):2225-2229.

Bhunia et al. (2004) "Free-Standing and Vertically Aligned InP Nanowires Grown by Metalorganic Vapor Phase Epitaxy," *Physica E* 21:583-587.

Blanchet et al. (2003) "Large Area, High Resolution, Dry Printing of Conducting Polymers for Organic Electronics," *Appl. Phys. Lett.* 82:463-465.

Boltau et al. (1998) "Surface-Induced Structure Formation of Polymer Blends on Patterned Substrates," *Nature* 391:877-879.

Bowden et al. (2001) "Molecule-Mimetic Chemistry and Mesoscale Self-Assembly," *Acc. Chem. Res.* 34:231-238.

Bowden et al. (1998) "Spontaneous Formation of Ordered Structures in Thin Films of Metals Supported on an Elastomeric Polymer," *Nature* 393:146-149.

Bruschi et al. (2001) "Micromachined Silicon Suspended Wires With Submicrometric Dimensions," *Microelectron. Eng.* 57-58:959-965.

Burgin et al. (2000) "Large Area Submicrometer Contact Printing Using a Contact Aligner," *Langmuir* 16:5371-5375.

Burns et al. (2003) "Printing of Polymer Thin-Film Transistors for Active-Matrix-Display Applications," *J. Soc. Inf. Display* 11:599-604.

Carr et al. (1998) "Measurement of Nanomechanical Resonant Structures in Single-Crystal Silicon," *J. Vac. Sci. Technol. B* 16:3821-3824.

Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.

Childs et al. (2002) "Decal Transfer Microlithography: A New Soft-Lithographic Patterning Method," *J. Am. Chem. Soc.* 124:13583-13596.

Chung et al. (2000) Silicon Nanowire Devices *Appl. Phys. Lett.* 76(15):2068-2070.

Crowder et al. (1998) "Low-Temperature Single-Crystal Si TFTs Fabricated on Si Films Processed via Sequential Lateral Solidification," *IEEE Electron. Dev. Lett.* 19:306-308.

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

DeBoer et al. (2004) "Organic Single-Crystal Field-Effect Transistors," *Phys. Stat. Sol.* 201:1302-1331.

Delmerche et al. (1997) "Stability of Molded Polydimethylsiloxane Microstructures," *Adv. Mat.* 9:741-746.

Dinsmore et al. (2002) "Colloidosomes: Selectively Permeable Capsules Composed of Colloidal Particles," *Science* 298:1006-1009.

Duan et al. (2003) "High-performance Thin-Film Transistors Using Semiconductor Nanowires and Nanoribbons," *Nature* 425:274-278.

Duan et al. (2000) "General Synthesis of Compound Semiconductor Nanowires," *Adv. Mater.* 12:298-302.

Duffy et al. (1998) "Rapid Prototyping of Microfluidic Systems in Poly(dimethylsiloxane)," *Anal. Chem.* 70:4974-4984.

Felgner et al. (1996) "Flexural Rigidity of Microtubules Measured with the Use of Optical Tweezers," *J. Cell Sci.* 109:509-516.

Folch et al. (1999) "Wafer-Level In-Registry Microstamping," *J. Microelectromech. Syst.* 8:85-89.

Furneaux et al. (1989) "The Formation of Controlled-Porosity Membranes from Anodically Oxidized Aluminum," *Nature* 337:147-149.

Gan et al. (2002) "Preparation of Thin-Film Transistors With Chemical Bath Deposited CdSe and CdS Thin Films," *IEEE Trans. Electron. Dev.* 49:15-18.

Garnier et al. (1994) "All-Polymer Field-Effect Transistor Realized by Printing Techniques," *Science* 265:1684-1686.

Gelinck et al. (2000) "High-Performance All-Polymer Integrated Circuits," *Appl. Phys. Lett.* 77:1487-1489.

Goetting et al. (1999) "Microcontact Printing of Alkanephosphonic Acids on Aluminum: Pattern Transfer by Wet Chemical Etching," *Langmuir* 15:1182-1191.

Goldmann et al. (2004) "Hole Mobility in Organic Single Crystals Measured by a "Flip-Crystal" Field-Effect Technique," *J. Appl. Phys.* 96:2080-2086.

Goldman et al. (1996) "Correlation of Buffer Strain Relaxation Modes with Transport Properties of Two-Dimensional Electron Gases," *J. Apple. Phys.* 80:6849-6854.

Haisma et al. (2002) "Contact Bonding, Including Direct-Bonding in a Historical and Recent Context of Materials Science and Technology, Physics and Chemistry," *Mater. Sci Eng.* 37:1-60.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Hoyer, P. (1996) "Semiconductor Nanotube Formation by a Two-Step Template Process," *Adv. Mater.* 8:857-859.

Hsu et al. (2003) "Nature of Electrical Contacts in a Metal-Molecule-Semiconductor System," *J. Vac. Sci. Technol. B* 21(4):1928-1935.

Hu et al. (1999) Chemistry and Physics in One Dimension: Synthesis and Properties of Nanowires and Nanotubes, *Acc. Chem. Res.* 32:435-445.

Hu et al. (1997) "Using Soft Lithography to Fabricate GaAs/AlGaAs Heterostructure Field Effect Transistors," *Appl. Phys. Lett.* 71:2020-2022.

Huang et al. (2001) "Directed Assembly of One-Dimensional Nanostructures into Functional Networks," *Science* 291:630-633.

Huang et al. (2001) "Room-Temperature Ultraviolet Nanowire Nanolasers," *Science* 292:1897-1899.

Huitema et al. (2001) "Plastic Transistors in Active-Matrix Displays," *Nature* 414:599.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jacobs et al. (2002) "Fabrication of a Cylindrical Display by Patterned Assembly," *Science* 296:323-325.

James et al. (1998) "Patterned Protein Layers on Solid Substrates by This Stamp Microcontact Printing," *Langmuir* 14:742-744.

Jenkins et al. (1994) "Gallium Arsenide Transistors: Realization Through a Molecularly Designs Insulator," *Science* 263:1751-1753.

Jeon et al. (2004) "Fabricating Complex Three-Dimensional Nanostructures with High Resolution Conformable Phase Masks," *Proc. Natl. Acad. Sci. USA* 101:12428-12433.

Jeon et al. (2004) "Three Dimensional Nanofabrication with A rubber Stamps and Conformable Photomasks," *Adv. Mater.* 16:593-600.

Jeon et al. (1995) "Patterning of Dielectric Oxide Thin Layers by Microcontact Printing of Self-Assembled Monolayers," *J. Mater. Res.* 10:2996-2999.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jiyun, C.H. (2003) "Guided Molecular Self-Assembly: A Review of Recent Efforts," *Smart Mater. Struct.* 12:264-271.

Johnson et al. (1999) "Ordered Mesoporous Polymers of Tunable Pore Size from Colloidal Silica Templates," *Science* 283:963-965.

Kagan et al. (2001) "Patterning Organic-Inorganic Thin-Film Transistors Using Microcontact Printed Templates," *Appl. Phys Lett.* 79(21):3536-3538.

Kagan (1999) "Organic-Inorganic Hybrid Materials as Semiconducting Channels in Thin-Film Field-Effect Transistors," *Science* 286:945-947.

Kagan et al. (2003) *Thin Film Transistors*, Dekker, New York, pp. 1-34.

Kane et al. (2000) "Analog and Digital Circuits Using Organic Thin-Film Transistors on Polyester Substrates," *IEEE Electron. Dev. Lett.* 21:534-536.

Kawata et al. (2001) "Finer Features for Functional Microdevices," *Nature* 412:697-698.

Kilby, J.S. (1976) "Invention of the Integrated Circuit," *IEEE Trans. Electron. Dev.* 23:648-654.

Kim et al. (2002) "Nanolithography Based on Patterned Metal Transfer and Its Application to Organic Electronic Devices," *Appl. Phys. Lett.* 80:4051-4053.

Kim et al. (2003) "Epitaxial Self-Assembly of Block Copolymers on Lithographically Defined Nanopatterned Substrates," *Nature* 424:411-414.

Klauk et al. (2002) "High-Mobility Polymer Gate Dielectric Pentacene Thin Film Transistors," *J. Appl. Phys.* 92:5259-5263.

Klein-Wiele et al. (2003) "Fabrication of Periodic Nanostructures by Phase-Controlled Multiple-Beam Interference," *Appl. Phys. Lett.* 83(23):4707-4709.

Koide et al. (2000) "Patterned Luminescence of Organic Light-Emitting Diodes by Hot Microcontact Printing (H/$\perp$CP) of Self-Assembled Monolayers," *J. Am. Chem. Soc.* 122:11266-11267.

Kong et al. (2004) "Single-Crystal Nanorings Formed by Epitaxial Self0Coating of Polar Nanobelts," *Science* 303:1348-1351.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.

Leclercq et al. (1998) "III-V Micromachined Devices for Microsystems," *Microelectronics J.* 29:613-619.

Lee et al. (2004)"Organic Light-Emitting Diodes Formed by Soft Contact Lamination," *Proc. Natl. Acad. Sci. USA* 101(2):429-433.

Lee et al. (2003) "High-Performance Poly-Si TFTs on Plastic Substrates Using a Nano-Structured Separation Layer Approach," *IEEE Elec. Dev. Lett.* 24:19-21.
Lee et al. (2000) "Thin Film Transistors for Displays on Plastic Substrates," *Solid State Electron.* 44:1431-1434.
Li et al. (2003) "Ultrathin Single-Crystalline-Silicon Cantilever Resonators: Fabrication Technology and Significant Specimen Size effect on Young's Modulus," *Appl. Phys. Lett.* 83:3081-3083.
Li et al. (2002) "High-Resolution Contact Printing with Dendrimers," *Nano Lett.* 2(4):347-349.
Lieber, C. (2001) "The Incredible Shrinking Circuit," *Sci. Am.* 285(3):58-64.
Loo et al. (2002) "Additive, Nanoscale Patterning of Metal Films with a Stamp and A Surface Chemistry Mediated Transfer Process: Applications in Plastic Electronics," *Appl. Phys. Lett.* 81:562-564.
Loo et al. (2002) "Interfacial Chemistries for Nanoscale Transfer Printing," *J. Am. Chem. Soc.* 124:7654-7655.
Loo et al. (2003) "Electrical Contacts to Molecular Layers by Nanotransfer Printing," *Nano Lett.* 3(7):913-917.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Luan et al. (1992) "An Experimental Study of the Source/Drain Parasitic Resistance Effects in Amorphous Silicon Thin Film Transistors," *J. Appl. Phys.* 72:766-772.
Maikap et al. (2004) "Mechanically Strained-Si NMOSFETs," *IEEE Electron. Dev. Lett.* 25:40-42.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Acc. Chem. Res.* 28:61-68.
Matsunaga et al. (2003) "An Improved GaAs Device Model for the Simulation of Analog Integrated Circuit," *IEEE Trans. Elect. Dev.* 50:1194-1199.
Markovich et al. (1999) "Architectonic Quantum Dot Solids," *Acc. Chem. Res.* 32:415-423.
McCaldin et al. (1971) "Diffusivity and Solubility of Si in the Al Metallization of Integrated Circuits," *Appl. Phys. Lett.* 19:524-517.
Meitl et al. (2004) "Solution Casting and Transfer Printing Single-Walled Carbon Nanotube Films," *Nano Lett.* 4:1643-1947.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "High-Performance n- and p-Type Single-Crystal Organic Transistors with Free-Space Gate Dielectrics," *Adv. Mat.* 16:2097-2101.
Menard et al. (2004) "Improved Surface Chemistries, Thin Film Deposition Techniques, and Stamp Designs for Nanotransfer Printing," *Langmuir* 20:6871-6878.
Menard et al. (2005) "Bendable Single Crystal Silicon Thin Film Transistors Formed by Printing on Plastic Substrates," *Appl. Phys. Lett.* 86(093507):1-3.
Michel et al. (2001) Printing Meets Lithography: Soft Approaches to High-Resolution Patterning, *IBM J. Res. Dev.* 45:697-719.
Milliron et al. (2004) "Colloidal Nanocrystal Heterostructures with Linear and Branched Topology," *Nature* 430:190-195.
Mirkin et al. (2001) "Emerging Methods for Micro- and Nanofabrication," *MRS Bulletin* 26(7):506-507.
Mitzi et al. (2004) "High-Mobility Ulltrathin Semiconducting Films Prepared by Spin Coating," *Nature* 428:299-303.
Mori et al. (1978) "A New Etching Solution System, $H_3PO_4$-$H_2O_2$-$H_2O$, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimthylsiloxane Surfaces," *J. Colloid Interface Sci.* 137:11-24.
Namazu et al. (2000) "Evaluation of Size Effect on Mechanical Properties of Single Crystal Silicon by Nanoscale Bending Test Using AFM," *J. MEMS* 9:450-459.
Nirmal et al. (1999) "Luminescence Photophysics in Semiconductor Nanocrystals," *Acc. Chem. Res.* 32:407-414.
Odom et al. (2002) "Improved Pattern Transfer in Soft Lithography Using Composite Stamps," *Langmuir* 18:5314-5320.
Ouyang et al. (2002) "High-Performance, Flexible Polymer Light-Emitting Diodes Fabricated by a Continuous Polymer Coating Process," *Adv. Mat.* 14:915-918.
Pan et al. (2001) "Nanobelts of Semiconducting Oxides," *Science* 291:1947-1949.
Panev et al. (2003) "Sharp Excitation from Single InAs Quantum Dots in GaAs Nanowires," *Appl. Phys. Lett.* 83:2238-2240.
Park et al. (1998) "Fabrication of Three-Dimensional Macroporous Membranes with Assemblies of Microspheres as templates," *Chem. Mater.* 10:1745-1747.
Park et al. (1997) "Block Copolymer Lithography: Periodic Arrays of ~$10^{11}$ Holes in 1 Square Centimeter," *Science* 276:1401-1404.
Quake et al (2000) "From Micro- to Nanofabrication with Soft Materials," *Science* 290:1536-1540.
Raman et al. (1989) "Study of Mesa Undercuts Produced in GaAs with $H_3PO_4$-Based Etchants," *J. Electrochem. Soc.* 136:2405-2410.
Razeghi et al. (1994) "High-Power Laser Diode Based on In GaAsP Alloys," *Nature* 369:631-633.
Ribas et al. (1998) "Bulk Micromachining Characterization of 1.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Robinson et al. (1983) "GaAs Readied for High-Speed Microcircuits," *Science* 219:275-277.
Rogers et al. (2002) "Paper-Like Electronic Displays: Large-Area Rubber-Stamped Plastic Sheets of Electronics and Microencazpsulated Electrophoretic Inks," *Proc. Nat. Acad. Sci. USA* 98:4835-4840.
Rogers et al. (1998) "Quantifying Distortions in Soft Lithography," *J. Vac. Sci. Technol.* 16:88-97.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers, J.A. (2001) "Toward Paperlike Displays," *Science* 291:1502-1503.
Rogers, J.A. (2001) "Rubber Stamping for Plastic Electronics and Fiber Optics," *MRS Bulletin* 26(7):530-534.
Rotkin et al. (2003) "Universal Description of Channel Conductivity for Nanotube and Nanowire Transistors," *Appl. Phys. Lett.* 83:1623-1625.
Schmid et al. (2003) "Preparation of metallic Films on Elastomeric Stamps and Their Application on Contact Processing and Contact Printing," *Adv. Funct. Mater.* 13:145-153.
Schrieber et al. (1998) "The Effectiveness of Silane Adhesion Promotors in the Performance of Polyurethane Adhesives," *J. Adhesion* 68:31-44.
Scnable et al. (1969) "Aluminum Metallization; Advantages and Limitations for Integrated Circuit Applications," *IEEE* 57:1570-1580.
Sheraw et al. (2002) "Organic Thin-Film Transistors-Driven Polymer-Dispersed Liquid Crystal Displays on Flexible Polymeric Substrates," *Appl. Phys. Lett.* 80:1088-1090.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.

Sun et al. (2004) "Fabricating Semiconductor Nano/Microwires and Transfer Printing Ordered Arrays of Them onto Plastic Substrates," *Nano Lett.* 4:1953-1959.

Sun et al. (2005) "Photolithographic Route to the Fabrication of Micro/Nanowires of III-V Semiconductors," *Adv. Fuct. Mater.* 15:30-40.

Sze, S. (1994) *Semiconductor Sensors*, John Wiley and Sons: New York, pp. 17-95.

Sze, S. (1985) *Semiconductor Devices: Physics and Technology*, New York: Wiley, pp. 428-467.

Sze.S. (1988) *VLSI Technology*, Mcgraw-Hill, 327-374, 566-611.

Tao et al. (2003) "Langmuir-Blodgett Silver Nanowire Monolayers for Molecular Sensing Using Surface-Enhanced Raman Spectroscopy," *Nano Lett.* 3:1229-1233.

Theiss et al. (1998) "PolySilicon Thin Film Transistors Fabricated at 100° C. on a Flexible Plastic Substrate," *IEDM* 98:257-260.

Tong (1999) *Semiconductor Wafer Bonding: Science and Technology*, John Wiley; New York, pp. 187-221.

Trau et al. (1997) "Microscopic Patterning of Orientated Mesoscopic Silica Through Guided Growth," *Nature* 390:674-676.

Trentler et al. (1995) "Solution-Liquid-Solid Growth of Crytalline III-V Semiconductors: An Analogy to Vapor-Liquid-Solid Growth," *Science* 270:1791-1794.

Velev et al. (1997) "Porous silica via colloidal crystallization," *Nature* 389:447-448.

Vilan et al. (2000) "Molecular Control Over Au/GaAs Diodes," *Nature* 404:166-168.

Vlasov et al. (2001) "On-Chip Natural Assembly of Silicon Photonic Bandgap Crystals," *Nature* 414:289-293.

Voss, D. (2000) "Cheap and Cheerful Circuits," *Nature* 407:442-444.

Wagner et al. (2003) "Silicon for Thin-Film Transistors," *Thin Solid Films* 430:15-19.

Wang et al. (2003) "A Solution-Phase, Precursor Route to Polycrystalline $SnO_2$ Nanowores that can be Used for Gas Sensing under Ambient Conditions," *J. Am. Chem. Soc.* 125:16176-16177.

Whang et al. (2003) "Large-Scale Hierarchical Organization of Nanowire Arrays for Integrated Nanosystems," *Nano Lett.* 3(9):1255-1259.

Won et al. (2004) "Effect of Mechanical and Electrical Stresses on the Performance of an a-Si:H TFT on Plastic Substrate," *J. Electrochem. Soc.* 151:G167-G170.

Wu et al. (2002) "Growth of Au-Catalyzed Ordered GaAs Nanowire Arrays by Molecular-Beam Epitaxy," *Appl. Phys. Lett.* 81:5177-5179.

Wu et al. (2003) "Growth, Branching, and Kinking of Molecular-Beam Epitaxial (110) GaAs Nanowires," *Appl. Phys. Lett.* 83:3368-3370.

Xia et al. (2003) "One-Dimensional Nanostructures: Synthesis, Characterization and Applications," *Adv. Mater.* 15:353-389.

Xia et al. (1998) "Soft Lithography," *Annu. Rev. Mater. Sci.* 28:153-184.

Xia et al. (1999) "Unconventional Methods for Fabricating and Patterning Nanostructures," *Chem. Rev.* 99:1823-1848.

Xia (1998) "Soft Lithography" *Angew. Chem. Int. Ed.* 37:551-575.

Yang et al. (1997) "Mesoporous Silica with Micrometer-Scale Desgns," *Adv. Mater.* 9:811-814.

Yeh et al. (1994) "Fluidic Self-Assembly for the Integration of GaAs Light Emitting Diodes on Si Substrates," *IEEE Photon. Techn. Lett.* 6:706-708.

Yin et al. (2000) "A Soft Lithography Approach to the Fabrication of Nanostructures of Single Crystalline Silicon with Well-Defined Dimensions and Shapes," *Adv. Mater.* 12:1426-1430.

Yu et al. (2003) "Two-Versus Three-Dimensional Quantum Confinement in Indium Phosphide Wires and Dots," *Nat. Mater.* 2:517-520.

Yu et al. (2003) "Solution-Liquid-Solid Growth of Soluble GaAs Nanowires," *Adv. Mater.* 15:416-419.

Zakhidov et al. (1998) "Carbon Structure with Three-Dimensional Periodicity at Optical Wavelengths," *Science* 282:897-901.

Zaumseil et al. (2003) "Nanoscale Organic Transistors that use Source/Drain Electrodes Supported by High Resolution Rubber Stamps," *Appl. Phys. Lett.* 82(5):793-795.

Zaumseil et al. (2003) "Three-Dimensional and Multilayer Nanostructures Formed by Nanotransfer Printing," *Nano Lett.* 3(9):1223-1227.

Zhou et al. (2002) "An Efficient Two-Photon-Generated Photoacid Applied to Positive-Tone 3D Microfabrication," *Science* 296:1106-1109.

Zhou et al. (2004) "p-Channel, n-Channel Thin Film Transistors and p-n Diodes Based on Single Wall Carbon Nanotube Networks," *Nano Lett.* 4:2031-2035.

Zhu et al. (2005) "Spin on Dopants for High-Performance Single Crystal Silicon Transistors on Flexible Plastic Substrates," *Appl. Phys. Lett.* 86(133507)1-3.

Allen et al. (Feb. 20, 2006) "Nanomaterial Transfer Using Hot Embossing for Flexible Electronic Devices," *Appl. Phys. Lett.* 88:083112.

Ambrosy et al. (1996) "Silicon Motherboards for Multichannel Optical Modules," *IEEE Trans. Compon. Pack. A* 19:34-40.

Aoki et al. (2003) "Microassembly of Semiconductor Three Dimensional Photonic Crystals," *Nat. Mater.* 2:117-121.

Bachtold et al. (Nov. 9, 2001) "Logic Circuits with Carbon Nanotube Transistors," *Science* 294:1317-1320.

Balmer et al. (2005) "Diffusion of Alkanethiols in PDMS and Its Implications on Microcontact Printing (μCP)," *Langmuir* 21(2):622-632.

Bao et al. (1997) "High-Performance Plastic Transistors Fabricated by Printing Techniques," *Chem. Mater.* 9:1299-1301.

Barquins, M. (1992) "Adherence, Friction and Wear of Rubber-Like Materials," *Wear* 158:87-117.

Bauer et al. (2004) "Biological Applications of High Aspect Ratio Nanoparticles," *J. Mater. Chem.* 14:517-526.

Bietsch et al. (Oct. 1, 2000) "Conformal Contact and Pattern Stability of Stamps Used for Soft Lithography," *J. Appl. Phys.* 88(7):4310-4318

Blanchet et al. (2003) "Printing Techniques for Plastic Electronics," *J. Imag. Sci. Tech.* 47(4):296-303.

Blazdell et al. (Nov. 1999) "Preparation of Ceramic Inks for Solid Freeforming Using a Continuous Jet Printer," *J. Mat. Syn. Process.* 7(6):349-356.

Bowden et al. (1997) "Self Assembly of Mesoscale Objects into Ordered Two-Dimensional Arrays," *Science* 276:233-235.

Braun et al. (1999) "Electrochemically Grown Photonic Crystals," *Nature* 402:603-604.

Brown, H.R. (1991) "The Adhesion Between Polymers," *Ann. Rev. Mater. Sci.* 21:463-489.

Buma et al. (2001) "High-Frequency Ultrasound Array Element Using Thermoelastic Expansion in an Elastomeric Film," *Appl. Phys. Lett.* 79:548-550.

Burdinski et al. (2005) "Single Etch Patterning of Stacked Silver and Molybdenum Alloy Layers on Glass Using Microcontat Wave Printing," *J. Am. Chem. Soc.* 127(31):10786-10787.

Campbell et al. (2000) "Fabrication of Photonic Crystals for the Visible Spectrum by Holographic Lithography," *Nature* 404:53-56.

Cao et al. (2006) "Highly Bendable, Transparent Thin-Film Transistors That Use Carbon-Nanotube-Based Conductors and Semiconductors with Elastomeric Delectrics," *Adv. Mater.* 18(3):304-309.

Chen et al. (2003) "Electronic Paper: Flexible Active-Matrix Electronics Ink Display," *Nature* 423:136-.

Chen et al. (2003) "Characterization of Pd-GaAs Schottly Diodes Prepared by the Electrodes Plating Technique," *Semiconductor. Sci. Technol.* 18:620-626.

Chen et al. (Mar. 24, 2006) "An Integrated Logic Crcuit Assembled on a Single Carbon Nanotube," *Science* 311:1735.

Chen et al. (Feb. 27, 2006) "Complementary Carbon Nanotube-Gated Carbon Nanotube Thin-Film Transistor," *Appl. Phys. Lett.* 88:093502.

Chen et al. (2005) "The Role of Metal-Nanotube Caontact in the Performance of Carbon Nanotube Field-Effect Transistors," *Nano Lett.* 5(7):1497-1502.

Chen et al. (Sep. 2004) "Herringbone Buckling Patterns of Compressed Thin Films on Compliant Substrates," *J. Appl. Mech.* 71:597-603.

Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.

Chou et al. (2004) "An Orientation-Controlled Pentacene Film Aligned by Photoaligned Polyimide for Organic Thin-Film Transistor Applications," *Adv. Func. Mater.* 14:811-815.

Chu et al. (2005) "High-Performance Organic Thin-Film Transistors with Metal Oxide/Metal Bilayer Electrode," *Appl. Phys. Lett.* 87:193508.

Collins et al. (Apr. 27, 2001) "Engineering Carbon Nanotubes and Nanotube Circuits Using Electrical Breakdown," *Science* 292:706-709.

Creagh et al. (2003) "Design and Performance of Inkjet Print Heads for Non-Graphic-Arts Applications," *MRS Bull.* 28:807-811.

Cui et al. (2001) "Nanowire Nanosensors for Highly Sensitive and Selective Detection of Biological and Chemical Species," *Science* 293:1289-1292.

Dai et al. (2003) "Novel Nanostructures of Functional Oxides Synthesized by Thermal Evaporation," *Adv. Funct. Mater.* 13:9-24.

Deen et al. (2004) "Electrical Characterization of Polymer-Based FETs Fabricated By Spin-Coating Poly(3-alkylthiophene)s," *IEEE Trans. Electron Devices* 51:1892-1901.

de Gans (2004) "Inkjet Printing of Polymers: State of the Art and Future Developments," *Adv. Mater.* 16(3):203-213.

Deruelle et al. (1995) "Adhesion at the Solid-Elastomer Interface: Influence of Interfacial Chains," *Macromol.* 28:7419-7428.

Derycke et al. (Sep. 2001) "Carbon Nanotube Inter- and Intramolecular Logic Gates," *Nano Lett.* 1(9):453-456.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Duboz et al. (1998) "Transistors and Detectors Based on GaN-Related Materials," In; *Group III Nitride Semiconductor Compounds*, Gill, B. ed., Clarendon, Oxford, pp. 343-387.

Durkop et al. (2004) "Extraordinary Mobility in Semiconducting Carbon Nanotube," *Nano Lett.* 4(1):35-39.

Edrington et al. (2001) "Polymer-Based Photonic Crystals," *Adv. Mater.* 13:421-425.

Eftekhari, G. (1993) "Variation in the Effective Richardson Constant of Metal—GaAs and Metal—InP Contacta Due to the Effect of Processing Parameters," *Phys. Status Solid A-Appl. Res.* 140:189-194.

Faez et al. (1999) "An Elastomeric CONductor Based on Poluaniline Prepared by Mechanical Mixing," *Polymer* 40:5497-5503.

Fink et al. (1999) "Block Copolymers as Photonic Bandgap Materials," *J. Lightwave Tech.* 17:1963-1969.

Flewitt et al. (2005) "Low-Temperature Deposition of Hydrogenated Amorpous Silicon in an Electron Cyclotron Resonance Reactor for Flexible Displays," *Proc. IEEE* 93:1364-1373.

Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.

Forrest et al. (2004) "The Path to Ubiquitous and Low-Cost Organic Electronic Appliances on Plastic," *Nature* 428:911-918.

Fortunato et al. (2005) "Flexible a-Si: H Position-Sensitive Detectors," *Proc. IEEE* 93:1281-1286.

Freund, L.B. (2000) "The Mechanics of Electronic Materials," *Int. J. Solids Struct.* 37:185-196.

Friedman et al. (2005) "High-Speed Integrated Nanowire Circuits," *Nature* 434:1085-.

Geissler et al. (Jun. 2003) "Selective Wet-Etching of Microcontact-Printed Cu Substrates with Control Over the Etch Profile," *Microelec. Eng.* 67-68:326-332.

Geissler et al. (2003) "Fabrication of Metal Nanowires Using Microcontact Printing," *Langmuir* 19(15):6301-6311.

Gelinck et al. (2004) "Fleible Active-Matrix Displays and Shift Registers Based on Solution-Processed Organic Transistors," *Nat. Mater.* 3:106-110.

Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.

Gray et al. (Dec. 2001) "Screen Printed Organic Thin Film Transistors (OTFTs) on a Flexible Substrate," *Proc. SPIE* 4466:89-94.

Gray et al. (Mar. 5, 2004) "High-Conductivity Elastomeric Electronics," *Adv. Mater.* 16(5):393-397.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Halik et al. (2004) "Low-Voltage Organic Transistors with an Amorphous Molecular Gate Dielectric," *Nature* 431:963-966.

Hamilton et al. (2004) "Field-Effect Mobility of Organic Polymer Thin-Film Transistors," *Chem. Mater.* 16:4699-4704.

Han et al. (2005) "Template-Free Directional Growth of Single-Walled Carbon Nanotues on a- and r-Plane Sapphire," *J. Am. Chem. Soc.* 127:5294-5295.

Hines et al. (2005) "Nanotransfer Printing of Organic and Carbon Nanotube Thin-Film Transistors on Plastic Substrates," *Appl. Phys. Lett.* 86:163101.

Horn et al. (1992) "Contact Electrification and Adhesion Between Dissimilar Materials," *Science* 256:362-364.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302:1355-1359.

Hsu et al. (Mar. 2004) "Effects of Mechanical Strain on TFT's on Spherical Domes," *IEEE Trans. Electron Dev.* 51(3):371-377.

Huang et al. (2005) "Nonlinear Analyses of Wrinkles in a Film Bonded to a Compliant Substrate," *J. Mech. Phys. Solids* 53:2101-2118.

Huang et al. (2005) "Stamp Collapse in Soft Lithography," *Langmuir* 21:8058-8068.

Huang et al. (2004) "Self-Organizing High-Density Single-Walled Carbon Nanotube Arrays from Surfactant Suspensions," *Nanotechnol.* 15:1450-1454.

Huck et al. (2000) "Ordering of Spontaneously Formed Buckles on Planar Surfaces," *Langmuir* 16:3497-3501.

Huie, J.C. (2003) "Guided Molecular Self Assembly: A review of Recent Efforts," *Smart Mater. Struct.* 12:264-271.

Hur et al. (205) "Organic Nanodelectrics for Low Voltage Carbon Nanotube Thin Film Transistors and Complementary Logc Gates," *J. Am. Chem. Soc.* 127:13808-13809.

Hur etal. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

Islam et al. (Jan. 16, 2003) "High Weight Fraction Surfactant Solubilization of Single-Wall Carbon Nanotubes in Water," *Nano Lett.* 3(2):269-273.

Ismach et al. (2004) "Atomic-Step-Templated Formation of Single Wall Carbon Nanotube Patters," *Angew. Chem. Int. Ed.* 43:6140-6143.

Jabbour et al. (2001) "Screen Printing for the Fabrication of Organic Light-Emitting Devices," *IEEE J. Select. Top. Quantum. Electron.* 7:769-773.

Jain et al. (2000) "III-Nitrides: Growth, Characterization, and Properties," *J. Appl. Phys.* 87:965-1006.

Jain et al. (2005) "Flexible Electronics and Displays: High-Resolution, Roll-to-Roll, Projection Lithography and Photoblation processing Technologies for Hiogh-Throughput Production," *Proc. IEEE* 93:1500-1510.

Jang et al. (2006) "Low-Voltage and High-Field-Effect Mobility Organic Transistors with a Polymer Insulator," *Appl. Phys. Lett.* 88:072101.

Javey et al. (Aug. 7, 2003) "Ballistic Carbon Nanotube Field-Effect Transistors," *Nature* 424:654-657.

Javey et al. (2002) "High-κ Dielectrics for Advanced Carbon-Nanotube Transistors and Logic Gates," *Nature Mater.* 1:241-246.

Jin et al. (2004) "Soft Lithographic Fabrication of an Image Sensor Array on a Curved Substrate," *J. Vac. Sci. Technol. B* 22(5):2548-2551.

Jortner et al. (2002) "Nanostructured Advanced Materials Perspectives and Directions," *Pure Appl. Chem.* 74(9):1491-1506.

Kang et al. (Apr. 2007) "High-Performance Electronics Using Dnese, Perfectly aligned Arrays of Single-Walled Carbon Nanotubes," *Nat. Nanotechnol.* 2:230-236.

Karnik et al. (2003) "Multiple Lateral Polysilicon Diodes as Temperature Sensors for Chemical Microreaction Systems," *Jpn. J. Appl. Phys.* 42:1200-1205.

Karnik et al. (2003) "Lateral Polysilicon $p^+$-p-$n^+$ and $p^+$-n-$n^+$ Diodes," *Solid-State Electronics* 47:653-659.

Katz et al. (2001) "Synthetic Chemistry for Ultrapure,Processable, and High-Mobility Organic Transistor Semiconductors," *Acc. Chem. Res.* 34:359-369.

Katz, H.E. (2004) "Recent Advances in Semiconductor Performance and Printing Processes for Organic Transistor-Based Electronics," *Chem. Mater.* 16:4748-4756.

Kendall, D.L. (1979) "Vertical Etching of Silicon at Very High Apect Ratios," *Ann. Rev. Mater. Sci.* 9:373-403.

Khan et al. (1993) "High Electron Mobility Transistor Based on a GaN-$Al_xGa_{1-x}$N Heterojunction," *Appl. Phys. Lett.* 63:1214-1215.

Khang et al. (2006) "A Strechable Form of Single-Crystal Silicon for High-Performance Electronics on Rubber Substraights," *Science* 311:208-212.

Kim et al. (2000) "Field Emission from Carbon Nanotubes for Displays," *Diamond and Related Mater.* 9(3-6):1184-1189.

Knipp et al. (2003) "Pentacine Thin Film Transistors on Inorganic Dielectrics: Morphology, Structural Properties, and Electronic Transport," *Appl. Phys. Lett.* 93:347-355.

Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.

Kocabas et al. (2005) "Guided Growth of Large-Scale, Horizontally Aligned Arrays of Single-Walled Carbon Nanotubes and Their Use in Thin-Film Transstors," *Small* 1(11):1110-1116.

Kong et al. (Jan. 28, 2000) "Nanotube Molecular Wires as Chemical Sensors," *Science* 287:622-625.

Kulkarni et al. (2002) "Mesoscale Organization of Metal Nanocrystals," *Pure Appl. Chem* 74(9):1581-1591.

Kumar et al. (2002) "Thermally-Stable Low-Resistance Ti/Al/Mo/Au Multilayer Ohmic Contacts on n-GaN," *J. Appl. Phys.* 92:1712-1714.

Kumar et al. (1994) "Patterning Self-Assembled Monolayers: Applications in Materials Science," *Langmuir* 10:1498-1511.

Kuo et al. (1985) "Effect of Mismatch Strain on Band Gap in III-V Semiconductors," *J. Appl. Phys.* 57:5428-5432.

Lacour et al. (2005) "Stretchable Interconnects for Elastic Electronic Surfaces," *Proc. IEEE* 93:1459-1467.

Lacour et al. (Apr. 14, 2003) "Stretchable Gold Conductors on Elastomeric Substrates," *Appl. Phys. Lett.* 82(15):2404-.

Lambacher et al. (2004) "Electrical Imaging of Neuronal Activity by Multi-Transistor-Array (MTA) Recording at 7.8 μm Resolution," *Appl. Phys. A* 79:1607-1611.

Landes et al. (2002) "Some Properties of Spherical and Rod-Shaped Semiconductor and Metal Nanocrystals," *Pure Appl. Chem.* 74(9):1675-1692.

Law et al. (2004) "Semiconductor Nanowires and Nanotubes," *Ann. Rev. Mater. Res.* 34:83-122.

Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.

Lee et al. (2005) "A Printable Form of Single-Crystalline Gallium Nitride for Flexable Optoelectronic Systems," *Small* 1:1164-1168.

Lee et al. (Feb. 2001) "Application of Carbon Nanotubes to Field Emission Displays," *Diamond and Related Mater.* 10(2):265-270.

Li et al. (2004) "Electrospinning of Nanofibers: Reinventing the Wheel," *Adv. Mater.* 16(14):1151-1170.

Lieber, C.M. (2003) "Nanoscale Science and Technology: Building a Bog Future from Small Things," *MRS. Bull.* 28:486-.

Lim et al. (2005) "Flexible Membrane Pressure Sensor," *Sens. Act. A* 119:332-335.

Lin et al. (Sep. 2005) "High-Performance Carbon Nanotube Field-Effect Transistor With Tunable Polarities," *IEEE Trans. Nano* 4(5):481-489.

Ling et al. (2004) "Thin Film Deposition, Patterning, and Printing in Organic Thin Film Transistors," *Chem. Mater.* 16:4824-4840.

Long et al. (1990) "Heterostructure FETs and Bipolar Transistors," In; *Gallium Arsenide Digital Integrated Circuit Design*, McGraw-Hill, New York, pp. 58-69.

Madou, M. (1997) "Etch-Stop Techniques," In; *Fundamentals of Microfabrication*, CRC Press, New York, pp. 193-199.

Maldovan et al. (2004) "Diamond-Structured Photonic Crystals," *Nature Materials* 3:593-600.

Marquette et al. (2004) "Conducting Elastomer Surface Texturing: A Path to Electrode Spotting Application to the Biochip Production," *Biosens. Bioelectron.* 20:197-203.

Mas-Torrent et al. (2006) "Large Photoresponsivity in High-Mobility Single-Crystal Organic Field-Effect Phototransistors," *ChemPhysChem* 7:86-88.

McAlpine et al. (2005) "High-Performance Nanowire Electronics and Photonics and Nanoscale Patterning on Flexible Plastic Substrates," *Proc. IEEE* 93:1357-1363.

McAlpine et al. (2003) "High-Performance Nanowire Electronics and Photonics on Glass and Plastic Substrates," *Nano Lett.* 3:1531-1535.

Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.

Meitl et al. (2006) "Transfer Printing by Kinetic Control of Adhesion to an Elastomeric Stamp," *Nat. Mater.* 5:33-38.

Min, G. (Apr. 4, 2003) "Plastic Electronics and Their Packaging Technologies," *Syn. Metals*. 135:141-143.

Misewich et al. (May 2, 2003) "Electronically Induced Optical Emission from a Carbon Nanotube FET," *Science* 300:783-786.

Mishra et al. (2002) "AlGaN/GaN HEMTs-an Overview of Device Operation and Applications," *Proc. IEEE* 90:1022-1031.

Moon et al. (2002) "Ink-Jet Printing of Binders for Ceramic Components," *J. Am. Ceram. Soc.* 85:755-762.

Moore et al. (Sep. 9, 2003) "Individually Suspended Single-Walled Carbon Nanotubes in Various Surfactants," *Nano Lett.* 3(10):1379-1382.

Nath et al. (2002) "Nanotubes of the Disulfides of Groups 4 and 5 Metals," *Pure Appl. Chem.* 74(9):545-1552.

Nathan et al. (2002) "Amorphous Silicon Technology for Large Area Digital X-Ray and Optical Imaging," *Microelectronics Reliability* 42:735-746.

Newman et al. (2004) "Introduction to Organic Thin Film Transistors and Design of n-Channel Organic Semiconductors," *Chem. Mater.* 16:4436-4451.

Noda et al. (1996) "New Realization Method for Three-Dimensional Photonic Crystal in Optical Wavelength Region," *Jpn. J. Appl. Phys.* 35:L909-L912.

Nomura et al. (2004) "Room-Temperature Fabrication of Transparent Flexible Thin-Film Transistors Using Oxide Semiconductors," *Nature* 432:488-492.

O'Connell et al. (Jul. 26, 2002) "Bang Gap Fluorescence from Individual Single-Walled Caarbon Nanotubes," *Science* 297:593-596.

Ong et al. (2004) "High-Performance Semiconducting Poolythiophenes for Organic Thin-Film Transistors," *J. Am. Chem. Soc.* 126:3378-3379.

Ong et al. (2005) "Design of High-Performance Regioreular Polythiophenes for Organic Thin-Film Transistors," *Proc. IEEE* 93:1412-1419.

Origin Energy (May 2004) "Fact Sheet—Sliver Cells," www.orginenergy.com.au/sliver.

O'Riordan et al. (2004) "Field Configured Assembly: Programmed Manipulation and Self-Assembly at the Mesoscale," *Nano Lett.* 4:761-765.

Pardo et al. (2000) "Application of Screen Printing in the Fabrication of Organic Ligh-Emitting Devices," *Adv. Mater.* 12(17):1249-1252.

Pearton et al. (1999) "GaN: Processing, Defects, and Devices," *J. Appl. Phys.* 86:1-78.

Podzorov et al. (2005) "Hall Effect in the Accumulation Layers on the Surface of Orgaic Semiconductors," *Phys. Rev. lett.* 95:226601.

Puspha et al. (2002) "Stars and Stripes. Nanoscale Misfit Dislocation Patterns on Surfaces," *Pure Appl. Chem.* 74(9):1663-1671.

Reuss et al. (Jul. 2005) "Macroelectronics: Perspectives on Technology and Applications," *Proc. IEEE* 93(7):1239-1256.

Roberts et al. (1979) "Looking at Rubber Adhesion," *Rubber Chem. Technol.* 52:23-42.

Rogers et al. (1997) "Using an Elastomeric Phase Mask for Sub-100 nm Photolithography in the Optical Near Field," *Appl. Phys. Lett.* 70:2658-2660.

Rogers et al. (2002) "Printed Plastic Electronics and Paperlike Displays," *J. Polym. Sci. Part A. Polym. Chem.* 40:3327-3334.

Rogers et al. (1999) Printing Process Sutable for Reel-to-Reel Production of High-Performance Organic Transistors and Circuits, *Adv. Mater.* 11(9):741-745.

Rogers et al. (Mar. 2000) "Organic Smart Pixels and Complementary Inverter Circuits Formed on Plastic Substrates by Casting and Rubber Stamping," *IEEE Electron Dev. Lett.* 21(3):100-103.

Rosenblatt et al. (2002) "High Performance Electrolyte Gated Carbon Nanotube Transistors," *Nano Lett.* 2(8):869-872.

Roundy et al. (2003) "Photonic Crystal Structure with Square Symetry within Each Layer and a Three-Dimensional Band Gap," *Appl. Phys Lett.* 82:3835-3837.

Samuelson et al. (2004) "Semiconductor Nanowires for Novel One-Dimensional Devices," *Physica E* 21:560-567.

Sanyal et al. (2002) "Morphology of Nanostructures Materials," *Pure Appl. Chem.* 74(9):1553-1570.

Sazonov et al. (2005) "Low-Temperature Materials and Thin-Film Transistors for Flexible Electronics," *Proc. IEEE* 93:1420-1428.

Sekitani et al. (2005) "Bending Experiment on Pentacene Fiield-Effect Transistors on Plastic Films," *Appl. Phys. Lett.* 86:073511.

Sen et al. (2002) "Nonequilibrium Processes for Generating Silicon Nanostructures in Single-Crystalline Silicon," *Pure Appl. Chem.* 74(9):1631-1641.

Servanti et al. (2005) "Functional Pixel Circuits for Elastic AMOLED displays," *Proc. IEEE* 93:1257-1264.

Sharp et al. (2003) "Holographic Photonic Crystals with Diamond Symmetry," *Phys. Rev. B* 68:205102/1-205102/6.

Shetty et al. (2005) "Formation and Characterization of Silicon Films on Flexible Polymer Substrates," *Mater. Lett.* 59:872-875.

Schon et al. (1995) "Ambipolar Pentacene Field-Effect Transistors and Inverters," *Science* 287:1022-1023.

Shtein et al. (Oct. 15, 2004) "Direct Mask-Free Patterning of Molecular Organic Semiconductors Using Organic Vapor Jet Printing," *J. Appl. Phys.* 96(8):4500-4507.

Shull et al. (1998) "Axisymmetric Adhesion Tests of Soft Materials," *Macromol. Chem. Phys.* 199:489-511.

Sirringhaus, H. (2005) "Device Physics of Solution-Processed Organic Field-Effect Transistors," *Adv. Mater.* 17:2411-2425.

Sirringhaus et al. (Dec. 15, 2000) "High-Resolution Inkjet Printing of All-Polymer Transistor Circuits," *Science* 290:2123-2126.

Someya et al. (2005) "Integration of Organic FETs with Organic Photodiodes for a Large Area, Flexible, and Lightweight Sheet Image Scanners," *IEEE Trans. Electron Devices* 52:2502-2511.

Someya et al. (2005) "Conformable, Flexible, Large-Area Networks of Pressure and Thermal Sensors with Organic Transistor Active Matrixes," *Proc. Nat. Acad. Sci. USA* 102:12321-12325.

Someya et al. (Jul. 6, 2004) "A Large-Area, Flexible, Pressure Sensor Matric with Organic Field-Effect Transistors for Artificial Skin Applications," *Proc. Nat. Acad. Sci. USA* 101(27):9966-9970.

Stafford et al. (Aug. 2004) "A Buckling-Based Metrology for Measureing the Elastic Moduli of Polymeric Thin Films," *Nature Mater.* 3:545-550.

Sun et al. (2005) "Bendable GaAs Metal-Semiconductor Field-Effect Transistors Formed with a Printed GaAs Wire Arrays on Plastic Substrates," *Appl. Phys. Lett.* 87:083501.

Sun et al. (2005) "Advances in Organic Field-Effect Transistors," *J. Mater. Chem.* 15:53-65.

Sundar et al. (2004) "Elastomeric Transistor Stamps: Reversible Probing of CHaarge Transport in Organic Crystals," *Science* 303:1644-1646.

Suo et al. (Feb. 22, 1999) "Mechnics of Rollable and Foldable Film-on-Foil Electronics," *Appl. Phys. Lett.* 74(8):1177-1179.

Sze et al. (1985) *Semiconductor Devices, Physics and Technology*, $2^{nd}$ ed., Wiley, New York, pp. 190-192.

Tanase et al. (2002) "Magnetic Trapping and Self-Assembly of Multicomponent Nanowires," *J. Appl. Phys.* 91:8549-8551.

Tang et al. (2005) "One-Dimensional Assemblies of Nanoparticles: Preparation, Properties, and Promise," *Adv. Mater.* 17:951-962.

Tate et al. (2000) "Anodization and Microcontact Printing on Electroless Silver: Solution-Based Fabrication Procedures for Low-Voltage Electronic Systems with Organic Active Components," *Langmuir* 16:6054-6060.

Toader et al. (2004) "Photonic Band Gaps Based on Tetragonal Lattices of Slanted Pores," *Phys. Rev. Lett.* 90:233901/1-233901/4.

Toader et al. (2004) "Photonic Band Gap Architectures for Holographic Lithography," *Phy. Rev. Lett.* 043905/1-043905/4.

Ucjikoga, S. (2002) "Low-Temperature Polycrystalline Silicon Thin-Film Transistor Technologies ofr System-on-Glass Displays," *MRS Bull.* 27:881-.

Wagner et al. (2005) "Electronic Skin: Architecture and Components," *Physica E* 25:326-334.

Weber et al. (Jan. 2004) "A Novel Low-Cost, High Efficiency Micromachined Silicon Solar Cell," *IEEE Electron Device Lett.* 25(1):37-39.

Willner et al. (2002) "Functional Nanoparticle Architectures for Senoric, Optoelectronic, and Bioelectronic Applications," *Pure Appl. Chem.* 74(9):1773-1783.

Wind et al. (May 20, 2002) "Vertical Scaling of Carbon Nanotube-Field-Effect Transistors Using Top Gate Electrodes," *Appl. Phys. Lett.* 80(20):3871-3819.

Wu et al. (2001) "Amorphous Silicon Crystallization and Polysilicon Thin Film Transistors on $SiO_2$ Passivated Steel Foil Substrates," *Apple. Surf. Sci* 175-176:753-758.

Wu et al. (2001) "Thermal Oxide of Polycrystalline Silicon on Steel Foil as a Thin-Film Transitor Gate Dielectric," *Appl. Phys. Lett.* 78:3729:2731.

Yang et al. (2002) "Creating Periodic Three-Dimensional Structures by Multibeam Interface of Visible Laser," *Chem. Mater.* 14:2831-2833.

Yang et al. (2000) "Stability of Low-Temperature Amorphous Silicon Thin Film Transistors Formed on Glass and Transparent Plastic Substrates," *J. Vac. Sci. Technol. B* 18:683-689.

Yao et al. (Mar. 2000) "High-Field Effect Electrical Transport in Single-Walled Carbon Nanotubes," *Phys. Rev. Lett.* 84(13):2941-2944.

Yin et al. (2005) "Colloidal Nanocrystal Synthesis and the Organic-Inorganic Interface," *Nature* 437:664-670.

Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.

Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.

Zheng et al. (2004) "Shape-and Solder-Directed Self-Assembly to Package Semiconductor Device Segments," *Appl. Phys. Lett.* 85:3635-3637.

Zhou et al. (2005) "Band Structure, Phonon Scattering, and the Performance Limit of Single-Walled Carbon Nanotube Transistors," *Phys. Rev. Lett.* 95:146805.

Search Report for Corresponding International PCT Application No. PCT/US05/19354 dated Apr. 18, 2007.

Search Report For Patent Application, Corresponding to Republic of China (Taiwan) Patent Application No. 094118507 dated Feb. 24, 2007.

\* cited by examiner

Fig.2
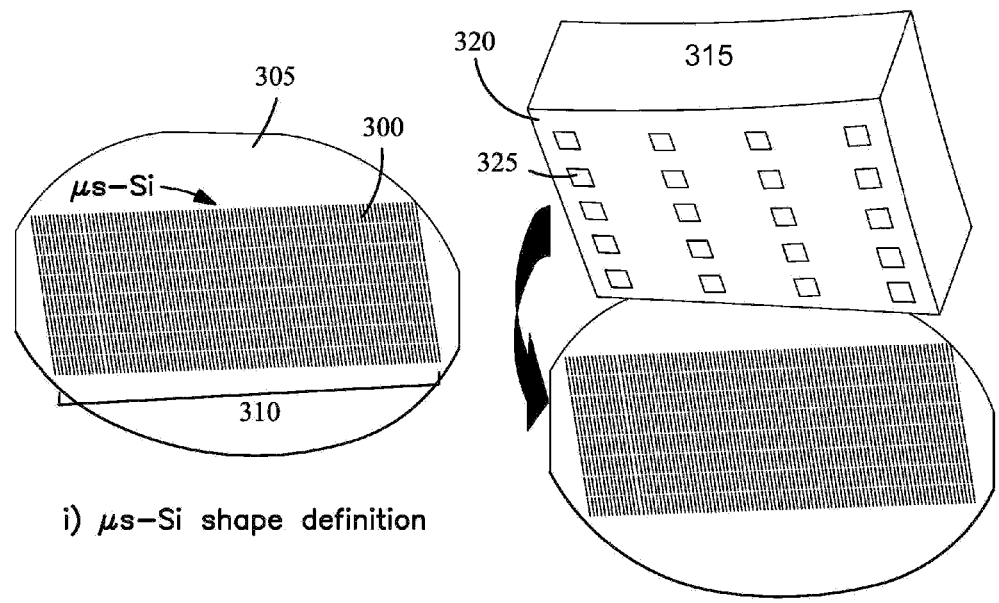
i) μs-Si shape definition
ii) Stamp/plastic substrate lamination
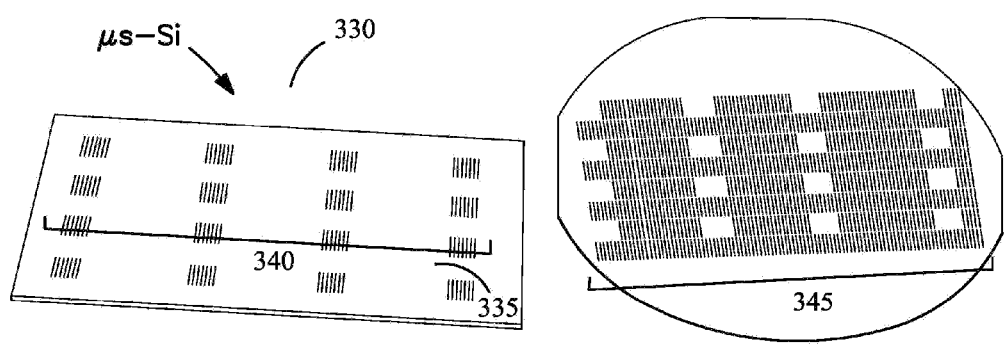
iii) Plastic and mother substrates after transfer a) Selective coating of the mother substrate with an adhesive material b) Flat stamp (or plastic substrate) selectively coated with an adhesive c) Structured stamp inked with an adhesive

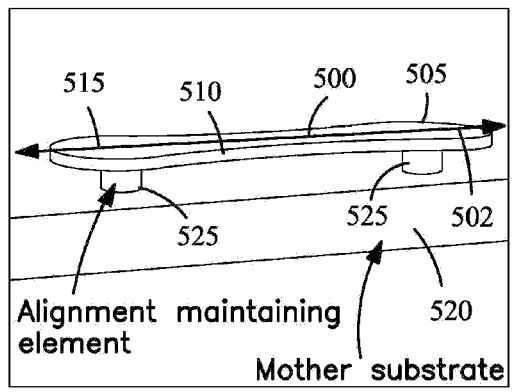
Fig.4A1
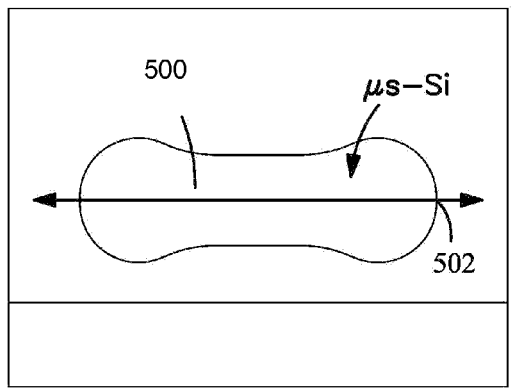
Fig.4A2
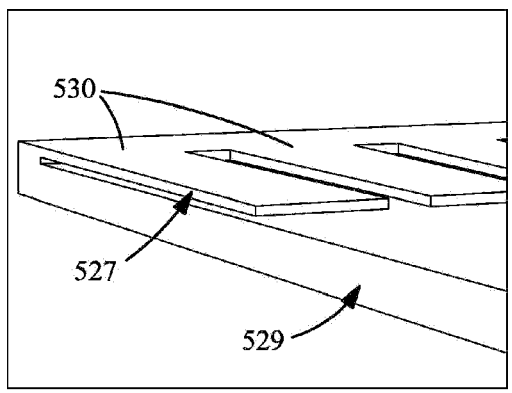
Fig.4B1
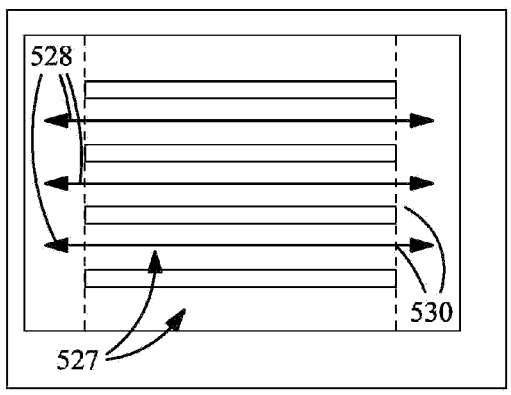
Fig.4B2

UV exposure through the polymer sheet

REM: The alignment does not have to be very precise, the channel will be defined in the next step

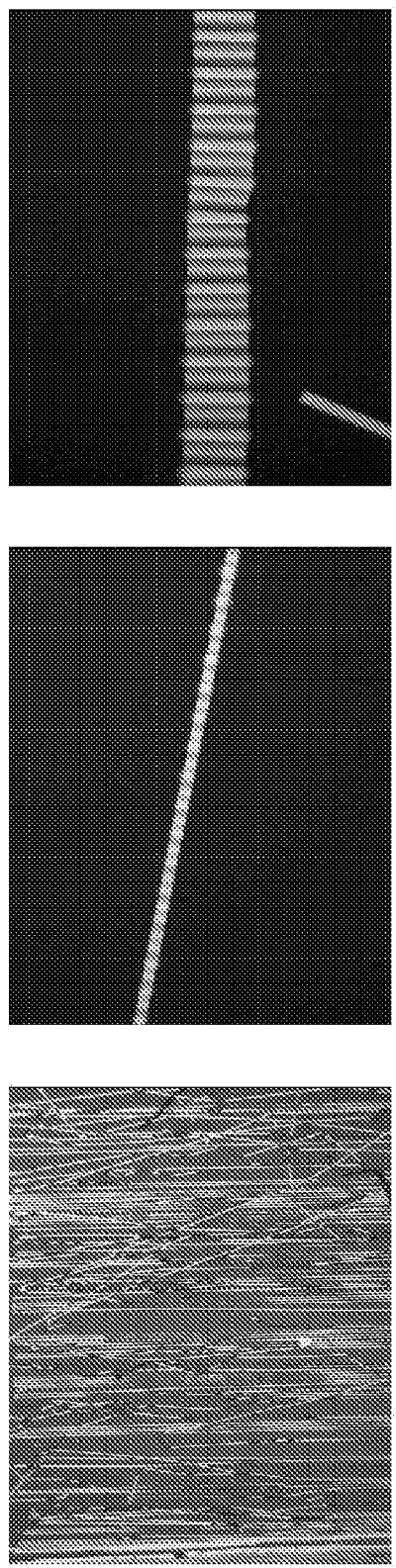
Fig. 15: Stretchable semiconductor element

Fig. 17

1. Providing a prestrained elastic substrate in an expanded state. (e.g. roll pressing or bending)

2. Bonding at least a portion of the internal surface of a printable semiconductor structure to the external surface of the prestrained elastic substrate in an expanded state.

3. Allowing the elastic substrate to relax at least partially, wherein relaxation of the elastic substrate bends the internal surface of the printable semiconductor structure

 OPTIONAL

4. Transfer printable semiconductor having curved internal substrate to a flexible receiving substrate.

Fig.18A
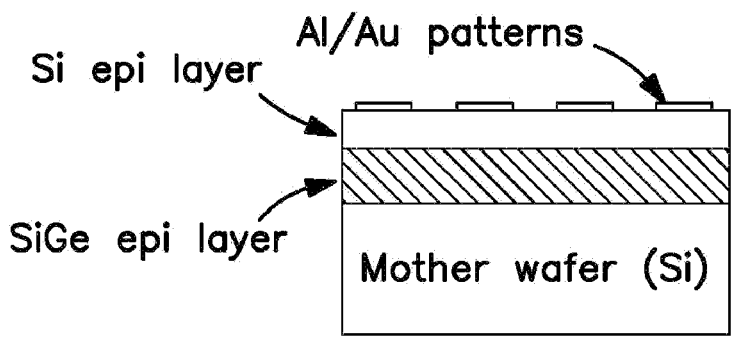
i) μs–Si shape definition
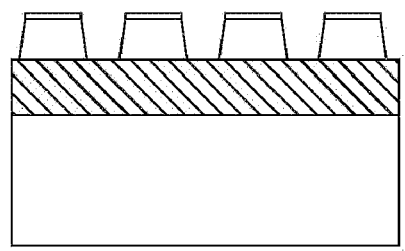
ii) μs–Si wet etching
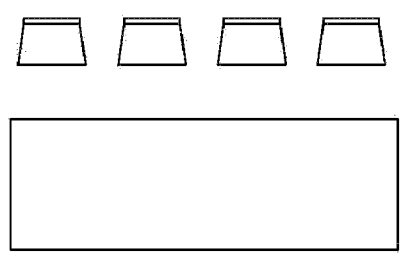
iii) Si–Ge selective wet etching

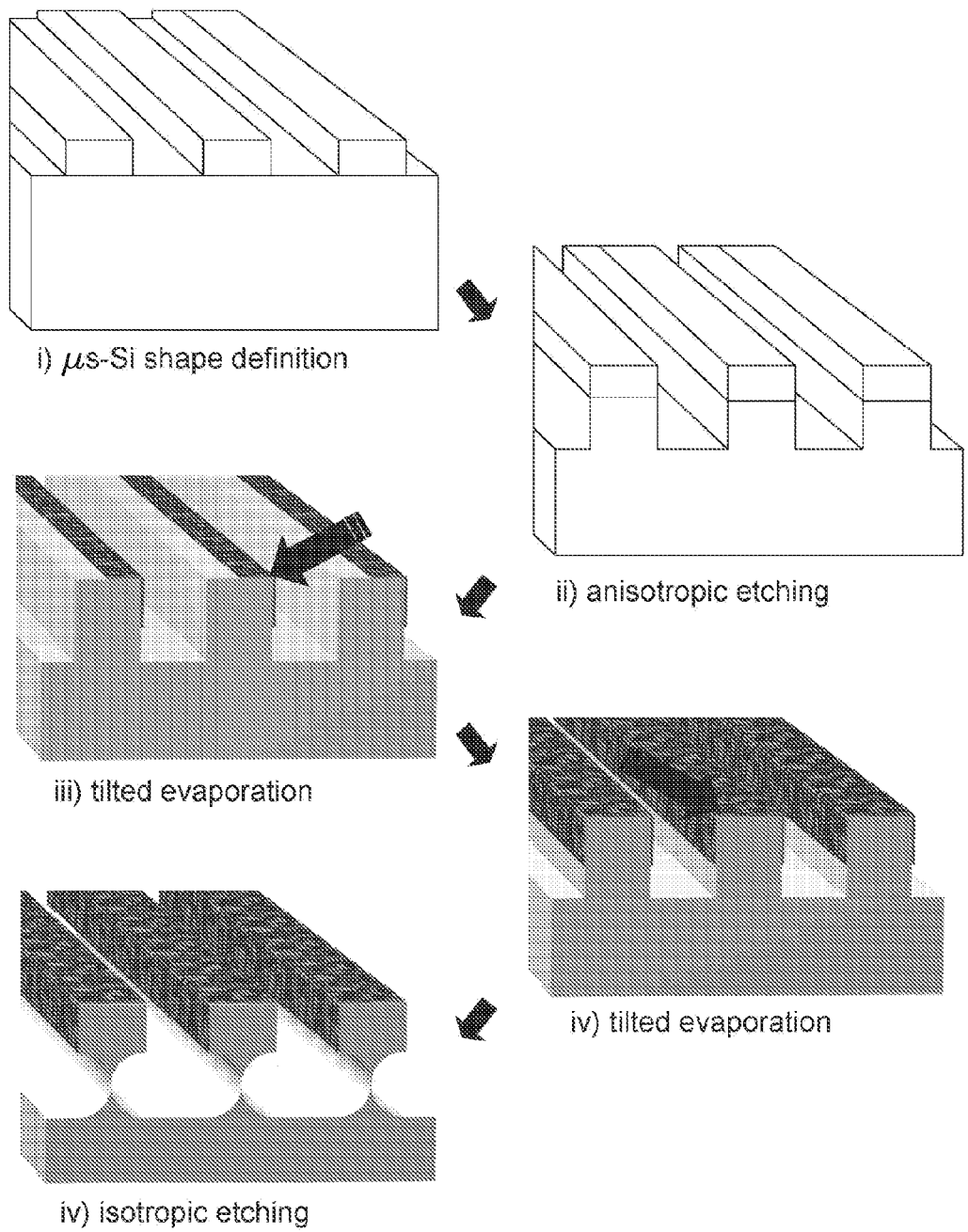

Fig.18D
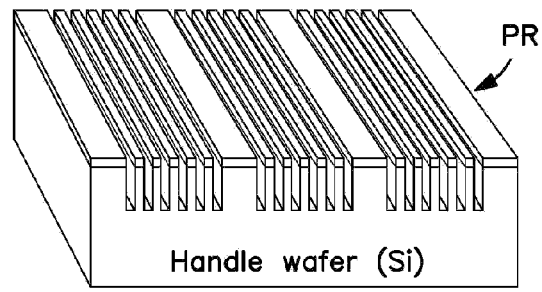
i) Si anisotropic etching
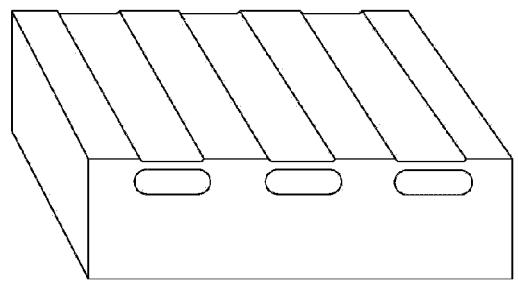
ii) Si annealing in N₂
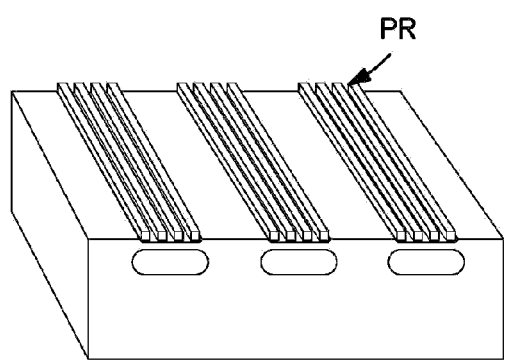
iii) μs–Si shape definition
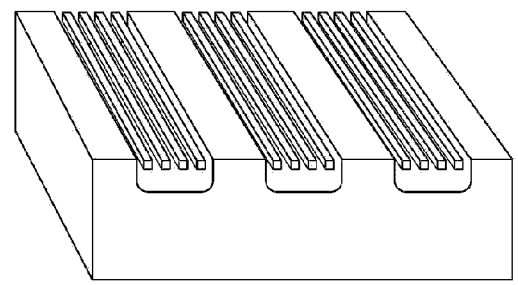
iii) Si etching

Fig.18E
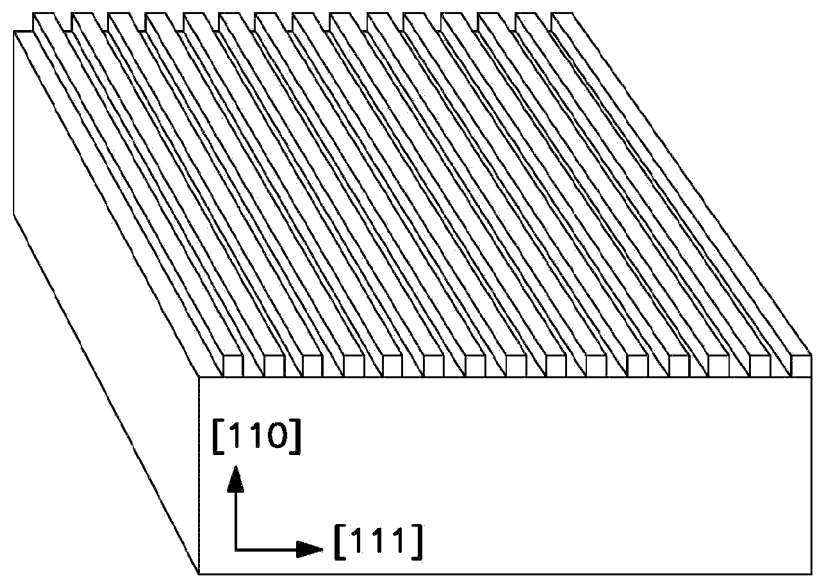
i) μs-Si shape definition
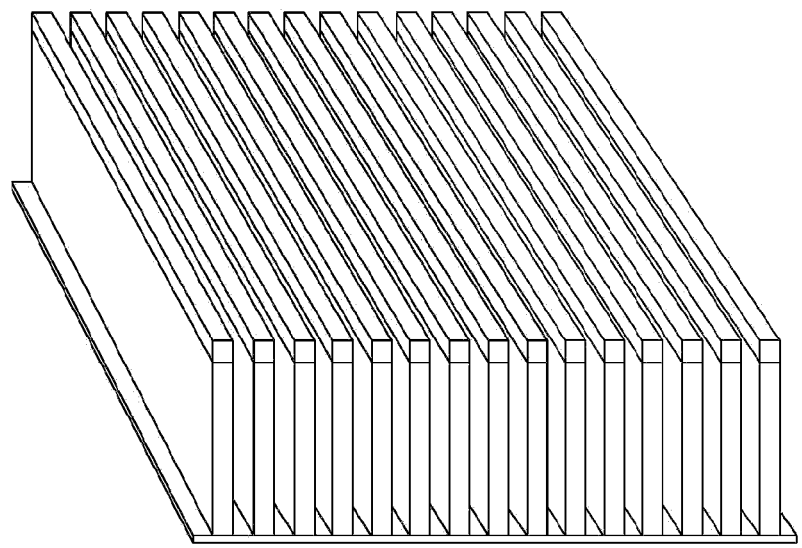
ii) anisotropic wet chemical etching

Fig. 18F
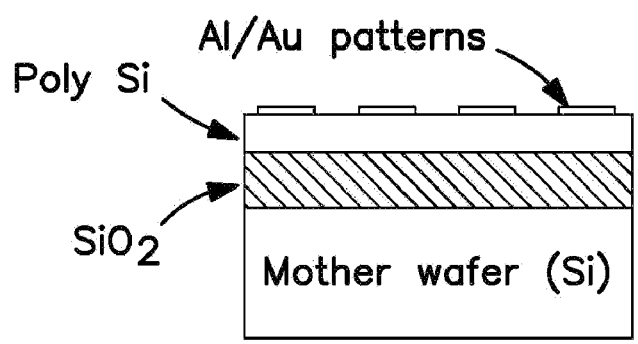
i) µs–Si shape definition
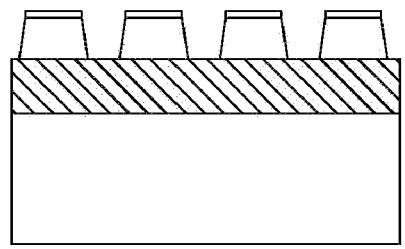
ii) µs–Si wet etching
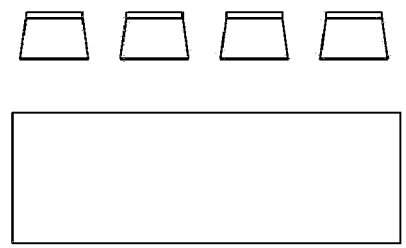
iii) Liftoff: SiO₂ selective wet etching

Fig.18G
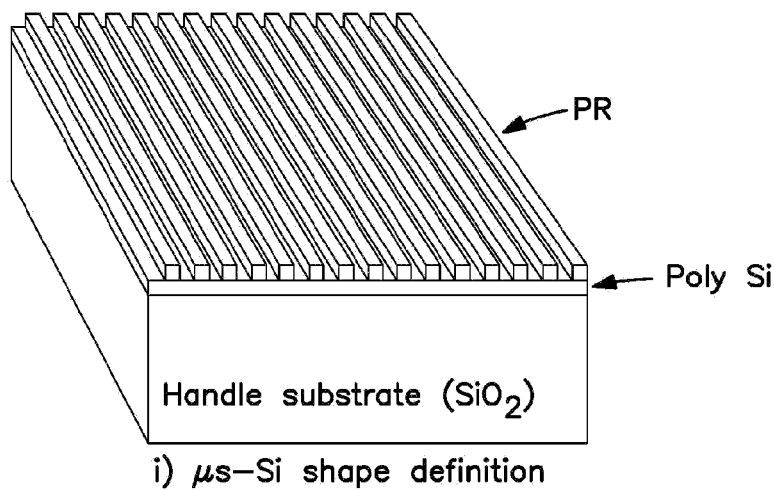
i) μs-Si shape definition
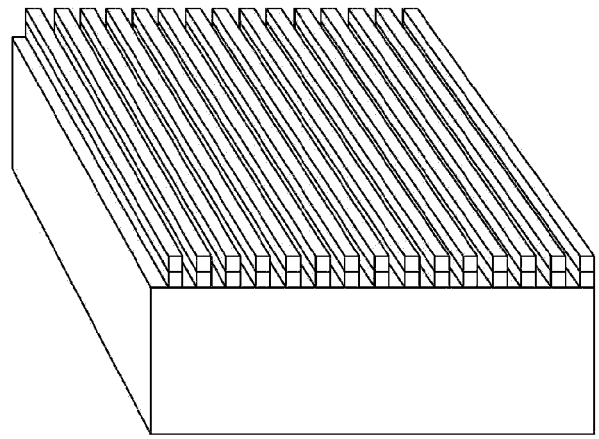
i) μs-pSi wet etching
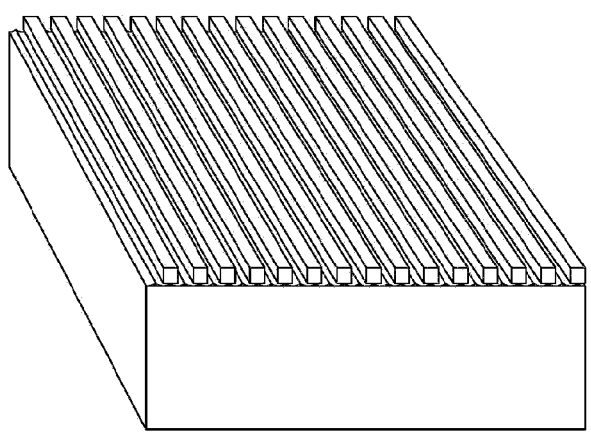
iii) Liftoff: SiO₂ selective wet etching

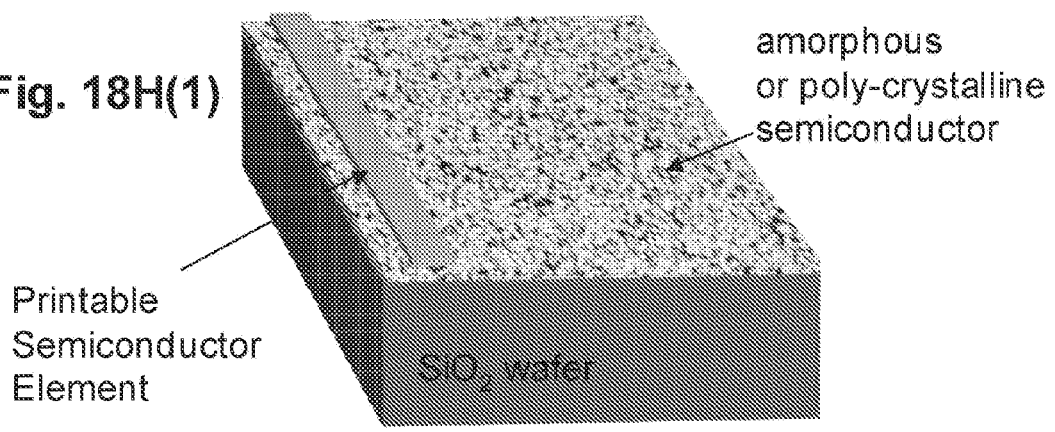
Fig. 18H(1)
Transfer of a Printable Semiconductor Element (seed)
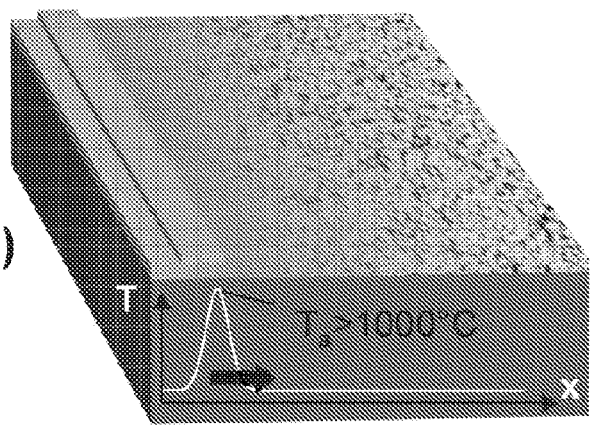
Fig. 18H(2)
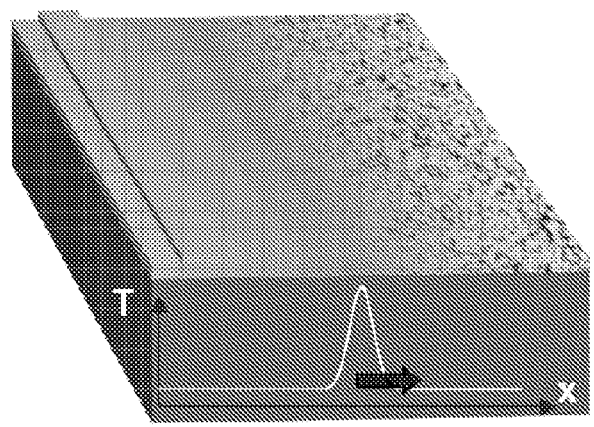
Annealing of the thin film

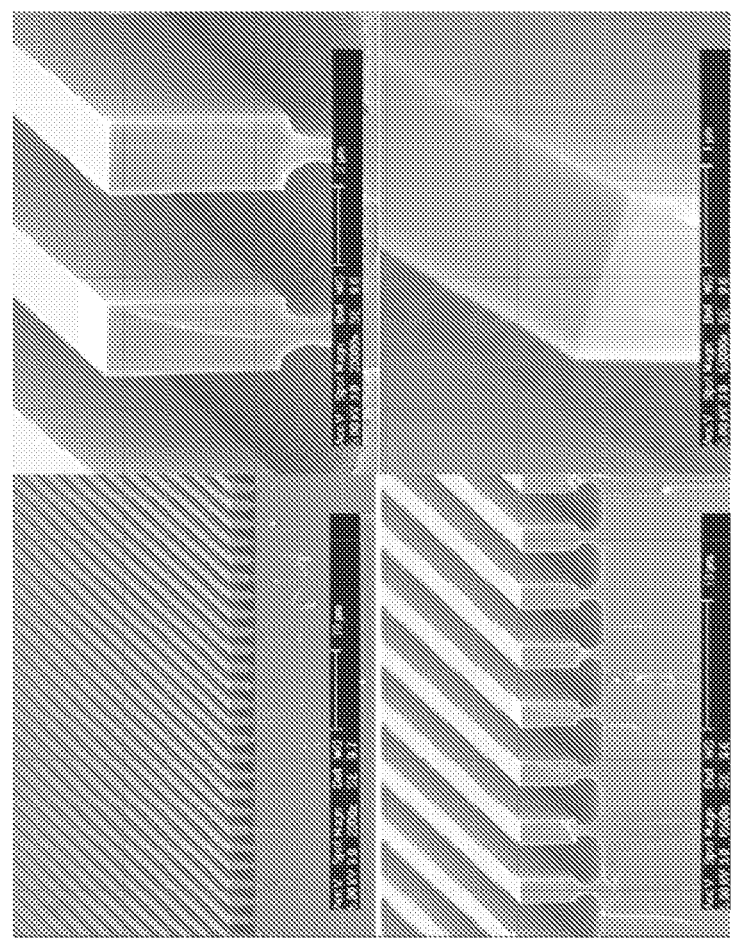
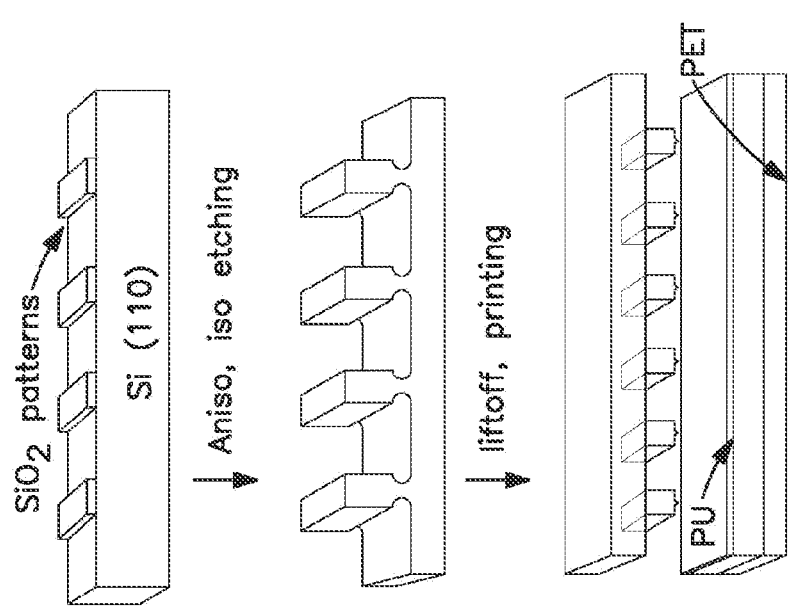
Fig. 18J

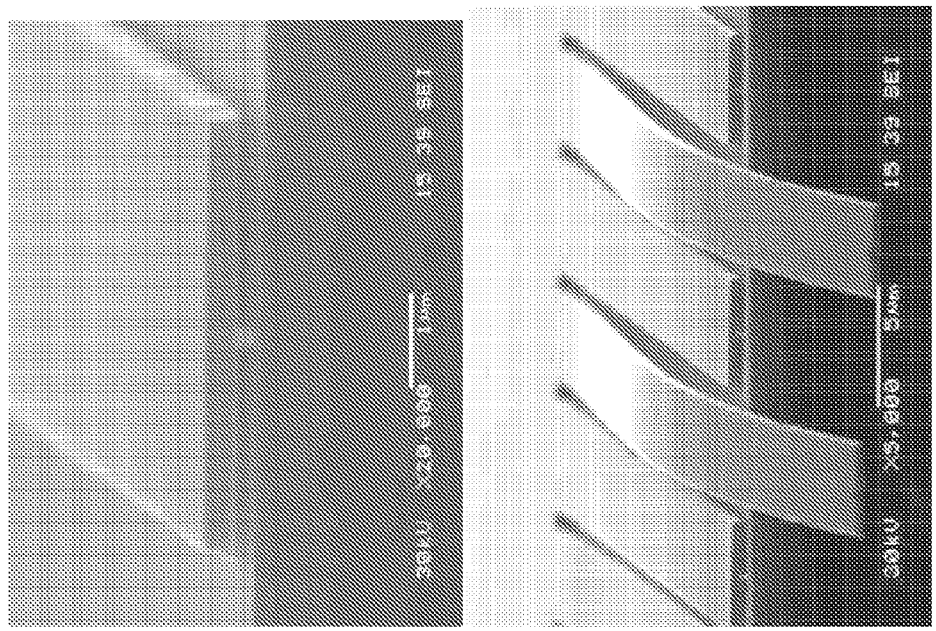
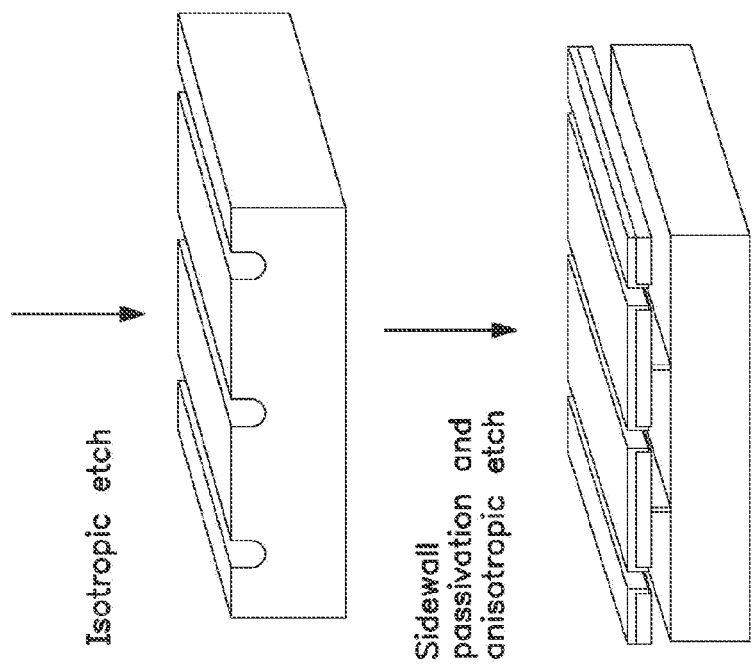
Fig.18K

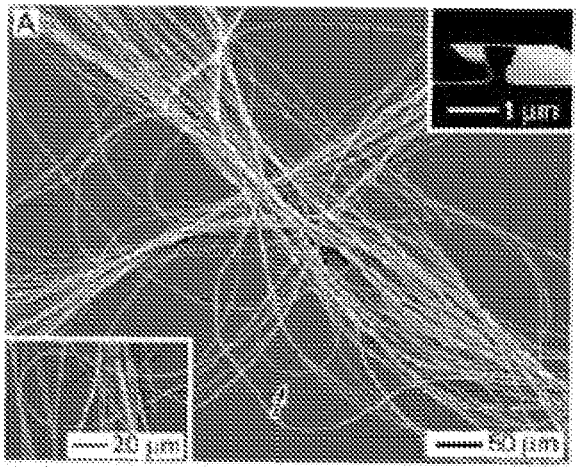
Fig. 20A
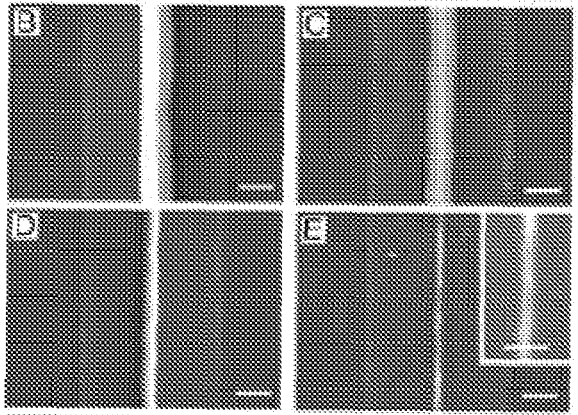
Fig. 20B    Fig. 20C
Fig. 20D    Fig. 20E
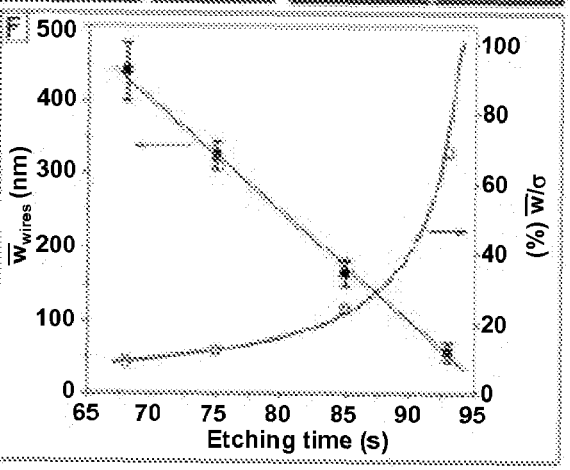
Fig. 20F

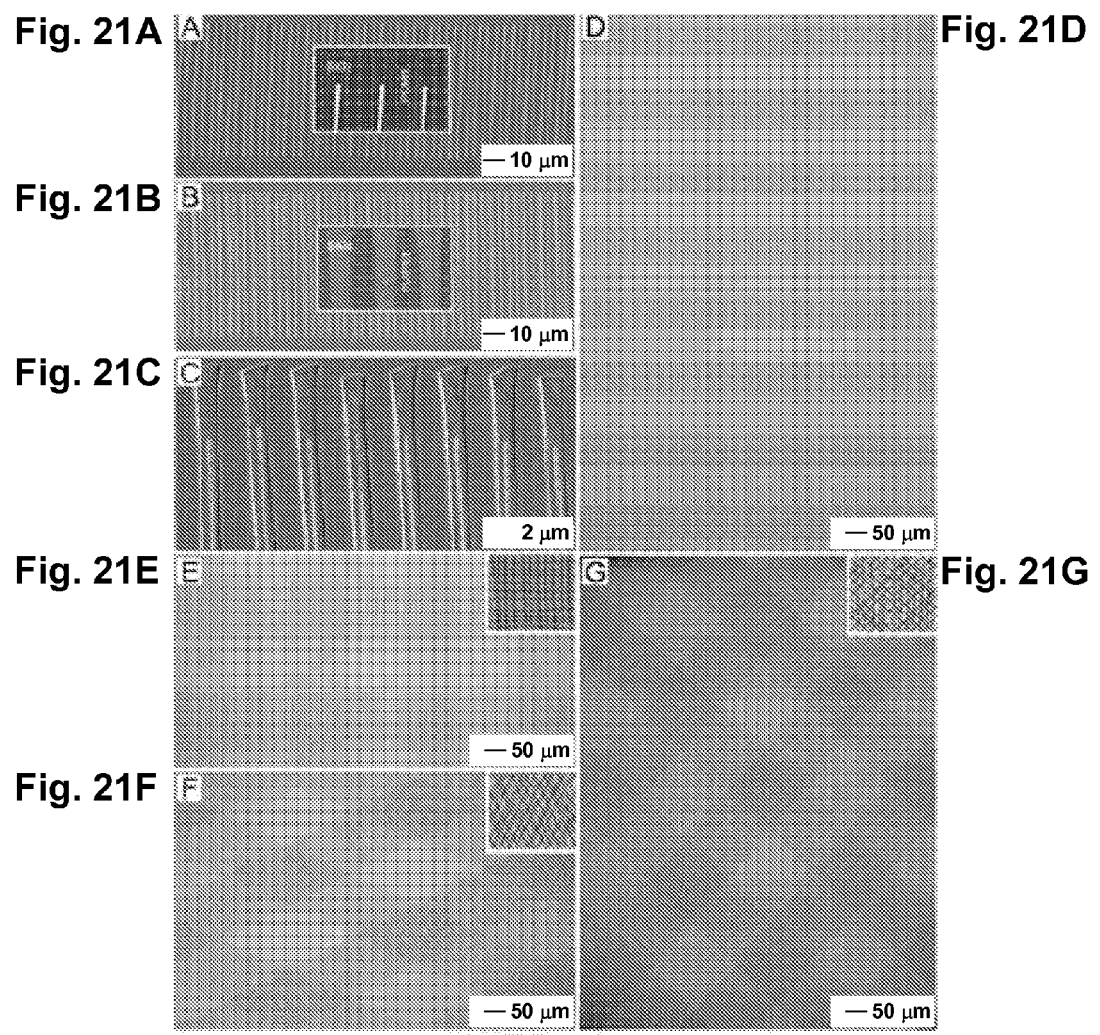

Fig. 24
I. Dispersal in Solution and Casting on Substrate
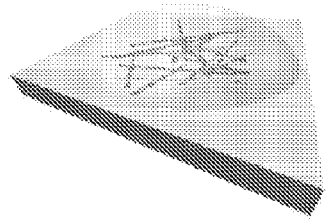
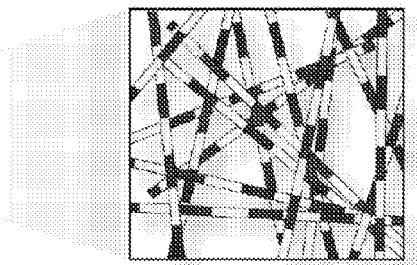
Magnetic Tags (light) on Microstructured Semiconductor (dark)
II. Organization in Magnetic Field
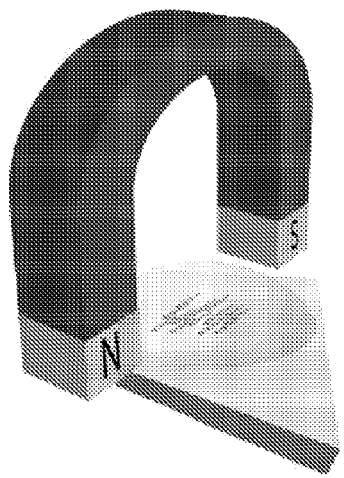
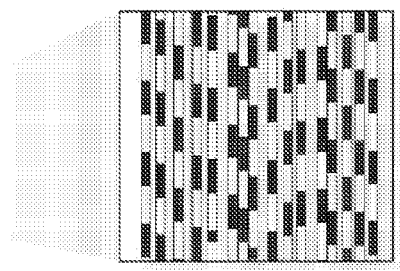
III. Metallization
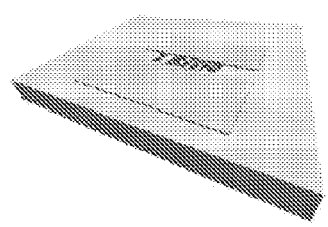
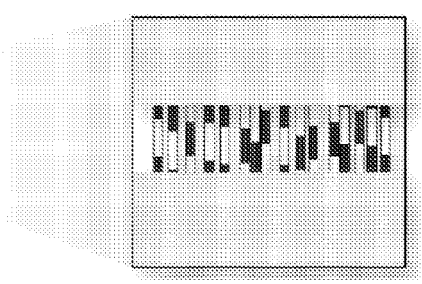

Magnetically tagged microstructures dispersed in solution and cast on a substrate (left). Influence of Magnetic field (right).

```
┌─────────────────────────────────────────────┐
│ Provide high quality semiconductor material,│
│ such as a single crystal silicon wafer.     │
└─────────────────────────────────────────────┘
                      ↓
┌─────────────────────────────────────────────┐
│ Process semiconductor material to generate  │
│ adjacent N doped and P doped layers, for    │
│ example using spin on dopants.              │
└─────────────────────────────────────────────┘
                      ↓
┌─────────────────────────────────────────────┐
│ 1. Pattern and etch processed semiconductor │
│ material to define physical dimensions of   │
│ the printable P-N junction.                 │
│                                             │
│ 2. Lift-off processing to generate monolithic│
│ structure comprising the printable P-N      │
│ junction.                                   │
│                                             │
│ 3. Optionally, deposit contacts prior to    │
│ lift-off, for example, via vapor deposition │
│ of metal(s).                                │
└─────────────────────────────────────────────┘
                      ↓
┌─────────────────────────────────────────────┐
│ Assemble printable P-N junction on substrate│
│ using (i) solution printing or (ii) dry     │
│ transfer printing.                          │
└─────────────────────────────────────────────┘
                      ↓
┌─────────────────────────────────────────────┐
│ Optionally, deposit contacts onto P-N       │
│ junction on substrate, for example, via     │
│ vapor deposition of metal(s).               │
└─────────────────────────────────────────────┘
```

Fig. 34A

Fig. 41
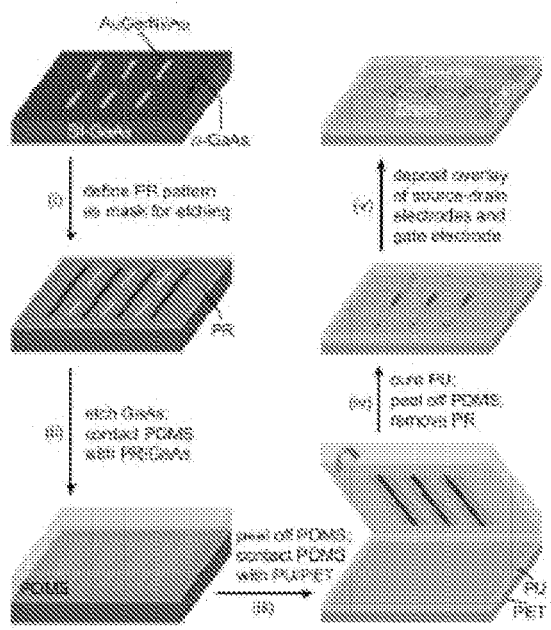
Fig. 42A 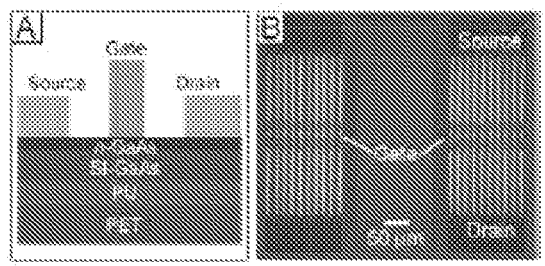 Fig. 42B

Fig. 44A 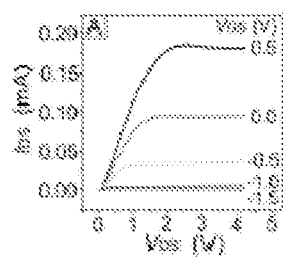 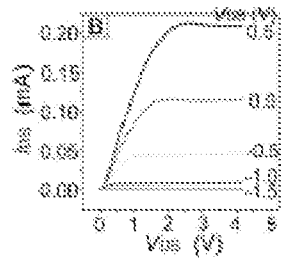 Fig. 44B
Fig. 44C 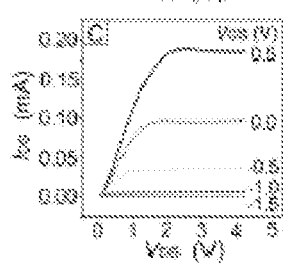 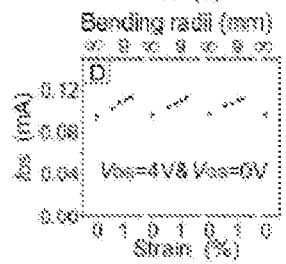 Fig. 44D

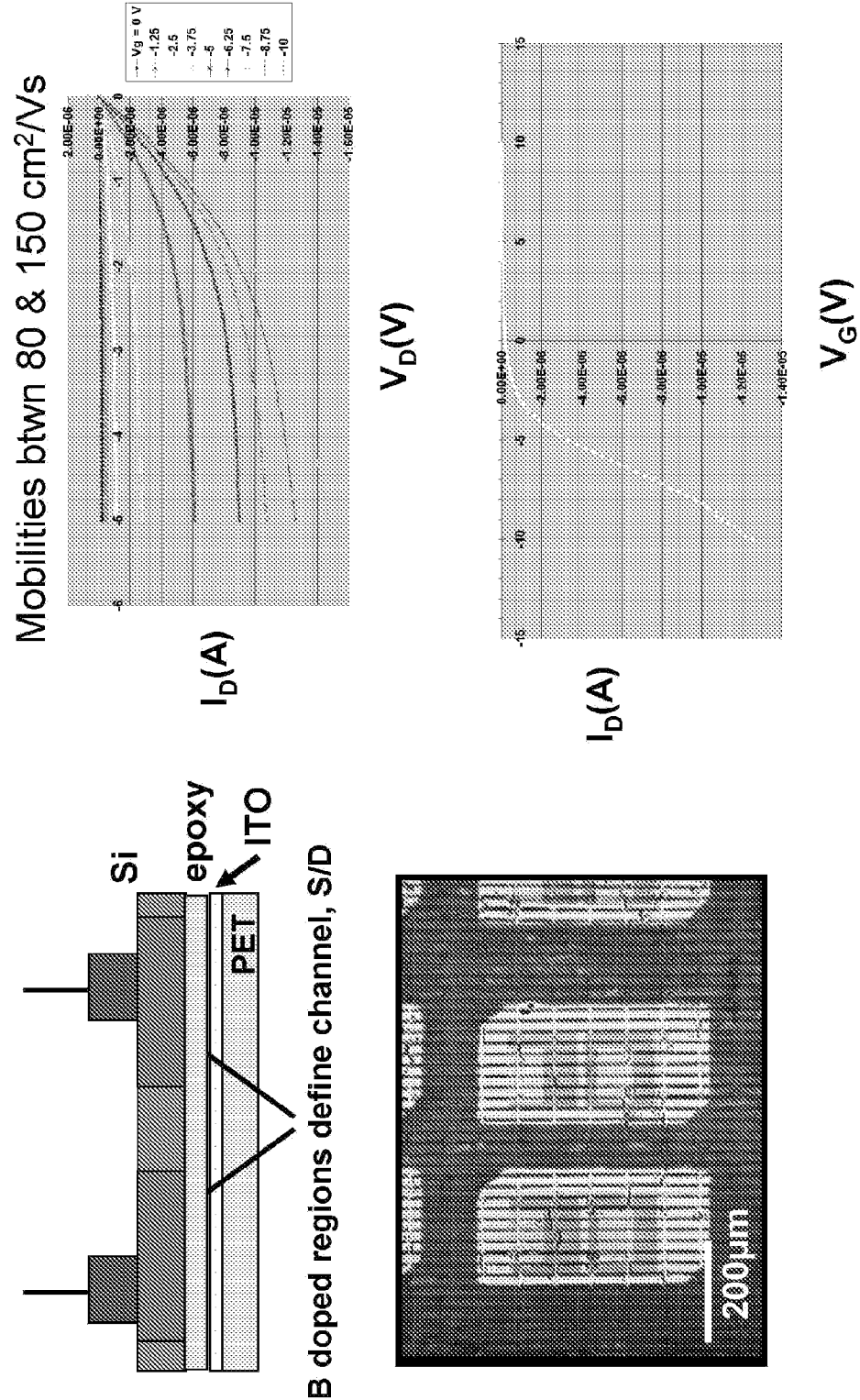

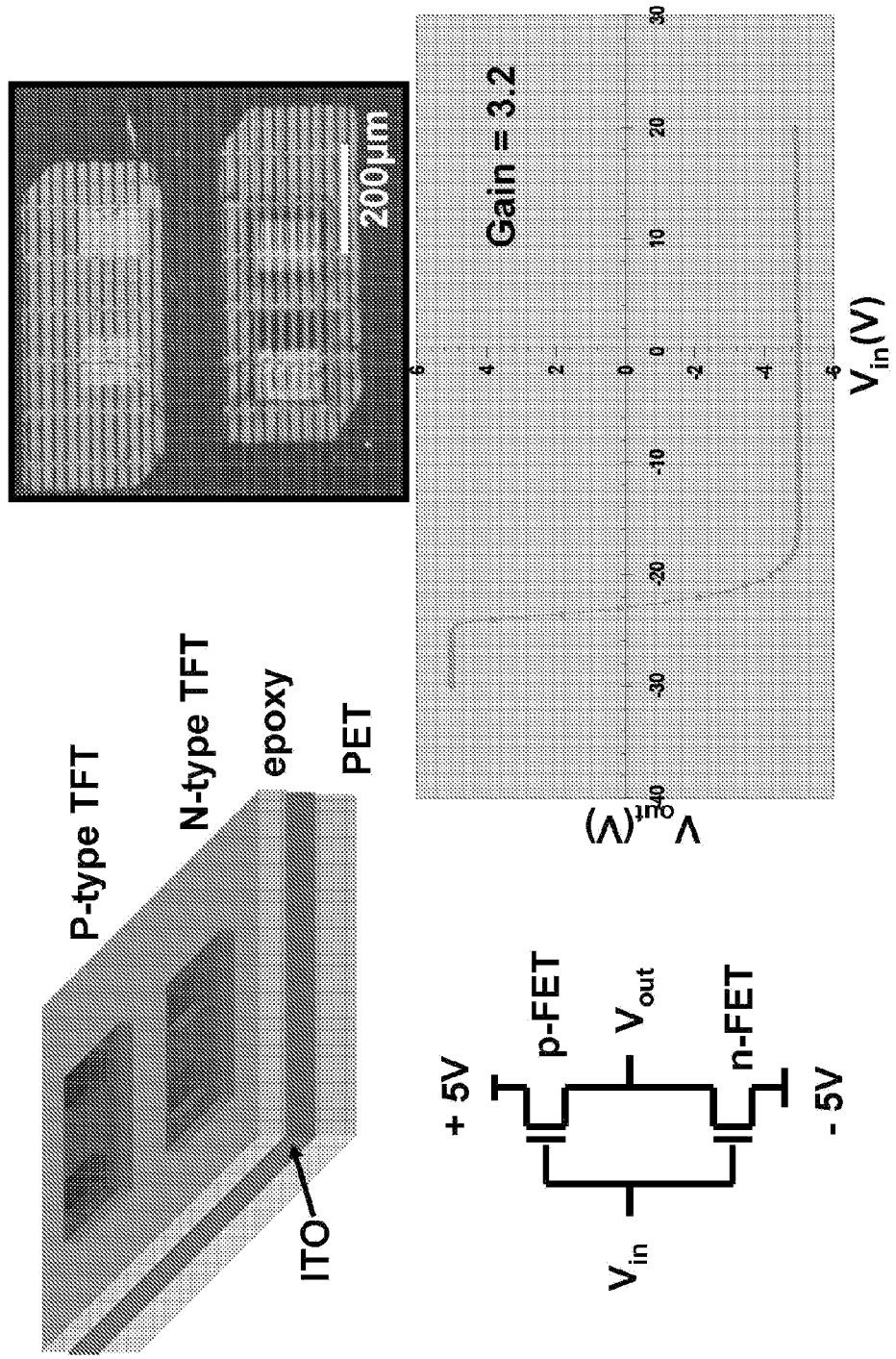
Fig. 46: Complementary Logic Gate (Inverter) on Plastic

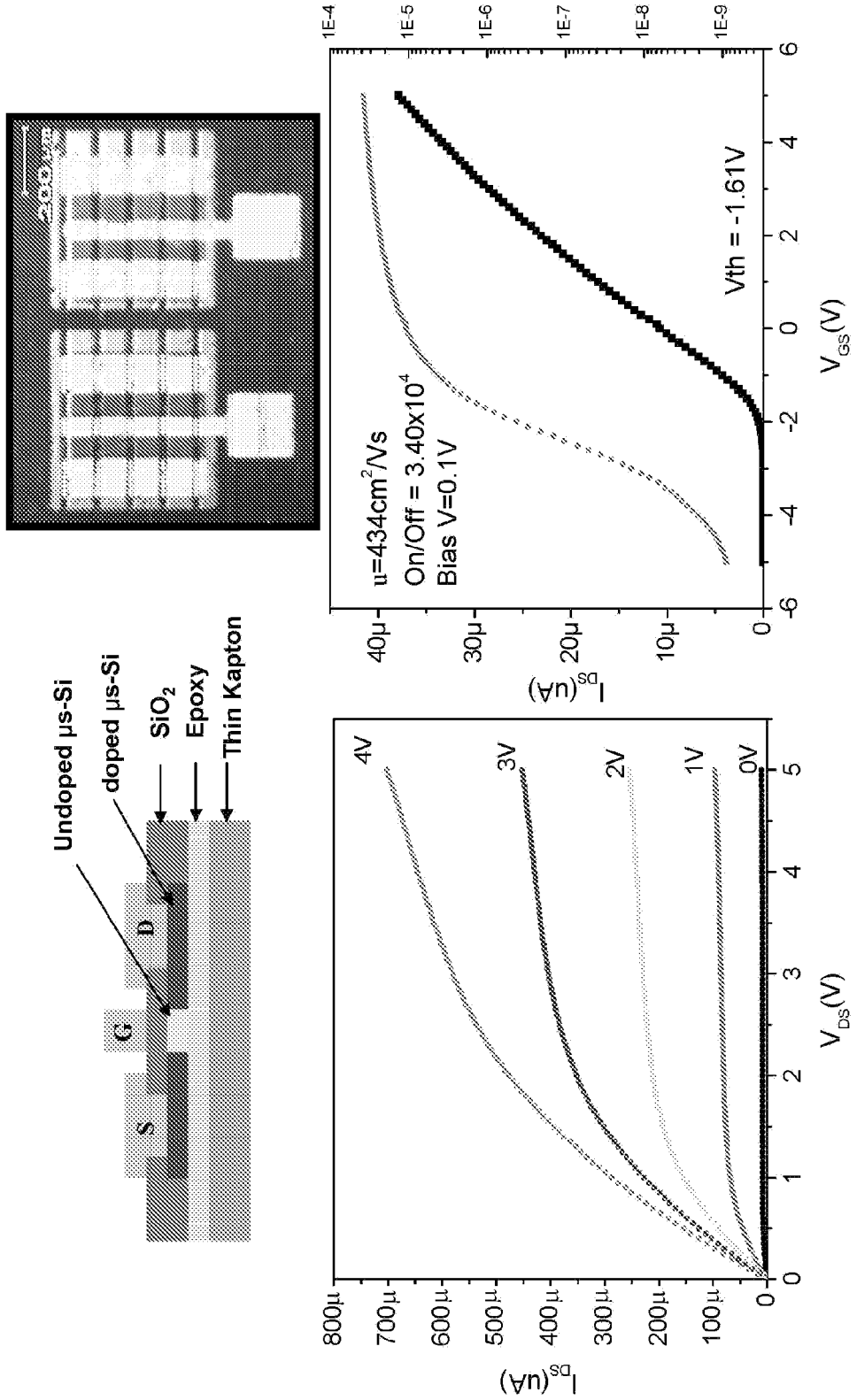
Fig. 47: Top Gate μs-Si Transistors on Plastic

STRETCHABLE SEMICONDUCTOR ELEMENTS AND STRETCHABLE ELECTRICAL CIRCUITS

CROSS REFERENCE TO RELATED APPLICATION

This application claims priority under 35 U.S.C. 119(e) to U.S. Provisional Patent Application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively, which are hereby incorporated by reference in their entireties to the extent not inconsistent with the disclosure herein.

STATEMENT REGARDING FEDERALLY SPONSORED RESEARCH OR DEVELOPMENT

This invention was made, at least in part, with United States governmental support awarded by Department of Energy under Grant No. DEFG02-91ER45439 and the Defense Advanced Projects Agency under Contract F8650-04-C-710. The United States Government has certain rights in this invention.

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors elements for flexible plastic electronic devices. Progress in the field of flexible electronics, however, is not only driven by the development of new solution processable materials but also by new device component geometries, efficient device and device component processing methods and high resolution patterning techniques applicable to plastic substrates. It is expected that such materials, device configurations and fabrication methods will play an essential role in the rapidly emerging new class of flexible integrated electronic devices, systems and circuits.

Interest in the field of flexible electronics principally arises out of several important advantages provided by this technology. First, the mechanical ruggedness of plastic substrate materials provides electronic devices less susceptible to damage and/or electronic performance degradation caused by mechanical stress. Second, the inherent flexibility of these substrate materials allows them to be integrated into many shapes providing for a large number of useful device configurations not possible with brittle conventional silicon based electronic devices. For example, bendable flexible electronic devices are expected to enable fabrication of new devices, such as electronic paper, wearable computers and large-area high resolution displays, that are not easily achieved with established silicon based technologies. Finally, the combination of solution processable component materials and plastic substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well developed methods of making conventional silicon based electronic devices are incompatible with most plastic materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Second, although many amorphous silicon, organic or hybrid organic-inorganic semiconductors are compatible with incorporation into plastic substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Progress has recently been made in extending the electronic performance capabilities of integrated electronic devices on plastic substrates to expand their applicability to a wider range of electronics applications. For example, several new thin film transistor (TFT) designs have emerged that are compatible with processing on plastic substrate materials and exhibit significantly higher device performance characteristics than thin film transistors having amorphous silicon, organic or hybrid organic-inorganic semiconductor elements. One class of higher performing flexible electronic devices is based on polycrystalline silicon thin film semiconductor elements fabricated by pulse laser annealing of amorphous silicon thin films. While this class of flexible electronic devices provides enhanced device electronic performance characteristics, use of pulsed laser annealing limits the ease and flexibility of fabrication of such devices, thereby significantly increasing costs. Another promising new class of higher performing flexible electronic devices is devices that employ solution processable nanoscale materials, such as nanowires, nanoribbons, nanoparticles and carbon nanotubes, as active functional components in a number of macroelectronic and microelectronic devices.

Use of discrete single crystalline nanowires or nanoribbons has been evaluated as a possible means of providing printable electronic devices on plastic substrates that exhibit enhanced device performance characteristics. Duan et al. describe thin film transistor designs having a plurality of selectively oriented single crystalline silicon nanowires or CdS nanoribbons as semiconducting channels [Duan, X., Niu, C., Sahl, V., Chen, J., Parce, J., Empedocles, S. and Goldman, J., Nature, Vol. 425, pgs, 274-278]. The authors report a fabrication process allegedly compatible with solution processing on plastic substrates in which single crystalline silicon nanowires or CdS nanoribbons having thicknesses less than or equal to 150 nanometers are dispersed into solution and assembled onto the surface of a substrate using flow-directed alignment methods to produce the semiconducting element of at thin film transistor. An optical micrograph provided by the authors suggests that the disclosed fabrication process prepares a monolayer of nanowires or nanoribbons in a substantially parallel orientation and spaced apart by about 500 nanometers to about 1,000 nanometers. Although the authors report relatively high intrinsic field affect mobilities for individual nanowires or nanoribbons (≈119 $cm^2$ $V^{-1}$ $s^{-1}$), the overall device field effect mobility has recently been determined to be "approximately two orders of magnitude smaller" than the intrinsic field affect mobility value reported by Duan et al. [Mitzi, D. B, Kosbar, L. L., Murray, C. E., Copel, M. Afzali, A., Nature, Vol. 428, pgs. 299-303]. This device field effect mobility is several orders of magnitude lower than the device field effect mobilities of conventional single crystalline inorganic thin film transistors, and is likely due to practical challenges in aligning, densely packing and electrically contacting discrete nanowires or nanoribbons using the methods and device configurations disclosed in Duan et al.

Use of a nanocrystal solutions as precursors to polycrystalline inorganic semiconductor thin films has also been explored as a possible means of providing printable electronic devices on plastic substrates that exhibit higher device performance characteristics. Ridley et al. disclose a solution processing fabrication method wherein a solution cadmium selenide nanocrystals having dimensions of about 2 nanometers is processed at plastic compatible temperatures to provide a semiconductor element for a field effect transistor. The authors report a method wherein low temperature grain growth in a nanocrystal solution of cadmium selenide provides single crystal areas encompassing hundreds of nanocrystals. Although Ridley et al. report improved electrical properties relative to comparable devices having organic semiconductor elements, the device mobilities achieved by these techniques (≈1 $cm^2$ $V^{-1}$ $s^{-1}$) are several orders of magnitude lower than the device field effect mobilities of conventional single crystalline inorganic thin film transistors. Limits on the field effect mobilities achieved by the device configurations and fabrication methods of Ridley et al. are likely to arise from the electrical contact established between individual nanoparticles. Particularly, the use of organic end groups to stabilize nanocrystal solutions and prevent agglomeration may impede establishing good electrical contact between adjacent nanoparticles that is necessary for providing high device field effect mobilities.

Although Duan et al. and Ridley et al. provide methods for fabricating thin film transistors on plastic substrates, the device configurations described employ transistors comprising mechanically rigid device components, such as electrodes, semiconductors and/or dielectrics. Selection of a plastic substrate with good mechanical properties may provide electronic devices capable of performing in flexed or distorted orientations. However, such motion is expected to generate mechanical strain on the individual rigid transistor device components. This mechanical strain may induce damage to individual components, for example by cracking, and also may degrade or disrupt electrical contact between device components.

It will be appreciated from the foregoing that there is currently a need in the art for methods and device configurations for fabricating integrated electronic semiconductor-containing devices on plastic substrates. Printable semiconductor elements having good electrical characteristics are needed to allow effective device fabrication at temperatures compatible with assembly on plastic polymer substrates. In addition, methods of printing semiconductor materials onto large areas of plastic substrates are needed to enable continuous, high speed printing of complex integrated electrical circuits over large substrate areas. Finally, fully flexible electronic devices capable of good electronic performance in flexed or deformed device orientations are needed to enable a wide range of new flexible electronic devices.

SUMMARY OF THE INVENTION

The present invention provides methods, devices and device components for fabricating structures and/or devices, such as semiconductor-containing electronic devices, on substrate surfaces, such as plastic substrates. Specifically, the present invention provides printable semiconductor elements for fabricating electronic devices, optoelectronic devices and other functional electronic assemblies by flexible, low cost printing methods. It is an object of the present invention to provide methods and devices for fabricating semiconductor elements, such as unitary single crystalline inorganic semiconductors having selected physical dimensions ranging from about 10s of nanometers to about 10s of centimeters, which are capable of high precision assembly on substrate surfaces via a range of printing techniques. It is another object of the present invention to provide methods for assembling and/or patterning printable semiconductor elements using dry transfer contact printing and/or solution printing techniques which provide good placement accuracy and pattern fidelity over large substrate areas. It is further an object of the present invention to provide good electronic performance integrated electronic and/or optoelectronic devices comprising one or more printable semiconductor elements supported by a plastic substrate, particularly fully flexible thin film transistors having printable semiconductor elements exhibiting good electronic performance characteristics, such as field effect mobilities, threshold voltages and on-off ratios.

In one aspect the present invention provides methods of fabricating high performance electronic and/or opto-electronic devices or device components having one or more printable components, such as a printable semiconductor element. Electronic and optoelectronic devices which may be fabricated by the methods of the present invention include, but are not limited to, transistors, diodes, light emitting diodes (LEDs), lasers, organic light emitting diodes (OLEDs), microelectromechanical systems (MEMS) and nanoelectromechanical systems (NEMS). Particularly, the present invention provides methods of assembling semiconductor elements and/or other device components via printing techniques into electronic and/or optoelectronic devices or device components which exhibit performance characteristics comparable to single crystalline semiconductor based devices fabricated by conventional high temperature processing methods.

In an embodiment of the present invention useful for device fabrication on substrates having low melting or decomposition temperatures, such as plastic substrates and semiconductor substrates, methods of the present invention comprise independently performable fabrication steps of: (1) forming one or more discrete, high quality semiconductor elements and (2) assembling and/or patterning these semiconductor elements and other device components on a substrate surface. For example, the present invention includes methods wherein independent, high quality printable inorganic semiconductors are generated by masking and etching bulk single crystalline inorganic semiconductor materials fabricated by conventional high temperature processing methods, such as high temperature (>1000 Celsius) film growth, doping and other processing techniques. After fabrication, such printable inorganic semiconductors are assembled onto one or more substrates surface by printing techniques which may be performed at relatively low temperatures (<about 400 degrees Celsius). An advantage of having independently performable preparation and patterning/assembly steps is that each step may be performed at ambient conditions, such as temperatures and ambient contamination levels (i.e. if clean room conditions are needed), which optimize the efficiencies, flexibilities and utilities of each independently performable fabrication step. For example, the present methods allow semiconductor materials to be fabricated at the high temperatures needed to generate high quality single crystalline semiconductors. Semiconductor element patterning and/or assembly, however, may be subsequently carried out at substantially lower temperatures favorable for device fabrication on substrates having low melting or decomposition temperatures, such as plastic substrates. In this manner, high performance devices may be fabricated on a wide range of substrate surfaces without significant melting, decomposition or damage to the substrate surface. Another advantage of separating semiconductor fabrication from semiconductor/device assembly is that integration of the semiconductor elements into high performance devices and device components may be achieved by a wide range of low cost and flexible assembly methods, such as dry transfer and solution printing techniques, which do not require clean room conditions and are compatible with continuous, high speed device fabrication on large areas of substrates. In the context of this aspect of the present invention, the present methods are compatible with printing on substrates comprising virtually any material, including plastic substrates and non-plastic substrates, such as semiconductor wafers, for example silicon wafers or GaAs wafers.

In another aspect, the present invention provides printable semiconductor elements for integration into high performance electrical and optoelectronic devices and device components. In the context of the present invention, the term "printable" relates to materials, structures, device components and/or integrated functional devices that may be transferred, assembled, patterned, organized and and/or integrated onto or into substrates without exposure of the substrate to high temperatures (i.e. at temperatures less than or equal to about 400 degrees Celsius). Printable semiconductors of the present invention may comprise semiconductor structures that are able to be assembled and/or integrated onto substrate surfaces by dry transfer contact printing and/or solution printing methods. Exemplary semiconductor elements of the present invention may be fabricated by "top down" processing of a range of inorganic semiconductor materials including, but not limited to, single crystalline silicon wafers, silicon on insulator wafers, polycrystalline silicon wafers and GaAs wafers. Printable semiconductor elements derived from high quality semiconductor wafers, for example semiconductor wafers generated using conventional high temperature vapor deposition processing techniques, are beneficial for applications requiring good electronic performance because these materials have better purities and extents of crystallization than materials prepared using "bottom up" processing techniques, such as conventional techniques for making nanocrystals and nanowires. Another advantage provided by the "top-down" processing methods of the present invention is that printable semiconductor elements and arrays of printable semiconductor elements may be fabricated in well defined orientations and patterns, unlike "bottom-up" processing methods typically used for fabricating nanowires and nanoparticles. For example, semiconductor elements may be fabricated in arrays having positions and spatial orientations directly corresponding to the eventual positions and spatial orientations of these elements in functional devices or arrays of functional devices, such as transistor arrays or diode arrays.

Printable semiconductor elements may comprise unitary, single crystalline inorganic semiconductor structures having wide range of shapes, such as ribbon (or strips), discs, platelets, blocks, post, cylinders or any combinations of these shapes. Printable semiconductor elements of the present invention may have a wide range of physical dimensions, for example, thicknesses ranging from about 10 nanometers to about 100 microns, widths ranging from about 50 nanometers to about 1 millimeter and lengths ranging from about 1 micron to about 1 millimeter. Use of semiconductor elements having thicknesses greater than about 10 nanometers and widths greater than about 500 nanometer are preferred for some application because these dimensions may provide electronic devices exhibiting good electronic performance, such as thin film transistors having a device field effect mobility greater than or equal to about 100 $cm^2$ $V^{-1}$ $s^{-1}$, and preferably greater than or equal to about 300 $cm^2$ $V^{-}s^{-1}$ and more preferably greater than or equal to about 800 $cm^2$ $V^{-1}$ $s^{-1}$. In addition, semiconductor elements having widths greater than about 10 nanometers can be assembled on substrates by a range of printing techniques with good placement accuracy and pattern fidelity.

Printable semiconductor elements of the present invention may also be provided with an alignment maintaining element that mechanically connects the printable semiconductor element to a mother substrate, such as a semiconductor wafer. Alignment maintaining elements are useful for maintaining a selected orientation and/or position of a printable semiconductor element during transfer, assembly and/or integration processing steps. Alignment maintaining elements are also useful for maintaining relative positions and orientations of a plurality of semiconductor elements defining a selected pattern of semiconductor elements during transfer, assembly and/or integration processing steps. In methods of the present invention, alignment maintaining elements preserve selected positions and orientations during contact (and bonding) of the printable semiconductor elements with the contact surface of a conformable transfer device. Useful alignment maintaining elements in this aspect of the present invention are capable of disengaging from the printable semiconductor elements upon movement of the conformable transfer device without significantly changing the selected positions and orientations of the printable semiconductor elements. Disengagement is typically achieved by fracture or release of the alignment maintaining elements during movement of the transfer device.

In one embodiment of the present invention, the printable semiconductor element has a peanut shape characterized by wider ends and a narrow central region. In this embodiment, alignment maintaining elements are provided via incomplete isotropic etching beneath the wider ends and complete isotropic etching beneath the central region. This processing lead to a semiconductor element connected to a mother substrate a two points corresponding to each end of the semiconductor element. In another embodiment, the printable semiconductor element has a ribbon shape extending along a central longitudinal axis. In this embodiment, alignment maintaining elements connect the both ends of the ribbon along the longitudinal axis to the mother substrate. In each embodiment, binding of the ribbon shaped or peanut shaped semiconductor element to the contact surface of a transfer device and movement of the transfer device results in fracture of both alignment maintaining elements and release of the printable semiconductor element from the mother substrate.

Printable semiconductor elements of the present invention have independently selectable physical dimensions, such as widths, heights, thicknesses surface roughness, and flatness, that are selectable with a high degree of accuracy. In an exemplary embodiment, physical dimensions of printable semiconductor elements may be selected to within less than about 5%. Large numbers of printable semiconductor elements having highly uniform selected physical dimension may be fabricated using the methods of the present invention. In an exemplary embodiment, large numbers of printable semiconductor elements can be fabricated having physical dimensions that vary by less than about 1%. The present invention, therefore, provides printable semiconductor elements without a significant size and shape distributions, in contrast to conventional methods of generating nanowires. A significant advantage of this approach is that structures and devices that integrate printable semiconductor elements of the present invention do not need to be built to tolerate dispersion in size and shape of the semiconductor elements. In some embodiments, printable semiconductor elements of the present invention have very low surface roughness, for example having a surface roughness less than about 0.5 nanometers root mean square. Printable semiconductor elements of the present invention may have one or more flat surfaces. This configuration is beneficial in some device fabrication applications because flat surfaces are useful for establishing interfaces with other device components, such as conducting, semiconducting and/or dielectric device components.

Further, the present methods and compositions of matter provide printable semiconductor elements comprising high quality semiconductor materials. In some embodiments useful for fabricating high performance electrical devices, printable semiconductor elements have a purity with a factor of about 1000 or less of conventional semiconductor wafer materials fabricated via high temperature processing techniques. For example, the present invention provides high purity semiconductor elements having oxygen impurities less than about 5 to 25 parts per million atoms, carbon impurities less than about 1 to 5 parts per million atoms, and heavy metal impurities less than or equal to about 1 part per million atoms (ppma), preferably less than or equal to about 100 parts per billion atoms (ppba) for some applications, and more preferably less than or equal to about 1 part per billion atoms (ppba) for some applications. Printable semiconductor elements having low levels of heavy metal impurities (e.g. less than about 1 parts per million atoms) are beneficial for applications and devices requiring good electronic performance, as the presence of heavy metals in semiconductor materials can severely degrade their electrical properties.

In addition, printable semiconductor elements of some aspects of the present invention have a very low resistivity gradient, for example a less than about 5% to 10% variation across their areas. This aspect of the present invention provides enhanced doping uniformity with respect to conventional semiconductor materials derived from "bottom up" processing techniques, such as nanowire and nanocrystal materials. Further, printable semiconductor elements of the present invention may comprise semiconductor materials exhibiting very few dislocations, for example less than 500 dislocations per square centimeter. Use of semiconductor elements comprising high quality semiconductor materials is beneficial for device fabrication applications requiring good electronic performance.

In addition, the present methods and compositions of matter provide printable semiconductor elements having highly uniform compositions. In this context, uniform composition refers to piece-to-piece uniformity with respect to purity, dopant concentrations, dopant spatial distributions and extents of crystallization. The high purities and good uniformity with respect to the composition of printable semiconductor elements of the present provide functional devices exhibiting enhanced reliability with respect to devices fabricated from conventional semiconductor materials derived from "bottom up" processing techniques, such as nanowire and nanocrystal materials.

Printable semiconductor elements of the present invention preferably have at least one smooth surface, such as the top or bottom surface of a microribbon, preferably exhibiting deviations from average surface position of less than 10 nanometers, and more preferably for some applications exhibiting deviations from average surface position of less than 1 Angstrom. Smooth surfaces of printable semiconductor elements of the present invention allow effective electrical contact and/or physical integration to be established with other device components in an integrated electronic device or optoelectronic device.

Alternatively, printable semiconductor elements of the present invention may comprise composite semiconductor elements having a semiconductor structure operationally connected to one or more additional structures, such as dielectric structures, conducting structures (e.g. electrode), additional semiconductor structures or any combination of these. Printable composite semiconductor elements provide materials and device components that may be easily and effectively integrated into complex electronic or optoelectronic devices. In addition, the assembly methods of the present invention allow printable semiconductor elements to be provided in array geometries wherein adjacent elements are close to each other, for example within 100 nanometers to 1 micron of each other. For example, a printable semiconductor element of the present invention comprises a unitary structure having a high quality semiconductor structure, such as a single crystalline inorganic semiconductor, operationally connected to an inorganic dielectric structure, such as a silicon oxide layer. This embodiment of the present invention is particular useful for fabrication of high performance thin film transistors because semiconductor and dielectric components may be assembled in a single printing step, and because use of unitary structures comprising both semiconductor and dielectric components results in insulator configurations exhibiting very low leakage of electric current from gate electrode to the semiconductor element or source and drain electrodes. In another embodiment, printable semiconductor elements of the present invention may comprise integrated functional devices, such as diodes, LEDs, transistors and OLEDS, which may be easily incorporated onto substrate surfaces.

The methods and compositions of the present invention provide a processing platform enabling fabrication of functional devices exhibiting enhanced reliability with respect to devices based on semiconductor materials generated via "bottom up" processing techniques, such as nanowires and nanocrystals. In this context, reliability refers to the capability of a functional devices to exhibit good electronic properties over extended operating periods and refers to piece-to-piece uniformity with respect to electrical properties of an ensemble of device fabricated using the present methods and compositions. For example, devices of the present invention exhibit very uniform threshold voltages (e.g. standard deviation of less than 0.08V) and very uniform device mobilities (e.g. standard deviation of less than about 13%). This represents improvements in uniformities of threshold voltages and device mobilities of a factor of about 40 and a factor of about 8, respectively, over nanowire based devices. The exceptional reliability of functional devices of the present invention is provided, at least in part, by the high degree of uniformity of the compositions and physical dimensions accessible using printable semiconductor elements of the present invention.

In another aspect, the present invention provides an electrical device comprising a first electrode, a second electrode and a printable semiconductor element positioned in electrical contact with said first and second electrodes. In one embodiment useful for applications requiring good electrical device performance, the printable semiconductor element comprises a unitary inorganic semiconductor structure having physical dimensions and shape that provides a fill factor between said first and second electrodes greater than or equal to about 20%, preferably greater than or equal to about 50% for some applications and more preferably greater than or equal to about 80% for some applications. Optionally, electrically devices of this embodiment may further comprise additional printable semiconductor elements, for example printable elements substantially longitudinally oriented, and optionally not in physical contact with each other. Importantly, multiple printable semiconductor elements of the present invention may be configured in devices or device arrays in a manner providing large fill factors (e.g. greater than or equal to 20%, 50% or 80%) and good electronic performance, in contrast to systems involving densely packed nanowire arrays. In one embodiment, the printable semiconductor element has at least one cross sectional dimension greater than or equal to about 500 nanometers. In one embodiment, the printable semiconductor element has a ratio of length to width equal to or less than about 10, preferably equal to or less than about 1.5 in for some applications. In one embodiment, the printable semiconductor element has a ratio of thickness to width equal to or less than about 0.1, preferably equal to or less than about 0.01 for some applications.

This aspect of the present invention further comprises arrays of electrical devices, such as transistors, diodes, photovoltaic devices, light emitting devices, comprising a first electrode, a second electrode and a plurality printable semiconductor elements positioned in electrical contact with the first and second electrode. In one embodiment, an array of electrical devices comprises over 20 printable semiconductor elements, preferably over 50 printable semiconductor elements for some applications and, more preferably over 100 printable semiconductor elements for some applications. In one embodiment useful for applications requiring good electrical device performance, the printable semiconductor elements provide a fill factor between said first and second electrodes greater than or equal to about 20%, preferably greater than or equal to about 50% for some applications and more preferably greater than or equal to about 80% for some applications. Printable semiconductor elements may be substantially longitudinally oriented with respect to a selected alignment axis, such as a selected alignment axis that extends along an axis which connects the closest points of said first and second electrical contacts. In one embodiment, the relative positions and orientations of the printable semiconductor elements are selected to within less than or equal to about 5 microns. In one embodiment providing good end to end registration of the semiconductor elements, each of said printable semiconductor elements extends a length and terminates in first and second ends. In this embodiment, the first ends of said printable semiconductor elements are positioned within 5 microns of the first electrode and the second ends of said printable semiconductor elements are positioned within 5 microns of said second electrode. In one embodiment, an array of electrical devices of the present invention comprises a plurality of printable semiconductors are provided in a configuration such that they are substantially longitudinally oriented, are not in physical contact with each other (i.e. do not overlap), and are in electrical contact with first and second electrodes. In one embodiment, at least one physical dimension, such as average length, average width and/or average thickness, of the printable semiconductor elements in the array of electrical devices varies by less than about 10%, preferably less than about 5% for some applications. In this embodiment, the printable semiconductor elements in the array have selected physical dimensions, such as average lengths, average widths and/or average thickness, that do not vary significantly (i.e. less than about 10%) from each other.

In another aspect, the present invention provides a transistor having a printable semiconductor element. In one embodiment, a transistor of the present invention comprises a source electrode, a printable semiconductor element, a gain electrode and a gate electrode. In this configuration, the source electrode and gain electrode are both in electrical contact with, and separated by, the printable semiconductor element, and the gate electrode is separated from the printable semiconductor element by the dielectric. The printable semiconductor element may comprise a unitary crystalline inorganic semiconductor structure having a thickness greater than or equal to about 50 nanometers, preferably for some applications greater than or equal to 100 nanometers and ever more preferably for some applications greater than or equal to 200 nanometers. The present invention also includes a transistor having a plurality of printable semiconductor elements in contact with source and drain electrodes. Use of a plurality of printable semiconductor elements in a single transistor may be beneficial in some applications because it may reduce the overall positional accuracy tolerances for various device components such as, source, drain and gate electrodes and dielectrics in field effect transistors. The present invention also includes embodiments wherein the printable semiconductor element is a stretchable semiconductor element. Use of one or more stretchable semiconductor elements in transistors of the present invention is beneficial because it provides good device performance and mechanical ruggedness in flexed, stretched or deformed device orientations.

In another embodiment, the present invention provides a high performance transistor supported by and/or in physical contact with a plastic substrate, such as a polyimide, polycarbonate or Mylar substrate. Transistors of this embodiment of the present invention may have a printable semiconductor element comprising a single crystalline inorganic semiconductor structure, such as a silicon or germanium. Such device configurations exhibit good device performance characteristics, such as field effect mobilities, threshold voltages, switching frequencies and on-off ratios. In an exemplary embodiment, a thin film transistor on a plastic substrate has a device field effect mobility comparable to the device field effect mobility of a transistor having a semiconductor element comprising a crystalline semiconductor fabricated by conventional high temperature processing methods, for example a device field effect mobility greater than or equal to 300 $cm^2$ $V^{-1}$ $s^{-1}$, more preferably greater than or equal to 800 $cm^2$ $V^{-1}$ $s^{-1}$. In another embodiment, the present invention provides a Si-MOS transistor having a single crystalline silicon printable semiconductor element capable of high frequency operation, such as operation at frequencies up to about 280 MHz.

In another embodiment, the present invention provides complementary metal-oxide semiconductor circuits comprising printable semiconductor elements. For example, printable semiconducting elements having lightly N (or P) type doped area between two highly P (or N) type doped area are used to form CMOS circuits. This capability is particularly interesting for applications requiring low power consumptions, as CMOS technology has a much smaller power dissipation over NMOS technology. Moreover, the CMOS technology has no static power dissipation, so this technology is particularly well suited for battery operated electronic systems. Finally, circuits design using CMOS technology are usually more compact than any over semiconductor technology, so more devices per surface area can be integrated.

In one embodiment, the dielectric and the semiconductor components of a transistor of this aspect of the present invention may comprise a unitary composite printable semiconductor element. Alternatively, the dielectric, gate electrode and semiconductor element of a transistor of this aspect of the present invention may comprise a unitary composite printable semiconductor element. Use of a composite printable semiconductor element having integrated semiconductor and insulator structures is preferred for some applications because it may provide very high quality dielectric-semiconductor interfaces in thin film transistors which exhibit very low leakage. In addition, use of a composite printable semiconductor element having integrated semiconductor and insulator structures also provides for efficient assembly of device components without the need for spin casting steps for integrating a dielectric layer in a thin film transistor.

In another embodiment, the present invention provides stretchable semiconductor elements capable of withstanding significant strain without fracturing. Stretchable semiconductor conductor elements of the present invention may exhibit good electronic performance even when undergoing significant strain, such as strain greater or equal about 0.5%, preferably 1% and more preferably 2%. Stretchable semiconductor elements of the present invention preferred for some applications are also flexible, and thus are capable of significant elongation, flexing, bending or deformation along one or more axes. Stretchable semiconductors that are flexible may also exhibit good electronic performance when in flexed, expanded, contracted, bent and/or deformed states. Stretchable and flexible semiconductor elements of the present invention may be printable, and may comprise composite semiconductor elements having a semiconductor structure operationally connected to other device components, such as dielectrics, electrodes and other semiconductors. The present invention includes a wide range of electronic and/or optoelectronic devices having stretchable and/or flexible semiconductor elements, such as transistors, diodes, LEDS, OLEDS, laser, micro- and nano-electromechanical devices.

A stretchable semiconductor element of the present invention comprises a flexible substrate having a supporting surface and a printable semiconductor structure having a curved internal surface. In this embodiment, at least a portion of the curved internal surface of the semiconductor structure is bonded to the supporting surface of the flexible substrate. Exemplary semiconductor structures having curved internal surfaces useful in present invention comprise bent semiconductor structures. In the context of this description, a "bent semiconductor structure" refers to a semiconductor structure having a curved conformation resulting from the application of a force. Bent semiconductor structures may have one or more folded regions. Bent semiconductor structures may be present in a coiled conformation or in a wrinkled conformation. Semiconductor structures having curved internal surfaces, such as bent semiconductor structures, may be bonded to a flexible substrate in a conformation that is under strain, such as a strain less than about 30%, a strain less than about 10% or a strain less than 1%.

Curved internal surfaces of stretchable semiconductors of the present invention may have any contour profile providing stretchablility or flexibility including, but not limited to, contour profiles characterized by at least one convex region, at least on concave region or a combination of at least one convex region and at least one concave region. In an embodiment, the curved internal surface of a stretchable and/or flexible semiconductor element has a contour profile characterized by a substantially periodic wave or a substantially aperiodic wave. In the context of this description, periodic and aperiodic waves may be any two or three dimensional wave form including but not limited to, sine waves, square waves, Aries functions, Gaussian waves, Lorentzian waves, or any combination of these. For example, an stretchable and flexible semiconductor element of the present invention comprises a bent semiconductor ribbon having a curved internal surface with a contour profile characterized by a substantially periodic wave extending along the length of the ribbon. Stretchable and flexible semiconductor elements of this embodiment may be expandable or contractible along an axis extending along the length of the ribbon, and may be bendable or deformable along one or more other axes.

The contour profile of semiconductor structures in this embodiment of the present invention may change when mechanical stressed or when forces are applied to the semiconductor element. Therefore, the ability to change contour profile of exemplary semiconductor structures may provide for their ability to expand, contract, flex, deform and/or bend without experiencing significant mechanical damage, fracture or a substantial reduction in electrical performance. The curved internal surface of the semiconductor structure may be continuously bonded to the supporting surface (i.e. bound at substantially all points along the curved internal surface). Alternatively, the curved internal surface of the semiconductor structure may be discontinuously bonded to the supporting surface, wherein the curved internal surface is bonded to the supporting surface at selected points along the curved internal surface.

The present invention also includes stretchable electronic devices and/or device components comprising a combination of a printable semiconductor structure and additional integrated device components, such as electrical contacts, electrodes, conducting layers, dielectric layers, and additional semiconductor layers (e.g. doped layers, P-N junctions etc.), all of which having curved internal surfaces that are supported by supporting surfaces of a flexible substrate. The curved internal surface configurations of the additional integrated device components enable then to exhibit good electronic performance even when undergoing significant strain, such as maintaining electrical conductivity or insulation with a semiconductor element while in a stretched or bent configuration. Additional integrated device components in this aspect of the present invention may have a bent configuration, such as a coiled or wrinkled configuration, as described above, and may be fabricated using techniques similar to those used to fabricate stretchable semiconductor elements. In one embodiment, for example, stretchable device components, including a stretchable semiconductor element, are fabricated independently and then interconnected. Alternatively, the semiconductor containing device may be fabricated in a planar configuration, and the resulting planar device is subsequently processed to provide curved internal surfaces to all or some of the device components.

Printable semiconductor elements of the present invention may comprise heterogeneous semiconductor elements exhibiting enhanced properties, such as enhanced mechanical, electrical, magnetic and/or optical properties, useful in a variety of device environments and configurations. Heterogeneous semiconductor elements are multicomponent structures comprising a semiconductor in combination with one or more additives. In this context of this description, additives comprise elements, molecules and complexes, aggregates and particles thereof, that are different from the semiconductor in which they are combined, such as additives having a different chemical compositions and/or physical states (e.g. crystalline, semicrystalline or amorphous states). Useful additives in this aspect of the invention include other semiconductor materials, N-type and P-type dopants such as arsenic, boron, and antimony, structural enhancers, dielectric materials and conducting materials. Heterogeneous semiconductor elements of the present invention include structures having spatial homogeneous compositions, such as uniformly doped semiconductor structures, and include structures having spatial inhomogeneous compositions, such as semiconductor structures having dopants with concentrations that vary spatially in one, two or three dimensions (i.e. a spatially inhomogeneous dopant distribution in the semiconductor element).

In another aspect, heterogeneous semiconductor elements comprise semiconductor structures having additional integrated functional device components, such as dielectric layers, electrodes, electrical contacts, doped contact layers, P-N junctions, additional semiconductor layers, and integrated multilayer stacks for charge confinement. Additional integrated functional device components of this aspect of the present invention include both semiconductor-containing structures and non-semiconductor-containing structures. In one embodiment, heterogeneous semiconductor elements comprise functional devices, such as transistors, diodes or solar cells, or multielement functional device components that are capable of being effectively patterned, assembled and/or interconnected on a substrate material.

Use of printable heterogeneous semiconductor elements provides certain advantages in the fabrication methods of the present invention. First, the "top down" processing approach of the present methods allows virtually any type of semiconductor processing, such as spatially controlled doping, to be carried out in fabrication steps separate from subsequent fabrication steps of (i) defining the spatial dimensions of the semiconductor elements and (ii) assembling the semiconductor elements on substrates and into functional devices. Separation of semiconductor processing from devices and device component assembly and interconnection in the present methods allows processing of semiconductor materials to be carried out under a range of conditions useful for generating very high quality semiconductor containing materials, including single crystal semiconductors having doped regions with well defined concentrations and spatial dopant distributions, and integrated, semiconductor multilayer stacks exhibiting high purities. For example, separation of semiconductor processing and device component assembly, allows for semiconductor processing at high temperatures and under conditions of highly controlled levels of impurities. Second, use of heterogeneous semiconductor elements comprising a plurality of integrated device components and/or functional devices allows for efficient high throughput printing of functional devices and arrays thereof in a commercially beneficial manner. For example, device fabrication methods of the present invention using heterogeneous semiconductor elements comprising a plurality of interconnected device components reduces the net number of fabrication steps and/or lowers the costs involved in manufacturing some devices.

In another aspect, the present invention provides methods of assembling, positioning, organizing, transferring, patterning and/or integrating printable semiconductor elements onto or into substrates via a range of printing methods, including dry transfer contact printing or solution printing techniques. Printing methods of the present invention are capable of integrating one or more semiconductor elements onto or into a substrate in a manner which does not substantially affect their electrical properties and/or mechanical characteristics. In addition, printing methods of the present invention are capable of assembling semiconductor elements onto or into selected regions of a substrate and in selected spatial orientations. Further, printing methods of the present invention are capable of integrating semiconductor elements and other device components into and/or onto a substrate in a manner providing high performing electronic and optoelectronic devices by establishing good conductivity between selected device components, good insulation between selected device components and/or good spatial alignment and relative positioning between device components.

In one embodiment of the present invention, semiconductor elements are assembled onto a substrate surface by dry transfer contact printing methods, such as soft lithographic microtransfer or nanotransfer methods. In one method, one or more printable semiconductor elements are contacted with a conformable transfer device having one or more contact surface(s). Contact established between the contact surface(s) and the printable semiconductor element(s) binds or associates the semiconductor element(s) to the contact surface(s). Optionally, conformal contact is established between the contact surface(s) and the printable semiconductor element(s) to facilitate binding or associate of these elements. At least a portion of the semiconductor element(s) disposed on the contact surface(s) is subsequently contacted with a receiving surface of the substrate. Optionally, the conformable transfer device also establishes conformal contact between the contact surface(s) having the semiconductor element(s) disposed thereon and at least a portion of the receiving surface. Separation of the contact surface of the conformable transfer device and the semiconductor element(s) transfers the semiconductor element(s) onto the receiving surface, thereby assembling the semiconductor element on the receiving surface of the substrate. In an embodiment preferred for device fabrication applications, printable semiconductor elements are positioned and/or integrated onto the substrate in selected regions and in selected spatial orientations. Optionally, the transfer process is repeated multiple times to provide patterning on large areas of a receiving surface of a substrate. In this embodiment, the transfer stamp having printable semiconductor elements is contacted with a different region of the receiving substrate for each successive patterning step. In this manner very large areas of a receiving surface may be pattern with semiconductor elements derived from a single mother wafer.

An advantage of the use of dry transfer contact printing methods in the present invention is that patterns of printable semiconductors elements may be transferred and assembled onto substrate surfaces in a manner preserving selected spatial orientations of semiconductor elements which define the pattern. This aspect of the present invention is particularly beneficial for applications wherein a plurality of printable semiconductor elements are fabricated in well defined positions and relative spatial orientations which directly correspond to a selected device configuration or array of device configurations. Transfer printing methods of the present invention are capable of transferring, positioning and assembling printable semiconductor elements and/o printable semiconductor containing functional devices including, but not limited to, transistors, optical waveguides, microelectromechanical systems, nanoelectromechanical systems, laser diodes, or fully formed circuits.

In another embodiment, the present invention provides selective transfer and assembly methods wherein some, but not all, of the printable semiconductors provided are transferred and assembled onto or into a substrate. In this embodiment, the conformable transfer device is capable of binding selectively to specific printable semiconductor elements provided. For example, the conformable transfer device may have a selected three dimensional relief pattern on its external surface having recessed regions and relief features. In this embodiment, recessed regions and relief features may be positioned such that only selected printable semiconductor elements are contacted by one or more contact surfaces provided by the relief pattern, and subsequently transferred and assembled onto the substrate surface. Alternatively, the conformable transfer device may have a contact surface or plurality of contact surfaces having a selected pattern of binding regions, such as chemically modified regions having hydroxyl groups extending from the contact surface and/or regions having one or more adhesive surface coatings. In this embodiment, only those semiconductor elements that are contacted with the binding regions on the contact surface(s) are bound to the transfer device, and subsequently transferred and assembled onto the substrate surface. An advantage of selective transfer and assembly methods of the present invention is that a first pattern of printable semiconductor elements characterized by a first set of positions and spatial orientations may be used to generate a second pattern of printable semiconductor elements different from the first pattern and characterized by a second set of positions and spatial orientations, corresponding to a selected device configuration or array of device configurations.

An exemplary conformable transfer device of the present invention comprises a dry transfer stamp, such as an elastomeric transfer stamp or composite, multi-layer patterning device. Conformable transfer devices useful for the present invention include patterning devices comprising a plurality of polymer layers as described in U.S. patent application Ser. No. 11/115,954, entitled "Composite Patterning Devices for Soft Lithography", filed with the U.S. Patent and Trademark Office on Apr. 27, 2005, which is hereby incorporated by reference in its entirety. An exemplary patterning device useable in the methods of the present invention comprises a polymer layer having a low Young's Modulus, such as a poly(dimethylsiloxane) (PDMS) layer, preferably for some applications having a thickness selected from the range of about 1 micron to about 100 microns. Use of a low modulus polymer layer is beneficial because it provides transfer devices capable of establishing good conformal contact with one or more printable semiconductor elements, particularly printable semiconductor elements having curved, rough, flat, smooth and/or contoured exposed surfaces, and capable of establishing good conformal contact with substrate surfaces having a wide range of surface morphologies, such as curved, rough, flat, smooth and/or contoured substrate surfaces.

Optionally, transfer devices of the present invention may further comprise a second layer having an external surface opposite an internal surface, and having a high Young's modulus, such as high modulus polymer layer, ceramic layer, glass layer or metal layer. In this embodiment, the internal surface of the first polymer layer and the internal surface of the second high modulus layer are arranged such that a force applied to the external surface of the second high modulus layer is transmitted to the first polymer layer. Use of a high modulus second polymer layer (or backing layer) in transfer devices of the present invention is beneficial because it provides transfer devices having a net flexural rigidity large enough to provide good binding, transfer and assembly characteristics. For example, use of a transfer device having a net flexural rigidity selected from the range of about $1 \times 10^{-7}$ Nm to about $1 \times 10^{-5}$ Nm minimizes distortions of the positions of semiconductor elements and/or other structures bound to the contact surface(s) upon establishing conformal contact with a substrate surface. Use of a high modulus, rigid backing layer also is beneficial for preventing degradation of the printable semiconductor elements during transfer, for example by prevent cracking of the printable semiconductor layers. This attribute provides methods and devices of assembling printable semiconductor elements exhibiting high placement accuracy and good pattern fidelity. Transfer devices of the present invention may comprise additional layers, including polymer layers, for providing easy handling and maintenance, good thermal properties and for providing uniform distribution of a force applied to the transfer device to the entire contact surface(s), as taught in U.S. patent application Ser. No. 11/115,954, entitled "Composite Patterning Devices for Soft Lithography, filed with the U.S. Patent and Trademark Office on Apr. 27, 2005 which is incorporated by reference in its entirety herein.

In another approach, the principles of 'soft adhesion' are used to guide the transfer. Here, the viscoeleastic nature of the surface material on the transfer element leads to a peel force (i.e. the force that can lift objects from a surface) that depends on peel rate. At high peel rates, this force is large enough to remove objects from a substrate and transfer them onto a transfer element, even when the static surface energy of the transfer element is lower than that of the substrate. At low peel rates, this peel force is low. In some embodiments, by contacting a transfer element that supports an array of objects against a final substrate, and then peeling the element away slowly leads to the transfer of these objects from the transfer element to the substrate. This approach of the present invention using controlled peeling rates can be used in combination with the other transfer approaches described herein.

Transfer devices of the present invention may have a single continuous contact surface or a plurality of discontinuous contact surfaces. The contact surface(s) of transfer devices of the present invention may be defined by a selected three-dimensional dimensional relief pattern having recessed regions and relief features having selected physical dimensions. Contact surfaces useful in the present invention may be capable of binding printable semiconductor elements by van der Waals forces, covalent bonds, adhesive layers, chemically modified regions such as regions having hydroxyl groups disposed on their surfaces, dipole-dipole forces or combinations of these. Transfer devices of the present invention may have contact surfaces having any area.

A number of methods may be used to facilitate transfer of printable semiconductor elements from a contact surface into or onto a substrate surface. In an exemplary embodiment, the difference in surface energy of the substrate surface and the contact surface promotes transfer to the substrate surface. For example, transfer may be effectively achieved from a contact surface comprised of a PDMS layer having a lower surface energy to a substrate surface having a higher surface energy, such as a polyimide, polycarbonate or Mylar surface. In addition, a plastic substrate surface may be softened or partially melted by heating prior to and/or during contact with printable semiconductor elements to be transferred, thereby generating semiconductor elements embedded in the substrate. Allowing the substrate to cool and harden prior to separation of the contact surface from the semiconductor elements promotes efficient transfer. Alternatively, the substrate surface may have one or more chemical modified regions exhibiting an enhanced affinity of the substrate for the semiconductor elements. For example, modified regions may be covered by one or more adhesive layers or may be modified such that they undergo efficient covalent bonding, attractive van der Waals forces, dipole-dipole forces or combinations of these with semiconductor elements to promote efficient transfer and assembly. Alternatively, a partial polymerized polymer precursor may be contacted with the semiconductor elements or other device components and, subsequently polymerized, resulting in formation of a substrate having semiconductor elements embedded therein.

In an exemplary embodiment, printable semiconductor elements are fabricated having top surfaces coated with a thin release layer, such as a layer of photoresist used as a photomask patterned onto a substrate during the definition and fabrication of the printable semiconductor elements. The contact surface of a conformable transfer device is brought into conformal contact with the coated surfaces of the printable semiconductor element. The release layer facilitates bonding of the printable semiconductor elements to the contact surface of the transfer device. Surfaces of the printable semiconductor elements not coated with the release layer are then contacted with a receiving surface of a substrate. Next, the release layer is removed, for example by exposure to an appropriate solvent such as acetone, thereby separating the printable semiconductor elements from conformable transfer device. Optionally, the receiving surface may be coated with one or more adhesive layers to facilitate transfer of the printable semiconductor elements.

In another embodiment of the present invention, printable semiconductor elements are assembled onto a substrate surface by solution printing. In the context of this description, the term "solution printing" is intended to refer to processes whereby one or more structures, such as printable semiconductor elements, are dispersed into a carrier medium, such as a carrier fluid or solvent, and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. In another embodiment, printable semiconductor elements remain suspended in a solvent until the solvent evaporates, or until an applied force, such as an electrostatic force, magnetic force or force provided by an acoustic wave, pulls the printable semiconductor elements out of solution and onto selected regions of the substrate. This functionality may be provided by selection of appropriate physical dimensions and masses of the printable semiconductor elements necessary to avoid premature sedimentation. In this way, the solution printing methods of the present invention differ materially from some fluidic self assembly methods in which elements suspended in a carrier medium fall out of solution due to the force of gravity and statistically fall into recessed regions of a substrate.

A method of assembling a printable semiconductor element on a receiving surface of a substrate of the present invention comprises the step dispersing a printable semiconductor element in a carrier medium, thereby generating a suspension comprising the semiconductor element in the carrier medium. The semiconductor element is delivered to the substrate by solution printing the suspension onto the receiving surface, thereby assembling the semiconductor element onto said receiving surface. In this embodiment, solution printing may be provided by a number of techniques known in the art including, but not limited to, ink jet printing, thermal transfer printing, and screen printing. Solution printing methods of the present invention may also employ self assembly alignment techniques. In one embodiment, for example, alignment, positioning and registration of printable semiconductor elements having patterned hydrophobic and hydrophilic groups are aligned on a receiving surface having complimentary patterned hydrophobic regions (such as methyl terminated surface groups) and hydrophilic regions (such as carboxylic acid terminated surface groups). Solution printing methods of the present invention may also employ capillary action of drops containing dispersed printable semiconductor elements to achieve alignment, positioning and registration.

Optionally, a number of methods may be used in the present invention to control the orientation, alignment and selective deposition of semiconductor elements and/or other device components on the substrate surface. These methods enable fabrication of complex integrated electronic and optoelectronic devices comprising a plurality of interconnected device components having precisely specified relative positions and spatial orientations. For example, electrostatic forces, acoustic waves and/or magnetostatic forces may be employed to facilitate positioning semiconductor elements and other device components in specific locations and in selected spatial orientations on a substrate surface. Alternatively, the properties and/or composition of the substrate surface itself may be modified in selected regions to achieve accurate placement of semiconductor elements and other device components. For example, selected regions of the substrate surface may be chemically modified such that they exhibit a selective affinity for semiconductor elements. In addition, the electrical properties of the substrate surface may be modified, for example by formation of potential holes in specific surface regions, to facilitate selective integration, orientation and alignment of printable semiconductor elements and other device components.

Printing methods of the present invention have a number of advantages important for the fabrication of high performance electronic and/or optoelectronic devices. First, printing methods of the present invention are capable of transferring and assembling inorganic single crystalline semiconductor structures without exposing these structures to mechanical strain large enough to induce significant damage or degradation, such as damage from cracking. Second, printing methods of the present invention are capable of positioning one or more semiconductor elements on selected regions of a substrate surface in selected orientations with good placement accuracy (i.e. good spatial registration with respect to a selected region of a receiving surface), preferably with spatial deviations from absolutely correct orientations and locations on a substrate less than or equal to 5 microns. Third, printing methods of the present invention are capable of generating patterns comprising a plurality of semiconductor elements, other device elements, integrated function devices or any combination of these having good fidelity with respect to a selected spatial configuration, such as a spatial configuration corresponding to a functional device or array of devices. Fourth, printing methods of the present invention may be carried out at relatively low temperatures (i.e. temperatures less than about 400 Celsius), and therefore are compatible with a wide range of substrates, particularly plastic substrates. Finally, printing methods of the present invention provide a low cost means of fabricating high performance electronic and/or optoelectronic devices, and do not require clean room conditions.

The present compositions and related methods of assembling, positioning, organizing, transferring, patterning and/or integrating printable semiconductor elements onto or into substrates may be used to fabricate virtually any structure comprising one or more semiconductor elements. These methods are particularly useful for fabricating complex integrated electronic or optoelectronic devices or device arrays, such as arrays of diodes, light emitting diodes, solar cells, transistors (FET and bipolar), and thin film transistors. The present compositions and related methods are also useful for fabrication of systems level integrated electrical circuits, such as complementary logic circuits, wherein printable semiconductor elements are printed onto a substrate in well defined spatial orientations and interconnected to form a desired circuit design. In one embodiment of this aspect of the invention, printable N-type and P-type heterogeneous semiconductor elements with selected dopant concentrations and dopant spatial distributions are assembled and interconnected to fabricate complex integrated circuits. In another embodiment, a plurality of printable semiconductor elements comprising different semiconductor materials are printed onto the same substrate and interconnected to fabricate complex integrated circuits.

The assembly methods of the present invention, however, are not limited to semiconductors. Rather these methods are broadly compatible with a wide range of materials that are not semiconductors. Materials that may be transferred and/or assembled by the methods of the present invention include, but are not limited to, insulating materials such as $SiO_2$, connecting materials such as conductors, optical elements such as active optical materials, passive optical materials and fiber optic elements, materials for sensing applications and magnetic materials. Accordingly, the present methods, devices and device components may be used to fabricate a wide range of microsized and/or nanosized structures and assemblies of structures, such as microfluidic devices and structures, NEMS devices and arrays of NEMS devices and MEMS devices and arrays of MEMS devices. Particularly, the transfer and assembly methods of the present invention may be used to generate complex three-dimensional structures, such as integrated circuits, by sequential overlay of a plurality of printing levels.

The present compositions, and related fabrication, assembly and interconnection methods are useful for fabricating devices, particularly semiconductor based devices, on large areas of a wide range of substrates. A benefit of the present methods is that they are compatible with device assembly at temperatures that are compatible with most flexible substrates, including polymer materials such as thermoplastic materials, thermoset materials, reinforced polymer materials and composite polymer materials. However, the present methods are equally applicable to device fabrication on rigid and/or brittle substrates including ceramic materials, glasses, dielectric materials, conductors, metals and semiconductor materials. The applicability of these methods to device fabrication on brittle materials arises from the very low force imparted to substrates using the printing methods of the present invention. The present compositions and fabrication methods are also compatible with device fabrication on more unusual substrate materials, such as paper, wood and rubber, and contoured substrates, including curved substrates, curved rigid substrates, concave substrates, and convex substrates. For example, the present methods are capable of assembling and integrating printable semiconductor elements and other device components (e.g. electrodes, dielectric layers, P-N junctions etc.) on substrates, including rigid and flexible substrates, having a radius of curvature ranging from about 10 microns to about 10 meters.

In another aspect, the present fabrication methods are capable of heterogeneous integration of printable semiconductor elements into functional substrates. For example, the printing methods of the present invention are capable of depositing and integrating printable semiconductor elements into substrates having well defined semiconductor regions, conducting regions and/or insulating regions. An advantage of the present fabrication methods is that printable semiconductor elements can be printed onto functional substrates, such as integrated circuits or components of integrated circuits, in selected orientations and positions with high placement accuracy, particularly in the context of dry transfer contact printing methods of the present invention.

Printable semiconductor elements of the present invention may be fabricated from a wide range of materials. Useful precursor materials for fabricating printable semiconductor elements include semiconductor wafer sources, including bulk semiconductor wafers such as single crystalline silicon wafers, polycrystalline silicon wafers, germanium wafers; ultra thin semiconductor wafers such as ultra thin silicon wafers; doped semiconductor wafers such as P-type or N-type doped wafers and wafers with selected spatial distributions of dopants (semiconductor on insulator wafers such as silicon on insulator (e.g. Si-SiO$_2$, SiGe); and semiconductor on substrate wafers such as silicon on substrate wafers and silicon on insulator. Further, printable semiconductor elements of the present invention may be fabricated from scrape or unused high quality or reprocessed semiconductor materials that are left over from semiconductor device processing using conventional methods. In addition, printable semiconductor elements of the present invention may be fabricated from a variety of nonwafer sources, such as a thin films of amorphous, polycrystalline and single crystal semiconductor materials (e.g. polycrystalline silicon, amorphous silicon, polycrystalline GaAs and amorphous GaAs) that is deposited on a sacrificial layer or substrate (e.g. SiN or $SiO_2$) and subsequently annealed.

The present invention also includes methods of making printable semiconductor elements and flexible semiconductor elements. These methods enable fabrication of printable semiconductor elements and flexible semiconductor elements from a wide range of precursor materials, such as silicon on insulator wafers, single crystalline silicon wafers, thin films of polycrystalline crystalline silicon, ultra thin silicon wafers and germanium wafers. In addition, these methods are capable of generating printable semiconductor elements having a wide range of shapes and physical dimensions. Further, the present methods enable low cost fabrication of large arrays/patterns of printable semiconductor elements in well defined, relative spatial orientations.

In another aspect, the present invention provides a method for assembling a printable semiconductor element on a receiving surface of a substrate comprising the steps of: (1) providing the printable semiconductor element comprising a unitary inorganic semiconductor structure; (2) contacting the printable semiconductor element with a conformable transfer device having a contact surface, wherein contact between the contact surface and the printable semiconductor element binds or associates the printable semiconductor element to the contact surface, thereby forming the contact surface having the printable semiconductor element disposed thereon; (3) contacting the printable semiconductor element disposed on the contact surface with the receiving surface of the substrate; and (4) separating the contact surface of the conformable transfer device and the printable semiconductor element, wherein the printable semiconductor element is transferred onto the receiving surface, thereby assembling the printable semiconductor element on the receiving surface of the substrate. In one embodiment, this method of the present invention further comprises the steps of: (1) providing additional printable semiconductor elements each of which comprising a unitary inorganic semiconductor structure; (2) contacting the printable semiconductor elements with a conformable transfer device having a contact surface, wherein contact between the contact surface and the printable semiconductor element binds or associates the printable semiconductor elements to the contact surface and generates the contact surface having the printable semiconductor elements disposed thereon in relative orientations comprising a selected pattern of the printable semiconductor elements; (3) contacting the printable semiconductor elements disposed on the contact surface with the receiving surface of the substrate; and (4) separating the contact surface of the conformable transfer device and the printable semiconductor elements, wherein the printable semiconductor elements are transferred onto the receiving surface in the relative orientations comprising the selected pattern.

In another aspect, the present invention provides a method for assembling a printable semiconductor element on a receiving surface of a substrate comprising the steps of: (1) providing the printable semiconductor element comprising a unitary inorganic semiconductor structure, wherein the printable semiconductor element has at least one cross sectional dimension greater than or equal to about 500 nanometers; (2) dispersing the semiconductor element in a solvent, thereby generating a suspension comprising the semiconductor element in the solvent; and (3) delivering the semiconductor element to the substrate by solution printing the suspension onto the receiving surface thereby assembling the semiconductor element onto the receiving surface. In one embodiment, this method of the present invention further comprises the steps: (1) providing additional printable semiconductor elements, wherein each of the additional printable semiconductor elements has at least one cross sectional dimension greater than or equal to about 500 nanometers; (2) dispersing the semiconductor elements in the solvent, thereby generating a suspension comprising the semiconductor elements in the solvent; and (3) delivering the semiconductor elements to the substrate by solution printing the suspension onto the receiving surface, thereby assembling the semiconductor elements onto the receiving surface.

In another aspect, the present invention provides a method of fabricating a printable semiconductor element comprising the steps of: (1) providing a wafer having an external surface, the wafer comprising a semiconductor; (2) masking a selected region of the external surface by applying a mask; (3) etching (optionally anisotropically etching) the external surface of the wafer, thereby generating a relief structure on the wafer and at least one exposed surface of the wafer, wherein the relief structure has a masked side and one or more unmasked sides; (4) applying a mask to at least a portion of the unmasked sides of the relief structure; (5) at least partially etching the exposed surfaces of the wafer, thereby releasing a portion of the relief structure from the wafer and fabricating the printable semiconductor element. In this embodiment, mask may be applied to the unmasked sides of the relief structure by angled deposition methods, such as sputtering or vapor deposition, or by flowing a portion of the mask on the external surface onto the unmasked sides In another aspect, the present invention provides a method of fabricating a printable semiconductor element comprising the steps of: (1) providing a wafer having an external surface, the wafer comprising a semiconductor; (2) masking selected regions of the external surface by applying a first mask; (3) etching (optionally anisotropically etching) the external surface of the wafer, thereby generating a plurality of relief structures; (4) annealing the wafer, thereby generating an annealed external surface; (5) masking selected regions of the annealed external surface by applying a second mask; and (6) etching (optionally anisotropically etching) the annealed external surface, thereby generating the semiconductor element.

In another aspect, the present invention provides a method of fabricating a printable semiconductor element comprising the steps of: (1) providing an ultra thin wafer having an external surface, the wafer comprising a semiconductor and having a selected thickness along an axis orthogonal to the external surface; (2) masking selected regions of the external surface by applying a mask; (3) etching (optionally anisotropically etching) the external surface of the wafer, wherein the wafer is etched throughout the thickness along the axis orthogonal to the external surface, thereby generating the printable semiconductor element.

In another embodiment, the present invention provides a method for making a flexible semiconductor element comprising the steps of: (1) providing a printable semiconductor structure having an internal surface; (2) providing a prestrained elastic substrate in an expanded state, wherein the elastic substrate has an external surface; and (3) bonding the internal surface of the printable semiconductor structure to the external surface of the prestrained elastic substrate in an expanded state; and allowing the elastic substrate to relax at least partially to a relaxed state, wherein relaxation of the elastic substrate bends the internal surface of the printable semiconductor structure thereby generating a semiconductor element having a curved internal surface. In an exemplary embodiment, the prestrained elastic substrate is expanded along a first axis, a second axis orthogonal to the first axis or both. The prestrained elastic substrate in an expanded state may be formed by bending the elastic substrate or rolling the elastic substrate. Optionally, the method of this aspect of the present invention may further comprise the step of transferring the semiconductor having a curved internal surface to a receiving substrate that is flexible.

In another embodiment, the present invention provides a method for fabricating a printable semiconductor element connected to a mother wafer via one or more alignment maintaining elements comprising the steps of: (1) providing the mother wafer having an external surface, the wafer comprising an inorganic semiconductor material; (2) masking a selected region of the external surface by applying a mask; (3) etching the external surface of the wafer, thereby generating a relief structure and at least one exposed surface of the wafer, wherein the relief structure has a masked side and one or more unmasked sides; (4) etching the exposed surfaces of the wafer; and (5) stopping etching of the exposed structure so that complete release of the relief structure is prevented, thereby fabricating the printable semiconductor element connected to a mother wafer via one or more alignment maintaining elements. In one embodiment of this method the printable semiconductor element has a peanut shape with a first end and a second end, wherein the alignment maintaining elements connect the first and second ends of the printable semiconductor element to the mother wafer. In another embodiment of this method the printable semiconductor element has a ribbon shape with a first end and a second end, wherein the alignment maintaining elements connect the first and second ends of the printable semiconductor element to the mother wafer.

BRIEF DESCRIPTION OF THE DRAWINGS

FIG. 2 provides a schematic diagram illustrating a selective dry transfer contact printing method for assembling printable semiconductor element on a receiving surface of a substrate.

FIGS. 4A1 and 4A2 show a preferred shape of a printable semiconductor element for assembly methods of the present invention using dry transfer contact printing. FIG. 4A1 provides a perspective view and FIG. 4A2 provides a top plan view. FIGS. 4B1 and 4B2 show a preferred shape of a printable semiconductor element for assembly methods of the present invention using dry transfer contact printing. FIG. 4B1 provides a perspective view and FIG. 4B2 provides a top plan view.

FIG. 15 shows optical micrographs of stretchable printable semiconductor elements of the present invention.

FIG. 17 shows a flow diagram illustrating an exemplary method of making a stretchable semiconductor element of the present invention.

FIG. 18A shows an exemplary method of making printable semiconductor elements from a Si—Ge epi substrate.

FIG. 18C shows another exemplary method of fabricating printable semiconductor elements from a bulk silicon substrate, preferably a single crystalline silicon substrate.

FIG. 18D shows yet another exemplary method of fabricating printable semiconductor elements from a bulk silicon substrate, preferably a single crystalline silicon substrate.

FIG. 18E shows an exemplary method of fabricating printable semiconductor elements from an ultra thin silicon substrate.

FIG. 18F shows an exemplary method for making printable semiconductor elements from a thin film of polycrystalline silicon on a supporting substrate.

FIG. 18G shows an exemplary method for making printable semiconductor elements from a thin film of polycrystalline silicon on a $SiO_2$ substrate.

FIGS. 18H(1) and 18H(2) illustrate a method for making single crystalline semiconductor thin films using printable semiconductor elements of the present invention.

FIG. 18J shows an alternative method for fabricating printable semiconductor elements comprising single crystalline silicon ribbons.

FIG. 18K shows an alternative method for fabricating printable semiconductor elements comprising single crystalline silicon ribbons.

FIG. 20A provides a scanning electron micrograph of free-standing GaAs wires obtained from GaAs wafer patterned with isolated $SiO_2$ lines. FIGS. 20B-E show scanning electron micrograph images of individual wires obtained by etching the GaAs wafer patterned with 2 μm wide $SiO_2$ lines. FIG. 20F provides a plot showing the dependence of the average width, $\overline{w}_{wires}$, of the top surfaces of wires fabricated by the present methods on etching time.

FIGS. 21A-G shows images of a variety of GaAs wire arrays printed on PDMS and PU/PET substrates.

FIG. 24 provides a schematic diagram illustrating an exemplary method of the present invention for solution printing printable semiconductor elements having handle elements comprising magnetic tags.

FIG. 31A provides typical current-voltage characteristics of a single crystal silicon transistor with doped contacts on a PET substrate, with L=7 microns and W=200 microns. From the bottom to top, $V_G$ varies from −2 V to 6 V. FIG. 31 B provides transfer curves ($V_d$=0.1 V) of devices with channel lengths, from top to bottom, of 97 microns, 72 microns, 47 microns, 22 microns, 7 microns, and 2 microns. The channel width in each case is 200 microns. FIG. 31C shows the width-normalized resistance of devices in the ON state ($R_{on}W$) as a function of channel length L at different gate voltages. The solid lines represent linear fits. The scaling is consistent with contacts that have negligible influence on device performance for this range of channel lengths. the inset in FIG. 31C shows the sheet conductance $[\Delta(R_{on}W)/\Delta L]^{-1}$, determined from the reciprocal of the slopes of the linear fitting in FIG. 31C, as a function of gate voltage. FIG. 31D shows effective mobility, evaluated in the linear regime, as a function of channel length for the devices with undoped (triangle) and doped (square) contacts.

FIG. 34A provides a process flow diagram schematically illustrating processing steps in a fabrication pathway for making a solar cell comprising a printable P-N junction.

FIG. 41 provides a schematic process flow diagram depicting steps involved in the process for fabricating μs-GaAs MESFETs on a poly(ethylene terephthalate) (PET) substrate. Anisotropic chemical etching produces wires from a standard (100) GaAs wafer. A printing technique that uses an elastomeric stamp transfers these wires from the wafer to the plastic device substrate in a manner that preserves spatial organization (i.e. ordered arrays). PR denotes photoresist.

FIG. 42A presents a schematic showing a cross section view of the geometry of a GaAs wire based MESFET on a plastic substrate (PU/PET). The source/drain electrodes form ohmic contacts to the n-GaAs layer. FIG. 42B shows a representative image of two GaAs wire based MESFETs on plastic each of which uses an array of ten GaAs wires, fabricated according to the process flow diagram of FIG. 41.

FIG. 43A shows the current-voltage (between drain and source electrodes) curves at gate voltages between 0.5 to −2.0 V with steps of 0.5 V. FIG. 43B shows the transfer characteristics (i.e., $I_{DS}$ vs. $V_{GS}$) of a GaAs MESFET of the present invention measured at different $V_{DS}$. FIG. 43C shows the transfer curve at $V_{DS}$=4 V, plotted as $(I_{DS})^{1/2}$ vs. $V_{GS}$, clearly showing a linear relationship as expected for a MESFET.

FIGS. 44A and 44B show gate-modulated current-voltage characteristics of a GaAs wire based MESFET on a flexible PET substrate (A) before bending; (B) after bending to a bend radius of 8.4 mm. FIG. 44C shows the gate-modulated current-voltage characteristics of the GaAs wire based MESFET after relaxing the bent substrate to its flat, unbent state. FIG. 44D shows the variation of $I_{DS}$ at $V_{DS}$=4 V and $V_{GS}$=0 V in 3 cycles in terms of bending (with different surface strains)/unbending, indicating that these MESFETs survive multiple bending cycles that cause the tensile strain at the device to vary between 0% and 1.2%, without significant change of their performance (<20%).

FIG. 45 provides a schematic diagram illustrating an exemplary device configuration of the present invention for a P type bottom gate thin film transistor on a plastic substrate.

FIG. 46 provides a schematic diagram illustrating an exemplary device configuration of the present invention for a complementary logic gate on a plastic substrate.

FIG. 47 provides a schematic diagram illustrating an exemplary device configuration of the present invention for a top gate thin film transistor on a plastic substrate.

DETAILED DESCRIPTION OF THE INVENTION

Figure 1:
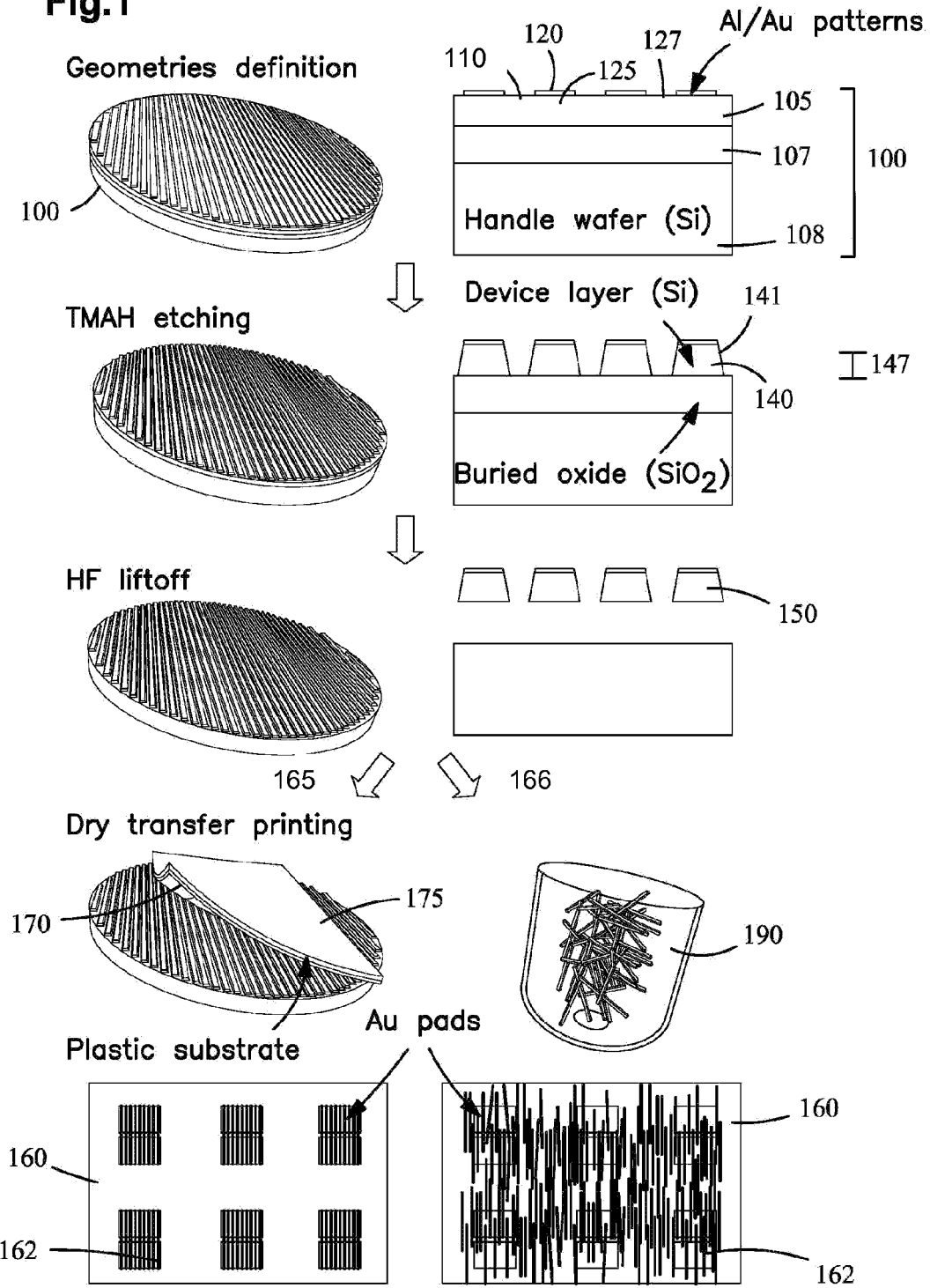
FIG. 1 schematically illustrates an exemplary method of the present invention for producing and assembling printable semiconductor elements comprising ribbons of single crystalline silicon.

Referring to the drawings, like numerals indicate like elements and the same number appearing in more than one drawing refers to the same element. In addition, hereinafter, the following definitions apply:

"Printable" relates to materials, structures, device components and/or integrated functional devices that are capable of transfer, assembly, patterning, organizing and/or integrating onto or into substrates without exposure of the substrate to high temperatures (i.e. at temperatures less than or equal to about 400 degrees Celsius). In one embodiment of the present invention, printable materials, elements, device components and devices are capable of transfer, assembly, patterning, organizing and/or integrating onto or into substrates via solution printing or dry transfer contact printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. The present invention includes microstructured printable semiconductor elements having at least one cross sectional dimension greater than or equal to about 1 micron and nanostructured printable semiconductor elements having at least one cross sectional dimension less than or equal to about 1 micron. Printable semiconductor elements useful in many applications comprises elements derived from "top down" processing of high purity bulk materials, such as high purity crystalline semiconductor wafers generated using conventional high temperature processing techniques. In one embodiment, printable semiconductor elements of the present invention comprise composite structures having a semiconductor operational connected to at least one additional device component or structure, such as a conducting layer, dielectric layer, electrode, additional semiconductor structure or any combination of these. In one embodiment, printable semiconductor elements of the present invention comprise stretchable semiconductor elements and/or heterogeneous semiconductor elements.

"Cross sectional dimension" refers to the dimensions of a cross section of device, device component or material. Cross sectional dimensions include width, thickness, radius, and diameter. For example, printable semiconductor elements having a ribbon shape are characterized by a length and two cross sectional dimensions; thickness and width. For example, printable semiconductor elements having a cylindrical shape are characterized by a length and the cross sectional dimension diameter (alternatively radius).

"Fill factor" refers to the percentage of the area between two elements, such as first and second electrodes, that is occupied by a material, element and/or device component. In one embodiment of the present invention, first and second electrodes are provided in electrical contact with one or more printable semiconductor elements that provide a fill factor between first and second electrodes greater than or equal to 20%, preferably greater than or equal to 50% for some applications and more preferably greater than or equal to 80% for some applications.

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Solution printing" is intended to refer to processes whereby one or more structures, such as printable semiconductor elements, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods useable in the present invention include, but are not limited to, ink jet printing, thermal transfer printing, and capillary action printing.

"Substantially longitudinally oriented" refers to an orientation such that the longitudinal axes of a population of elements, such as printable semiconductor elements, are oriented substantially parallel to a selected alignment axis. In the context of this definition, substantially parallel to a selected axis refers to an orientation within 10 degrees of an absolutely parallel orientation, more preferably within 5 degrees of an absolutely parallel orientation.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electrical devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electrical properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electrical properties of semiconductor materials, and include but are not limited to oxygen, carbon, and metals including heavy metals. Heavy metal impurities include, but are not limited to, the group of elements between copper and lead on the periodic table, calicum, sodium, and all ions, compounds and/or complexes thereof. Gold is a specific heavy metal impurity which significantly degrades the electrical properties of semiconductors.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Dielectric" and "dielectric material" are used synonymously in the present description and refer to a substance that is highly resistant to flow of electric current. Useful dielectric materials include, but are not limited to, $SiO_2$, $Ta_2O_5$, $TiO_2$, $ZrO_2$, $Y_2O_3$, $SiN_4$, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones.

The term "electromagnetic radiation" refers to waves of electric and magnetic fields. Electromagnetic radiation useful for the methods of the present invention includes, but is not limited to, gamma rays, X-rays, ultraviolet light, visible light, infrared light, microwaves, radio waves or any combination of these.

"Good electronic performance" and "high performance" are used synonymously in the present description and refer to devices and device components have electronic characteristics, such as field effect mobilities, threshold voltages and on-off ratios, providing a desired functionality, such as electronic signal switching and/or amplification. Exemplary printable semiconductor elements of the present invention exhibiting good electronic performance may have intrinsic field effect mobilities greater than or equal 100 cm$^2$ V$^{-1}$ s$^{-1}$, preferably for some applications greater than or equal to about 300 cm$^2$ V$^{-1}$ s$^{-1}$. Exemplary transistors of the present invention exhibiting good electronic performance may have device field effect mobilities great than or equal to about 100 cm$^2$ V$^{-1}$ s$^{-1}$, preferably for some applications greater than or equal to about 300 cm$^2$ V$^{-1}$ s$^{-1}$, and more preferably for some applications greater than or equal to about 800 cm$^2$ V$^{-1}$ s$^{-1}$. Exemplary transistors of the present invention exhibiting good electronic performance may have threshold voltages less than about 5 volts and/or on-off ratios greater than about 1×10$^4$.

"Large area" refers to an area, such as the area of a receiving surface of a substrate used for device fabrication, greater than or equal to about 36 inches squared.

"Device field effect mobility" refers to the field effect mobility of an electrical device, such as a transistor, as computed using output current data corresponding to the electrical device.

Conformal contact" refers to contact established between surfaces, coated surfaces, and/or surfaces having materials deposited thereon which may be useful for transferring, assembling, organizing and integrating structures (such as printable semiconductor elements) on a substrate surface. In one aspect, Conformal contact involves a macroscopic adaptation of one or more contact surfaces of a conformable transfer device e to the overall shape of a substrate surface. In another aspect, conformal contact involves a microscopic adaptation of one or more contact surfaces of a conformable transfer device to a substrate surface leading to an intimate contact with out voids. The term conformal contact is intended to be consistent with use of this term in the art of soft lithography. Conformal contact may be established between one or more bare contact surfaces of a conformable transfer device and a substrate surface. Alternatively, conformal contact may be established between one or more coated contact surfaces, for example contact surfaces having a transfer material, printable semiconductor element, device component, and/or device deposited thereon, of a conformable transfer device and a substrate surface. Alternatively, conformal contact may be established between one or more bare or coated contact surfaces of a conformable transfer device and a substrate surface coated with a material such as a transfer material, solid photoresist layer, prepolymer layer, liquid, thin film or fluid.

"Placement accuracy" refers to the ability of a transfer method or device to transfer a printable element, such as a printable semiconductor element, to a selected position, either relative to the position of other device components, such as electrodes, or relative to a selected region of a receiving surface. "Good placement" accuracy refers to methods and devices capable of transferring a printable element to a selected position relative to another device or device component or relative to a selected region of a receiving surface with spatial deviations from the absolutely correct position less than or equal to 50 microns, more preferably less than or equal to 20 microns for some applications and even more preferably less than or equal to 5 microns for some applications. The present invention provides devices comprising at least one printable element transferred with good placement accuracy.

"Fidelity" refers to a measure of how well a selected pattern of elements, such as a pattern of printable semiconductor elements, is transferred to a receiving surface of a substrate. Good fidelity refers to transfer of a selected pattern of elements wherein the relative positions and orientations of individual elements are preserved during transfer, for example wherein spatial deviations of individual elements from their positions in the selected pattern are less than or equal to 500 nanometers, more preferably less than or equal to 100 nanometers.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad \text{(II)}$$

wherein E is Young's modulus, L$_0$ is the equilibrium length, ΔL is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad \text{(III)}$$

wherein λ and μ are Lame constants. High Young's modulus (or "high modulus") and low Young's modulus (or "low modulus") are relative descriptors of the magnitude of Young's modulus in a give material, layer or device. In the present invention, a High Young's modulus is larger than a low Young's modulus, preferably about 10 times larger for some applications, more preferably about 100 times larger for other applications and even more preferably about 1000 times larger for yet other applications.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods and devices for fabricating printable semiconductor elements and assembling printable semiconductor elements onto substrate surfaces. The present invention provides a variety of semiconductor elements that are printable including single crystalline inorganic semiconductors, composite semiconductor elements comprising a semiconductor structure operationally connected to one or more other device components, and stretchable semiconductor elements. The methods, devices and device components of the present invention are capable of generating high performance electronic and optoelectronic devices and arrays of devices, such as thin film transistors on flexible plastic substrates.

FIG. 1 schematically illustrates exemplary methods of the present invention for producing and assembling printable semiconductor elements comprising ribbons of single crystalline silicon. The process begins by providing a silicon-on-insulator (SOI) substrate 100 having a thin single crystalline silicon layer 105, a buried SiO$_2$ layer 107 and Si handling layer 108. Optionally, the surface native oxide layer on thin single crystalline silicon layer 105, if present, may be removed, for example by exposing the surface of the SOI substrate 100 to dilute (1%) HF. Upon adequately stripping the native oxide layer, selected regions of external surface 110 of SOI substrate 100 are masked, thereby forming a pattern of mask elements 120, masked regions 125 and exposed surface regions 127 on external surface 110. In the embodiment shown in FIG. 1, external surface 110 is patterned with rectangular aluminum and gold surface layers which provide mask elements 120 that are capable of inhibiting etching of the masked regions 125 of external surface 110. Mask elements 120 may have any size and shape including, but not limited to, square, rectangular, circular, elliptical, triangular shapes or any combinations of these shapes. In an exemplary embodiment, patterns of Al/Au layers providing mask elements having desired geometries are fabricated using microcontact printing, nanocontact printing techniques, or photolithography, and etching methods (TFA for Au; AL-11 premixed Cyantec etchant for Al). Deposition of mask elements comprising thin metal films may be provided by an electron beam evaporator, such as a Temescal BJD1800, for example by sequential deposition of Al (20 nm; 0.1 nm/s) and then Au (100 nm; 1 nm/s).

External surface 110 of SOI substrate 100 is anisotropically etched downward. As shown in FIG. 1, although material is selectively removed from exposed surface regions 127, mask elements 120 prevent etching of masked regions 125, thereby generating a plurality of relief features 140 comprising single crystalline silicon structures having slightly angled side walls 141. In an exemplary embodiment wherein relief features have side walls 141 having a thickness 147 of about 100 nanometers, exposed surface regions 127 are exposed to tetramethylammonium hydroxide (TMAH) for about 3.5 minutes. In this embodiment, etching generates smooth sidewalls on relief features 140 of single crystal silicon having Al/Au mask elements 120, preferably with deviations from average surface positions of less than 10 nanometers. Relief features 140 may be lifted off of the substrate 100 when the underlying $SiO_2$ layer 107 is partially or completely isotropically etched away, for example using concentrated (49%) HF. Liftoff of the relief features 140 generates printable semiconductor elements 150 comprising discrete single crystalline silicon structures having one surface covered by a mask element. Mask elements 120, Al/Au layers in the present example, may be removed or may be integrated directly into a final device structure, for example, as the source and drain electrodes in a thin film transistor. As shown in FIG. 1, the printable semiconductor elements 150 may be assembled onto the receiving surface of substrate surface 160, such as a plastic substrate, by either dry transfer contact printing techniques (schematically shown by arrow 166) or by solution casting methods (schematically shown by arrow 165). Both assembly methods may be carried out at room temperature in an ambient environment and, therefore, are compatible with a wide range of substrates, including low cost, flexible plastic substrates.

Use of dry transfer contact printing methods to assemble printable semiconductor elements has the benefit of taking advantage of the known orientations and positions of the printable semiconductor elements just prior to their liftoff from the SOI substrate. In this case, procedures similar to those of soft lithographic transfer printing techniques are used to move the printable semiconductor elements from the SOI (after etching away the $SiO_2$ but before lifting off the silicon) to desired locations on the device substrate. In particular, a conformable elastomeric transfer element picks up the objects from the SOI surface and transfers them to a desired substrate. Similarly, the printable semiconductor elements can be directly transferred onto thin plastic substrates by Au cold welding using receptacle pads defined on the surface of the target substrate.

In an exemplary method, at least a portion of printable semiconductor elements 150 are brought into conformal contact with the contact surface 170 of a conformable transfer device 175, such as an elastomeric transfer stamp, polymer transfer device or composite polymer transfer device, thereby bonding at least a portion of printable semiconductor elements 150 onto the contact surface 170. Printable semiconductor elements 150 disposed on the contact surface 170 of conformable transfer device 175 are brought into contact with a receiving surface of substrate 160, preferably in a manner establishing conformal contact between contact surface 170 and the receiving surface of substrate 160. Contact surface 170 is separated from printable semiconductor elements 150 in contact with receiving surface of substrate 160, thereby assembling printable semiconductor elements 150 onto the receiving surface. This embodiment of the present invention is capable of generating a pattern on the receiving surface comprising printable semiconductor elements 150 in well defined positions and spatial orientations. In the embodiment shown in FIG. 1, printable semiconductor elements 150 are operationally connected to gold pads 162 present on the receiving surface of substrate 160.

FIG. 2 provides a schematic diagram illustrating a selective dry transfer contact printing method for assembling printable semiconductor elements on a receiving surface of a substrate. A plurality of printable semiconductor elements 300 are fabricated on a mother substrate 305 in a first pattern 310 of printable semiconductor elements 300 characterized by well defined positions and spatial orientations. A conformable transfer device 315 having a contact surface 320 with a plurality of discrete binding regions 325 is brought into conformal contact with at least a portion of printable semiconductor elements 300 on mother substrate 305. Binding regions 325 on contact surface 320 are characterized by an affinity for printable semiconductor elements 300, and may be chemically modified regions, such regions having hydroxyl groups extending from the surface of a PDMS layer, or regions coated with one or more adhesive layers. Conformal contact transfers at least a portion of printable semiconductor elements 300 which contact binding regions 325 on contact surface 320. Printable semiconductor elements 300 transferred to contact surface 320 are brought into contact with receiving surface 330 of substrate 335, which may be a flexible substrate such as a plastic substrate. Subsequent separation of semiconductor elements 300 and contact surface 320 results in assembly of the semiconductor elements 300 on receiving surface 330 of substrate 335, thereby generating a second pattern 340 of printable semiconductor elements characterized by well defined positions and spatial orientations different from the first pattern of printable semiconductor elements 310. As shown in FIG. 2, the printable semiconductor elements that remain on mother substrate 305 are characterized by a third pattern 345 of printable semiconductor elements different from first and second patterns of printable semiconductor elements. Printable semiconductor elements comprising the third pattern 345 may be subsequently transferred to and/or assembled onto substrate 335 or another substrate using the printing methods of the present invention, including selective dry transfer methods.

Figure 3A:
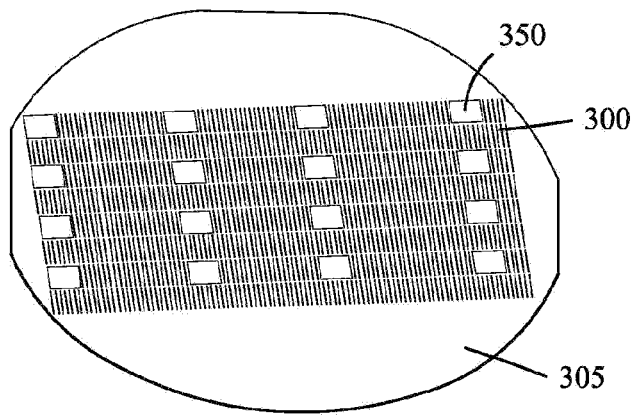
FIGS. 3A-C, are schematic diagrams showing devices, device configurations and device components useful in selective dry transfer contact printing methods of the present invention.
Figure 3B:
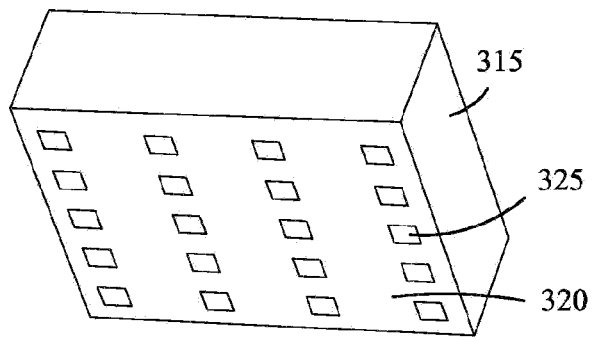
Figure 3C:
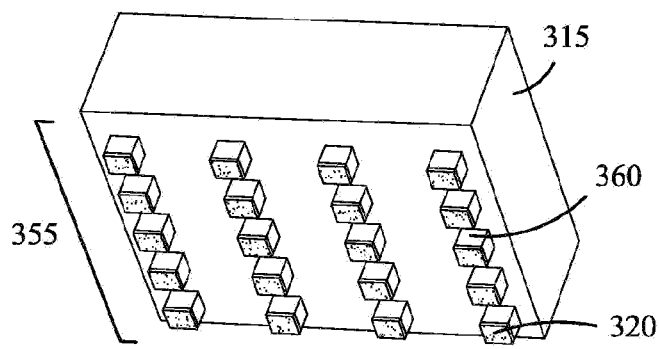

FIGS. 3A-C, are schematic diagrams showing devices, device configurations and device components useful in selective dry transfer contact printing methods of the present invention. FIG. 3A shows a plurality of printable semiconductor elements 300 on a mother substrate 305, wherein selected printable semiconductor elements 300 have one or more adhesive coatings 350. As shown in FIG. 3A, adhesive coatings 350 are provided in a well defined pattern. FIG. 3B shows a conformable transfer device 315 having a contact surface 320 with a plurality of discrete binding regions 325 provided in a well defined pattern. FIG. 3C shows a conformable transfer device 315 having a three dimensional relief pattern 355 comprising relief features 360 provided in a well defined pattern. In the embodiment shown in FIG. 3C, relief pattern 355 provides a plurality of contact surfaces 320 that may be optionally coated with one or more adhesive layers. Patterns of adhesive coatings 350, binding regions 325 and relief features 360 preferably corresponding to relative positions and spatial orientations of printable semiconductor elements 300 in device configurations or device array configurations, such as thin film transistor array configurations.

Figure 3D:
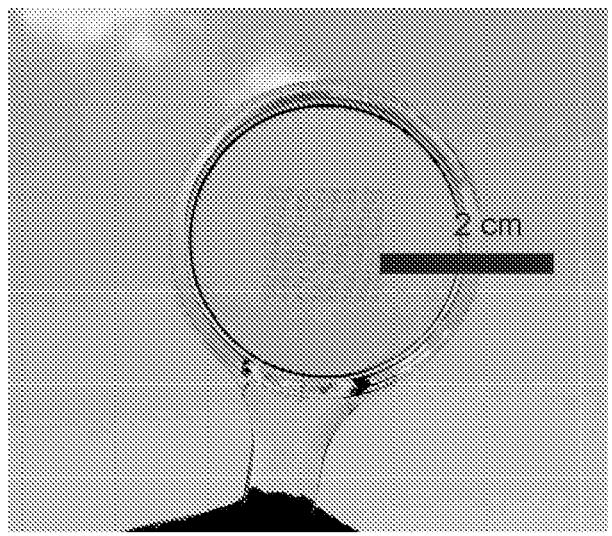
FIG. 3D provides a photograph of an array of photodiodes printed onto a spherical surface of a polycarbonate lens (FL 100 mm).
Figure 3E:
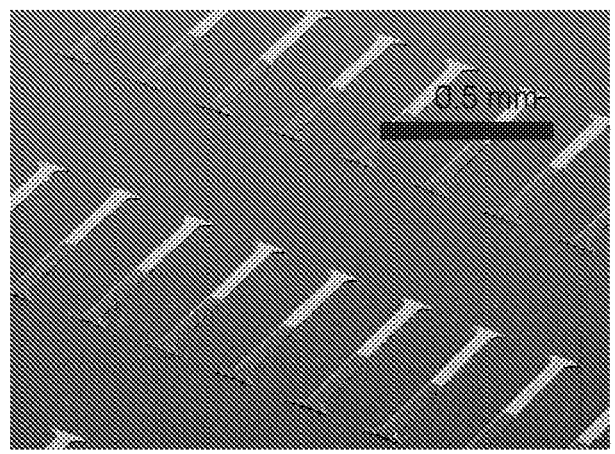
FIG. 3E provides a scanning electron micrograph of an array of photodiodes printed onto the curved surface of a spherical glass lens (FL 1000 mm). Contrast in the image provided in FIG. 3E is slightly enhanced to show p-doped regions.
Figure 3F:
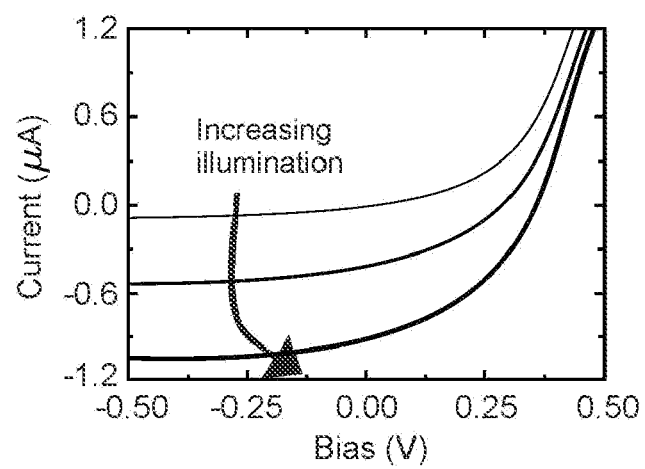
FIG. 3F provides a plot of electric current (μA) verse bias potential (volts) illustrating the light response of the photodiodes pictured in FIG. 3E.

Use of dry transfer printing methods are useful in the present invention for assembling, organizing and integrating printable semiconductor elements on substrates having a wide range of compositions and surface morphologies, including curved surfaces. To demonstrate this functional capability of the present methods and compositions, semiconductor elements comprising silicon photodiodes were printed directly (i.e. no adhesive) onto the curved surfaces of a variety of optical lenses using dry transfer printing methods employing an elastomeric stamp. FIG. 3D provides a photograph of an array of photodiodes printed onto a spherical surface of a polycarbonate lens (FL 100 mm). FIG. 3E provides a scanning electron micrograph of an array of photodiodes printed onto the curved surface of a spherical glass lens (FL 1000 mm). Contrast in the image provided in FIG. 3E is slightly enhanced to show p-doped regions. FIG. 3F provides a plot of electric current (μA) verse bias potential (volts) illustrating the light response of the photodiodes pictured in FIG. 3E.

FIGS. 4A1 and 4A2 show a preferred shape of a printable semiconductor element for assembly methods of the present invention using dry transfer contact printing. FIG. 4A1 provides a perspective view and FIG. 4A2 provides a top plan view. Printable semiconductor element comprises a ribbon 500 extending along a central longitudinal axis 502 having a first end 505, center region 510 and second end 515. As shown in FIG. 4A, the width of ribbon 500 selectively varies along its length. Particularly, first and second ends 505 and 515 are wider than center region 510. In an exemplary method, ribbon 500 is formed by etching mother substrate 520. In this embodiment, mother substrate is isotropically exposed to an enchant until ribbon 500 is only attached to mother substrate 520 by two alignment maintaining elements comprising sacrificial layers 525 proximate to first and second ends 505 and 515. At this point in the fabrication process the etching process is stopped, and the ribbon 500 is brought into contact with and/or bonded to a conformable transfer device. Sacrificial layers 525 are broken and ribbon 500 is released as the transfer device is moved away from mother substrate 520. This method may also be applied to dry transfer contact printing of a plurality of printable semiconductor elements having shapes as shown in FIG. 4. An advantage of this method of the present invention is that the orientations and relative positions of a plurality of ribbons 500 on mother substrate 520 may be precisely preserved during transfer, assembly and integration steps. Exemplary ranges for the thickness of the sacrificial layers are ~1 um down to ~100 nm with ribbons widths between ~2 um and 100 um. Interestingly, the cleavage of the ribbons typically occurs at the extremity of the objects (very close to the point/edge where the ribbons are attached to the mother wafer). Wide ribbons usually do not distort during the lift-off process are they are bonded to the stamp.

FIGS. 4B1 and 4B2 show a preferred shape of a printable semiconductor element for assembly methods of the present invention using dry transfer contact printing. FIG. 4B1 provides a perspective view and FIG. 4B2 provides a top plan view. Printable semiconductor element comprises ribbons 527 extending along a parallel central longitudinal axes 528. Ribbons 527 are held in a selected position and orientation by alignment maintaining elements 530 which connect at least on end of the ribbon along the central longitudinal axes 528 to mother substrate 529. alignment maintaining elements 530 are fabricated during patterning of ribbons 527 by not defining one or both ends of the ribbon along their central longitudinal axes. Alignment maintaining elements 530 are broken and ribbons 527 are released upon contact with the ribbons with the contact surface of a transfer device and subsequent movement away from mother substrate 520.

To achieve assembly by solution printing, at least a portion of printable semiconductor elements 150 are dispersed into a carrier medium, thereby generating a suspension 190 comprising semiconductor element elements 150 the carrier medium. Printable semiconductor elements 150 are delivered to the substrate and assembled by solution printing the suspension onto the receiving surface of substrate 160. Solution printing may be provided by a number of techniques known in the art including, but not limited to, ink jet printing, thermal transfer printing and screen printing. In the embodiment shown in FIG. 1, printable semiconductor elements 150 are operationally connect to gold pads 162 present on the receiving surface of substrate 160.

Figure 5A:
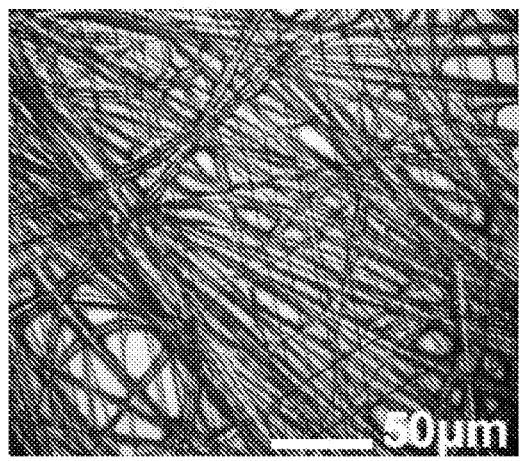
FIG. 5A-C presents optical and scanning electron micrographs of a range of printable semiconductor elements comprising microstrips of single crystalline silicon having selected physical dimensions
Figure 5B:
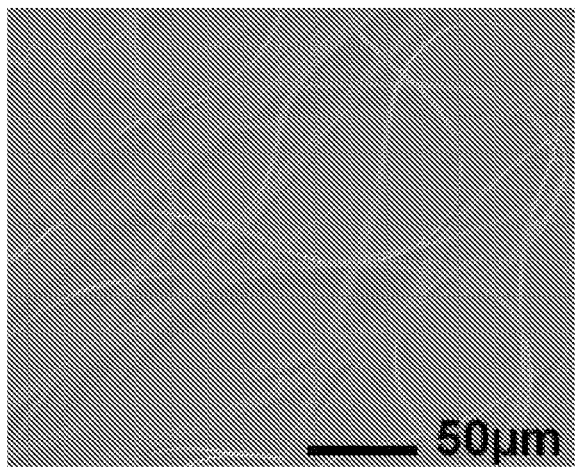
Figure 5C:
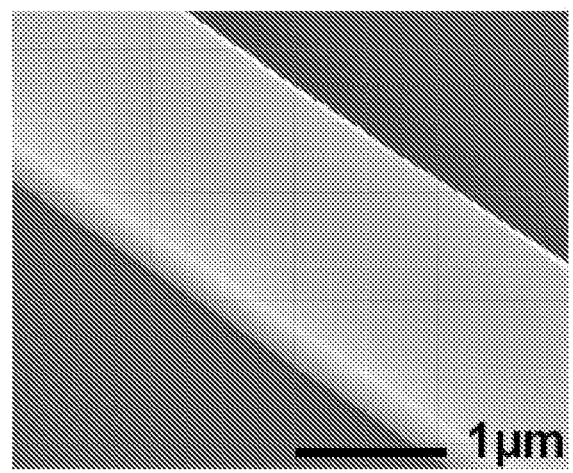

FIGS. 5A-C presents optical and scanning electron micrographs of a range of printable semiconductor elements 150 comprising microstrips of single crystalline silicon having selected physical dimensions. Printable semiconductor elements are shown in ethanol suspensions and as cast onto substrates of various types. FIG. 5A shows an optical micrograph of a solution cast tangled mat of silicon rods (widths 2 microns; thickness 2 microns; lengths ~15 millimeters). The low resolution SEM image in FIG. 5B illustrates the mechanical flexibility range of some flat microstrips (thickness 340 nanometers; widths 5 microns; lengths ~15 millimeters) solution casted onto a bare silicon wafer. FIG. 5C presents a high resolution SEM image of one of these objects. Note the extremely smooth sidewalls generated by the anisotropic wet etching procedures.

Printable semiconductor elements in the form of wires, platelets and disks may also be formed using the methods of the present invention. By use of large area soft lithographic techniques, it is possible, in a single low cost processing sequence, to produce large numbers (i.e. billions) of printable semiconductor elements with lateral dimensions down to 50 nm and with nearly any geometry. Printable semiconductor elements having lateral dimension as small as 20 nanometer may also be fabricated by the methods of present invention. For use in thin film transistors in flexible electronic systems, printable semiconductor elements comprising long (~10 microns) and narrow (~1 microns) strips of single crystalline silicon are particularly useful.

Figure 6:
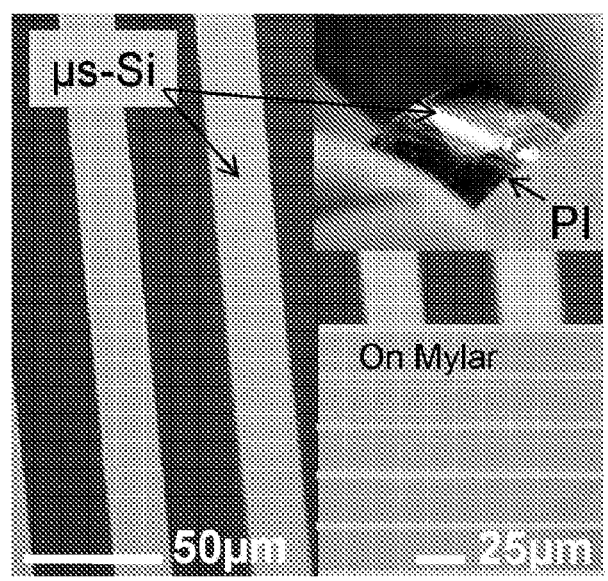
FIG. 6 presents an image of transferred printable semiconductor elements comprising single crystalline silicon microstrips on a PDMS coated polyimide sheet.

FIG. 6 presents an image of transferred printable semiconductor elements comprising single crystalline silicon microstrips on a PDMS coated polyimide sheet having a thickness of about 25 microns. The top inset pictures illustrate the intrinsic flexibility of this system. The bottom inset shows a top view micrograph of printable silicon dense microstrips (25 microns wide, ~2 microns spaced apart) cold welded on a thin Ti/Au coated Mylar sheet. As shown in FIG. 6, the printable semiconductor elements comprising silicon microstrips are well aligned and transferred with controlled orientation. No cracking of the printable semiconductor elements induced by assembly was observed upon careful examination using scanning electron microscopy, even when the substrate was bent significantly. Similar results were obtained (without the need of an elastomeric layer) using a Au coated thin Mylar sheet as illustrated by the bottom inset micrograph picture. A coverage density close to 100% can be achieved in this manner.

The present invention also provides composite printable semiconductor elements comprising a semiconductor structure operationally connect to one or more other device components, such as dielectric elements, conducting elements (i.e. electrodes) or additional semiconductor elements. An exemplary printable semiconductor elements of the present invention that is particularly useful for fabricating thin film transistors comprises an integrated semiconductor and dielectric element. Such composite printable semiconductor elements provide transistors having high quality, leak free dielectrics and avoids the need for separate spin casting steps for fabricating the dielectric element in a thin film transistor. In addition, use of composite printable semiconductor elements enables efficient device fabrication on large substrate areas by low cost printing techniques.

The following references relate to self assembly techniques which may be used in methods of the present invention to transfer, assembly and interconnect printable semiconductor elements via contact printing and/or solution printing techniques: (1) "Guided molecular self-assembly: a review of recent efforts", Jiyun C Huie *Smart Mater. Struct.* (2003) 12, 264-271; (2) "Large-Scale Hierarchical Organization of Nanowire Arrays for Integrated Nanosystems", Whang, D.; Jin, S.; Wu, Y.; Lieber, C. M. *Nano Lett.* (2003) 3(9), 1255-1259; (3) "Directed Assembly of One-Dimensional Nanostructures into Functional Networks", Yu Huang, Xiangfeng Duan, Qingqiao Wei, and Charles M. Lieber, *Science* (2001) 291, 630-633; and (4) "Electric-field assisted assembly and alignment of metallic nanowires", Peter A. Smith et al., *Appl. Phys. Lett.* (2000) 77(9), 1399-1401.

All references cited in this application are hereby incorporated in their entireties by reference herein to the extent that they are not inconsistent with the disclosure in this application. Some references provided herein are incorporated by reference to provide details concerning sources of starting materials, additional starting materials, additional reagents, additional methods of synthesis, additional methods of analysis and additional uses of the invention. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques specifically described herein are intended to be encompassed by this invention.

U.S. patent application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively, are hereby incorporated by reference herein in their entireties to the extent not inconsistent with the disclosure of this application.

When a group of materials, compositions, components or compounds is disclosed herein, it is understood that all individual members of those groups and all subgroups thereof are disclosed separately. When a Markush group or other grouping is used herein, all individual members of the group and all combinations and subcombinations possible of the group are intended to be individually included in the disclosure. Every formulation or combination of components described or exemplified herein can be used to practice the invention, unless otherwise stated. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms.

EXAMPLE 1

Thin Film Transistor Having a Printable Semiconductor Element

The ability of printable semiconductor elements of the present invention to provide semiconductor channels in thin film transistors was verified by experimental studies. Specifically, it is a goal of the present invention to provide thin film transistors capable of fabrication on a flexible plastic substrates by printing methods. Further, it is a goal of the present invention to provide high performance thin film transistors on plastic substrates having field effect mobilities, on-off ratios and threshold voltages similar to or exceeding thin film transistors fabricated by convention high temperature processing methods.

Figure 7:
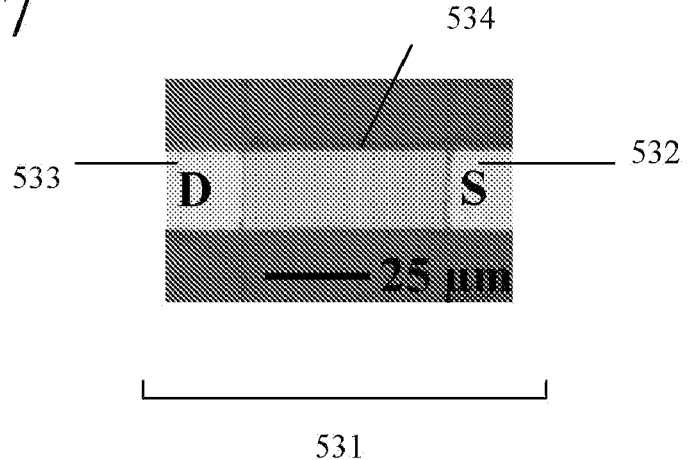
FIG. 7 presents an optical micrograph image of a thin film transistor having a printable semiconductor element.

FIG. 7 presents an optical micrograph image of a thin film transistor having a printable semiconductor element. The illustrated transistor 531 comprises source electrode 532, drain electrode 533, printable semiconductor element 534, dielectric (not shown in the micrograph in FIG. 7) and gate electrode (also not shown in the micrograph in FIG. 7). The thin film transistor is supported by a substrate comprising of a Mylar sheet coated with indium tin oxide (ITO, ~100 nanometers thick) as a gate and a photocured epoxy as a gate dielectric (SU8-5; Microchem Corp). The capacitance of the dielectric (2.85 nF/cm2) was evaluated using capacitor test structures formed near the device. This device uses a solution cast printable semiconductor element comprising a ~5 millimeter long, 20 micron width and 340 nanometer thick microstrip fabricated from a p-doped SOI wafer (Soitec) with a 340 nanometer device layer thickness and resistivity of 14-22 ohm cm. A 25 nanometer thick layer of $SiO_2$ was grown on top of the silicon by dry oxidation in a horizontal quartz tube furnace. Source and drain electrodes of Al (20 nanometer)/Au (180 nanometer) where defined by liftoff techniques. The semiconductor channel length is 50 microns and the width is 20 microns.

Figure 8:
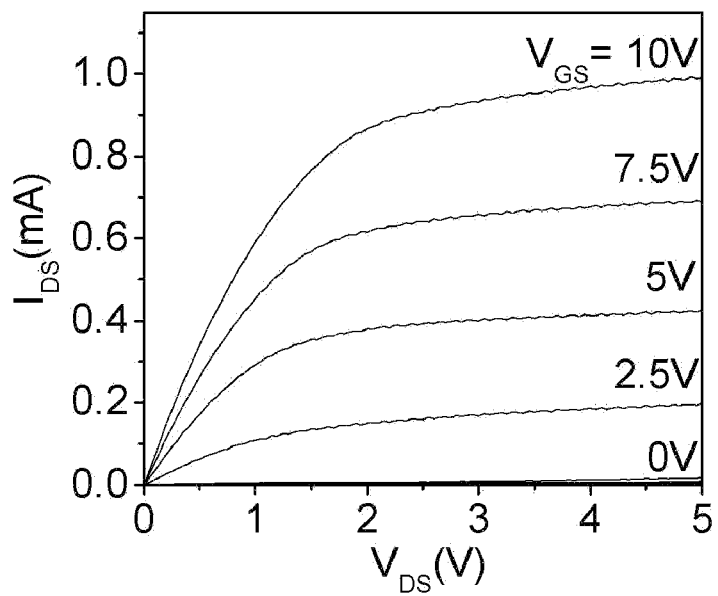
FIG. 8 provides a plot showing current-voltage (IV) characteristics of a device made on a pre-oxidized Si wafer.
Figure 9:
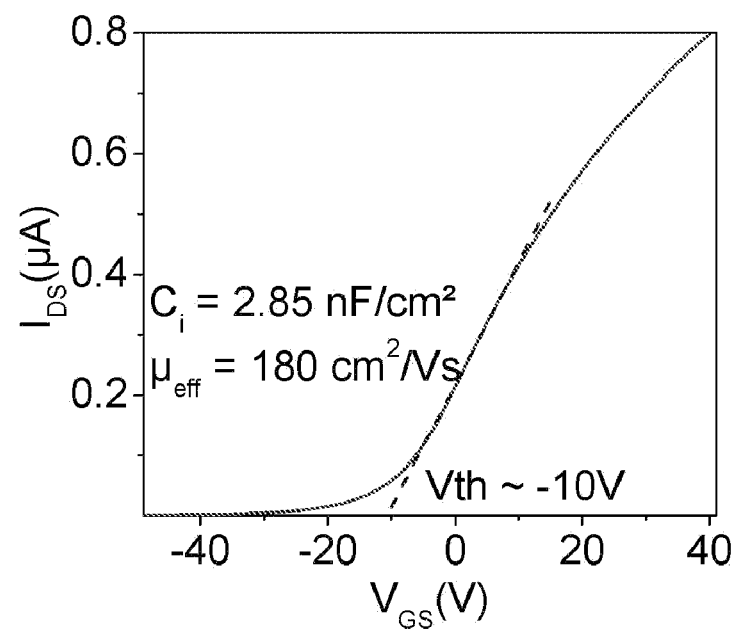
FIG. 9 provides a plot showing transfer characteristics measured at $V_{DS}$=0.1 V of a device made on a Mylar sheet coated with ITO gate and polymer dielectric.

FIGS. 8 and 9 show electrical measurements collected from thin film transistors of the present invention having a printable semiconductor element. The device operates similarly to a back gated SOI device with a top contact configuration. The semiconductor uses a width equal to a 20 microns microstrip of single crystal silicon in a channel whose length is equal to 50 microns. The printable semiconductor element in this case was patterned by solution casting methods. The source/drain contacts were defined by photolithography and lift off.

FIG. 8 provides a plot showing current-voltage (IV) characteristics of a device made on a pre-oxidized Si wafer. FIG. 9 provides a plot showing transfer characteristics measured at $V_{DS}=0.1$ V of a device made on a Mylar sheet coated with ITO gate and polymer dielectric. The slope of this curve defines an effective device mobility (using the physical width of the source and drain electrodes, which is equal to the width of the semiconductor element microstrip in this case) of 180 cm$^2$/Vs. The Al/Au metallization for the contacts to the printable semiconductor element provides reasonably low resistance Schottky barrier contacts to the silicon, as expected for an Al (work function of 4.2 eV) metallization on p-doped silicon. Aluminum is well known to diffuse rapidly into silicon, but no special care was taken to avoid localized aluminum-silicon interactions as no post metallization high temperature annealing step was carried out. The on/off ratio of this device is slightly lower than 10$^3$. Analysis of the transfer characteristic of FIG. 9 indicates a linear field effect mobility of 180 cm$^2$ V$^{-1}$ s$^{-1}$ using a parallel plate model for the dielectric capacitance. This analysis ignores the effects of contacts and processing induced changes in the threshold voltage.

Even with perfect contacts, there are theoretical arguments to suggest that transistors which incorporate very high aspect ratio (i.e. ultra large length to width ratios) semiconducting elements in the channel region (i.e. nanotubes or nanowires) will have responses that are different than those of conventional devices. To avoid these effects, we chose printable semiconductor elements comprising microstrips having widths on the same order of magnitude with the transistor channel length. The properties (mobilities, normalized transconductance, on/off ratio) observed here are ~¾ to those of thin film transistors made on the SOI substrate after etching of the Si but before liftoff. In these measurements the buried SiO$_2$ oxide acts as the dielectric and the silicon supporting substrate acts as the gate electrode. This result demonstrates that the processing steps used to produce the printable semiconductor elements and to transfer it to the device substrate do not alter significantly the properties of the silicon or its surfaces that result from the initial patterning and silicon etching steps. It also indicates that the van der Waals interface with the SU8 dielectric is capable of supporting good device properties.

A principle advantage of the fabrication method of the present example is that it separates the crystal growth and processing of the silicon from the plastic substrate and other components of the devices. In addition, the methods of processing printable semiconductor elements of the present invention are highly flexible in the processing sequences and in the materials choices that are possible. For example, an SiO$_2$ layer can be formed on one side of the silicon (by, for example, growing a thermal oxide before lifting off the Si elements or lifting the SOI buried oxide together with the Si device layer) to yield an integrated dielectric, in a strategy similar to that for the integrated source/drain metallization demonstrated here. A dielectric introduced in this manner may avoid the significant challenges that can be associated with leakage, hysteresis, doping, trapping, etc. in many solution cast thin dielectrics on plastic substrates.

Figure 10A:
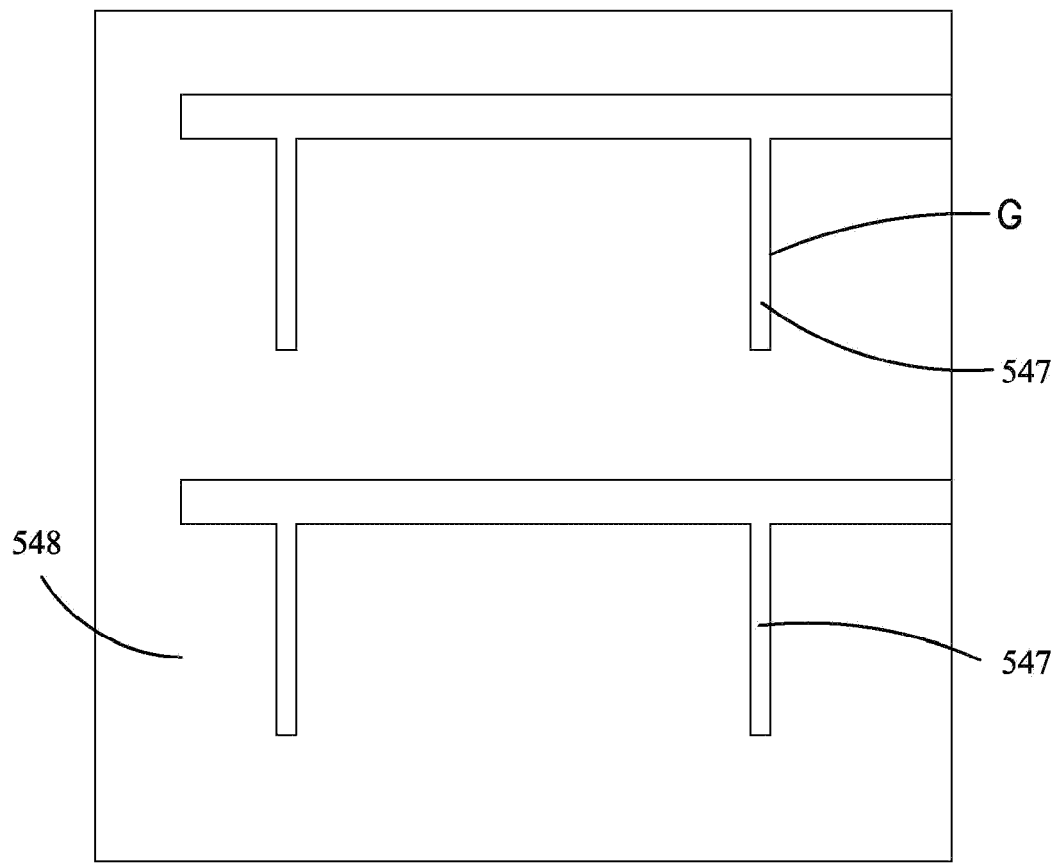
FIGS. 10A-H provide a schematic diagrams illustrating a method of the present invention for making an array of thin film transistors having composite printable semiconductor elements.
Figure 10B:
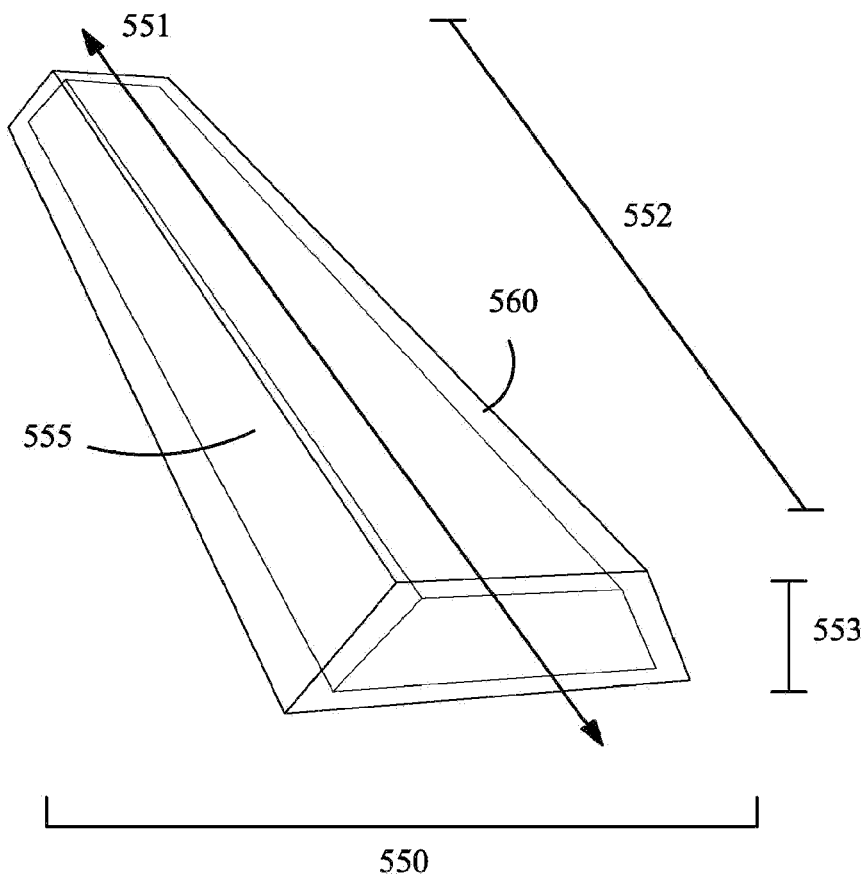

FIGS. 10A-H provide a schematic diagram illustrating a method of the present invention for making an array of thin film transistors having composite printable semiconductor elements. As shown in FIG. 10A, gate electrodes 547 are deposited on the surface 548 of a thin sheet of a flexible substrate, such as Kapton, Mylar or PET. Gate electrodes may be patterned on the flexible substrate by any means known in the art including but not limited to photolithography, microtransfer printing, nanotransfer printing, soft lithography or combinations of these. As shown in FIG. 10B, the method further comprises the step of fabricating a plurality of composite printable semiconductor elements 550 comprising single crystalline silicon structures 555 operationally connected to a SiO$_2$ dielectric element 560. As illustrated in FIG. 10B, composite printable semiconductor elements 550 have a ribbon shape extending a selected length 552 along a central longitudinal axis 551. Composite printable semiconductor element 550 has a selected thickness 553 and a width that varies as a function of thickness.

Figure 10C:
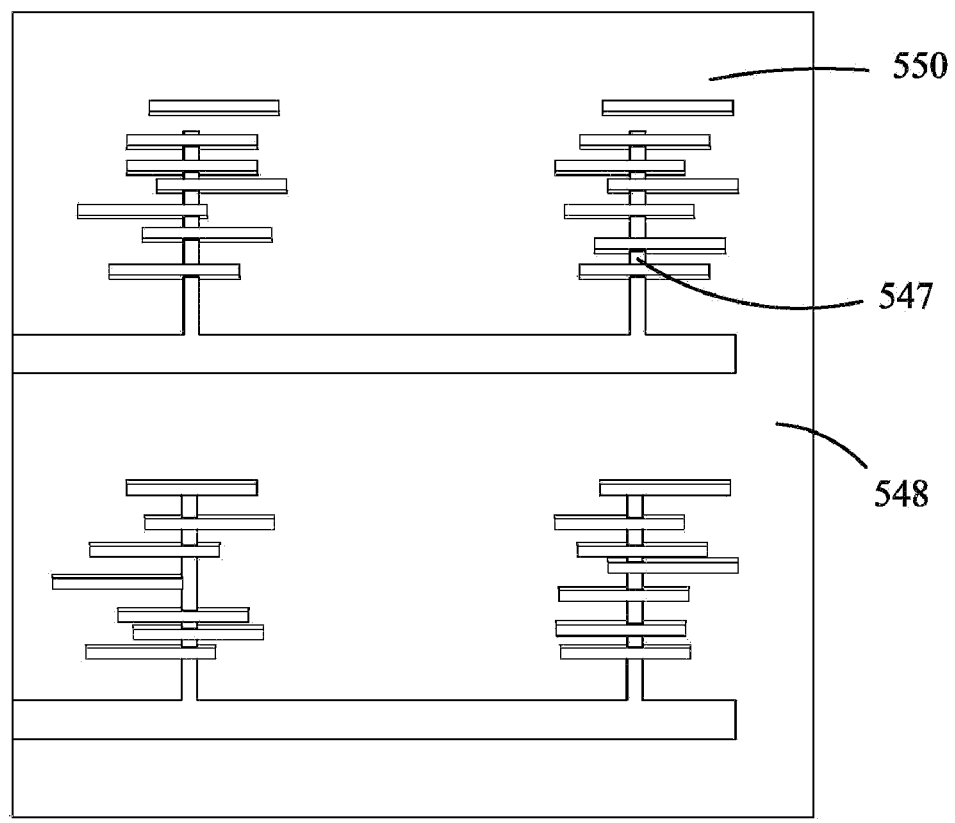
Figure 10D:
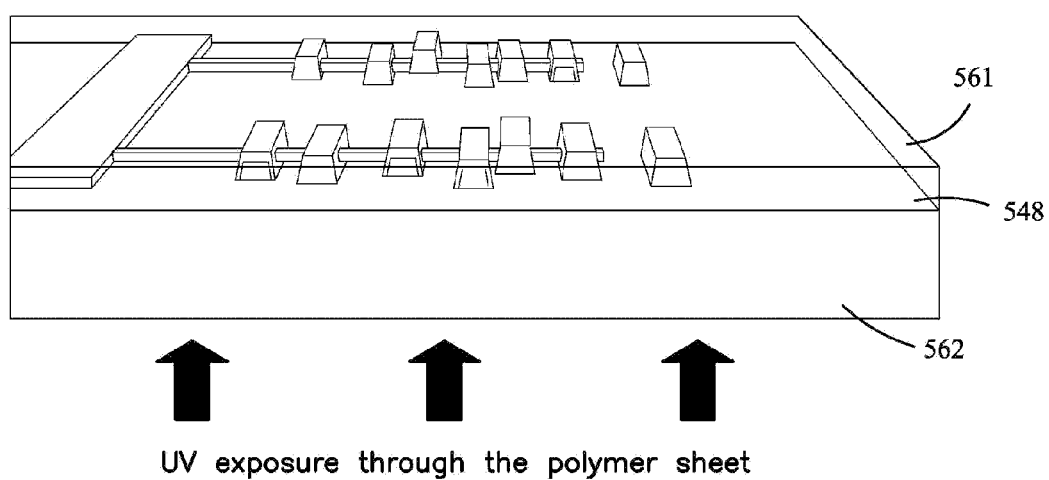
Figure 10E:
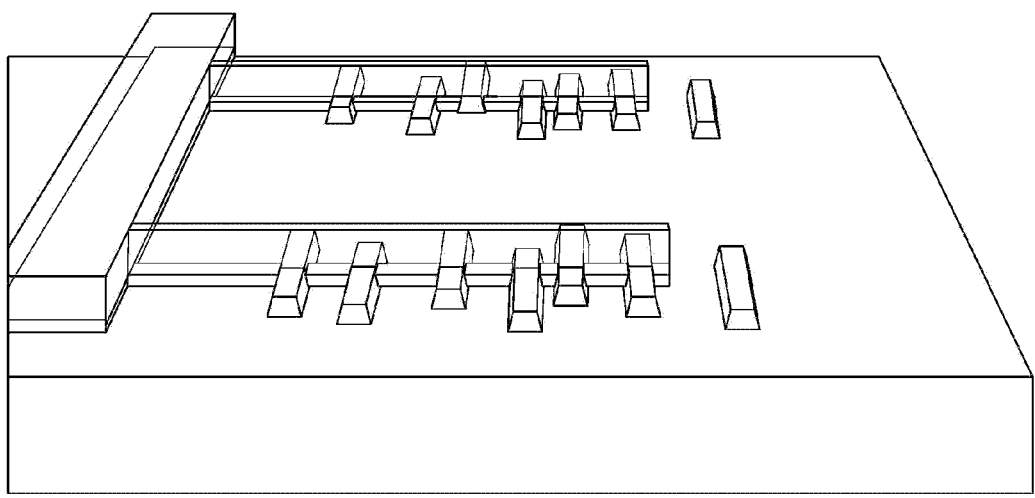
Figure 10F:
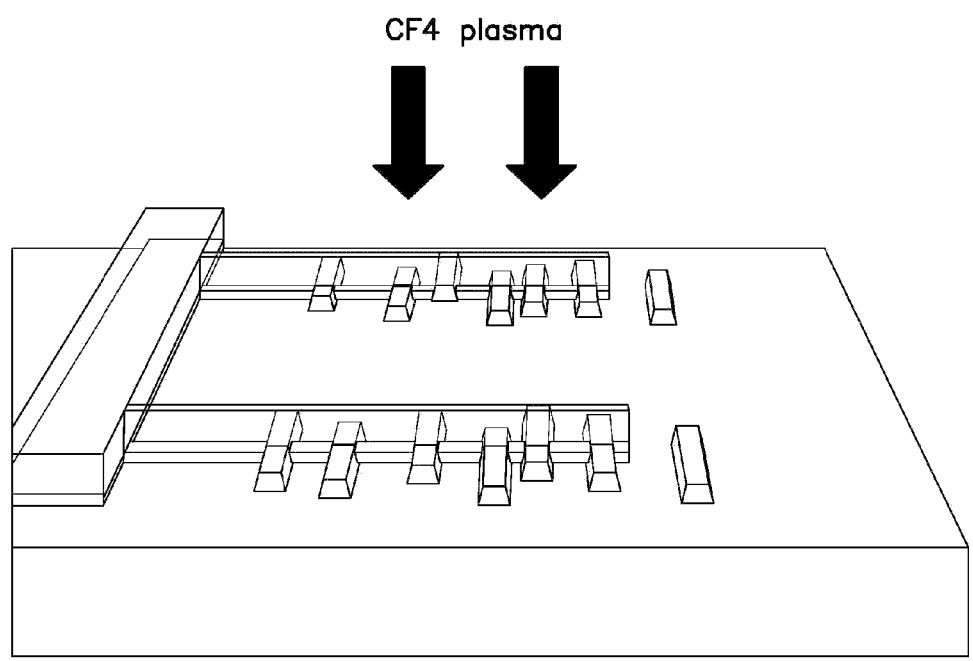
Figure 10G:
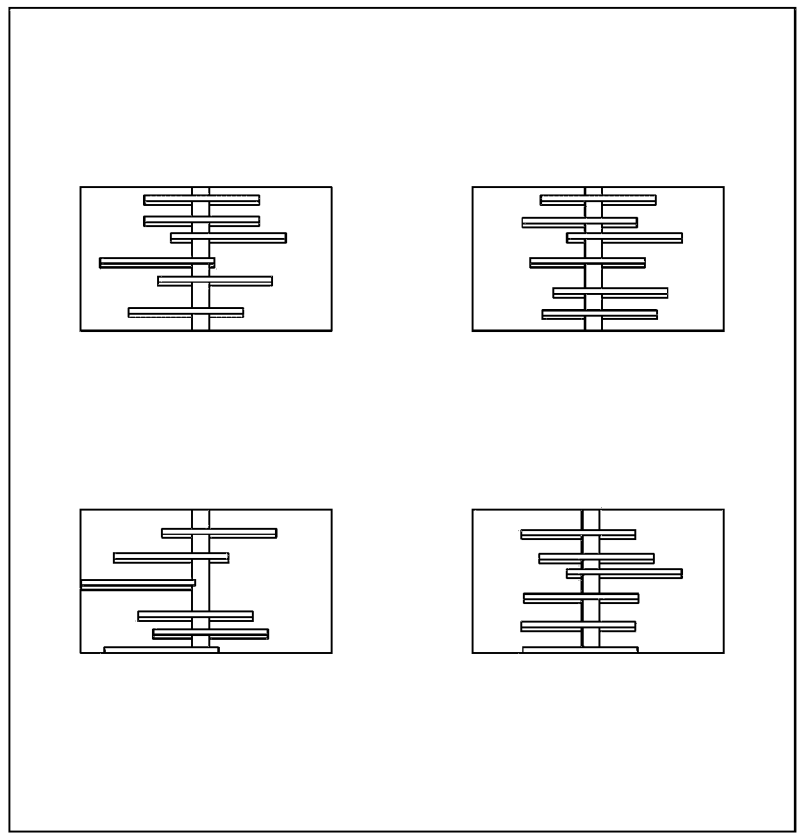
Figure 10H:
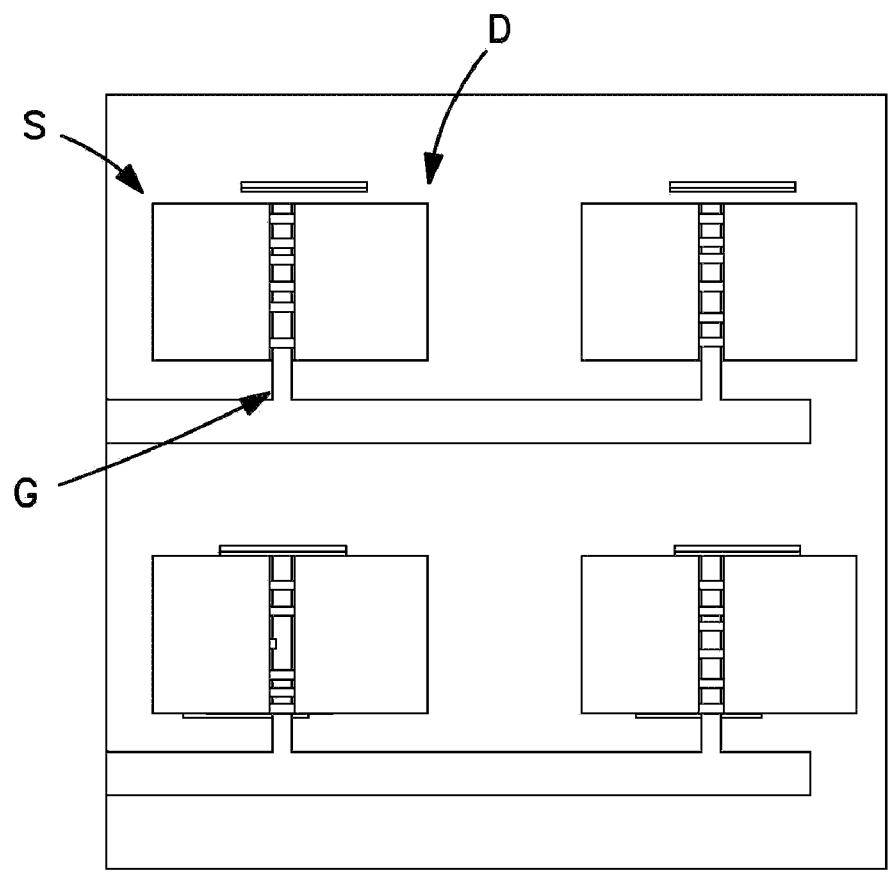

As shown in FIG. 10C, the method further comprises the step of assembling composite printable semiconductor elements 550 onto gate electrodes 547 and substrate 548 via dry transfer contact printing or solution printing. Composite printable semiconductor elements 550 are oriented such that SiO$_2$ dielectric elements 560 are in contact with gate electrodes 547. As shown in FIG. 10D, the method further comprises the step of spin coating a thin layer of positive photoresist 561 on the patterned surface of substrate 548. Alternatively, the thin layer of positive photoresist 561 may be applied to the pattern surface of substrate 548 using a roller. Regions of photoresist 561 not masked by gate electrodes 547 are exposed to a beam of electromagnetic radiation transmitted through underside 562 of substrate 548. Use of an optically transmissive substrate 548 is preferred for this method of the present invention, particularly a substrate 548 that is at least partially transparent in ultraviolet and/or visible regions of the electromagnetic spectrum. As shown in FIG. 10E, the method further comprises the step of developing the thin photoresist layer. As shown in this figure, the regions of thin photoresist layer 561 that are shadow masked by the gate electrodes are undeveloped. As shown in FIG. 10F, the method further comprises the step of dry or wet etching the integrated SiO$_2$ dielectric, thereby opening contacts for source and drain electrodes. In the embodiment illustrated by FIG. 10F this is achieved by exposing the patterned surface of substrate 548 to a CF$_4$ plasma. As shown in FIG. 10G, the method further comprises the step of defining source and drain electrodes by shadow mask evaporation. The alignment of semiconductor elements, source electrodes and drain electrodes does not need to be very precise because the semiconductor channels will be defined in the next fabrication step. As shown in FIG. 10H, the method further comprises the step of defining the semiconductor channel by lifting off the positive resist, for example by exposure to a solvent such as acetone.

Figure 11A:
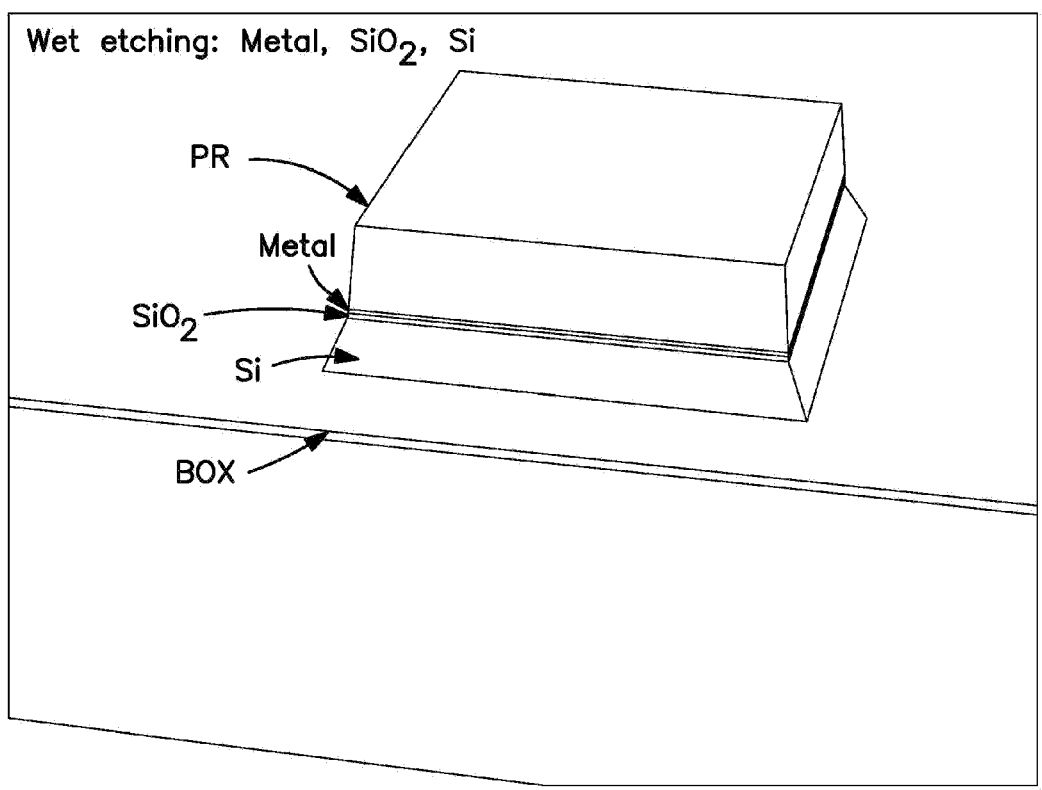
FIGS. 11A-D provide diagrams illustrating a method of the present invention for making a printable device comprising integrated gate electrode, gate dielectric, semiconductor, source electrode and drain electrode.

FIGS. 11A-D provide diagrams illustrating a method of the present invention for making a printable device comprising integrated gate electrode, gate dielectric, semiconductor, source electrode and drain electrode. As shown in FIG. 11A, a high quality gate dielectric is grown by thermal oxidation of the surface of a SOI wafer. Next, the gate electrode material (such as metal or doped poly-silicon) is deposited. Selected regions of the top surface are subsequently masked using for example a lithography process. In one embodiment, an array of identical patterns with controlled spacing will be defined in a single masking step. Printable semiconductor elements are then fabricated by anisotropically wet and/or dry etching. Preferentially, three different selective etching processes are carried out sequentially to etch away the exposed areas of the gate electrode material, the gate dielectric and the top silicon layer.

Figure 11B:
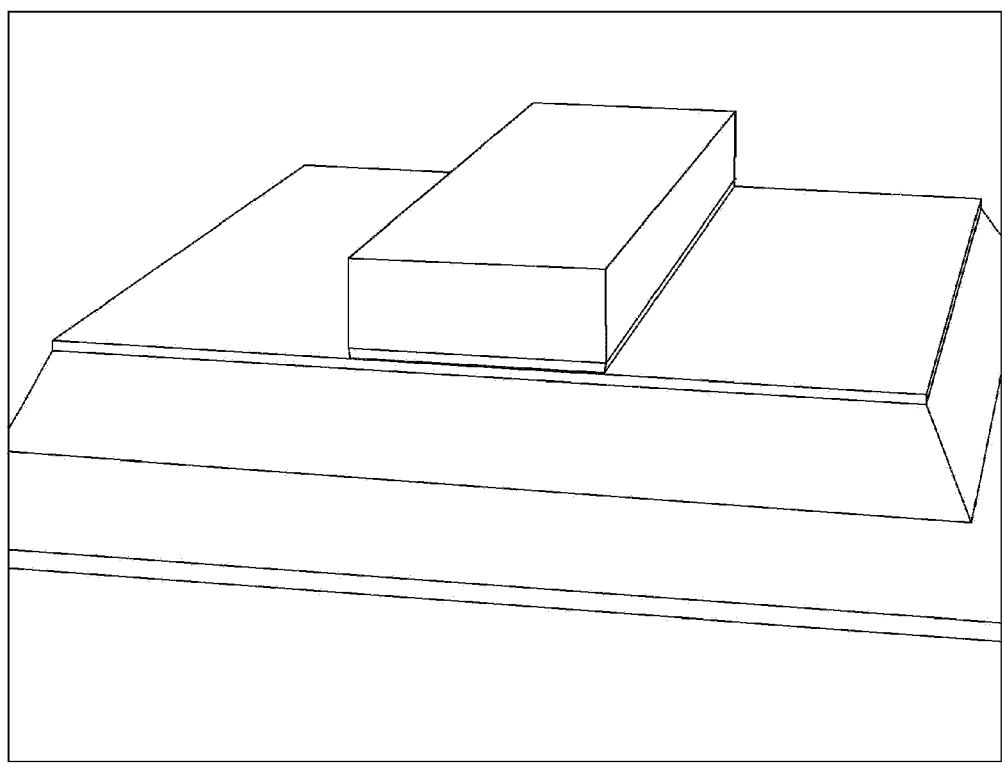
Figure 11C:
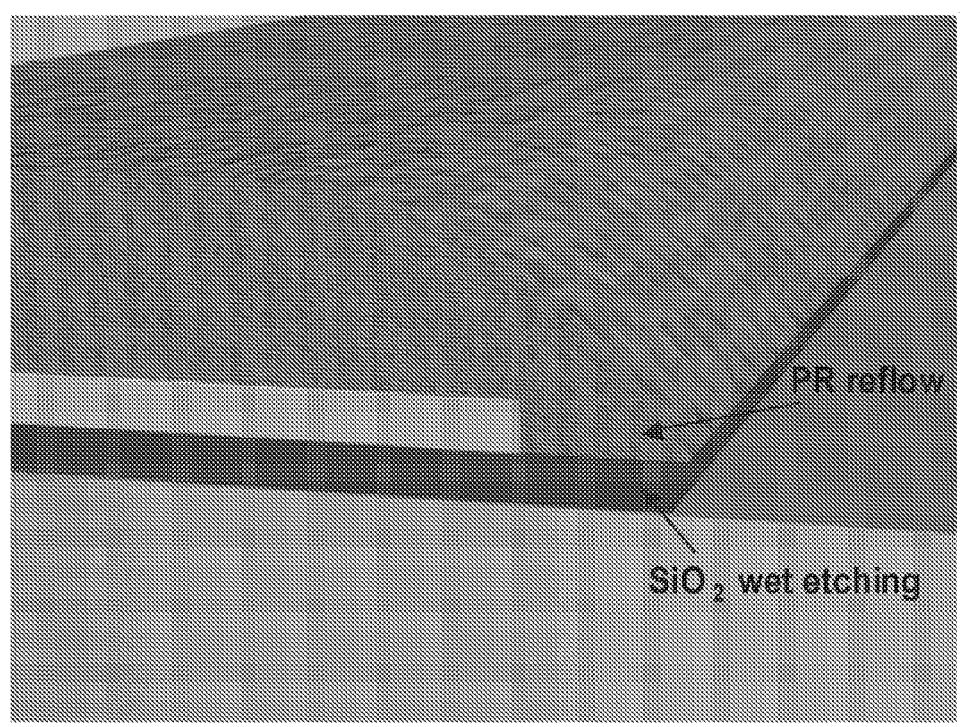

A lithography process, as shown in FIG. 11B, is used to define the channel of the transistors. In this process step, the exposed areas of the gate electrode material are etched away (dry or wet etching). As shown in FIG. 11C, the photoresist is then heated above its glass transition, thereby initiating a reflow process. The reflowing distance of the photoresist can be selected by carefully selecting an appropriate thickness of the photo-resist layer, the glass transition temperature of the photo-resist layer or the temperature and duration of the reflow process. The exposed areas of the gate dielectric are then etched using an HF solution.

Figure 11D:
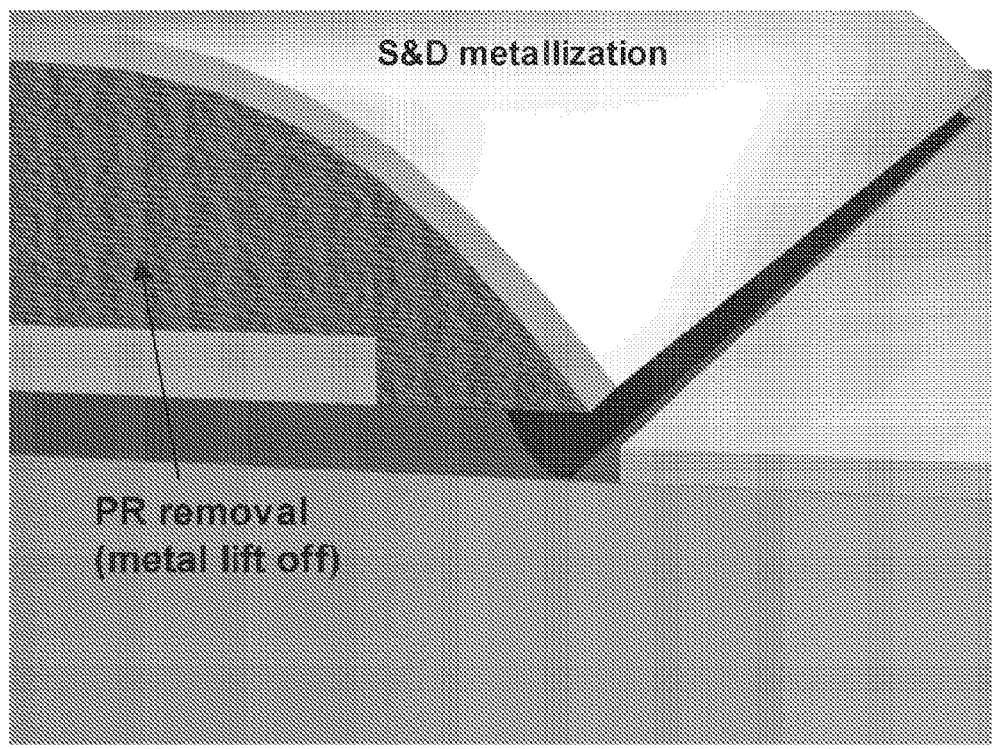

Next, a metallization process, as shown in FIG. 11D, is carried out, followed by lifting off the metal deposited onto the photoresist to complete the fabrication of a printable device. The source and drain electrodes are self aligned with the gate, and the spacing between source and drain electrodes may be selected by the adjusting the different parameters, such as temperature and duration, of the reflow process.

The printable device shown in FIG. 11D may be transferred and assembled onto a substrate, such as a plastic substrate, by the dry transfer or solution printing methods of the present invention. The self aligned process illustrated in FIGS. 11A-D presents a simple way to integrate all the elements necessary for the realization of a printable device, such as a MOSFET device. A significant advantage of this fabrication method of the present invention is that all processes steps which require temperatures incompatible with plastic substrates (e.g. requiring temperature>about 400 Celsius) may be carried on the SOI substrate prior to lifting off and transferring the device to the substrate. For example, additional processing steps such as doping of the source and drain contact areas, formation of silicide layers, and high temperature annealing of the device could be performed prior to transferring the elements onto a plastic substrate.

EXAMPLE 2

Stretchable Printable Semiconductor Elements

The present invention provides stretchable printable semiconductor elements capable of providing good performance when stretched, flexed or deformed. Further, stretchable printable semiconductor elements of the present invention may be adapted to a wide range of device configurations to provide fully flexible electronic and optoelectronic devices.

Figure 12A:
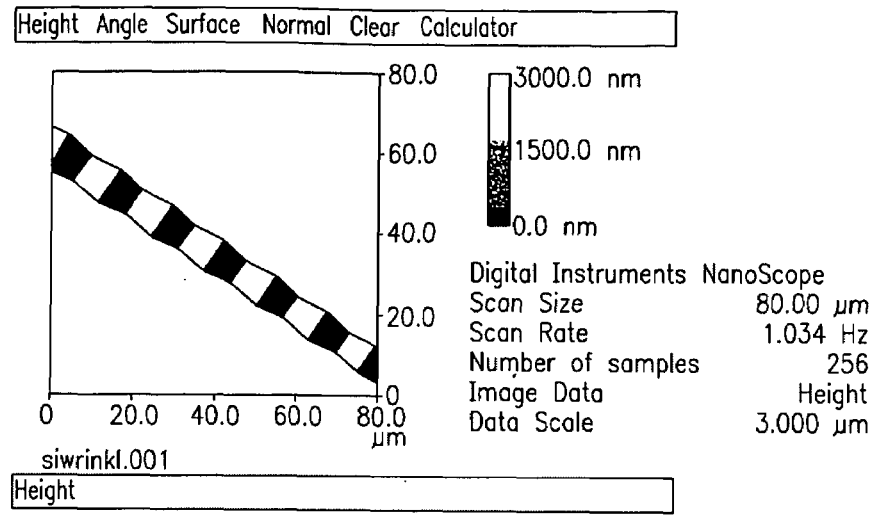
FIGS. 12A-C provide schematic drawings representing an atomic force micrograph showing a stretchable printable semiconductor element of the present invention.
Figure 12B:
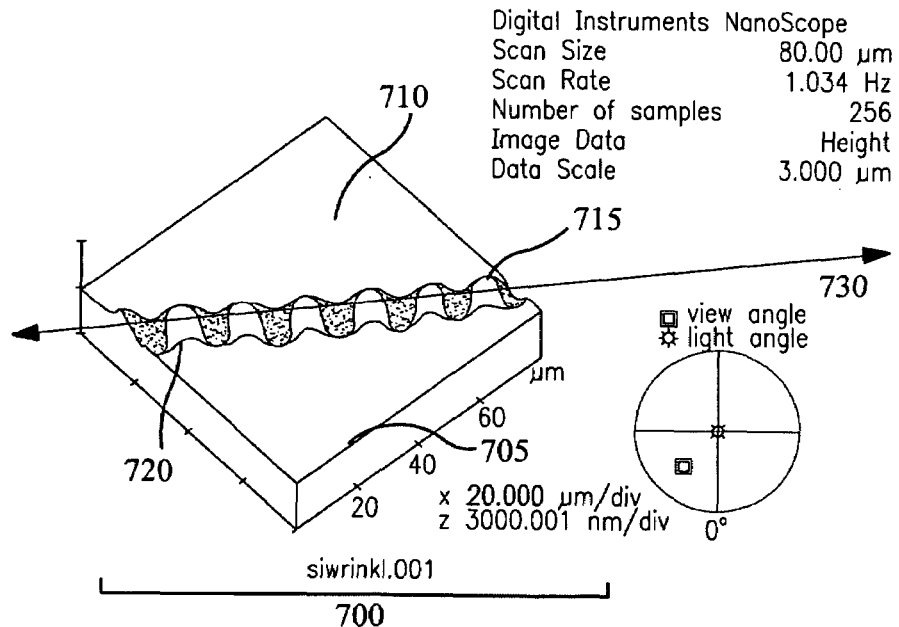
Figure 12C:
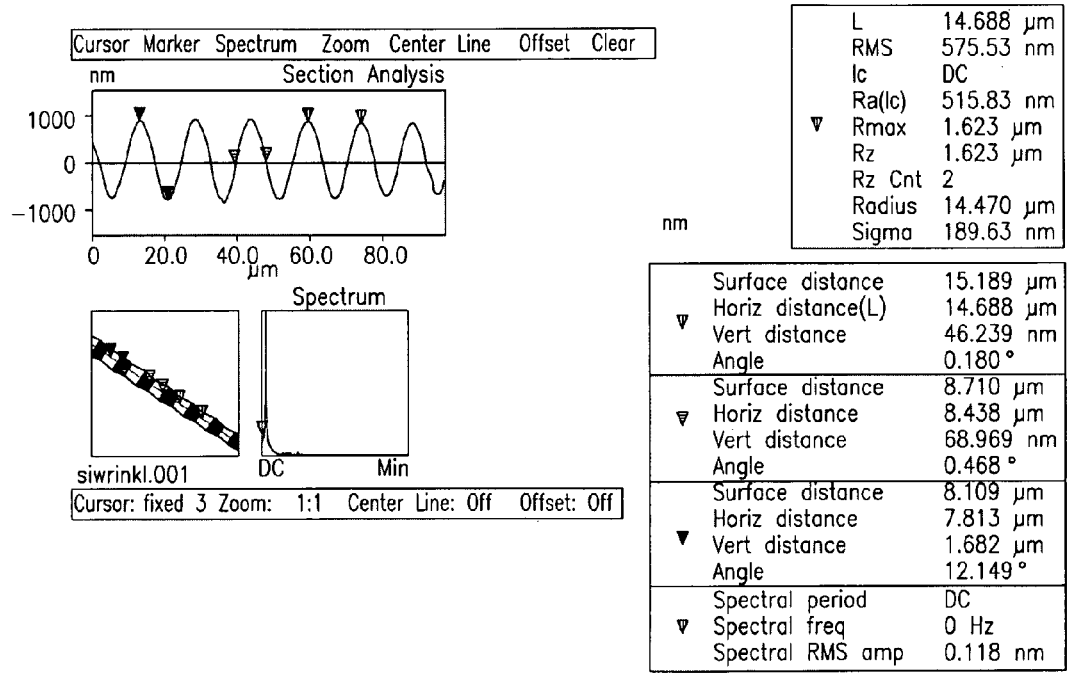
Figure 13A:
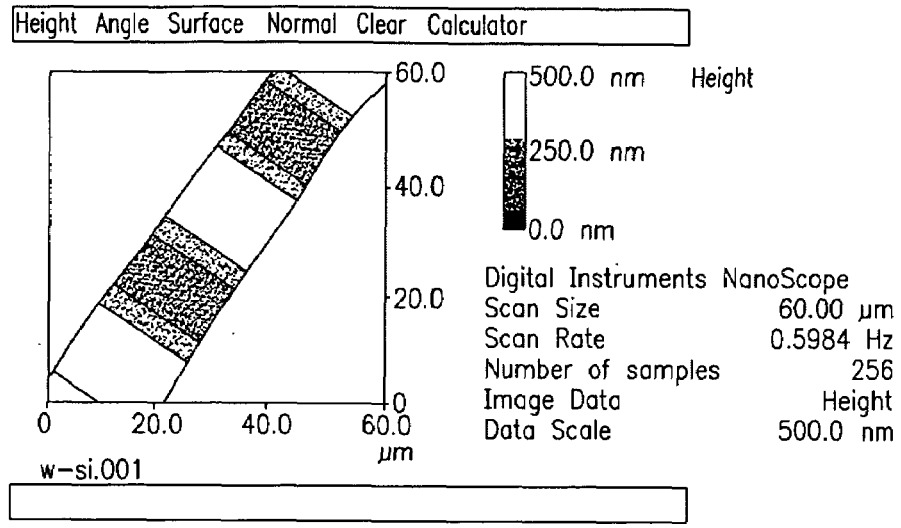
FIGS. 13A-E show schematic drawings representing an atomic force micrograph providing an expanded view of a semiconductor structure having curved internal surface.
Figure 13B:
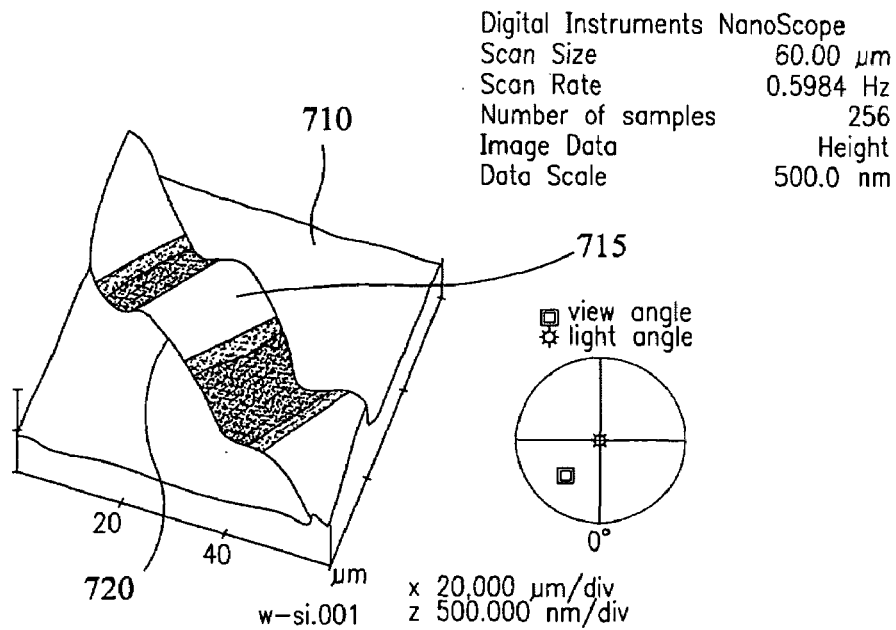
Figure 13C:
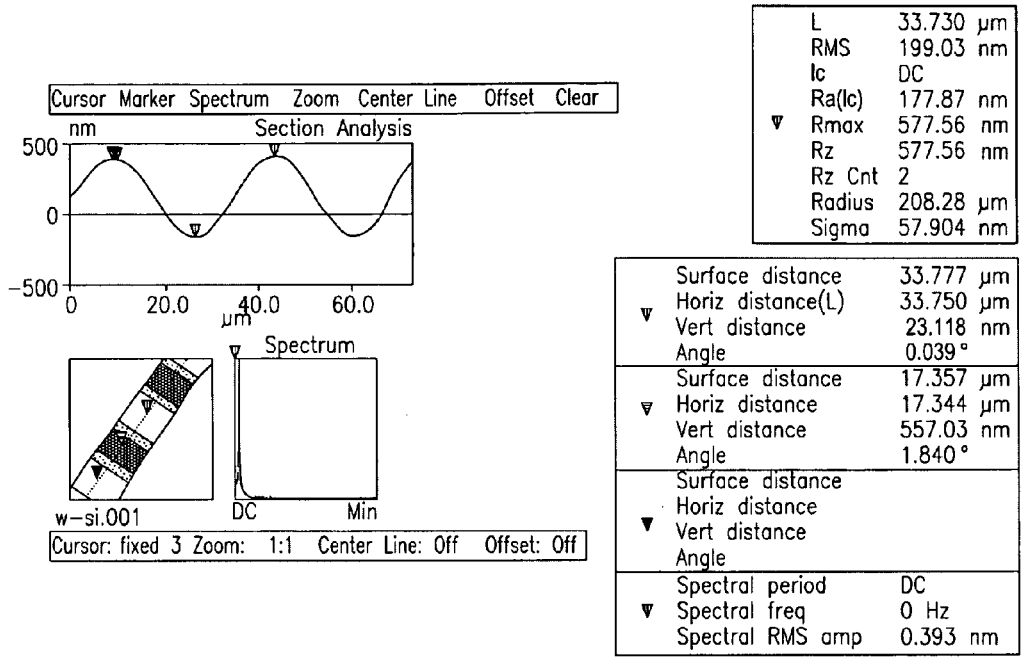
Figure 13D:
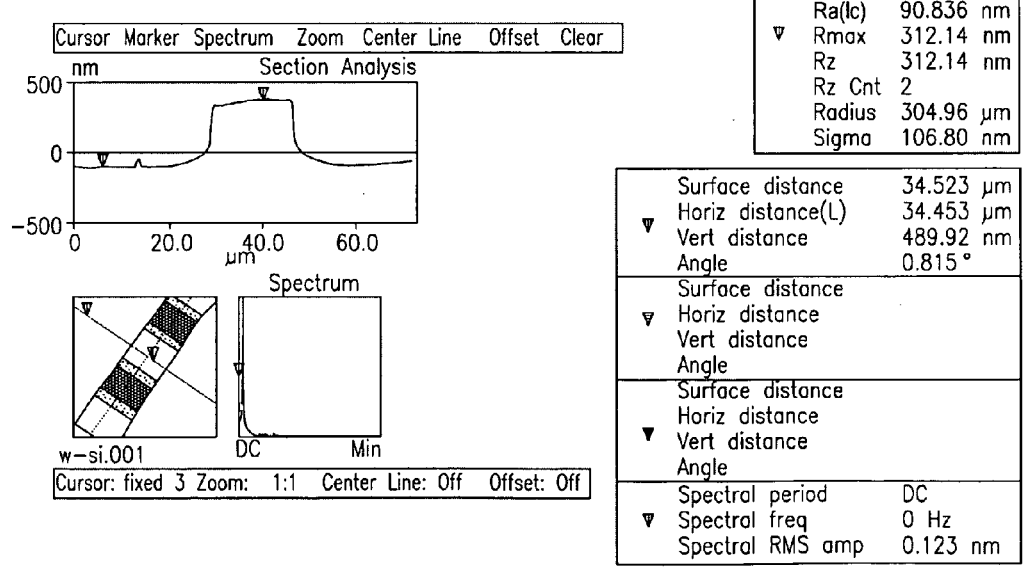
Figure 13E:
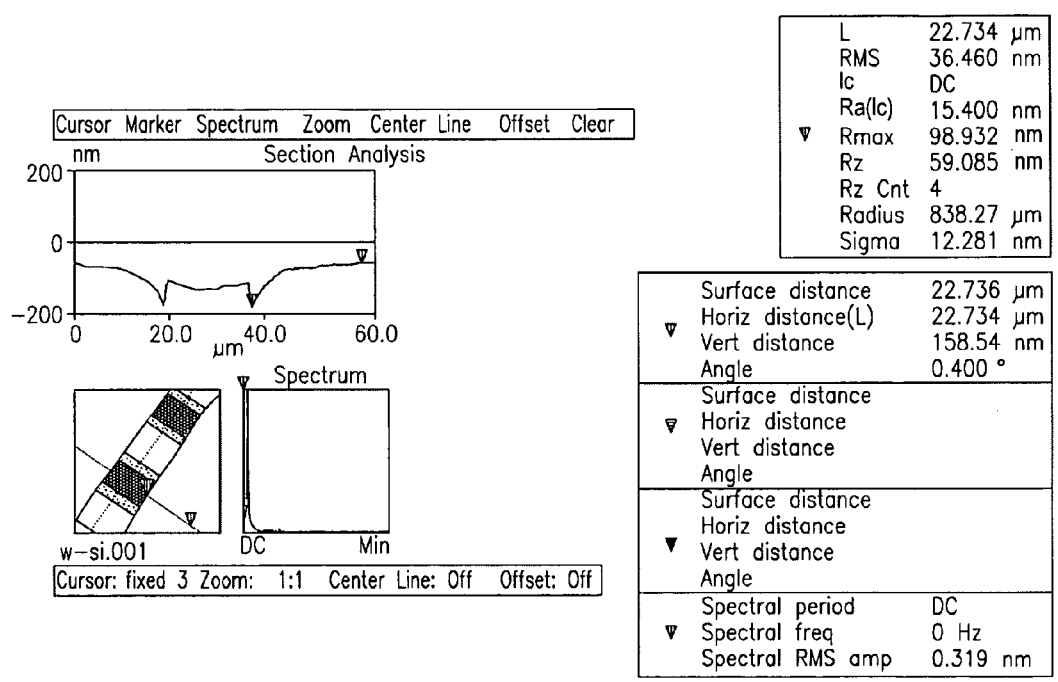

FIGS. 12A-C provide schematic drawings illustrating an atomic force micrograph showing a stretchable printable semiconductor element of the present invention. The stretchable printable semiconductor element 700 comprises a flexible substrate 705 having a supporting surface 710 and a bent semiconductor structure 715 having a curved internal surface 720. In this embodiment, at least a portion of the curved internal surface 720 of bent semiconductor structure 715 is bonded to the supporting surface 710 of the flexible substrate 705. The curved internal surface 720 may be bonded supporting surface 710 at selected points along internal surface 720 or at substantially all points along internal surface 720. The exemplary semiconductor structure illustrated in FIGS. 12A-C comprises a bent ribbon of single crystalline silicon having a width equal to about 100 microns and a thickness equal to about 100 nanometers. The flexible substrate illustrated in FIGS. 12A-C is a PDMS substrate having a thickness of about 1 millimeter. Curved internal surface 720 has a contour profile characterized by a substantially periodic wave extending along the length of the ribbon. As shown in FIGS. 12A-C, the amplitude of the wave is about 500 nanometers and the peak spacing is approximately 20 microns FIGS. 13A-F shows schematic drawincis illustrinci an atomic force micrograph providing an expanded view of a bent semiconductor structure 715 having curved internal surface 720

Figure 14A:
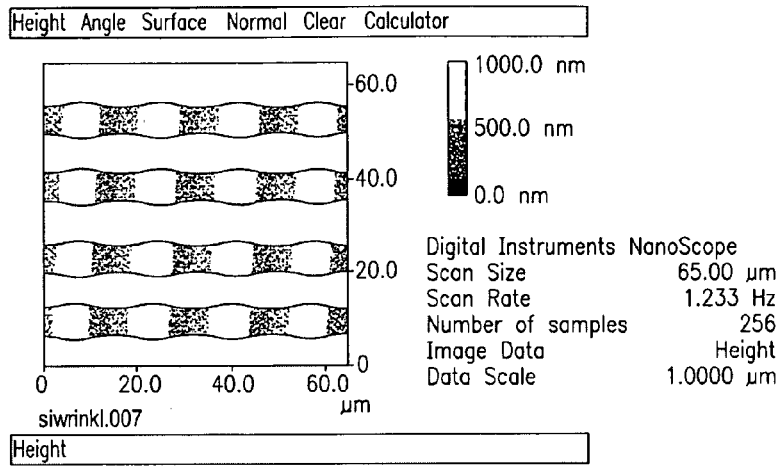
FIGS. 14A-C show schematic drawings representing an atomic force micrograph of an array of stretchable printable semiconductor elements of the present invention.
Figure 14B:
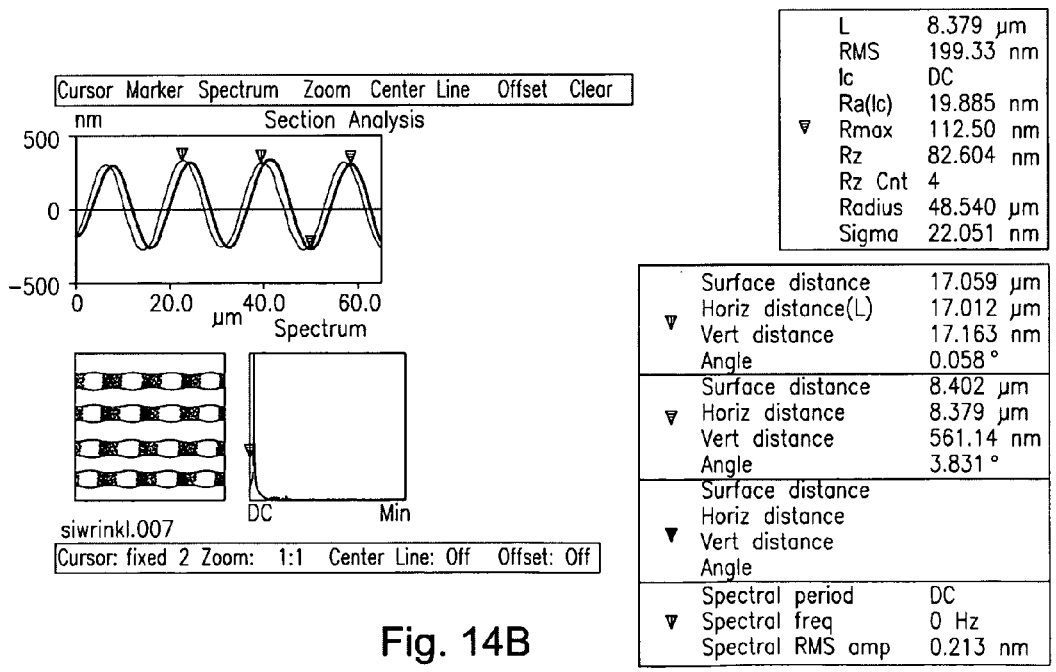
Figure 14C:
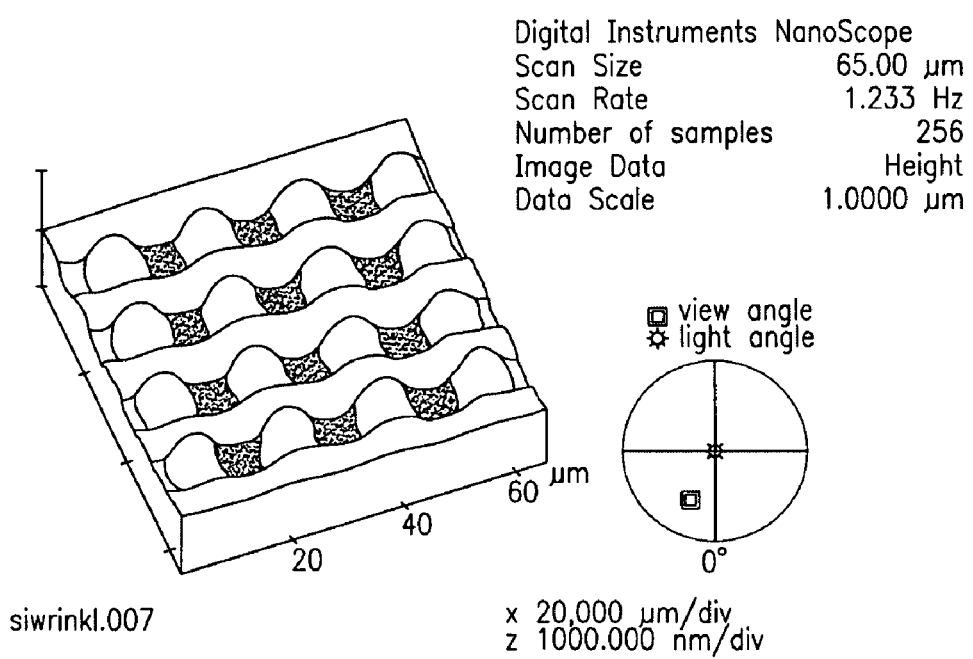

FIGS. 14A-B show schematic drawings illustrating an atomic force micrograph of an array of stretchable printable semiconductor elements of the present invention. Analysis of the atomic force micrograph in FIGS. 14A-B suggest that the bent semiconductor structures are compressed by about 0.27%. FIG. 15 shows optical micrographs of stretchable printable semiconductor elements of the present invention.

The contour profile of curved surface 720 allows the bent semiconductor structure 715 to be expanded or contracted along deformation axis 730 without undergoing substantial mechanical strain. This contour profile may also allow the semiconductor structure to be bent, flexed or deformed in directions other than along deformation axis 730 without significant mechanical damage or loss of performance induced by strain. Curved surfaces of semiconductor structures of the present invention may have any contour profile providing good mechanical properties, such as stretchabilty, flexibility and/or bendability, and/or good electronic performance, such as exhibiting good field effect mobilities when flexed, stretched or deformed. Exemplary contour profiles may be characterized by a plurality of convex and/or concave regions, and by a wide variety of wave forms including sine waves, Gaussian waves, Aries functions, square waves, Lorentzian waves, periodic waves, aperiodic waves or any combinations of these. Wave forms useable in the present invention may vary with respect to two or three physical dimensions.

Figure 16A:
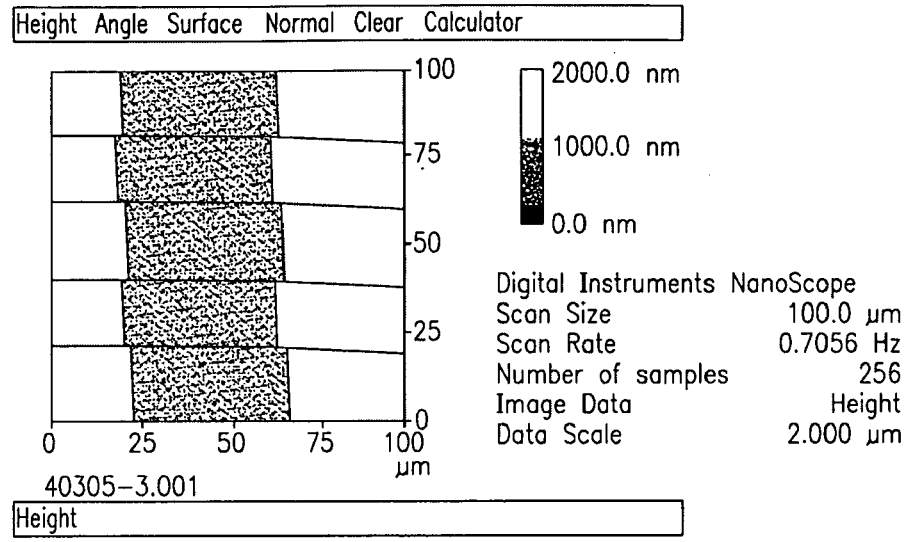
FIGS. 16A-B show schematic drawings representing an atomic force micrograph of a stretchable printable semiconductor element of the present invention having a semiconductor structure bonded to a flexible substrate having a three dimensional relief pattern on its supporting surface.
Figure 16B:
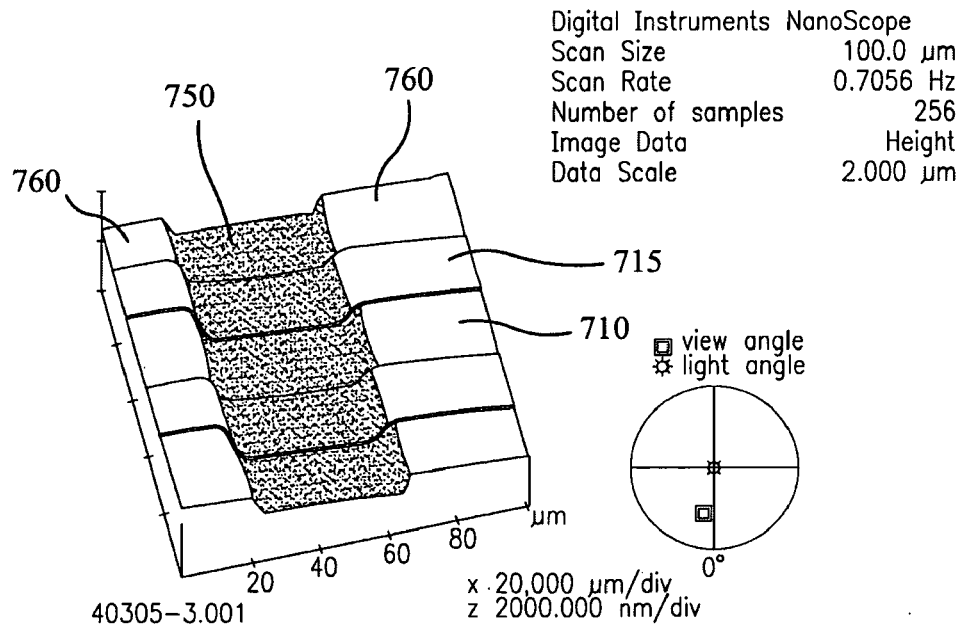

FIGS. 16A-B show schematic drawings illustrating an atomic force micrograph of a stretchable printable semiconductor element of the present invention having a bent semiconductor structure 715 bonded to a flexible substrate 705 having a three dimensional relief pattern on its supporting surface 710. The three-dimensional relief pattern comprises recessed region 750 and relief features 760. As shown in FIGS. 16A-B, bent semiconductor structure 715 is bound to supporting surface 710 in recessed region 750 and on relief features 760.

FIG. 17 shows a flow diagram illustrating an exemplary method of making a stretchable semiconductor element of the present invention. In the exemplary method, a prestrained elastic substrate in an expanded state is provided. Prestraining can be achieved by any means known in the art including, but not limited to, roll pressing and/or prebending the elastic substrate. An exemplary elastic substrate useable in this method of the present invention is a PDMS substrate having a thickness equal to about 1 millimeter. The elastic substrate may be prestrained by expansion along a single axis or by expansion along a plurality of axes. As shown in FIG. 17, at least a portion of the internal surface of a printable semiconductor structure is bonded to the external surface of the prestrained elastic substrate in an expanded state. Bonding may be achieved by covalent bonding between the internal surface of the semiconductor surface, by van der Waals forces, by using adhesive or any combinations of these. In an exemplary embodiment wherein the elastic substrate is PDMS, the supporting surface of the PDMS substrate is chemically modified such that is has a plurality of hydroxyl groups extending from its surface to facilitate covalent bonding with a silicon semiconductor structure. Referring back to FIG. 17, after binding the prestrained elastic substrate and semiconductor structure, the elastic substrate is allowed to relax at least partially to a relaxed state. In this embodiment, relaxation of the elastic substrate bends the internal surface of said printable semiconductor structure, thereby generating a semiconductor element having a curved internal surface.

As shown in FIG. 17, the fabrication method may optionally include a second transfer step wherein the semiconductor structure 715 having a curved internal surface 720 is transferred from the elastic substrate to another substrate, preferably a flexible substrate. This second transfer step may be achieved by bringing an exposed surface of the semiconductor structure 715 having a curved internal surface 720 in contact with a receiving surface of the other substrate that binds to the exposed surface of the semiconductor structure 715. Bonding to the other substrate may be accomplished by any means in the are including covalent bonds, bonding via van der Waals forces and the use of adhesives.

Stretchable semiconductor elements of the present invention may be effectively integrated into a large number functional devices and device components, such as transistors, diodes, lasers, MEMS, NEMS, LEDS and OLEDS. Stretchable semiconductor elements of the present invention have certain advantages over conventional rigid inorganic semiconductors. First, stretchable semiconductor elements may be flexible, and thus, less susceptible to structural damage induced by flexing, bending and/or deformation than conventional rigid inorganic semiconductors. Second, as a bent semiconductor structure may be in a slightly mechanically strained state to provide a curved internal surface, stretchable semiconductor elements of the present invention may exhibit higher intrinsic field effect mobilities than conventional unstrained inorganic semiconductors. Finally, stretchable semiconductor elements are likely to provide good thermal properties because they are capable of expanding and contracting freely upon device temperature cycling.

EXAMPLE 3

Methods of Making Printable Semiconductor Elements

The present invention provides methods of making printable semiconductor elements from a wide range of starting materials, including single crystalline wafers, silicon on substrate wafers, germanium wafers, thin films of polycrystalline silicon and ultra thin silicon wafers. Particularly, the present invention provides low cost methods of making large numbers of printable semiconductors in selected orientations and relative positions.

FIG. 18A shows an exemplary method for making printable semiconductor elements from a Si—Ge epi substrate. In this method, selective regions of a Si epi layer are masked by depositing a mask material, such as a thin films comprising a metal, $SiO_2$ or SiN. This masking step defines shape and some of the physical dimensions (e.g. length and width for a ribbon) of the printable semiconductor elements to be fabricated. The exposed Si surface of the Si—Ge epi substrate is anisotropically etched by either dry or wet chemical etching methods. This generates relief features of silicon, preferably having smooth side walls, that can be effectively released from the Si-Ge epi substrate by lift off techniques, for example using selective SiGe wet etching provided by $NH_4OH:H_2O_2:H_2O$ 1:1:4 at 50° C. Optionally, source electrode, gain electrode, gate electrode, dielectric element or any combinations of these may be integrated into the semiconductor element prior to lift off. An advantage of this fabrication method is that the mother substrate can be cleaned and re-used.

Figure 18B:
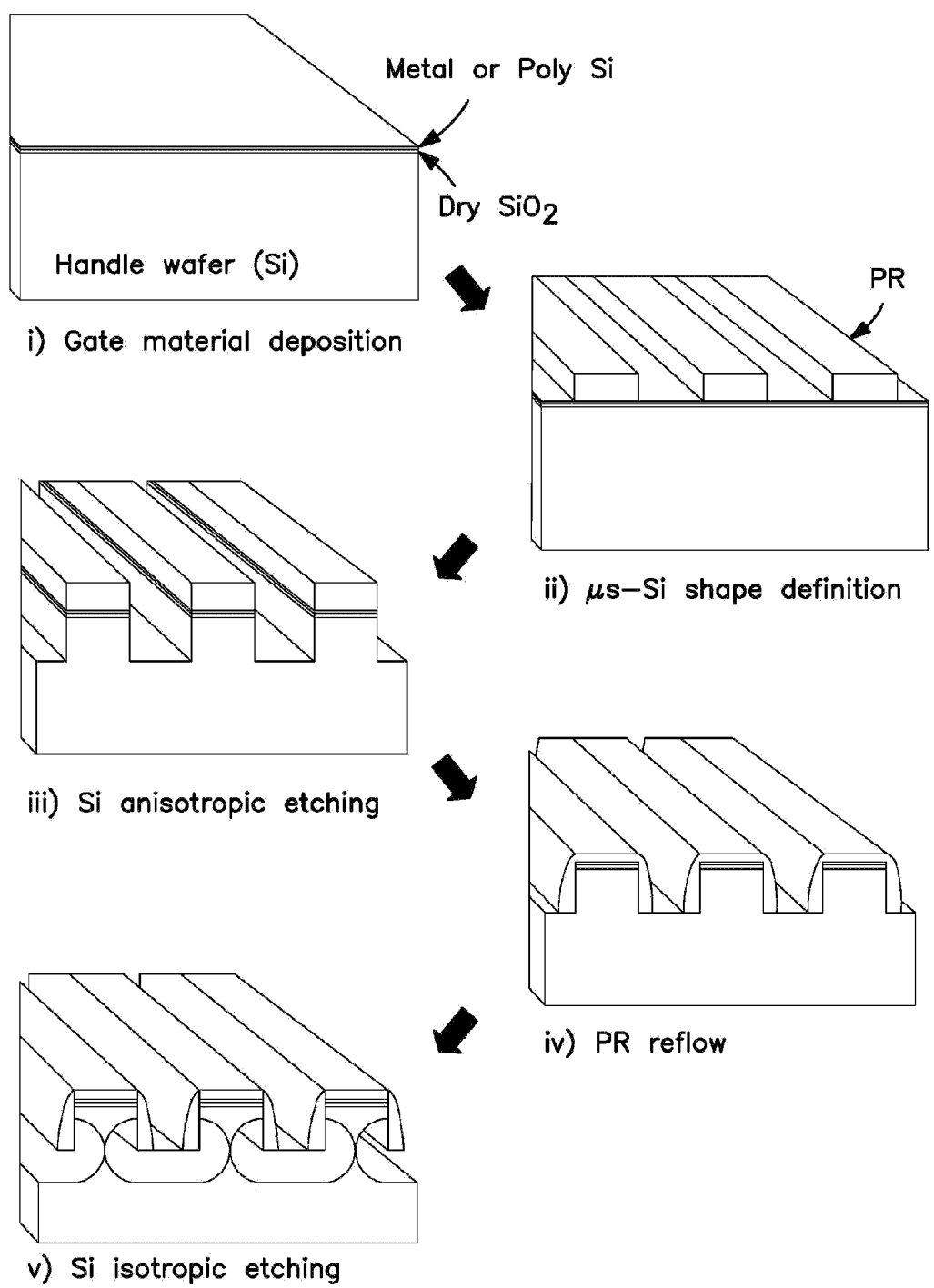
FIG. 18B shows an exemplary method for fabricating printable semiconductor elements from a bulk silicon substrate, preferably a single crystalline silicon substrate.

FIG. 18B shows an exemplary method for fabricating printable semiconductor elements from a bulk silicon substrate, preferably a single crystalline silicon substrate. In this method, a silicon wafer is first dry oxidized, for example in a quartz tube furnace at a temperature selected from the range of about 800 degrees Celsius to about 1200 degrees Celsius. Next, a thin layer of gate material is deposited on the oxidized surface of the silicon wafer. Exemplary gate materials include metals or doped polycrystalline silicon. The thin layer of gate material is selectively patterned with photoresist. This patterning step defines the shape and some of the physical dimensions (e.g. length and width for a ribbon) of the printable semiconductor elements to be fabricated. The thin layer of gate material and dielectric layer are anisotropically back etched, thereby generating relief features comprising a photoresist layer, gate material layer, dielectric layer and silicon layer and, preferably having smooth side walls. Next, the photoresist layer is reflowed, for example by annealing to a temperature selected from the range of about 100 degrees Celsius to about 130 degrees Celsius. Reflowing the photoresist transfers a portion of the photoresist to the side walls of the relief features. As shown in FIG. 18B, the exposed Si surface is isotropically etch using wet or dry etching methods, thereby releasing the relief features and generating composite printable semiconductor elements, preferably having smooth surfaces. Isotropic etching of the silicon may be achieved using a $HNO_3:NH_4F:H_2O$ 64:3:33 solution. Advantages of this fabrication method are the relatively low cost of the silicon substrate starting materials and the ability to reuse the mother substrate after planarization (ECMP).

FIG. 18C shows another exemplary method of fabricating printable semiconductor elements from a bulk silicon substrate, preferably a single crystalline silicon substrate. In this method, the external surface of a bulk silicon substrate is selectively patterned with photoresist. This patterning step defines the shape and some of the physical dimensions (e.g. length and width for a ribbon) of the printable semiconductor elements to be fabricated. The patterned substrate surface is anisotropically etched, preferably using dry etching methods such as reactive ion etching and inductive coupled plasma etching, thereby generating relief features, preferably relief features having smooth side walls. At least a portion of the side walls of the relief features are masked by depositing a masking material such as a thin layer of metal, $SiO_2$ or SiN. In one embodiment, masking material is applied to the side walls of relief features by angled evaporative or sputtering deposition techniques combined with sample rotation to ensure deposition all exposed side walls. As shown in FIG. 18C, the exposed Si surface is isotropically etched using wet or dry etching methods, thereby releasing the relief features and generating printable semiconductor elements, preferably having smooth surfaces. Isotropic etching of the silicon may be achieved using a $HNO_3:NH_4F:H_2O$ 64:3:33 solution. Advantages of this fabrication method are the relatively low cost of the silicon substrate starting materials and the ability to reuse the mother substrate after planarization (ECMP).

FIG. 18D shows yet another exemplary method of fabricating printable semiconductor elements from a bulk silicon substrate, preferably a single crystalline silicon substrate. In this method, the external surface of a bulk silicon substrate is selectively patterned with photoresist. The patterned substrate surface is anisotropically etched, thereby generating relief features. Next the silicon substrate is annealed, for example by annealing in a quartz furnace at a temperature of about 1100 degrees Celsius and in nitrogen. Next, the surface of the annealed silicon substrate is patterned by masking selected regions with photoresist. This patterning step defines the shape and some of the physical dimensions (e.g. length and width for a ribbon) of the printable semiconductor elements to be fabricated. As shown in FIG. 18D, the patterned surface of the annealed Si substrate is anisotropically etched using wet or dry etching methods, thereby generating printable semiconductor elements, preferably having smooth surfaces. Advantages of this fabrication method are the relatively low cost of the silicon substrate starting materials, the ability to reuse the mother substrate after planarization (ECMP) and the ability to integrate source electrode, drain electrode, gate electrode and dielectric device components after the annealing step. In addition, wet etching may be used in the first etching step with a 110 silicon wafer.

FIG. 18E shows an exemplary method of fabricating printable semiconductor elements from an ultra thin silicon substrate. In this method, the external surface of an ultra thin silicon substrate is selectively patterned with photoresist. This patterning step defines the shape and some of the physical dimensions (e.g. length and width for a ribbon) of the printable semiconductor elements to be fabricated. The patterned substrate surface is anisotropically etched through thickness of the ultra thin silicon substrate, thereby printable semiconductor elements. Ultra thin silicon substrates having thicknesses selected from the range of about 10 microns to about 500 microns are preferred for some applications of this fabrication method. An advantage of this fabrication method is the relatively low cost of the ultra thin silicon substrate starting materials.

FIGS. 18F and 18G show exemplary methods for making printable semiconductor elements from thin films of poly-crystalline silicon. In this method, a thin layer of polycrystalline silicon is deposited on a supporting substrate, such as glass or silicon substrate, having a sacrificial surface layers, such as a coating comprising SiN or $SiO_2$. The polycrystalline thin film is then annealed, and selective regions of a the exposed surface are selectively masked by depositing a mask material, such as a thin films comprising a metals, $SiO_2$ or SiN. This masking step defines shape and some of the physical dimensions (e.g. length and width for a ribbon) of the printable semiconductor elements to be fabricated. The patterned surface is anisotropically etched by either dry or wet chemical etching methods, generating relief features of silicon supported by the sacrificial layer, preferably relief features having smooth side walls. Isotropically etching the sacrificial layer releases the relief features, thereby generating printable semiconductor elements. An advantage of this fabrication method is that the supporting substrate can be cleaned an reused. Alternatively, a thin layer of polycrystalline silicon may be deposited directly on a $SiO_2$ substrate. As shown in FIG. 18G, similar annealing, patterning, anisotropic etching and lift off steps may be used to generate printable semiconductor elements. Optionally, source electrode, gain electrode, gate electrode, dielectric element or any combinations of these may be integrated into the semiconductor element prior to lift off in either of these methods.

FIGS. 18H(1) and 18H(2) illustrate a method for making single crystalline semiconductor films using printable semiconductor elements of the present invention. As shown in FIG. 18H(1), an amorphous or poly-crystalline semiconductor thin film is prepared on the surface of a substrate comprising an insulating material, such as $SiO_2$. The thin amorphous or poly-crystalline semiconductor film may prepared by any means known in the art including, but not limited to, deposition techniques such as vapor deposition or sputtering deposition. Also referring to FIG. 18H(1), a printable semiconductor element comprising a single crystalline semiconductor structure is transferred onto the surface of the substrate covered with the thin amorphous or poly-crystalline semiconductor film. Use of a single crystalline semiconductor structure having one long lateral dimension is preferred for some applications of this method. The present invention also includes methods wherein the printable semiconductor element comprising a single crystalline semiconductor structure is transferred onto the substrate surface prior to deposition of the amorphous or poly-crystalline semiconductor thin film.

As shown in FIG. 18H(2), the thin amorphous or poly-crystalline semiconductor film is annealed while in contact with the single crystalline semiconductor structure, for example by annealing at high temperatures such as temperatures greater than 1000 degrees Celsius. In this embodiment of the present invention, the single crystalline semiconductor structure acts as a seed promoting a phase transition throughout the thin film from an amorphous or poly-crystalline state to a well organized single crystalline state. As shown in FIG. 18H(2), the phase transition follows a front of a high temperature gradient which moves across the entire surface of the wafer. Different high temperature furnaces or focused optical systems may be used to produce the temperature gradient necessary to obtain an efficient phase conversion of the semiconductor thin film. An advantage of this process is that it may significantly reduce the cost of producing single crystalline semiconductor thin films, such as single crystalline silicon or germanium films.

Figure 18I:
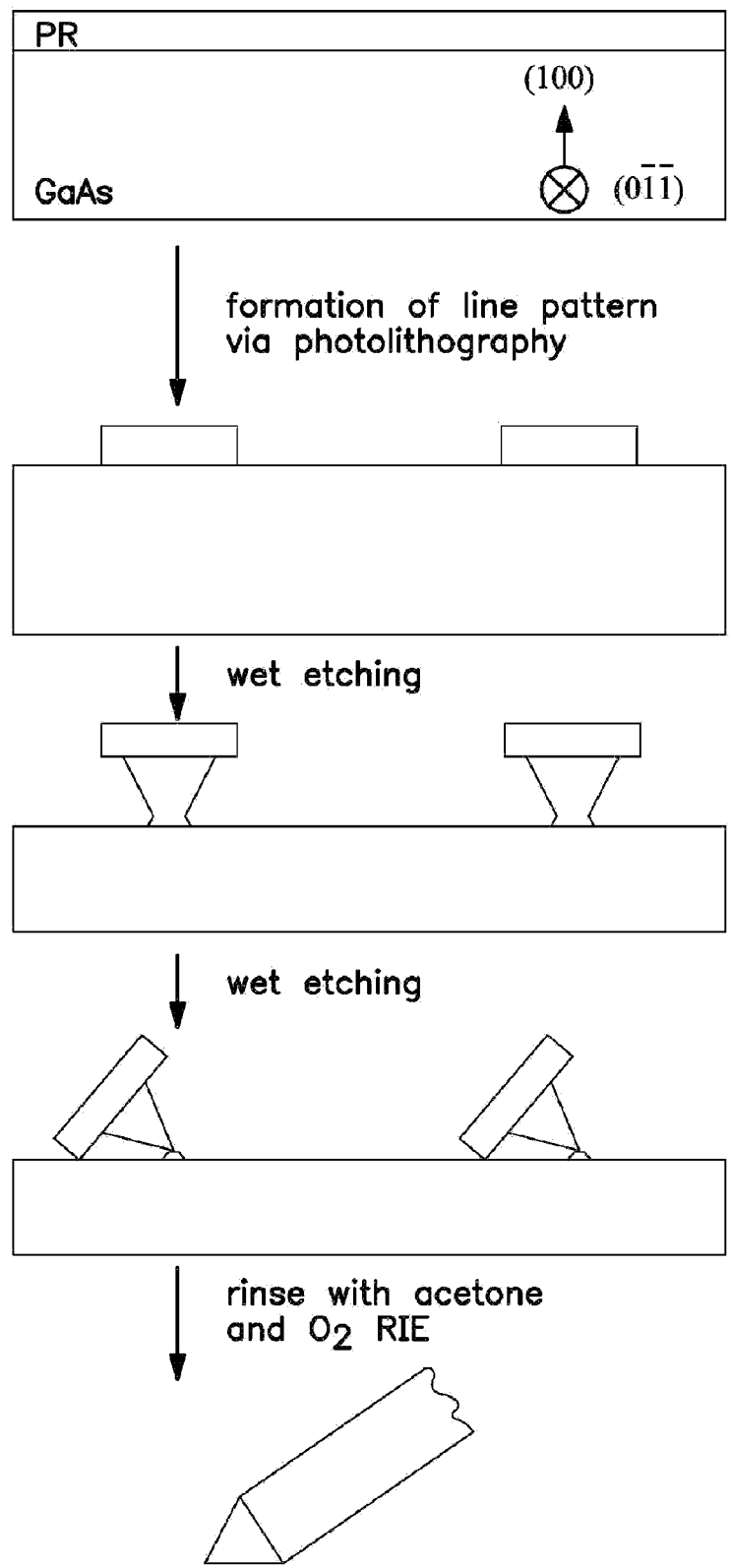
FIG. 18I shows an exemplary method of fabricating printable semiconductor elements comprising micro-wires from GaAs substrate.

FIG. 18I shows an exemplary method of fabricating printable semiconductor elements comprising micro-wires from GaAs substrate. As shown in this figure, the exposed surface of the GaAs substrate is patterned with mask material, such as photoresist. Patterning may be achieved by microcontact or nanocontact printing or via conventional photolithography, as shown in FIG. 18E. The patterned surface is anisotropically etched using wet etching methods. In the example method shown, re-entrant profiles of side walls are obtained using a $H_3PO_4$—$H_2O_2$—$H_2O$ solution, and the relief features formed are etching until they are released from the GaAs substrate, thereby generating GaAs micro-wires. As shown, the photoresist layer may be removed by washing with acetone and exposure to $O_2$ reactive ion etching. An advantage of this technique is that the GaAs substrate may be reused after planarization (ECMP). This technique may also be used to fabricate micro-wires from an InP substrate.

FIG. 18J shows an alternative method for fabricating printable semiconductor elements comprising single crystalline silicon ribbons. The starting material in this method is a Si (110) wafer. As shown in FIG. 18J, an exterior surface of the Si (110) wafer is selected patterned with thin films of $SiO_2$ which serves as a mask during processing. This masking step defines shape and some of the physical dimensions (e.g. length and width for a ribbon) of the printable semiconductor elements to be fabricated. The exposed (i.e. unmasked) surface of the Si (110) wafer is then isotropically etched by either dry or wet chemical etching methods. This processing step generates relief features of silicon, preferably having smooth side walls separated by a series of trench have a selected depth. The silicon relief features are then released from the Si (110) wafer by isotropic etching and liftoff processing, thereby generating printable semiconductor elements. Optionally, source electrode, gain electrode, gate electrode, dielectric element or any combinations of these may be integrated into the semiconductor element prior to lift off. An advantage of this fabrication method is that the mother substrate can be cleaned and re-used. FIG. 18J also shows SET micrographs of Si (110) at various points in the processing method.

FIG. 18K shows an alternative method for fabricating printable semiconductor elements comprising single crystalline silicon ribbons. The starting material in this method is a Si (111) wafer. The Si (111) wafer is selective isotropically etched for example using a combination of conventional photolithography masking and wet etching methods. This processing step generates relief features of silicon. As shown in FIG. 18K, the side walls, surface or both of the silicon relief features are coated using a passivation process. Printable single crystalline silicon ribbons are released from the Si (111) wafer by isotropic etching and liftoff processing. FIG. 18J also shows SET micrograph of single crystalline silicon ribbons generated by this method just prior to liftoff.

EXAMPLE 4

Methods of Making Semiconductor Nanowires and Microwires

It is a goal of the present invention to provide methods of making semiconductor nanowires and microwires having good mechanical and electrical properties allowing for their use in a wide variety of devices, device components and device settings. It is further a goal of the present invention to provide methods of assembling nanowires and microwires to construct selected single layer structures, multilayer structures and functional devices comprising these elements. To assess the utility of the methods of the present invention, nanowires and microwires of GaAs and InP were fabricate and evaluated with respect to their electrical conductivity and mechanical flexibility in a range of device configurations. In addition, the ability of the present methods to assemble large numbers of nanowires and microwires in well defined positions and orientations corresponding to large substrate surface areas was evaluated by fabricating a number of complex nano/microwire assemblies comprising single layer structures and multilayer structures. The present methods of making and assembling GaAs and InP nanowires and microwires were demonstrated to provide excellent control over wire width, length and spatial orientation. In addition, the GaAs and InP nanowires and microwires fabricated exhibited good mechanical and electrical properties when integrated into microelectronic devices.

Figure 19A:
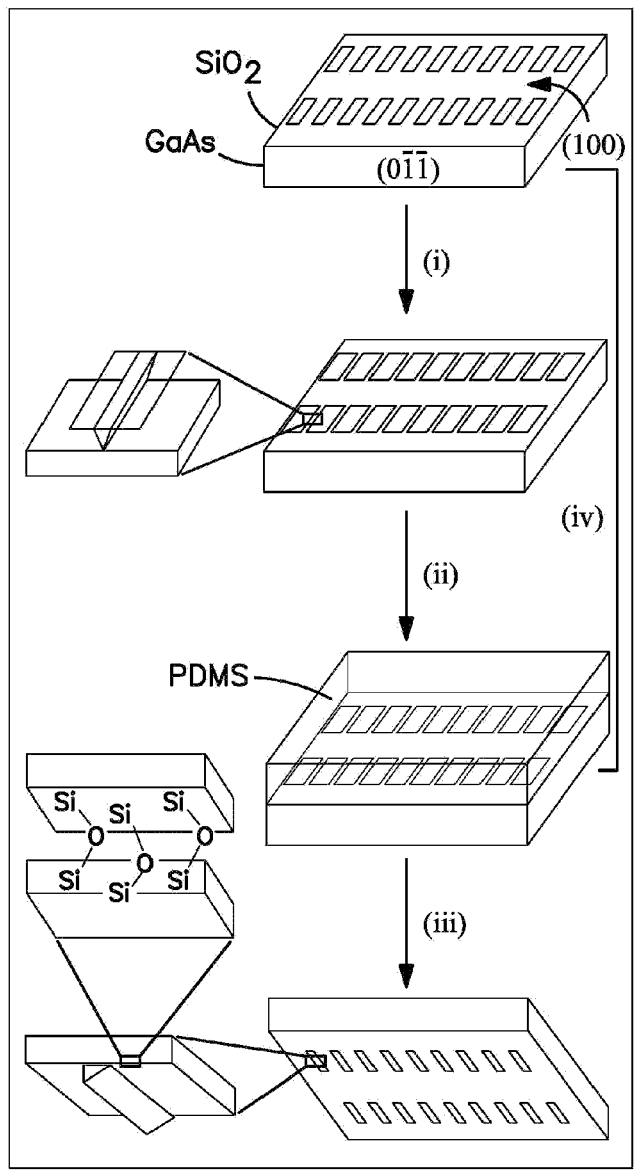
FIG. 19 provides a schematic diagram illustrating the steps of an exemplary method of generating and transferring nanowire arrays of GaAs to a substrate, such as plastic substrate comprising poly(ethylene terephthalate) (PET) sheet coated with a thin layer of cured polyurethane (PU).
Figure 19B:
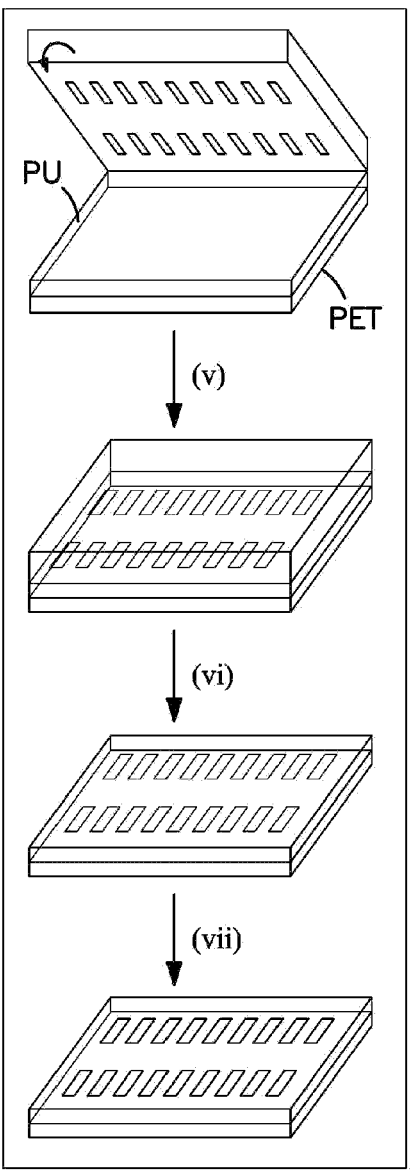

FIG. 19 provides a schematic diagram illustrating the steps of an exemplary method of generating and transferring nanowire arrays of GaAs to a substrate, such as plastic substrate comprising poly(ethylene terephthalate) (PET) sheet coated with a thin layer of cured polyurethane (PU). As shown in FIG. 19, the process begins with a piece of GaAs wafer with its surface oriented along the (100) direction (American Xtal Technology, Fremont, Calif.). Defining a etch mask of $SiO_2$ in the form of lines oriented along the ($0\bar{1}\bar{1}$) direction prepares the structure for anisotropic etching using an aqueous solution of $H_3PO_4$ and $H_2O_2$ comprising $H_3PO_4$ (85 wt %):$H_2O_2$ (30 wt %):$H_2O$=1:13:12 in volume (step i in FIG. 19). This etching chemistry, when applied in this fashion, exhibits high anisotropy, thereby generating sharply defined reverse mesa-shaped profiles of GaAs under the $SiO_2$ mask stripes. For sufficient etching times, the two side walls of each reverse mesa intersect, resulting in the formation of a wire with triangular cross section. This triangular cross section is exemplified in the top inset of panel A (left side) of FIG. 19.

In one embodiment, the patterned $SiO_2$ lines are surrounded by bulk $SiO_2$ film, which results in both ends of each GaAs wire being connected to the mother wafer. This connection confines the wires and preserves the spatial orientation and layout as defined by the pattern of $SiO_2$. FIG. 20A provides a scanning electron micrograph of free-standing GaAs wires obtained from GaAs wafer patterned with isolated $SiO_2$ lines. It is worthy of note that lateral undercutting of GaAs occurs along with the vertical etching, resulting in the ability to decrease the width of resultant GaAs wires down to nanometer scale even with $SiO_2$ lines that have micron widths.

GaAs wire arrays prepared by the present methods may be transfer printed to plastic sheets with retention of the orientation and relative position of individual wires in the array. In the embodiment illustrate in FIG. 19, a conformable elastomeric transfer element, such as a flat piece of poly(dimethylsiloxane), or PDMS, Sylgard 184, A/B=1:10, (Dow Corning), is placed on the GaAs wafer to pick up the wires (as shown in step ii of FIG. 19). In this embodiment, relatively strong bonding between PDMS sheet and the $SiO_2$ mask layer is required to break the crystalline connections to the underlying substrate at the ends of wires.

Cleaning the PDMS stamp and GaAs wafer having the $SiO_2$ mask with a weak oxygen plasma promotes formation of covalent siloxane (Si—O—Si) bonds between PDMS and $SiO_2$ by a condensation reaction (see the middle inset of FIG. 19). The present invention includes methods, therefore, wherein the elastomeric transfer element, semiconductor wafer having the $SiO_2$ mask or both are exposed to a weak oxygen plasma to provide effective and mechanically strong transfer of the semiconductor wafer having the $SiO_2$ mask to the elastomeric transfer element. The density of bonds over the interface is proportional to the number of —$O_n Si(OH)_{4-n}$ on the PDMS surface, which is highly dependent on the intensity of oxygen plasma and the treatment time. Treatment with a strong plasma for a long time can induce bonding that is too strong to release the wires from PDMS to the desired plastic substrates. Controlled experiments indicate that the PDMS and $SiO_2$ coated GaAs wafer treated by the plasma generated from $O_2$ at pressure of 10 mTorr, flow rate of 10 sccm, and power intensity of 10 W (Uniaxis 790, Plasma-Therm Reactive Ion Etching System) for 3 and 60 s, respectively, generated the best results. In these embodiments, the interaction between the e-beam evaporated $SiO_2$ mask layer and GaAs is strong enough to prevent delamination during the transfer process. Peeling the PDMS stamp away from the GaAs substrate after leaving it in contact with the GaAs wafer having the $SiO_2$ mask for ~2 hrs lifts off all of the wires (as illustrated in step iii of FIG. 19).

The present methods make the fabrication and assembly of large numbers of nanowires and/or microwires practically feasible. For example, the GaAs wafer after the transfer step (step iii of FIG. 19) can be polished to regenerate a flat surface for another run of wire fabrication (step iv of FIG. 19). The combination of wafer polishing with wire fabrication as described above makes it possible to generate a huge number of GaAs wires from a single piece of wafer. For example, one piece of GaAs wafer with diameter of 10 cm and thickness of 450 μm (commercially available from American Xtal Technology) can generate enough wires (~2.2 billions wires with widths of ~400 nm and lengths of 100 μm) to densely cover the entire surface of a plastic substrate with an area of 1.76 $m^2$ if one cycle of anisotropic etching and polishing consumes 2 μm GaAs in thickness. These conditions are typical of the results described in the present example. Accordingly, such repetitive application of wire fabrication followed by wafer polishing steps enables highly cost effective use of the bulk wafers.

As shown in steps v and vi of FIG. 19, the GaAs wires having $SiO_2$ mask elements can be effectively transferred to a substrate, such as a plastic substrate having an adhesive layer on its outer surface. In one embodiment, the PDMS stamp with bonded GaAs wires is exposed to ambient environment for one day or rinsed it with ethanol to reconstitute the PDMS surface to its native, hydrophobic status. This hydrophobic property of the PDMS surface substantially prevents the PDMS from strongly interacting with adhesives that are normally hydrophilic. When the recovered PDMS stamp is placed against an adhesive layer, such as a PU layer (obtained from Nolarland products, Cranbury, N.J.) spin-coated onto a plastic substrate (e.g., PET of ~175 μm in thickness, Mylar film, Southwall Technologies, Palo Alto, Calif.), only the GaAs wires attached to $SiO_2$ mask stripes are wettable to the adhesive. The thickness of PU layer can be varied from 1 to tens of microns by controlling the spin speed. Illuminating the sample with an ultraviolet lamp (Model B 100 AP, Black-Ray, Upland, Calif.) for 1 hr cures the PU layer and forms a strong bond between the cured PU and the GaAs wires and $SiO_2$ mask stripes and between the cured PU and the underlying PET sheet (step v in FIG. 19). Peeling away the PDMS stamp leaves the GaAs wires and $SiO_2$ stripes embedded in the matrix of cured PU with preservation of order and crystallographic orientation similar to those of wires prior to lift-off (step vi in FIG. 19). The separation of $SiO_2$ from PDMS stamp is enabled by two effects: i) moderate adhesion strength associated with sparse siloxane bonds at the interface between PDMS and $SiO_2$ which further weaken during the process of reconstituting PMDS surface; and ii) ultra-thin layer of $SiO_2$ (with thickness of several nanometers) that remains on the PDMS after cohesive failure of the $SiO_2$, which can be amorphous, incompact and fragile. Immersing the plastic sheet in a solution of buffered oxide etchant (BOE, $NH_4F$ (40 wt %):HF (49 wt %)=10:1) for 15 min removes the $SiO_2$ mask stripes, leaving the clean (100) top surfaces of the GaAs nanowires (step vii of FIG. 19) facing out.

This simple 'top down' approach to the fabrication and dry printing of GaAs wire arrays offers many advantages. For example, the geometries (i.e., length, width and shape) of the wires and their spatial organization can be defined by the initial lithographic step to satisfy the design of the desired electronic or optical end application. The transfer printing technique can generate yield as high as 100% with preservation of the patterns defined by the lithography. The well oriented crystallographic facets of the transferred wires (i.e., the top (100) surface) on plastic substrates provide an extremely flat top surface (having a flatness similar to that of original wafer), which is very useful for device fabrication. Furthermore, the $SiO_2$ mask stripes prevent the top surfaces of GaAs wires from becoming contaminated by organics, such as PDMS, PU and solvents used in the processing. Embedding the GaAs wires in cured PU immobilizes them, thereby preventing them from moving in lateral or vertical directions, especially when the plastic substrates are bent or twisted. it is important to note that PU and PET are only examples of materials usable in the present invention. Accordingly, it will be understood by persons skilled in that art that other adhesives, for example NEA 155 (Norland®) and other types of plastic sheets, for example Kapton® or polyimide film, can be used in the methods of the present invention.

Unlike 'bottom up' approaches of the prior art, the 'top down' processes of the present invention can generate GaAs nanowires with uniform lengths from several microns up to tens of centimeters (i.e., the diameter of original wafers). FIG. 20A shows an SEM image of free-standing GaAs nanowires with widths of ~400 nm and lengths of 2 cm which were randomly assembled on a mother wafer. The long nanowires formed curved structures during drying process, indicating the high degree of flexibility that is afforded by their narrow widths. As shown in the lower inset of FIG. 20A, the circled nanowire has a bend radius as small as ~20 μm, which suggests that nanowires with width of ~400 nm could withstand stain of ~1.3%. The upper inset in FIG. 20A provides a scanning electron micrograph image of the cross section before a nanowire lift off, which clearly shows formation of inverse mesa profiles of GaAs and undercutting from anisotropic etching.

In one aspect of the present invention, the width of the GaAs wires is controlled by selectively adjusting the width of $SiO_2$ mask lines, selectively adjusting the etching time or both. Widths between hundreds of microns and tens of nanometers are attainable using the present methods. Controlling etching time provides an easy way to generate nanowires from $SiO_2$ patterns having micron widths. FIGS. 20B-E show scanning electron micrograph images of individual wires obtained by etching the GaAs wafer patterned with 2 μm wide $SiO_2$ lines. The wires were transferred to a PDMS surface using the procedures described above to measure precisely the average width of their top surfaces (referred to as $\overline{w}_{wires}$). FIG. 20F provides a plot showing the dependence of the average width, $\overline{w}_{wires}$, of the top surfaces of wires fabricated by the present methods on etching time. This plot indicates that GaAs wires with widths down to 50 nm can be obtained using this embodiment of the present methods. The linear relationship between width and etching time is consistent with previous studies on etching kinetics of GaAs in $H_3PO_4$—$H_2O_2$—$H_2O$ solution, i.e., the etching rate was proportional to etching time when the molar ratio between $H_2O_2$ and $H_3PO_4$ ($n_{H2O2}/n_{H3PO4}$) was larger than 2.3 and the molar fraction of $H_2O$ ($r_{H2O}$) was equal to or less than 0.9 ($n_{H2O2}/n_{H3PO4}$ and $r_{H2O}$ of the etchant used in our experiments were 7.8 and 0.9, respectively). The statistical results show that the distributions of the widths of the wires (as determined by averaging along their lengths) was <9% for wires with widths of ~50 nm, which is somewhat narrower than the >14% variation in one type of 'bottom up' nanowires that has been reported to provide average widths of ~16.8 nm.

The scanning electron micrograph images shown in FIGS. 20B-D also show that the triangular cross sections of the wires is preserved during the thinning process, indicating the etching is highly anisotropic even for the free-standing GaAs wires. Close observations of the wires show that there is some roughness on their side walls. Much of this roughness comes directly from the lithographic procedures used to define the $SiO_2$ mask stripes; some is induced by the misalignment of mask lines and etching itself. This roughness determines the width of the smallest continuous wires that we could obtain using this embodiment of the present invention. As shown in FIG. 20F, the ratio between the width variation along individual wires and average wire width ($\overline{\sigma w}$) was also highly dependent on the etching time. Continuous GaAs nanowires can be prepared when the ratio was less than 100%. The curve provided in FIG. 20F indicates that the width of nanowires obtained from application of this embodiment of the present invention can be decreased down to ~40 nm. Nanowires with different average widths exhibited essentially the same width variation along individual wires (i.e., ~40 nm), which was close to the width variation along individual $SiO_2$ mask lines (i.e., ~36 nm). This comparison confirms that the roughness of wire side walls is mainly initiated by the rough edges of $SiO_2$ mask stripes regardless of etching times. Accordingly, use of lithographic procedures that reduce the roughness of the mask stripes reduces the roughness on the edges of the wires. It is important to note that the transfer printing process described in this example exposes the pristine, ultraflat unetched top surface of the wires for electrical connection and device fabrication on the final substrate (i.e. the PET of FIG. 19).

FIGS. 21A-G shows images of a variety of GaAs wire arrays printed on PDMS and PU/PET substrates. The wires in this case have widths of ~400 nm and lengths of ~100 μm. The corresponding SiO$_2$ mask lines had widths of 2 μm and lengths of 100 μm oriented along the (0 $\bar{1}$ $\bar{1}$) direction on the (100) GaAs wafers. FIG. 21A is a scanning electron micrograph image taken from an GaAs wire array bonded to a flat PDMS stamp via the SiO$_2$ mask layer, indicating that the order of wires was preserved. The inset of FIG. 21A shows the ends of three wires with relatively higher magnification, clearly revealing the breakage at their ends. As shown in FIG. 21B, peeling the PDMS stamp away from the cured PU left a smooth surface (as smooth as that of the PDMS) with the SiO$_2$ mask stripes facing out. As shown in FIG. 21C, etching away the SiO$_2$ layers with BOE exposes the pristine top surfaces of GaAs wires. FIG. 21D presents an optical image collected from a PU/PET substrate with embedded GaAs wires, indicating that large-area of wire arrays can be routinely printed on the PU/PET substrate using the method illustrate FIG. 19. GaAs wire arrays with other patterns (e.g., patches consisting of wires with different lengths) can also be transferred to PU/PET substrates.

The transfer process is repeated to print multiple layers of GaAs wire arrays on the same PET substrate by spin-coating a new layer of PU. These methods provide important pathways to generating multilayer structures comprising nanowires and/or microwires. FIGS. 21E and 21F give typical images of multilayer structures having double layers of GaAs wire arrays. In one embodiment, such multilayer structures are obtained by rotating the second layer with different angles (~90° and ~45° for E and F, respectively) relative to the first layer. FIG. 21G provide images of PU/PET substrates having three layers of GaAs wire array obtained by repeating the printing process on samples shown in FIGS. 21E and 21F. The thickness of the PU layer, which can be controlled by tuning the spin speed, controls the spacing between the wire arrays. This type of multilayer capability does not, of course, require any form of epitaxial growth, and the PU insulates the arrays in different levels. This fabrication capability is useful for a large number of device fabrication applications.

Figure 22A:
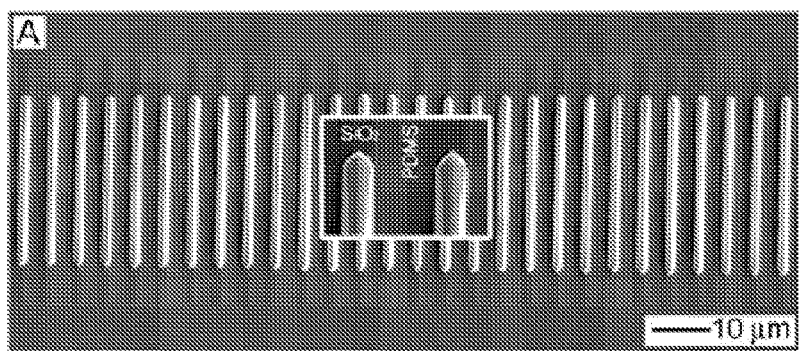
FIGS. 22A-C shows scanning electron micrograph images of an InP wire array on PMDS and PU/PET substrates.
Figure 22B:
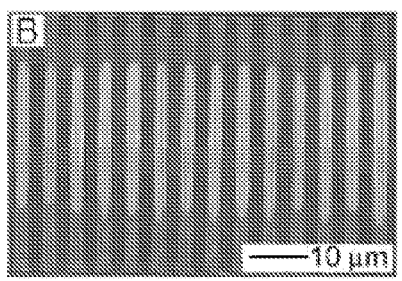
Figure 22C:
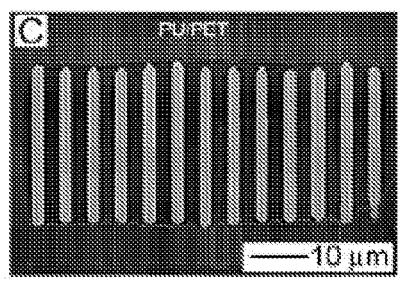

The wire fabrication and printing techniques of the present invention can be used to generate wire arrays of other semiconductor materials on plastic substrates by using suitable anisotropic etchants. For example, InP wires with triangular cross sections are fabricated by etching an (100) InP wafer having SiO$_2$ mask lines along (0 $\bar{1}$ $\bar{1}$) direction in a 1% (v/v) methanol solution of Br$_2$. FIGS. 22A-C shows scanning electron micrograph images of an InP wire array on PMDS and PU/PET substrates. These wires were fabricated from an InP wafer patterned with SiO$_2$ lines of 50 μm in length and 2 μm in width. The wires shown have lengths and widths of ~35 μm and ~1.7 μm, respectively. The etching behavior of InP in methanol solution of Br$_2$ is significantly different from that of GaAs in aqueous solution of H$_3$PO$_4$—H$_2$O$_2$ in terms of profile of wire ends and lateral undercutting. For example, the etching process disconnected all the ends of InP wires from the mother wafer even with an etch mask that was similar to the one used in fabrication of GaAs wires (FIG. 21). Furthermore, the degree of undercutting in InP is less than that in GaAs, indicating that InP wires with small widths (less than 500 nm) can be more easily prepared by using narrow SiO$_2$ stripes rather than by controlling the etching time.

Figure 23A:
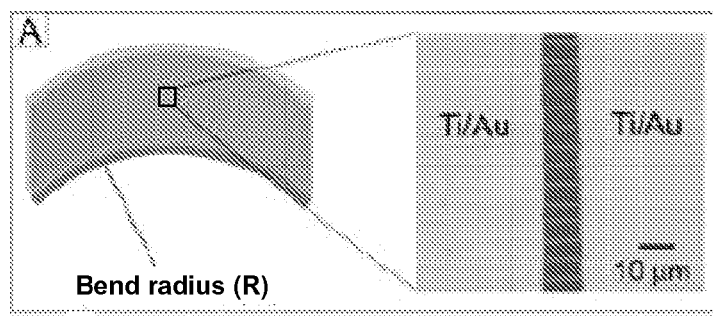
FIG. 23A provides a schematic diagram and image of an exemplary two terminal diode device comprising GaAs wire arrays.

The mechanical flexibility of a simple two terminal diode device made with GaAs wire arrays (same as those shown in FIG. 21 which were fabricated from Si-doped n-GaAs wafer with carrier density of $1.1\text{-}5.6\times10^{17}$ cm$^{-3}$) on a PU/PET substrate was evaluated by measuring the electrical properties as a function of bend radius. The structures were fabricated with GaAs wire arrays defined according to the methods of FIG. 19. Photolithography and metal deposition defined on these wires two Schottky contacts made of Ti/Au (5 nm/150 nm) and separated by 10 μm. FIG. 23A provides a schematic diagram and image of an exemplary two terminal diode device comprising GaAs wire arrays. Dipping the substrate into a concentrated HCl solution for 10 min removed the native oxide layers on the surfaces of GaAs wires just before deposition of electrodes.

Figure 23B:
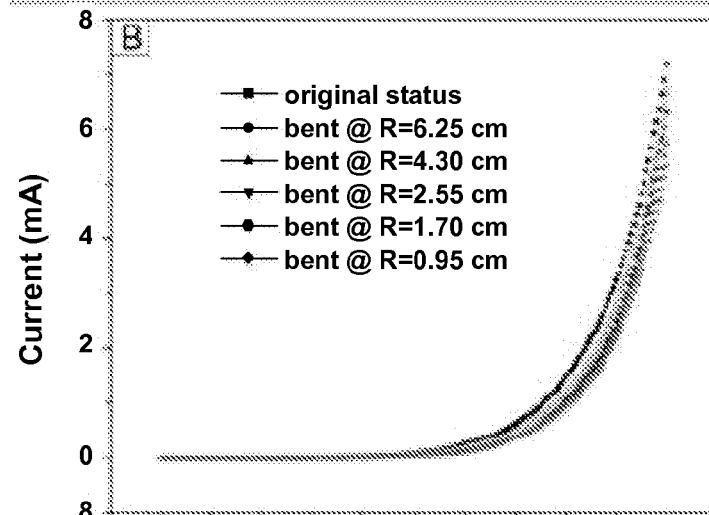
FIG. 23B shows the current-voltage (I-V) curves recorded for the two terminal diode device at different bend radii indicating that the two terminal diode device comprising GaAs wire arrays exhibited expected diode characteristics.
Figure 23C:
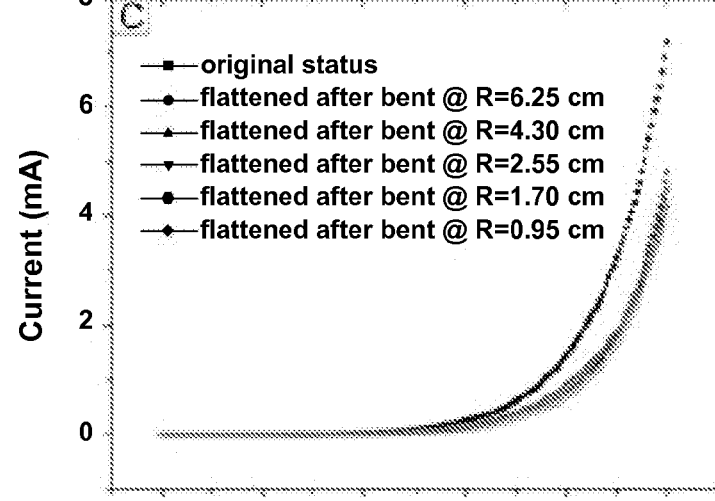
FIG. 23C shows the current-voltage (I-V) curves measured for the two terminal diode device after relaxation after bending at different bend radii.

FIG. 23B shows the current-voltage (I-V) curves recorded at different bend radii. These curves all exhibit expected diode characteristics. The small differences among these curves suggest that almost no GaAs nanowires were broken even when the bend radius (R) of substrate was 0.95 cm. The strain on the PET surface in this case was ~0.92%, which is less than that estimated to exist in the free-standing GaAs nanowire shown in the inset of FIG. 20A. These results further confirm that GaAs nanowires generated by the present 'top down' fabrication methods are flexible and are able to be integrated with bendable plastic sheets. We note that the data show that when the substrate was relaxed after first bending it, the current was ~40% smaller than that recorded from original device before bending. FIG. 23C shows the current-voltage (I-V) curves measured for the two terminal diode device after relaxation after bending at different bend radii. For the sake of comparison, the black curve in FIG. 23C shows the current-voltage curve corresponding to the device configuration prior to bending. The lack of variation in the I-V characteristics with bend radius and with multiple bending/unbending cycles after the first one suggest, however, that the one-time decrease in current might be caused by an initial variation in the properties at the interface between the electrodes and the wires.

The combined use of traditional photolithography and anisotropic chemical etching with bulk high quality single crystal wafers of these materials forms an attractive 'top down' route to micro and nanowires of GaAs and InP with triangular cross sections. The dimensions of the wires and their organization are selectively adjustable by appropriate selection of the lithography and etching conditions, for example etching time. The as-obtained wire arrays on the mother substrates are able to be effectively transfer printed with high fidelity to plastic substrates coated with a thin layer of adhesive in which the wires are embedded. The mother wafer is able to be re-used after polishing, which enables large numbers of wires to be generated from a single wafer. This "dry" transfer printing of 'top down' nanowires/micron wires represents a new class of transfer processes that offer many advantages over "wet" assembly of 'bottom up' nanowires in terms of preservation of order and crystallographic orientation of the wires as well the purity of their active surfaces. For macroelectronics applications in particular, where wires wider than 100-200 nm are useful, the "top down" fabrication methods of the present invention has many attractive features. The systems of wires on plastic substrates demonstrated here illustrate excellent bendability and significant potential for use in this class of application.

EXAMPLE 5

Solution Printing Methods for Printable Semiconductor Elements

The present invention provides solution printing methods capable of transferring and assembling printable semiconductor elements over large areas of many substrates. This aspect of the present invention provides continuous, high speed fabrication methods applicable to a wide range of semiconductor devices and device components.

In one method of this aspect of the present invention, a printable semiconductor element is provided having a handle element. In the context of this description, the term "handle element" refers to a component that allows for controlled manipulation of the position and/or orientation of a printable semiconductor element after solution phase delivery to a substrate surface. In one embodiment, a semiconductor element is provided having one or more handle elements each comprising a layer of material that is responsive to a magnetic field, electric field, or both. This aspect of the present invention is useful for providing methods of aligning, positioning and/or orienting printable semiconductor elements on substrate surfaces using electrostatic forces, and/or magnetostatic forces. Alternatively, the present invention provides methods wherein a semiconductor element is provided having one or more handle elements each comprising a layer of material that is responsive to laser induced momentum transfer processes. This aspect of the present invention is useful for providing methods of aligning, positioning and/or orienting printable semiconductor elements on substrate surfaces by exposing the printable semiconductor element having one or more handle elements to a series of laser pulses (e.g. laser tweezers methods). Alternatively, the present invention provides methods wherein a semiconductor element is provided having one or more handle elements each comprising a droplet that is response to forces generated by capillary action. The present invention includes methods and devices using printable semiconductor elements having one or more handle elements or one or more different types of handle element, such as handle elements responsive to different types of fields. Handle elements may be provide in many types of printable semiconductor elements of the present invention including, but not limited to, microstructures, nanostructures, microwires, nanowires, microribbons and nanoribbons.

In this aspect of the present invention, one or more printable semiconductor elements each having one or more handle elements are dispersed into a solution or carrier fluid and delivered to a substrate surface. Delivery of the mixture of printable semiconductor elements and solution/carrier fluid distributes the printable semiconductor elements randomly about the substrate surface. Next, the semiconductor elements randomly distributed on the substrate surface are concertedly moved into selected positions and orientations on the substrate surface by application of forces arising from the presence of handle elements of the printable semiconductor elements. This aspect of the present invention is useful for aligning printable semiconductor elements having handle elements into well order arrays or into positions and orientations corresponding to a selected device or device component configuration. For example, printable semiconductor elements having one or more handle elements comprising a layer of magnetic material may be moved into selected positions and orientations on a substrate surface by application of a magnetic field having appropriate distributions of intensities and directions. In this embodiment, a magnetic field having selected distributions of intensities and directions may be applied by positioning one or more ferromagnetic elements or electromagnetic elements proximate to the substrate (such as positioned behind the substrate surface, above the substrate surface and/or along side the substrate), thereby generating selected distributions of intensities and directions which correspond to a desired assembly, pattern or structure of printable semiconductor elements or a selected device or device component configuration. In this aspect of the present invention, solvent, carrier fluid or both may be removed before, during or after selective positioning and orientation of printable semiconductor elements via manipulation of handle elements by any means known in the art, including by evaporation or by desorption methods.

FIG. 24 provides a schematic diagram illustrating an exemplary method of the present invention for solution printing printable semiconductor elements having handle elements comprising magnetic tags. As shown in FIG. 24, printable semiconductor elements are provided, each of which have a plurality of magnetic tags comprising thin nickel layers. In one embodiment, thin nickel layers are provided on the surface of a microsized or nanosized semiconductor structure. The use of nickel for handle elements in this example is only by way of example and any crystalline or amorphous ferromagnetic material may be used in these methods, including but not limited to, Co, Fe, Gd, Dy, MnAs, MnBi, MnSb, $CrO_2$, $MnOFe_2O_3$, $NiOFe_2O_3$, $CuOFe_2O_3$, $MgOFe_2O_3$ and amorphous ferromagentic alloys such as transition metal-metalloid alloys.

As shown in step I of the schematic diagram in FIG. 24, a plurality of printable semiconductor elements each having handle elements are dispersed into solution and cast onto the surface of a substrate. This step provides the printable semiconductor elements to the substrate surface in a random distribution of positions and orientations. As shown in step II of the schematic diagram in FIG. 24, a magnetic field is then applied to the printable semiconductor elements, preferably a magnetic field having selected distributions of intensities and directions. In the schematic shown in FIG. 24, a magnetic field having selected distributions of intensities and directions is applied by positioning the magnetic poles of one or more magnets on opposite sides of the substrate surface having printable semiconductors thereon. As a ferromagnetic material, interaction of the magnetic field and the nickel layers comprising the handle elements generates forces which move the printable semiconductors into desired positions and orientations on the substrate surface. In the embodiment shown in FIG. 24, a magnetic field is applied that orients the printable semiconductor elements into a well ordered array characterized by a substantially parallel alignment of the long sides of the printable semiconductor elements. As shown in step III of the schematic diagram in FIG. 24, electrical connections can be deposited on the ends of printable semiconductor elements comprising the ordered array in a manner establishing an electric connection and in a manner preserving the orientations prepared by application of the magnetic field.

Figure 25:
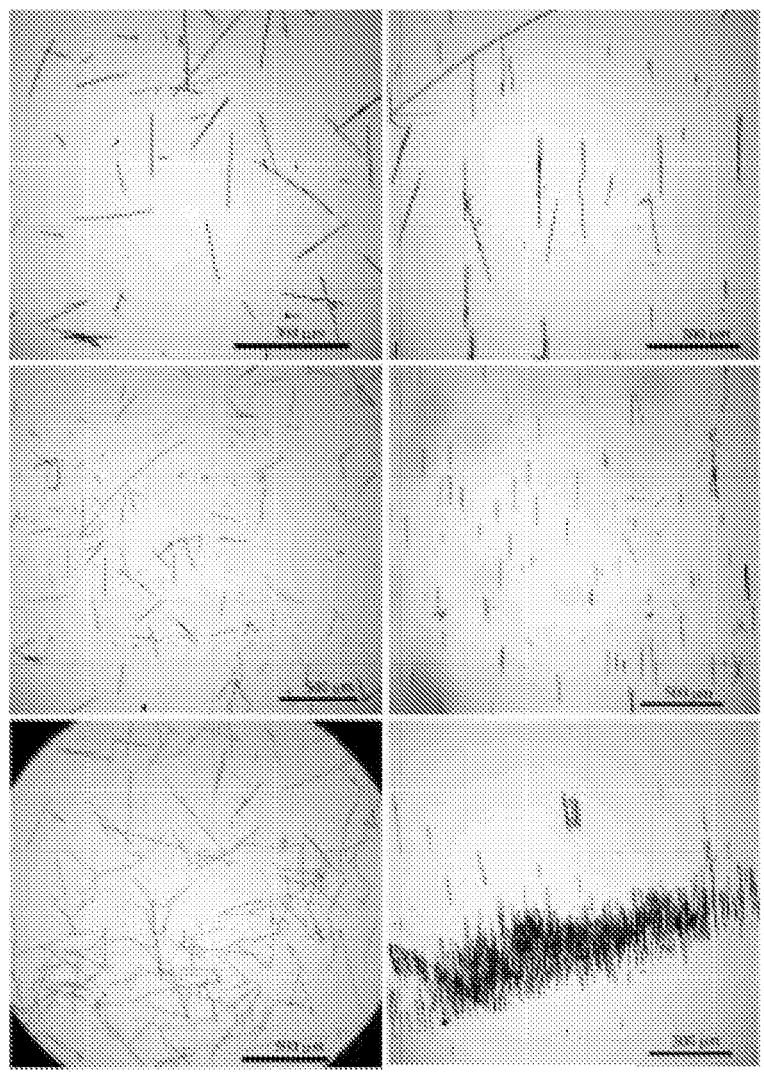
FIG. 25 provides several optical images demonstrating the use of solution printing methods of the present invention to generate well order arrays of microstructures having handle elements comprising thin nickel layers.

FIG. 25 provides several optical images demonstrating the use of solution printing methods of the present invention to generate well order arrays of microstructures comprising printable semiconductor elements having handle elements comprising thin nickel layers. The optical images presented in the panels on the left of FIG. 25 correspond to a substrate surface having printable semiconductors dispersed on a substrate surface without the application of a magnetic field. As shown in these images, the printable semiconductor elements are randomly distributed on the substrate surface. The optical images presented in the panels on the right of FIG. 25 correspond to a substrate surface having printable semiconductors dispersed on a substrate surface upon the application of a magnetic field. In contrast to the images presented in the left panels, the optical images corresponding to conditions wherein a magnetic field is applied show that the printable semiconductor elements are provided in selected orientations and positions corresponding to a well ordered array. Comparison of the images presented in the left panels and right panels of FIG. 25 indicate that application of a magnetic field having selected distributions of intensities and directions is capable of generating forces that move individual printable semiconductor elements into selected positions and orientations.

As will be understood by persons of skill in the art of device fabrication, the positions and orientations of printable semiconductor elements in the right panels of FIG. 25 are but one example of orientations and positions achievable using the solution printing methods of the present invention. Selection of appropriate positions of handle elements on printable semiconductor elements and selection of appropriate magnetic fields having selected distributions of intensities and directions may be used to generate virtually any distribution of semiconductor element positions and orientations.

EXAMPLE 6

Fabrication of High Performance Single Crystal Silicon Transistors on Flexible Plastic Substrates It is a goal of the present invention to provide bendable macroelectronic, microelectronic and/or nanoelectronic devices and device components comprising printable, high quality semiconductor elements assembled on flexible substrates. In addition, it is a goal of the present invention to provide bendable electronic devices, such as bendable thin film transistors that exhibit field effect mobilities, on-off ratios and threshold voltages similar to or exceeding that of thin film transistors fabricated by convention high temperature processing methods. Finally, it is a goal of the present invention to provide bendable electronic devices compatible with efficient high throughput processing on large areas of flexible substrates at lower temperatures, such as room temperature processing on plastic substrates.

The ability of the present methods, devices and compositions to provide useful macroelectronic and/or microelectronic devices and device components exhibiting high device performance characterizing in bent and planar configurations was verified by experimental studies. The results of these measurements demonstrate that the present invention provides dry transfer contact printing techniques, exhibiting excellent registration capability, that are capable of assembling bendable thin film transistors by depositing a range of high quality semiconductors, including single crystal Si ribbons, Ga—As and InP wires and single-walled carbon nanotubes onto plastic substrates. For example, the results of these experimental studies indicate that bendable thin film type transistors comprising spatially well defined arrays of dry transferred printable single crystal silicon elements exhibit high device performance characteristics, such as average device effective mobilities, evaluated in the linear regime, of ~240 $cm^2/Vs$, and threshold voltages near 0 V. Further, these studies show that the thin film transistors of the present invention exhibit bendability (i.e. strain at which failure occurs) comparable to devices made with organic semiconductors, and mechanical robustness and flexibility when subjected to frontward and backward bending.

High performance printed circuitry on large area flexible substrates represents a new form of electronics that has wide ranging applications in sensors, displays, medical devices and other areas. Fabricating the required transistors on plastic substrates represents a challenge to achieving these macroelectronic systems. Some approaches that have been explored over the last several years are based on modified, low temperature versions of the types of process steps used to fabricate conventional silicon based thin film transistors (TFTs) on glass/quartz substrates. The high temperatures associated with the directional solidification processes developed for producing single-crystal silicon films (i.e., zone-melting recrystallization of Si films on $SiO_2$ using a cw laser, a focused lamp, an electron beam, or a graphite-strip heater) make this approach unsuitable for use with plastic substrates. Laser based approaches have achieved some limited degree of success, although uniformity, throughput and use with low cost plastics poses significant continuing experimental challenges. Direct full wafer transfer of preformed circuits onto plastic substrates yield some useful devices, but this approach is difficult to scale to large areas and it does not retain printing type fabrication sequences that might be important for low cost, large area macroelectronics. Organic semiconductor materials provide an alternative pathway to flexible electronics; wherein the organic based electronic materials can be naturally integrated, via room temperature deposition, with a range of plastic substrates. The organic semiconductors materials currently known, however, enable only modest device mobilities. For example, even high quality single crystals of these materials have mobilities in the range of 1-2 $cm^2/Vs$ and ~10-20 $cm^2/Vs$ for n and p-type devices, respectively.

Other fabrication techniques such as fluidic self assembly separate the high temperature steps for producing high mobility materials from the low temperature processing that is required for building devices on plastic substrates. These methods do not, however, allow efficient control of the organization or location of the deposited objects.

Figure 26A:
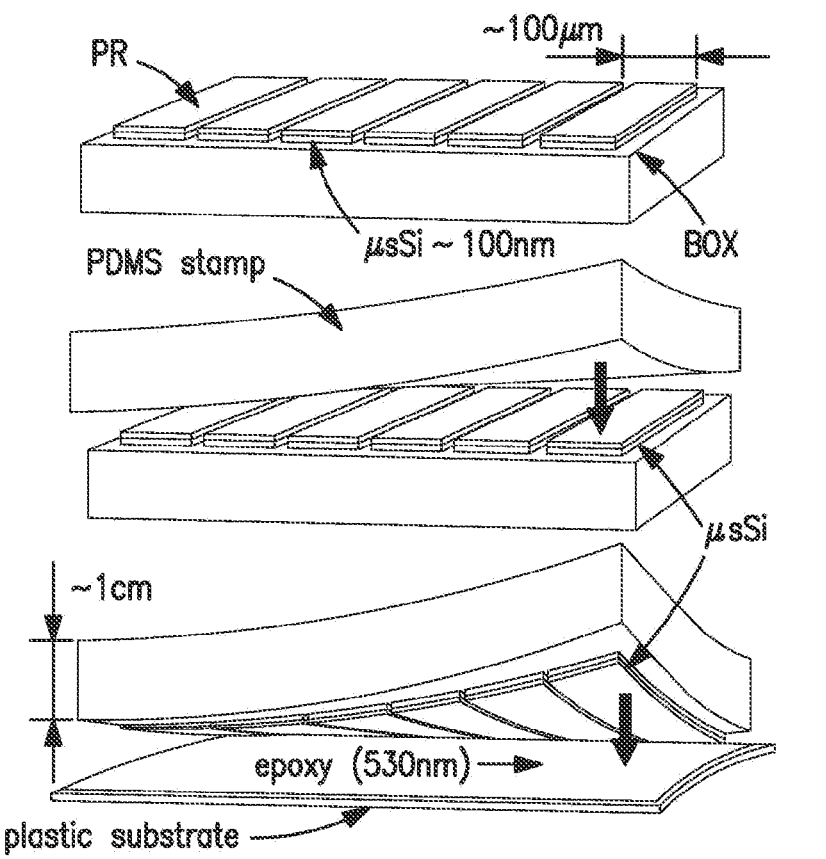
FIG. 26A illustrates the steps used to fabricate exemplary bendable thin film transistors devices of the present invention.

FIG. 26A illustrates the steps used to fabricate exemplary bendable thin film transistors devices of the present invention. First, photolithography defined a pattern of photoresist on the surface of a silicon-on-insulator wafer (Soitec unibond SOI with a 100 nm top Si layer and 145 nm buried oxide). This resist served as a mask for dry etching the top silicon layer of the SOI wafer with a $SF_6$ plasma (Plasmatherm RIE system, 40 sccm $SF_6$ flow with a chamber base pressure of 50 mTorr, 100 W RF power for 25 s). A concentrated HF solution etched the buried oxide and freed (but did not completely float off) the printable single crystal silicon semiconductor elements from their substrate. A flat piece of poly(dimethylsiloxane) (PDMS) was brought into conformal contact with the top surface of the wafer and then carefully peeled back to pickup the interconnected array of ribbons. The interaction between the photoresist and the PDMS was sufficient to bond the two together for removal, with good efficiency.

An Indium-Tin-Oxide (ITO; thickness ~100 nm) coated poly(ethyleneteraphtalate) (PET; thickness ~180 µm) plastic sheet served as the device substrate. Washing it with acetone & isopropopanol, rinsing it with deionized water and then drying it with a stream of nitrogen cleaned its surface. Treating the ITO with a short oxygen plasma (Plasmatherm RIE system, 20 sccm $O_2$ flow with a chamber base pressure of 100 mTorr, 50 W RF power for 10 s) promotes adhesion between it and a spin cast dielectric layer of epoxy (3000 RPM for 30 s of Microchem SU8-5 diluted with 66% of SU8-2000 thinner). This photo sensitive epoxy was pre-cured at 50° C. on a hot plate during ~1 min. Bringing the PDMS with a printable single crystal silicon semiconductor element on its surface into contact with the warm epoxy layer and then peeling back the PDMS led to the transfer of the printable single crystal silicon semiconductor element to the epoxy. This result suggests that the bonding forces between the silicon and the soft epoxy layer (some of which are mechanical, due to the flow of epoxy around the edges of the printable single crystal silicon semiconductor elements) are stronger than those between the photoresist and the PDMS stamp. The epoxy layer was fully cured at 100° C. for 5 min, exposed to UV light from the back side of the transparent substrate for 10 s and then post baked at 115° C. for 5 min to crosslink the polymer. The photoresist mask (which, conveniently, prevents contamination of the top surface of the printable single crystal silicon semiconductor elements during the transfer steps) was dissolved with acetone and the sample was then abundantly rinsed with deionized water.

Figure 26B:
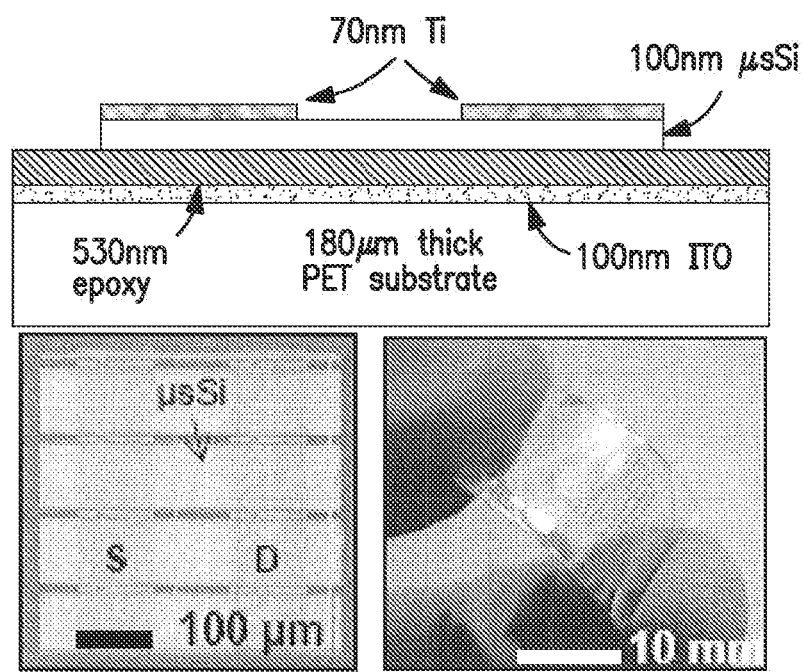
FIG. 26B presents a schematic illustration of the bottom gate device configuration of the thin film transistor together with high and low magnification optical images of part of the device array.

Source and drain electrodes were formed with Ti (~70 nm; Temescal e-beam evaporator) deposited on the top surface of the printable single crystal silicon semiconductor elements. Etching (1:1:10 $HF:H_2O_2:DI$ for ~2 s) through a photoresist mask (Shipley S1818) patterned on the Ti defined the geometry of these electrodes. The last step of the fabrication involved dry etching ($SF_6$ using the RIE parameters given above) through a photoresist mask to define islands of silicon at the locations of the devices. FIG. 26B presents a schematic illustration of the bottom gate device configuration of the thin film transistor together with high and low magnification optical images of part of the device array.

Figure 27A:
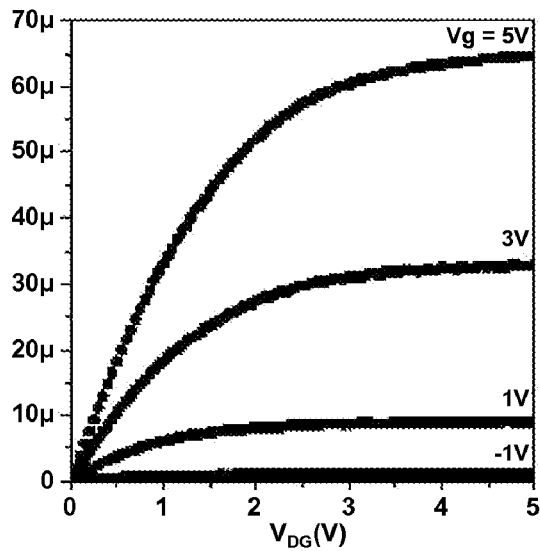
FIG. 27A presents current voltage characteristics of a bendable thin film transistor of the present invention that shows an effective device mobility of 140 cm$^2$/Vs in the saturation regime and 260 cm$^2$/Vs in the linear regime, as evaluated by application of standard field effect transistor models that ignore the effects of contacts.
Figure 27B:
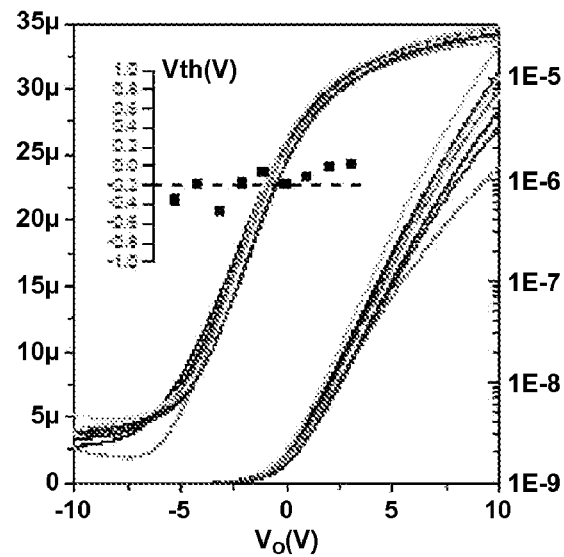
FIG. 27B presents transfer characteristics of several devices, plotted on linear (left axis) and logarithmic (right axis) scales.
Figure 27C:
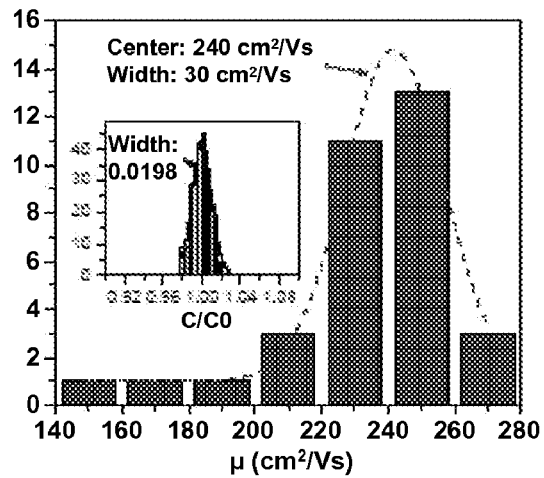
FIG. 27C shows the distribution of the linear effective mobilities of several bendable thin film transistors fabricate by the present methods.

FIG. 27A presents current voltage characteristics of a bendable thin film transistor of the present invention that shows an effective device mobility of 140 $cm^2/Vs$ in the saturation regime and 260 $cm^2/Vs$ in the linear regime, as evaluated by application of standard field effect transistor models that ignore the effects of contacts. The high resistance (~90 Ωcm) of the Schottky contacts in these devices, however, has a significant effect on the device response. FIG. 27B presents transfer characteristics of several devices, plotted on linear (left axis) and logarithmic (right axis) scales. The plot in the inset shows that the threshold voltages have a narrow distribution near 0 V. Small (<4% in current for a ±10 V cycle) hysteresis in the transfer characteristics indicates a low density of trapped charge at the interface between the silicon (with native oxide) and the epoxy dielectric. The small values ($\leq 13$ $V.nF/dec.cm^2$) of the normalized subthreshold slopes confirm the good quality of this interface, which may be governed primarily by the interface between the silicon and its native oxide. FIG. 27C shows the distribution of the linear effective mobilities of several bendable thin film transistors fabricate by the present methods. A Gaussian fit indicates a center value of 240 $cm^2/Vs$ with a standard deviation of 30 $cm^2/Vs$. Some of the low values are associated with visible defects in the electrodes or other components of the devices. The uniformity of the epoxy dielectric was investigated by building, using the same substrate and methods used to prepare the transistor gate dielectric, an array of 256 (200×200 µm) square capacitors. The inset in FIG. 27C shows the measured capacitance values. A Gaussian fit indicates a standard deviation lower than 2% confirming the excellent electrical and physical properties uniformity of the epoxy layer. Capacitance measurements carried out at various frequencies (between 1 kHz and 1 MHz) indicted a small (<3%) frequency-dependence of the dielectric constant.

Figure 28A:
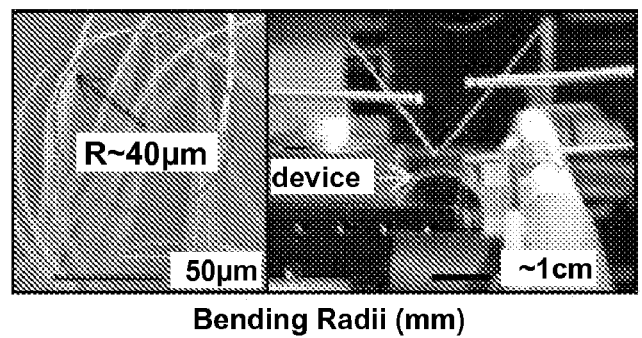
FIG. 28A presents a high-resolution scanning electron micrograph of solution cast ribbons (left inset) illustrating the remarkable flexibility of the printable single crystal silicon semiconductor elements. The right inset in FIG. 28 shows a picture of the experimental setup used to bend the bendable thin film transistors evaluated in this study.
Figure 28B:
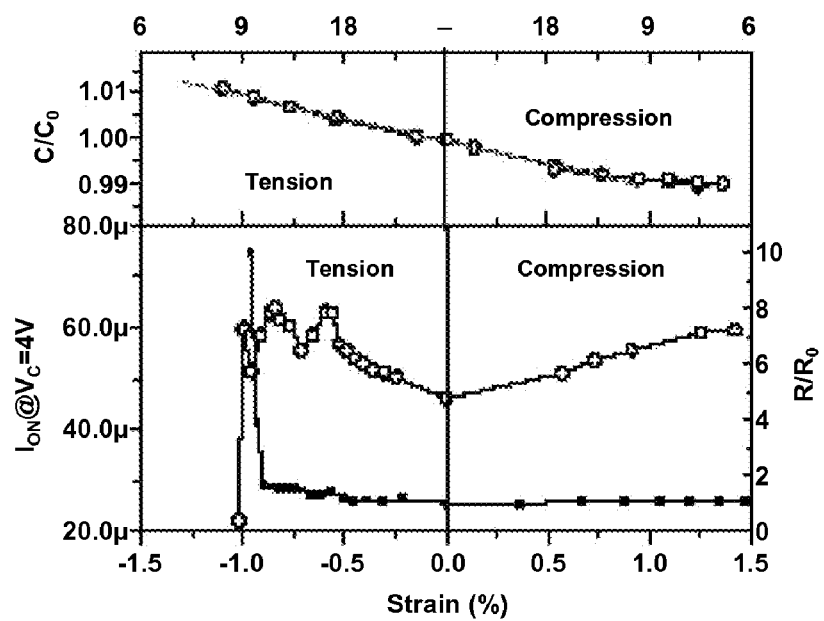
FIG. 28B shows the small (~<1%) linear variation of the epoxy dielectric capacitance when subject to tensile and compressive strains (see top inset). The lower inset in FIG. 28B presents the variation of the saturation current of a device measured for a gate and drain bias voltages of both 4 V.

The mechanical flexibility and robustness of the bendable thin film transistors of the present invention were investigated by performing frontward and backward bending tests. FIG. 28A presents a high-resolution scanning electron micrograph of solution cast ribbons (left inset) illustrating the remarkable flexibility of the printable single crystal silicon semiconductor elements. The right inset in FIG. 28 shows a picture of the experimental setup used to bend the bendable thin film transistors evaluated in this study. To maximize the strain induced in the thin film transistors when the plastic sheet is bent, a relatively thick (~180 µm) plastic substrate was used in these studies. FIG. 28B shows the small (~<1%) linear variation of the epoxy dielectric capacitance when subject to tensile and compressive strains (see top inset). The bending radius and strain values where computed using a finite element model of the buckling sheet. Comparisons of the bending profiles of the buckling sheet (for several bending radius) to the profiles obtained with the finite element method confirmed the accuracy of the simulations. The lower inset in FIG. 28B presents the variation of the saturation current of a device measured for a gate and drain bias voltages of both 4 V. The maximum value of the tensile strain at which the bendable thin film transistor can be operated seems to be limited by the failure of the ITO gate electrode (which fails a tensile strain value of ~−0.9%). The bendable thin film transistor operate well even at compressive strains as high as 1.4%. This level of bendability is comparable to that recently reported for organic transistors based on pentacene. Failure of the present bendable thin film transistors is likely to occur only at very high strains, as Takahiro et al. recently demonstrated that micron-sized single crystal silicon objects etched from the top layer of a SOI wafer can withstand remarkably high tensile stress (>6%) [T. Namazu, Y. Isono, and T. Tanaka J. MEMS 9, 450 (2000)]

The cause of the modest variation in output current with strain in our devices is not entirely known, as the known variation in mobility with strain contributes to, but does not fully account for, these changes. Devices of the type that we describe in this example enable new opportunities to investigate the charge transport in mechanically strained silicon at strain values not easily reached when bulk Si wafers are bent.

In summary, this Example demonstrates the high device performance and beneficial mechanical properties of bendable single crystal silicon transistors formed on plastic substrates by the simple and efficient parallel printing process for silicon provided by the present invention. To the best of our knowledge, the performance of these devices exceeds that of the best devices (silicon based or otherwise) exhibiting a similar degree of mechanical bendability. The top down control over the shapes, physical dimensions and composition (e.g. doped or not doped) of the printable silicon semiconductor elements, and the printing technique provide significant advantages compared to other approaches. In addition, the mechanical flexibility of the resulting devices is excellent. Further, these same general approaches are applicable to other inorganic semiconductors (e.g. GaAs, GaN, etc.) and can be used to fabricate a wide range of flexible microelectronic and macroelectronic devices and device components, such as solar cells, diodes, light emitting diodes, complementary logic circuits, information storage devices, bipolar junction transistors, and FET transistors. Therefore, the methods and device of the present invention are useful for an enormous range of fabrication applications for making flexible electronic products.

EXAMPLE 7

Printable Heterogeneous Semiconductor Elements and Devices Comprising Printable Heterogeneous Semiconductor Elements The present invention provides heterogeneous printable semiconductor elements comprising multimaterial elements, and related devices and device components. Printable heterogeneous semiconductor elements of this example comprise a semiconductor layer having a dopant with a selected spatial distribution, and provide enhanced functionality in a range of macroelectronic, microelectronic and/or nanoelectronic devices.

The ability of the present methods to fabricate heterogeneous printable semiconductor elements exhibiting useful electronic properties was verified by experimental studies. In addition, the applicability of the present methods to assembling printable elements into functional devices was demonstrated by fabrication of flexible thin film transistors comprising printable single crystal silicon semiconductor elements having integrated doped regions for contacts.

Large area, mechanically flexible electronic systems, known as macroelectronics, are attractive for a range of applications in consumer electronics, sensors, medical devices and other areas. A variety of organic, inorganic and organic/inorganic hybrid materials have been explored as semiconductors for these systems. Use of the present "top-down" technology approach for generating single crystal silicon micro/nanoelements (wires, ribbons, platelets, etc, which are refer to collectively as printable silicon semiconductor elements) is an alternative approach that has been demonstrated as useful for fabricating high performance thin film transistors on flexible substrates. This fabrication approach has also been demonstrated as applicable to other important semiconductor materials, such as GaAs, InP, GaN, and carbon nanotubes.

An important characteristic of the present approach is its use of high quality, wafer-based sources of semiconductor materials, which are grown and processed separately from subsequent device assembly steps. Separate semiconductor processing and assembly steps allow for device assembly at relatively low temperatures (e.g. room temperature ±30 degrees Celsius) compatible with most flexible device substrates, such as plastic substrates. The present invention includes methods wherein high quality semiconductors are not only grown, but are also processes in other ways in fabrication steps independent from subsequent fabrication steps involving assembly of printable semiconductor elements on flexible substrates. In one embodiment, the present invention includes methods wherein dopants are introduced into the semiconductor during high temperature processing, and the resulting doped semiconductor material is subsequently used to generate printable heterogeneous semiconductor elements which can be assembled into a variety of useful electronic devices. Processing steps useful in for doping semiconductors include high temperature processing and processing wherein dopants are introduced in a manner providing control over their spatial distribution in one two or three dimensions (i.e. control over the area of implantation and depth of implantation). In one method, the semiconductor is selectively contact doped by spin on doping procedures performed at the wafer fabrication level in steps that are performed independently from the low temperature substrates. Contact doping provides precise control over the spatial distribution of dopant in the semiconductor material and, therefore, subsequent patterning and etching steps allow fabrication of high quality printable heterogeneous semiconductor elements having integrated doped regions. The solution printing and dry transfer contact printing methods are ideally suited for assembling these printable heterogeneous elements into devices, such as thin film transistors, exhibiting the excellent device performance and excellent bendability that can be achieved.

Figure 29A:
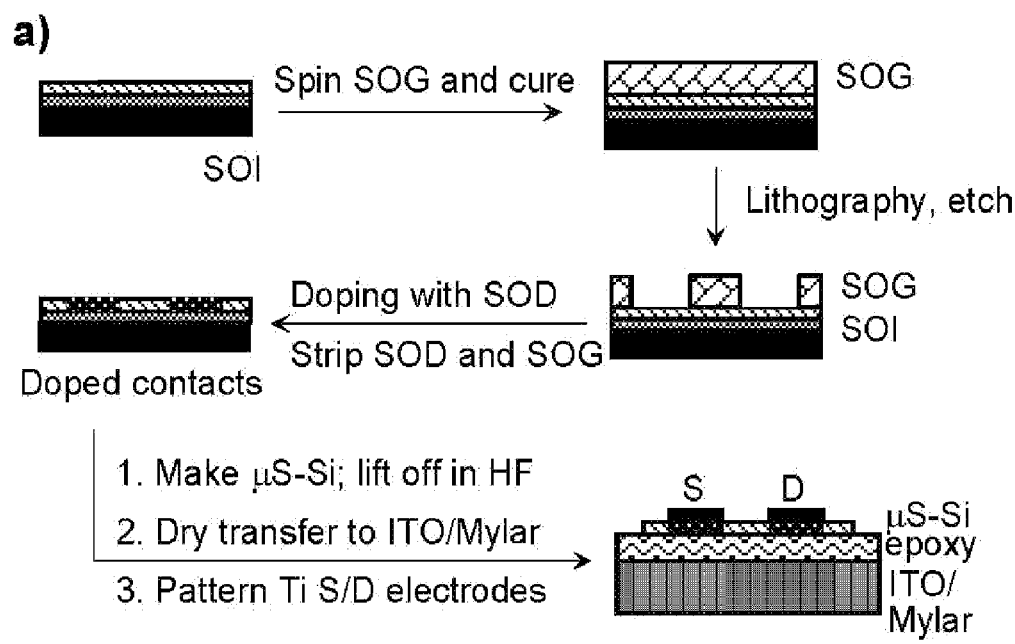
FIG. 29A presents a schematic representation of a fabrication process for generating transistors comprising printable heterogeneous semiconductor elements on a PET substrate.

FIG. 29A presents a schematic representation of a fabrication process for generating transistors comprising printable heterogeneous semiconductor elements on a PET substrate. In this embodiment, the printable heterogeneous semiconductor element comprises crystal silicon with doped source (S) and drain (D) contacts. The approach illustrated in FIG. 29A uses a solution processable spin-on dopant (SOD) to dope selected regions of the top silicon layer of a silicon-on-insulator wafer (SOI; Soitec unibond with a 100 nm top Si layer and 200 nm buried oxide). Therefore, a spin-on dopant (SOD) provides the phosphorus dopant and a spin-on glass (SOG) serves as a mask to control where dopant diffuses into the silicon. This doped SOI provides the source of printable heterogeneous semiconductor elements.

To produce the printable heterogeneous semiconductor elements we first spin cast a spin-on glass (SOG) solution (Filmtronic) onto a SOI wafer and exposed it to rapid thermal annealing (RTA) at 700° C. for 4 minutes to form a uniform film (300 nm thickness). Etching (6:1 buffered oxide enchant (BOE) for 50 seconds) through a lithographically patterned layer of photoresist (Shipley 1805) opened source and drain windows in the SOG. After stripping the resist, we uniformly deposited a phosphorous containing SOD (Filmtronic) by spin casting. RTA at 950° C. for 5 seconds caused the phosphorous from the SOD to diffuse through the lithographically defined openings in the SOG and into the underlying silicon. The SOG blocked diffusion in the other areas. The wafer was rapidly cooled to room temperature, immersed in BOE for 90 seconds to remove both the SOG and SOD and then thoroughly washed with DI water to complete the doping process.

Figure 29B:
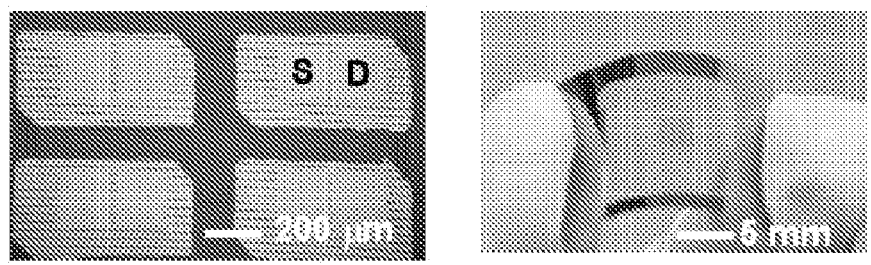
FIG. 29B shows optical images of several devices having heterogeneous printable semiconductor elements fabricated using the present techniques.

The printable heterogeneous semiconductor elements were assembled onto plastic substrates of PET coated with indium tin oxide (ITO; 100 nm, gate electrode) and epoxy (SU8; 600 nm, gate dielectric) using the present methods. The epoxy not only provides the dielectric, but also facilitates the transfer printing of the printable heterogeneous semiconductor elements. Source and drain electrodes of Ti (100 nm) were formed on the doped contact regions by an aligned photolithography step followed by etch back. FIG. 29B shows optical images of several devices having heterogeneous printable semiconductor elements fabricated using the present techniques.

Figure 30A:
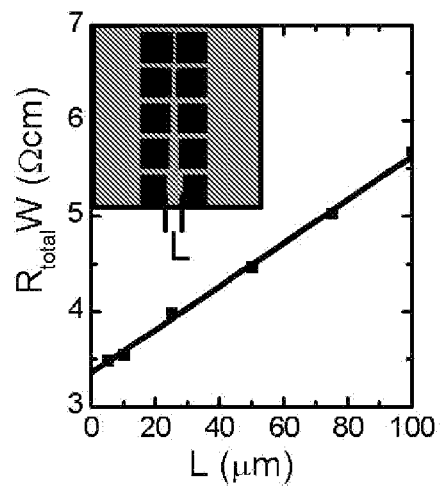
FIG. 30A shows a plot of the normalized resistance, $R_{total}W$, $_{as}$ as a function of L. for an arrangement of printable heterogeneous semiconductor elements and contact pads used to characterize the contact resistances (see inset).
Figure 30B:
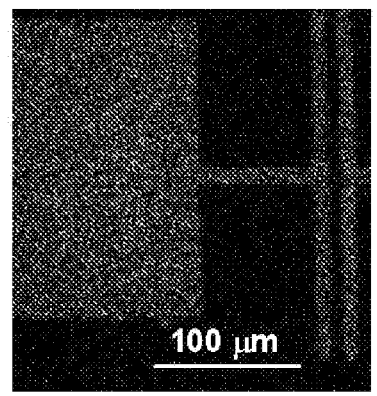
FIG. 30B shows Time-of-Flight Secondary Ion Mass Spectroscopy (TOF-SIMS) measurements that show the use of patterned SOG as a diffusion barrier (See, Schematic in FIG. 29A) localizes the dopants to desired regions in the silicon. In the image shown in FIG. 30B, the bright red color indicates high phosphorous concentration.

We estimated the doping levels and the contact resistances using a standard transfer line model (TLM). In particular, we measured resistances between Ti contact pads with separations (L) between 5 and 100 microns and widths (W) of 200 microns on printable heterogeneous semiconductor elements comprising uniformly doped crystalline silicon that were printed onto a plastic substrate were measured. The inset in FIG. 30A shows images of the arrangement of printable heterogeneous semiconductor elements and contact pads used to characterize the contact resistances. The linear current (I) vs. voltage curves (V) (not shown) indicate that the contacts are ohmic and that the doping level is high. The dependence of the resistance on L can be described by $R_{total}=2R_c+(R_s/W)L$, where $R_{total}(=V/I)$ is the resistance between two contact pads, $R_c$ is the contact resistance, and $R_s$ is the sheet resistance. FIG. 30A shows a plot of the normalized resistance, $R_{total}W$, as a function of L. Linear fitting of $R_{total}W$ gives $R_s=228\pm5$ Ω/sq, and $R_cW\sim1.7\pm0.05$ Ω·cm. The value of normalized contact resistance $R_cW$ is more than an order of magnitude lower than what we observed for undoped printable single crystal silicon semiconductor elements processed in a similar manner. The resistivity is about $2.3\times10^{-3}$ Ω·cm, which corresponds to a doping level of $10^{19}/cm^3$ if we assume, for simplicity, that the doping is uniform through the 100 nm doped printable silicon semiconductor element. FIG. 30B shows Time-of-Flight Secondary Ion Mass Spectroscopy (TOF-SIMS) measurements that show the use of patterned SOG as a diffusion barrier (See, Schematic in FIG. 29A) localizes the dopants to desired regions in the silicon. In the image shown in FIG. 30B, the bright red color indicates high phosphorous concentration.

Figure 31A:
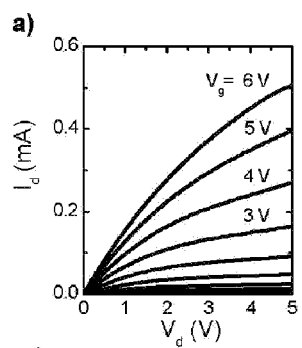
FIGS. 31A-D shows measurements corresponding to transistors comprising printable contact doped silicon semiconductor elements on an epoxy/ITO/PET substrate.
Figure 31B:
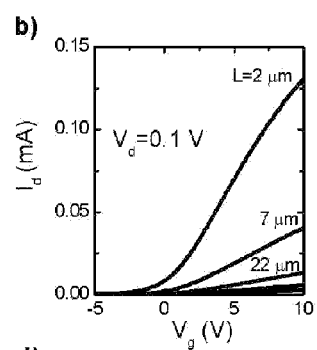
Figure 31C:
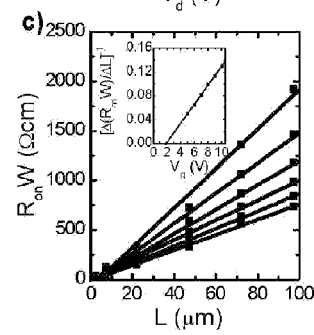

FIGS. 31A-D shows measurements corresponding to transistors comprising printable contact doped silicon semiconductor elements on an epoxy/ITO/PET substrate. FIG. 31A plots the current-voltage characteristics of a device (L=7 μm, W=200 μm) of the present invention. The effective device mobility ($\mu_{eff}$) is ~240 cm$^2$/Vs in the linear regime and ~230 cm$^2$/Vs in the saturation regime, as determined by application of standard field-effect transistor models. FIG. 31B shows transfer characteristics of devices of the present invention with channel lengths between 2 μm and 97 μm and channel widths of 200 μm. The ON to OFF current ratios in all cases are ~$10^4$. The threshold voltages vary from ~2 V to ~0 V, monotonically from L=97 μm to 2 μm. FIG. 31C presents the resistance of the devices measured in ON state ($R_{on}$) at small drain voltages, and multiplied by W, as a function of L at different gate voltages. Linear fits of $R_{on}$W vs. L at each gate voltage provide information about both intrinsic device mobility and contact resistance. In this simple model, $R_{on}$ consists of the series addition of the channel resistance (which is proportional to L) and the combined contact resistance $R_c$ associated with the source and drain electrodes. FIG. 31C shows that $R_c$, as determined from the intercepts of linear fitting, is negligible compared to channel resistance for all channel lengths evaluated. The inset in FIG. 31C in shows the variation of sheet conductance, as determined from the reciprocal of the slope of linear fitting in FIG. 31C, with gate voltage. The linear fit to these data, as shown in the inset of FIG. 31C, gives an intrinsic device mobility of ~270 cm$^2$/Vs, and an intrinsic threshold voltage of ~2 V.

Figure 31D:
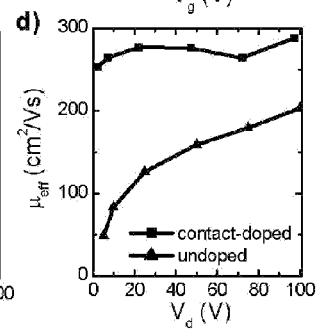

FIG. 31D compares the effective mobilities, $\mu_{eff}$, of transistors having undoped and contact-doped printable single crystal silicon semiconductor elements evaluated directly from transfer characteristics measured in the linear regime (i.e. contact effects are not subtracted). For the undoped devices, $\mu_{eff}$ decreases rapidly from 200 cm$^2$/Vs to 50 cm$^2$/Vs with decreasing the channel length L from 100 microns to 5 microns. The contacts begin to dominate device behavior at channel lengths below ~50 microns. In the contact doped case, the mobilities are around 270 cm$^2$/Vs, with <20% variation with channel length over this range, which is in consistent with the intrinsic device mobility determined from inset of FIG. 31C. These data provide additional evidence that these devices show negligible effects of contact resistance. We note that, in addition to the different mobilities, we notice that the devices with doped contacts are more stable, more uniform in their properties and less sensitive to processing conditions than those with undoped contacts.

Figure 32A:
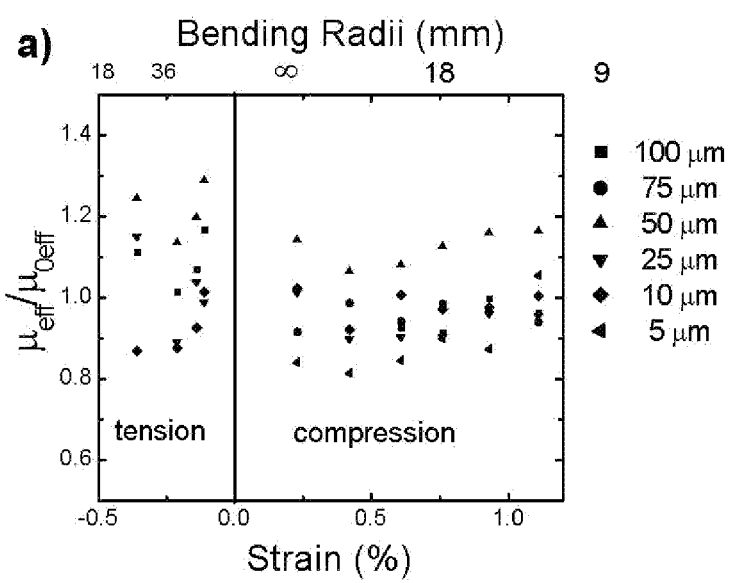
FIG. 32A shows the change of the effective device mobility, normalized by the value in the unbent state, $\mu_{0eff}$, as a function of strain (or bending radius).
Figure 32B:
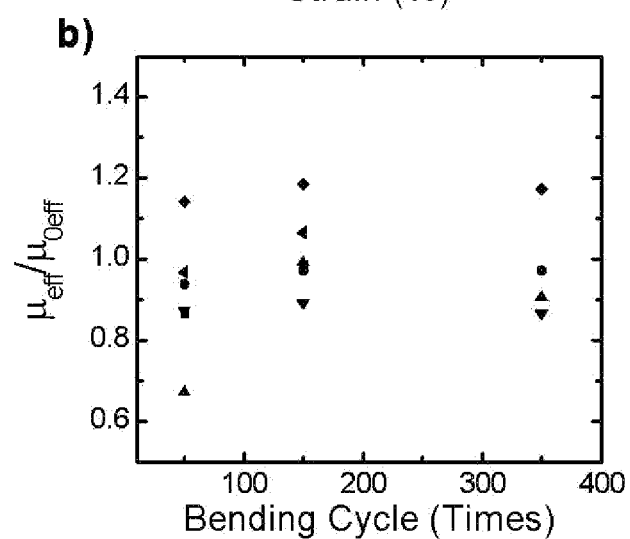
FIG. 32B presents normalized effective mobilities $\mu_{eff}/\mu_{0eff}$ after several hundred bending cycles (to a radius of 9.2 mm) that cause compressive strain at the device to vary between 0 and 0.98%.

Mechanical flexibility is an important characteristic of devices of this type. We performed systematic bending tests on the contact-doped μs-Si transistors, with bending directions that place the devices in compression and in tension. We also carried out some fatigue tests. The details of the experimental set-up is provided in Example 6. FIG. 32A shows the change of the effective device mobility, normalized by the value in the unbent state, $\mu_{0eff}$, as a function of strain (or bending radius). Negative and positive strains correspond to tension and compression, respectively. For this range of strains (corresponding to bend radii down to ~1 cm for the 200 micron thick substrate), we observed only small (<20% in most cases) changes in $\mu_{eff}/\mu_{0eff}$, the threshold voltage and the on/off ratio. This level of mechanical flexibility is comparable to that reported for organic and a-Si transistors on plastic substrates. FIG. 32B presents normalized effective mobilities $\mu_{eff}/\mu_{0eff}$ after several hundred bending cycles (to a radius of 9.2 mm) that cause compressive strain at the device to vary between 0 and 0.98%. Little change in the properties of the devices was observed; after 350 cycles, the $\mu_{eff}/\mu_{0eff}$, the threshold voltage and the on/off ratio change by less than 20%. These results indicate good fatigue stability of the present transistors comprising printable heterogeneous semiconductor elements.

This example demonstrates the usefulness of spin-on dopant processes for contact-doped printable single crystal silicon semiconductor elements in transistors on plastic substrates. Scaling analysis indicates that the present process yields devices that are not contact limited, which demonstrates the applicability of the present methods for fabricating high frequency silicon devices on plastic substrates. This feature, combined with the remarkably good mechanical flexibility and fatigue stability of the devices, make this contact doped printable heterogeneous semiconductor approach a valuable route to a wide variety of flexible macroelectronic, microelectronic and/or nanoelectronic systems.

The present invention also provides heterogeneous integration methods for integrating printable semiconductor elements into a range of devices and device configurations. This aspect of the present invention provides fabrication pathways for making a wide range of devices wherein disparate classes of materials are assembled and interconnected on the same platform. Heterogeneous integration methods of the present invention utilize solution printing and/or dry transfer contact printing to combining two or more different materials in a manner establishing their electrical, optical and/or mechanical interconnectivity. Printable semiconductor elements of the present invention may be integrated with different semiconductor materials or other classes of materials, including dielectrics, conductors, ceramics, glasses and polymeric materials.

In one embodiment of this concept, heterogeneous integration involves transferring and interconnecting a printable semiconductor element to a semiconductor chip having a different composition, for example to assemble a system on a chip type device. In another embodiment, a plurality free standing devices and/or device components are fabricated on different kinds of semiconductor wafers (e.g. silicon wafers and GaN wafers) and subsequently integrated together on the same receiving substrate, such as a receiving wafer. In yet another embodiment, heterogeneous integration involves introducing one or more printable semiconductor elements into preformed complex integrated circuits by assembling the printable elements in specific orientations and effectively interconnecting the printable elements with other components comprising the integrated circuit. Heterogeneous integration methods of the present invention may employ a large number of other techniques for assembling and interconnecting microscale and/or nanoscale printable semiconductor elements known in the art including, but not limited to, wafer bonding methods, use of adhesives and intermediate bonding layers, annealing steps (high and low temperature anneal), treatment to strip oxide outer coating, semiconductor doping techniques, photolithography and additive multilayer processing via successive thin film layer transfer.

Figure 33:
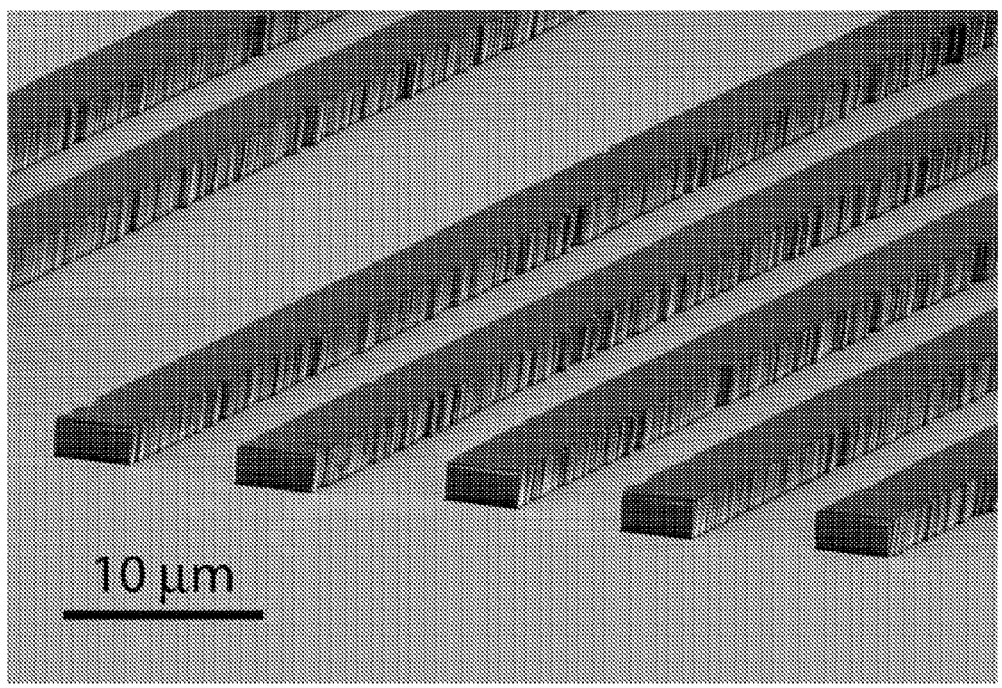
FIG. 33 shows an example of a composite semiconductor structure fabricated using a heterogeneous integration method of the present invention comprising gallium nitride microstructures direct-bonded onto a silicon wafer (1 0 0).

FIG. 33 provides a SEM image a composite semiconductor structure comprising gallium nitride microstructures direct-bonded onto a silicon wafer (100) fabricated using a heterogeneous integration method of the present invention. To fabricate the composite semiconductor structure shown in FIG. 33, printable semiconductor elements comprising GaN were micromachined from a GaN on silicon (111) wafer using inductively coupled plasma etching and released from the silicon using an anisotropic wet etch in hot aqueous KOH (100 degrees Celsius). The printable GaN elements were removed from the mother chip and printed onto a receiving silicon chip by dry transfer contact printing using a PDMS stamp. Bonding between the printable GaN elements and the silicon chip is provided by attractive intermolecular forces does not require use of an adhesive layer. The SEM image provided in FIG. 33 shows that printable semiconductor elements and transfer printing assembly methods of the present invention are capable of heterogeneous integration of different semiconductor materials.

EXAMPLE 8

Fabrication of High Performance Solar Cells Having Printable Semiconductor Elements It is a goal of the present invention to provide methods of making solar cells, solar cell arrays and integrated electronic devices having solar cells on large areas of substrates having a range of compositions, including flexible plastic substrates. In addition, it is a goal of the present invention to provide heterogeneous printable semiconductor elements capable of providing P-N junctions in solar cells exhibiting photodiode responses comparable to solar cells fabricated by convention high temperature processing methods.

The ability of printable semiconductor elements of the present invention to provide heterogeneous printable semiconductor elements comprising P-N junctions with high quality P-N layer interfaces in solar cells was verified by experimental studies. Solar cells were fabricated using two different fabrication pathways for making P-N junctions, and the photodiode responses of devices made by these pathways were evaluated. The experimental results provided in this example demonstrate that printable heterogeneous semiconductor elements and related assembly methods of the present invention are useful for providing high quality P-N junctions in solar cells.

FIG. 34A provides a process flow diagram schematically illustrating processing steps in a fabrication pathway for making a solar cell comprising a printable P-N junction. As shown in FIG. 34A, a high quality semiconductor material, such as a single crystalline silicon wafer, is provided and processed in a manner generating an N doped semiconductor region positioned directly adjacent to a P doped semiconductor region. Preferably for fabricating solar cells exhibiting good efficiencies, P and N regions are in physical contact and have an abrupt interface without undoped semiconductor present between them. The processed semiconductor material is subsequently patterned and etched to define the physical dimensions of a printable a P-N junction. Subsequent processing via lift-off techniques generates a monolithic structure comprising the printable P-N junction having a P doped layer directly adjacent to an N doped semiconductor layer. The printable P-N junction is then assembled onto a substrate using solution printing or dry transfer contact printing methods of the present invention. As shown in FIG. 34A, contacts (i.e. electrodes) on P and N doped semiconductor layers may be defined by deposition on to the monolithic structure prior to lift-off processing of the printable P-N junction or by deposition onto the printable P-N junction after assembly on the substrate. In one embodiment, contacts are defined using vapor deposition of one or more metals.

Figure 34B:
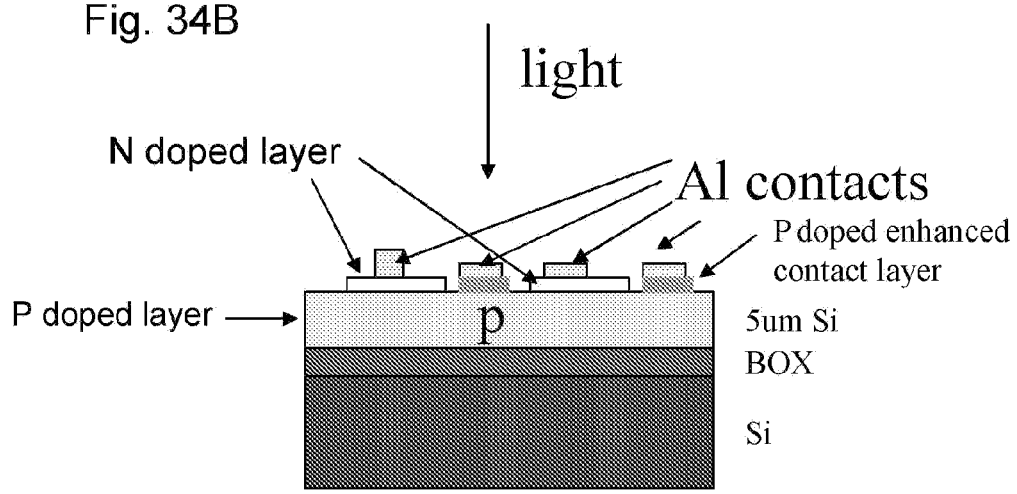
FIG. 34B shows a schematic diagram of a solar cell device configuration generated by the fabrication pathway illustrated in FIG. 34A.
Figure 34C:
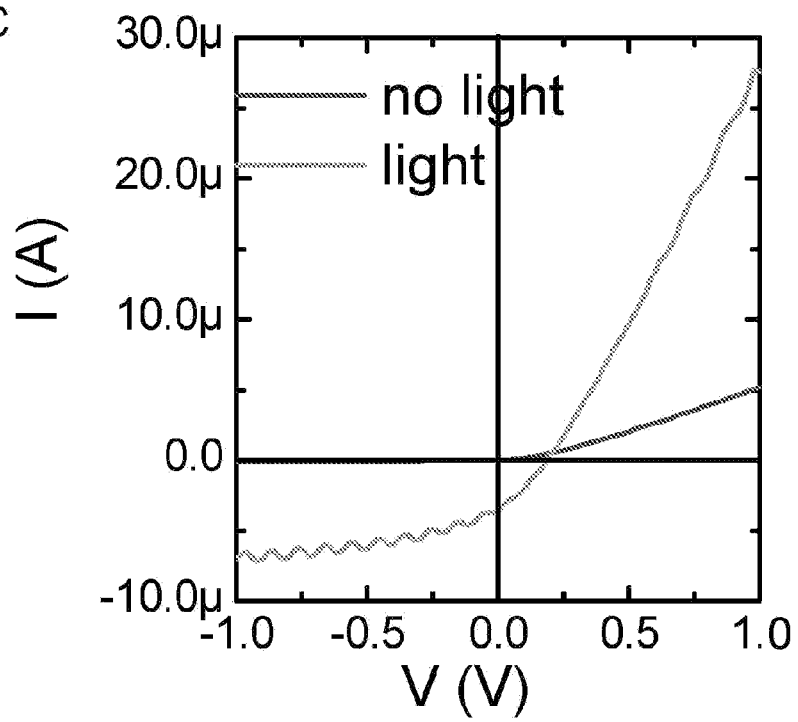
FIG. 34C shows the photodiode response observed upon illumination of a solar cell device having the configuration shown in FIG. 34B.

FIG. 34B shows a schematic diagram of a solar cell device configuration generated by the fabrication pathway illustrated in FIG. 34A. A 5 micron thick P doped semiconductor layer having boron dopant is provided in direct contact with two N doped semiconductor layers having phosphorous dopant. Contacts are provided directly on the N doped layers and on two enriched P doped layers in contact with the P doped semiconductor layer forming the P-N junction. Introduction of phosphorous and boron doped contact regions overcomes the contact resistance of the system. FIG. 34C shows a plot of current verse bias showing the photodiode response observed upon illumination of a solar cell device having the configuration shown in FIG. 34B. As shown in FIG. 34C current is generated when the solar cell is illuminated and provided with a positive bias.

Figure 35A:
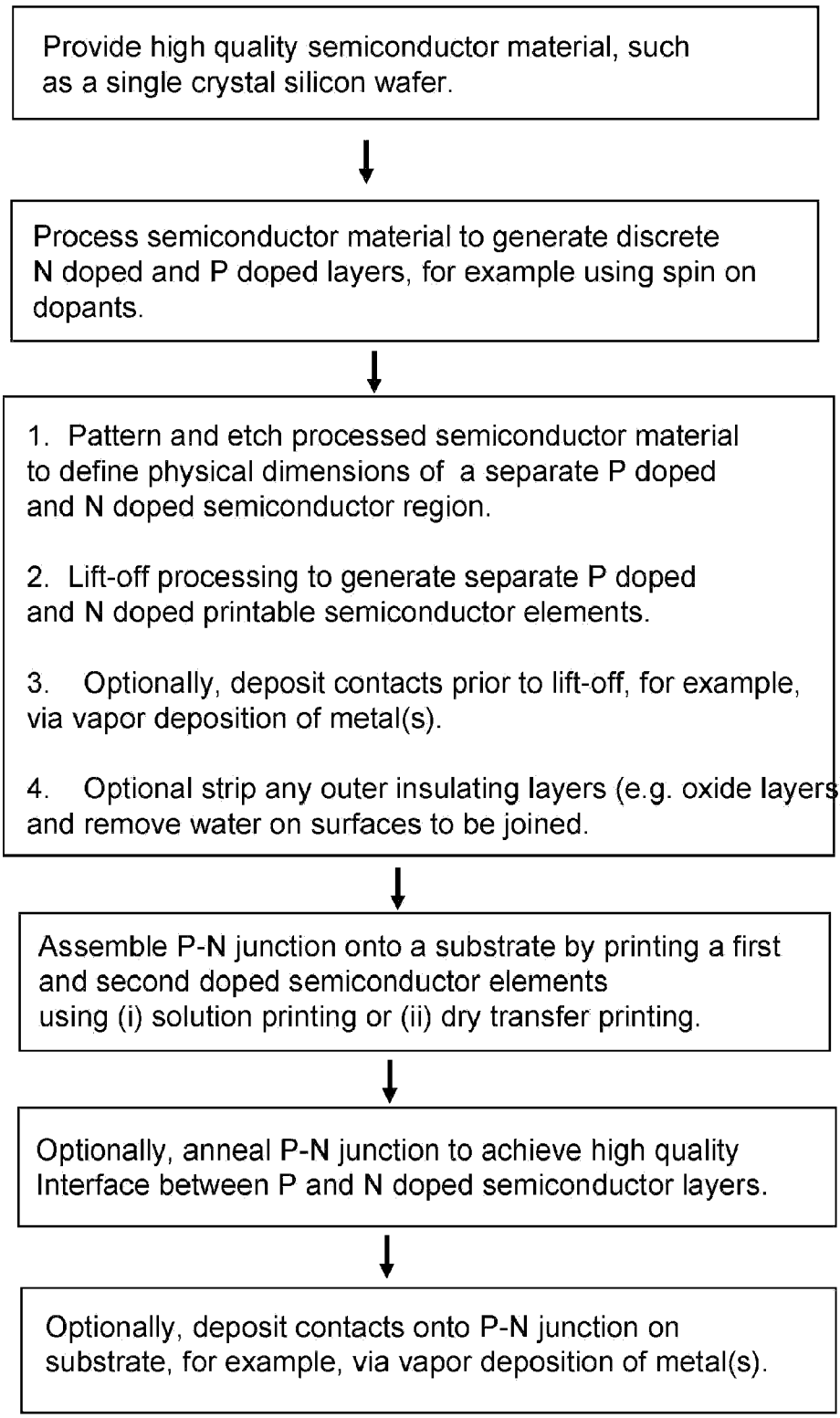
FIG. 35A provides a process flow diagram schematically illustrating processing steps in an alternative fabrication pathway for making a solar cell comprising printable P and N doped semiconductor layers.

FIG. 35A provides a process flow diagram schematically illustrating processing steps in an alternative fabrication pathway for making a solar cell comprising independently printable P and N doped semiconductor layers. As shown in FIG. 35A, a high quality semiconductor material, such as a single crystalline silicon wafer, is provided and processed in a manner generating discrete N doped and P doped semiconductor regions. The processed semiconductor material is subsequently patterned and etched to define the physical dimensions of separate P doped and N doped layers. Subsequent processing via lift-off techniques generates a separately printable P doped semiconductor layer and/or a separately printable N doped semiconductor layer. A P-N junction is then assembled by printing a first doped semiconductor element (either P or N doped) onto a second doped semiconductor element having a different composition such that it is in contact with the first doped element. In one embodiment, the P-N junction is assembled by printing both P and N doped semiconductor layers, for example by printing a first doped semiconductor layer onto a substrate and subsequently printing a second doped semiconductor layer onto the first doped semiconductor layer. Alternatively, the PN junction may be assembled by printing a first doped semiconductor layer onto a substrate comprising a second doped semiconductor layer. Any orientation of P and N doped layers providing a good interface between these elements is usable in the present invention including, but not limited to, a orientation in which the first doped semiconductor element is contacted to the top of the second doped semiconductor element.

Joining N and P doped printable semiconductor elements may be accomplished via wafer bonding techniques well known in the art (See, e.g. "Materials Science and Engineering R" Jan Haisma and G. A. C. M. Spierings, 37 pp 1-60 (2002)). Optionally, P and N doped semiconductor layers are treated prior to, during or after printing to strip away any outer insulating layers on them, such as outer oxide layers, which can interfere with establishing a P-N junction having a high quality interface between P-N doped layers. Optionally, in some embodiments any water present on the doped semiconductor surfaces to be joined is eliminated, for example by heating, prior to contacting these elements to enhance the quality of the interface in the P-N junction. Assembly of the first and second doped semiconductor elements may be carried out using solution printing or dry transfer contact printing methods of the present invention. Optionally, the fabrication pathway of this aspect of the present invention may further comprise the step of annealing the P-N junction to establish a good interface between P and N doped semiconductor layers. Annealing is preferably carried out at temperatures low enough so as not to significantly damage the substrate supporting the P-N junction, for example at temperatures less than about 200 degrees Celsius for P-N junctions assembled on plastic substrates. Alternatively, the P-N Junction may be annealed in processing steps separate from the substrate. In this embodiment, the annealed P-N junction is allowed to cool and subsequently assembled onto the substrate via solution printing or dry transfer contact printing methods. As shown in FIG. 35A, contacts (i.e. electrodes) on P and N doped semiconductor layers may be defined by deposition on to individual doped semiconductor layers prior to lift-off processing or by deposition onto the printable P-N junction after assembly on the substrate. In one embodiment, contacts are defined using vapor deposition of one or more metals.

Figure 35B:
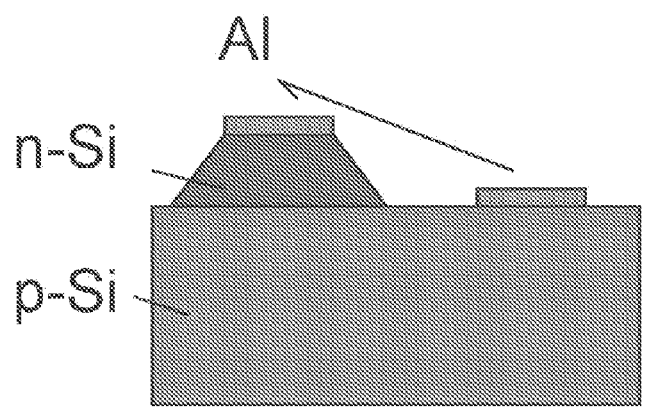
FIG. 35B shows a schematic diagram of a solar cell device generated using the fabrication pathway illustrated in FIG. 35A.
Figure 35C:
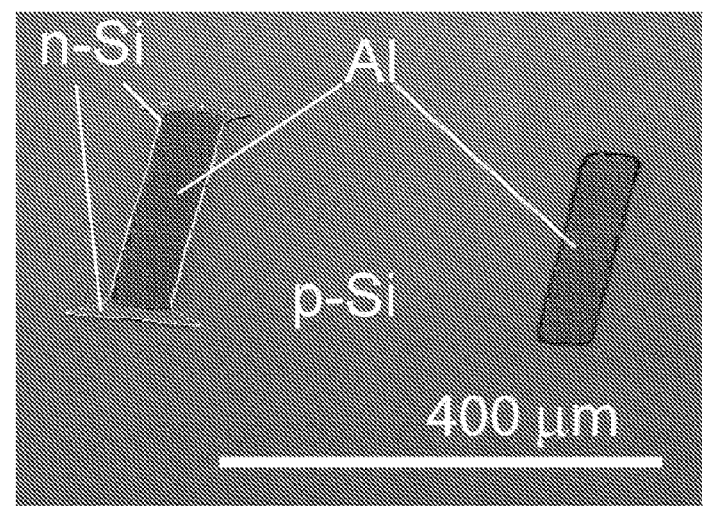
FIG. 35C shows a SEM image of a top view of the solar cell schematically depicted in FIG. 35B.
Figure 35D:
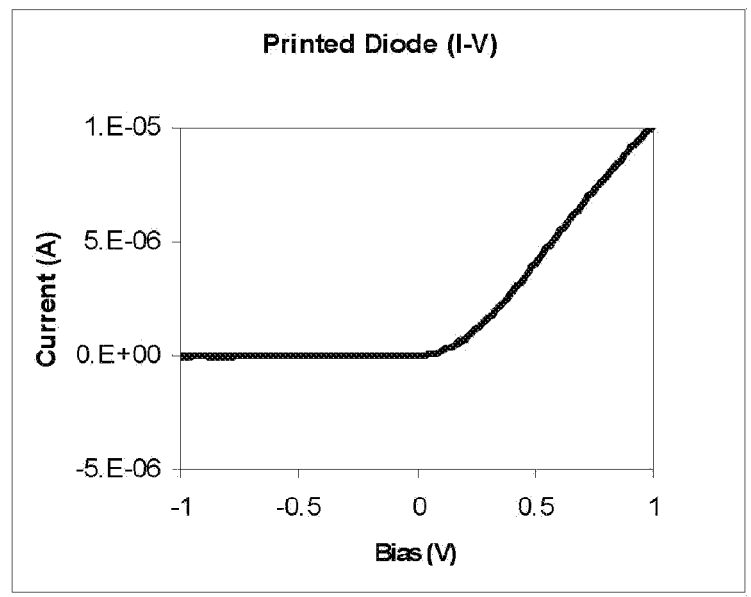
FIG. 35D provides a plot of current verse bias demonstrating the photodiode response of the solar cell shown in FIG. 35C.
Figure 35E:
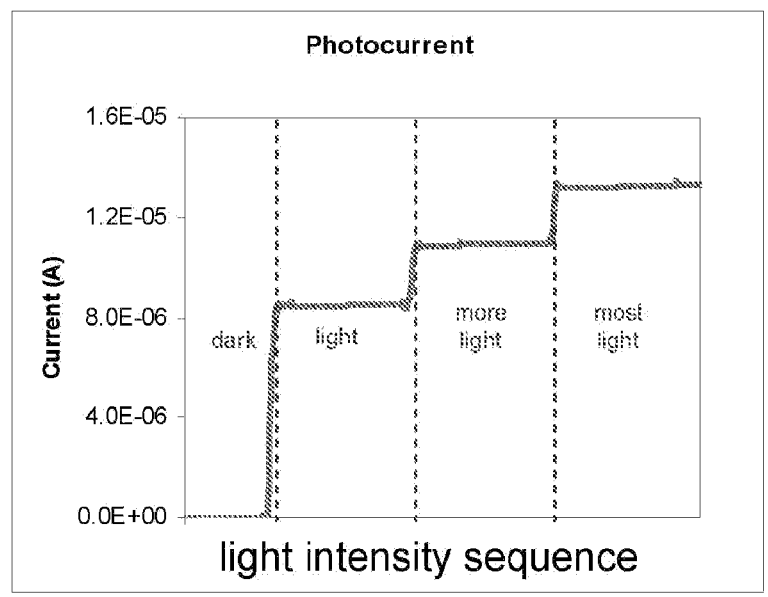
FIG. 35E shows plots of current verse bias corresponding to several different illumination intensities demonstrating the photodiode response of the solar cell shown in FIG. 35C.

FIG. 35B shows a schematic diagram of a solar cell device generated by printing a N doped semiconductor layer on top of a P doped semiconductor layer of a silicon wafer. The composite structure was annealed to a temperature of about 1000 degrees Celsius to generate a P-N junction having a high quality interface between N and P doped semiconductor layers. Electrical contacts were provided directly on top of each doped semiconductor layer via vapor deposition of aluminum layers. FIG. 35C shows a SEM image of a top view of the solar cell schematically depicted in FIG. 35B. The SEM image shows the N doped semiconductor layer positioned on top of the P doped semiconductor layer and also shows the aluminum contacts on top of each doped semiconductor layer. FIG. 35D provides a plot of current verse bias demonstrating the photodiode response of the solar cell shown in FIG. 35C. As shown in FIG. 35D current is generated when the solar cell is illuminated and provided with a positive bias. FIG. 35E provides a plot of photocurrent as a function of time observed upon illumination of the solar cell shown in FIG. 35C with different intensities of light.

The physical dimensions of printable heterogeneous semiconductor elements, such as printable doped semiconductor elements and printable P-N junctions, useful in solar cells of the present invention depend on a number of variables. First, the thickness must be large enough that appreciable fractions of the incident photons per area are absorbed by the P-N junction. Therefore, the thicknesses of P and N doped layers will depend, at least in part, on the optical properties of the underlying semiconductor material, such as its absorption coefficient. For some useful applications, thicknesses of printable silicon elements range from about 20 microns to about 100 microns and thicknesses of gallium arsenide elements range from about 1 micron to about 100 microns. Second, in some device applications the thickness of the printable elements must be small enough that they exhibit a useful degree of flexible for a particular device application. Use of thin (<100 microns) elements provides flexibility, even for brittle materials such as single crystalline semiconductors, and also lowers fabrication costs by requiring less raw materials. Third, the surface area of the printable elements should be large so as to capture a significant number of incident photons.

Dopants can be introduced into the semiconductor material by any process capable of providing well defined spatial distributions of high quality doped semiconductor materials, including methods using spin-on dopants (e.g., see Example 8). Exemplary methods of introducing dopant into semiconductor materials prove control in the spatial distribution of dopants in one, two or three dimensions (i.e. depth of implantation and area of a semiconductor layer implanted with dopant). A significant advantage of the fabrication pathways shown in FIGS. 34A and 35A is that dopant implantation and activation may be separately carried out under clean room conditions and at high temperatures. Subsequent fabrication and assembly of printable doped semiconductor elements and/or P-N junctions, however, may be carried out at lower temperatures and in non-clean room conditions, thereby allowing high throughput fabrication of solar cells on a variety of substrate materials.

EXAMPLE 9

Fabrication of Stretchable Circuits and Electronic Devices

The present invention provides stretchable electrical circuits, devices and device arrays capable of good performance when stretched, flexed or deformed. Similar to the stretchable semiconductor elements described in Example 2, the present invention provides stretchable circuits and electronic devices comprising a flexible substrate having a supporting surface in contact with a device, device array or circuit having a curved internal surface, such as a curved internal surface exhibiting a wave structure. In this structural arrangement, at least a portion of the curved internal surface of the device, device array or circuit structure is bonded to the supporting surface of the flexible substrate. In contrast to the stretchable semiconductors in Example 2, however, the device, device array or circuit of this aspect of the present invention is a multicomponent element comprising a plurality of integrated device components, such as semiconductors, dielectrics, electrodes, doped semiconductors and conductors. In an exemplary embodiment, flexible circuits, devices and device arrays having a net thickness less than about 10 microns comprise a plurality of integrated device components at least a portion of which have a periodic wave curved structure.

In a useful embodiment of the present invention, a free standing electrical circuit or device comprising a plurality of interconnected components is provided. An internal surface of the electrical circuit or device is contacted and at least partially bonded to a prestrained elastic substrate in an expanded state. Prestraining can be achieved by any means known in the art including, but not limited to, roll pressing and/or prebending the elastic substrate, and the elastic substrate may be prestrained by expansion along a single axis or by expansion along a plurality of axes. Bonding may be achieved directly by covalent bonding or van der Waals forces between at least a portion of the internal surface of the electrical circuit or device and the prestrained elastic substrate, or by using adhesive or an intermediate bonding layer. After binding the prestrained elastic substrate and the electrical circuit or device, the elastic substrate is allowed to relax at least partially to a relaxed state, which bends the internal surface of the printable semiconductor structure. Bending of the internal surface of the electrical circuit or device generates a curved internal surface which in some useful embodiments has a periodic or aperiodic wave configuration. The present invention includes embodiments wherein all the components comprising the electrical device or circuit are present in a periodic or aperiodic wave configuration.

Periodic or aperiodic wave configurations of stretchable electrical circuits, devices and device arrays allow them to conform to stretch or bent configurations without generating large strains on individual components of the circuits or devices. This aspect of the present invention provides useful electrical behavior of stretchable electrical circuits, devices and device arrays when present in bent, stretched or deformed states. The period of periodic wave configurations formed by the present methods may vary with (i) the net thickness of the collection of integrated components comprising the circuit or device and (ii) the mechanical properties, such as Young's modulus and flexural rigidity, of the materials comprising integrated device components.

Figure 36A:
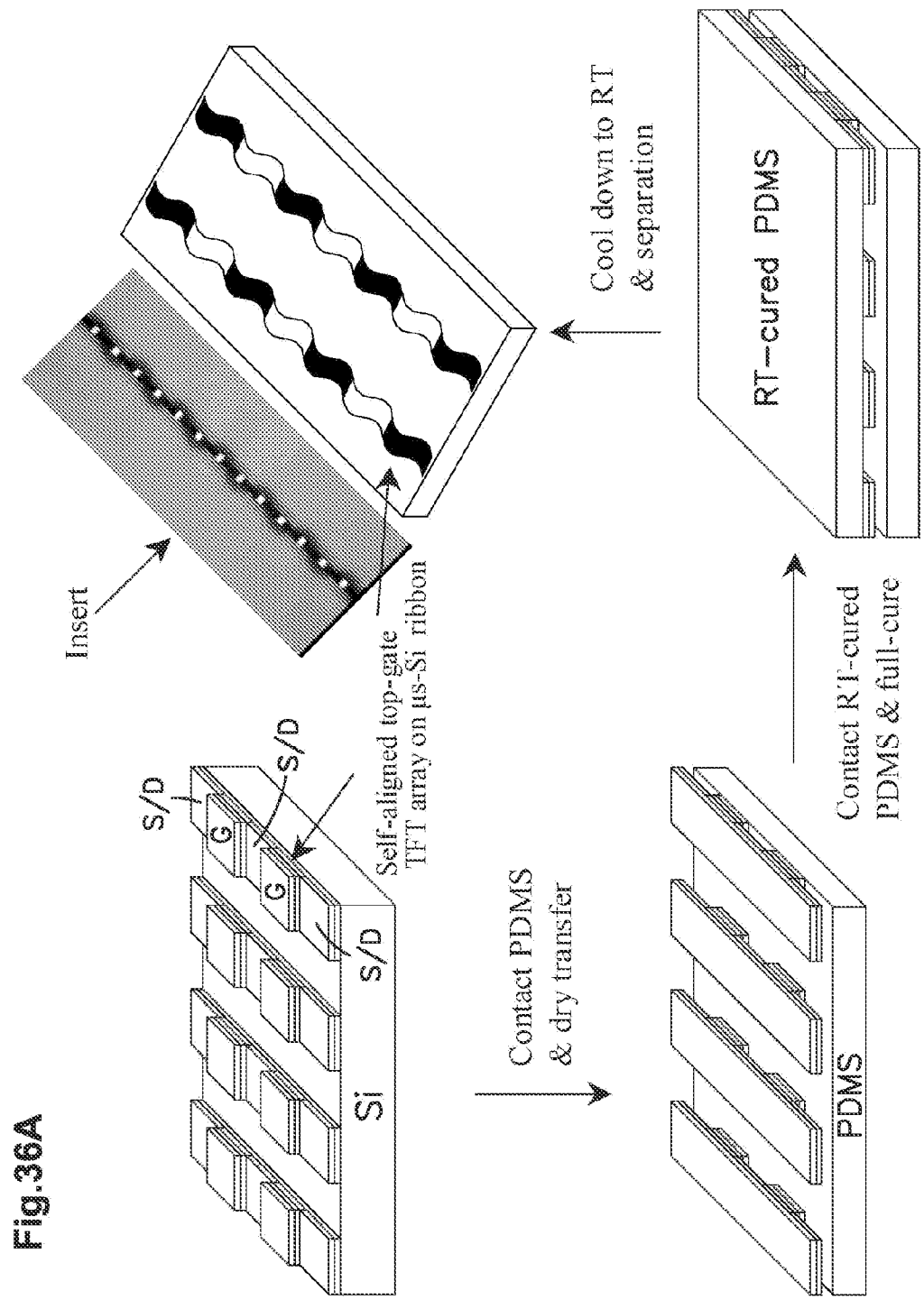
FIG. 36A shows a process flow diagram illustrating an exemplary method of making an array of stretchable thin film transistors.

FIG. 36A shows a process flow diagram illustrating an exemplary method of making an array of stretchable thin film transistors. As shown in FIG. 36A, an array of free standing printable thin film transistors is provided using the techniques of the present invention. The array of thin film transistors is transferred to a PDMS substrate via dry transfer contact printing methods in a manner which exposes internal surfaces of the transistors. The exposed internal surfaces are next contacted with a room temperature cured prestrained PDMS layer present in an expanded state. Subsequent full curing of the prestrained PDMS layer bonds the internal surfaces of the transistors to the prestrained PDMS layer. The prestrained PDMS layer is allowed to cool and assume an at least partially relaxed state. Relaxation of PDMS layers introduces a periodic wave structure to the transistors in the array, thereby making them stretchable. The inset in FIG. 36A provides an atomic force micrograph of a array of stretchable thin film transistors made by the present methods. The atomic force micrograph shows the periodic wave structure that provides for good electrical performance in stretched or deformed states.

Figure 36B:
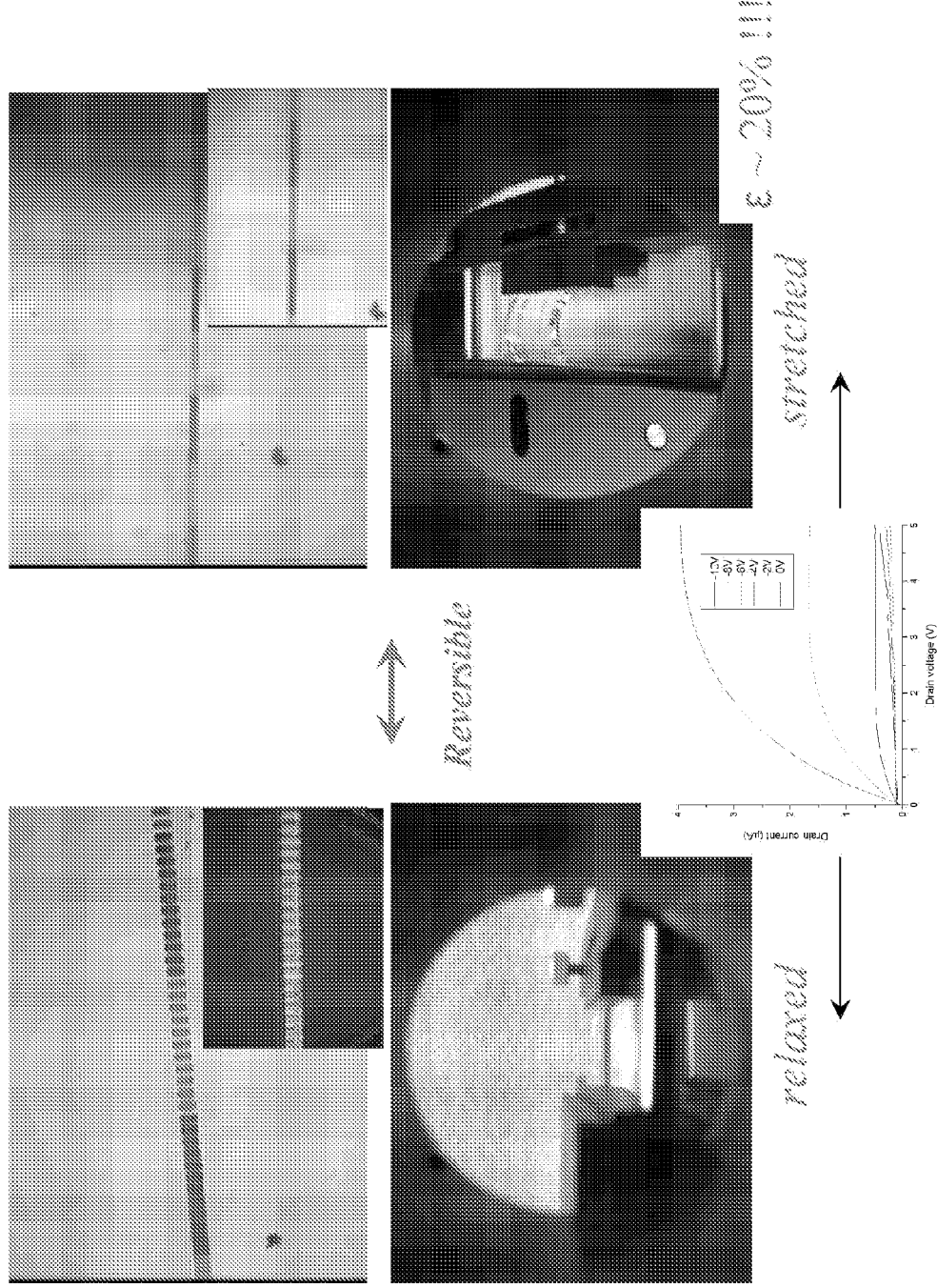
FIG. 36B shows provides optical micrographs of an array of stretchable thin film transistors in relaxed and stretched configurations.

FIG. 36B shows provides optical micrographs of an array of stretchable thin film transistors in relaxed and stretched configurations. Stretching the array in a manner generating a net strain of about 20% on the array did not fracture or damage the thin film transistors. The transition from a relax configuration to a strain configuration was observed to be a reversible process. FIG. 36B also provides a plot of drain current verse drain voltage for several potentials applied to the gate electrode showing that the stretchable thin film transistors exhibit good performance in both relaxed and stretched configurations.

EXAMPLE 10

Large Area, Selective Transfer of Printable Microstructured Silicon (μs-Si): A Printing-based Approach to High Performance Thin Film Transistors Supported on Flexible Substrates The methods, devices and device components of the present invention provide a new printing-based fabrication platform for making high performance integrated microelectronic devices and device arrays. Advantages of the present approach to macroelectronic and microelectronic technologies over conventional processing methods include compatibility with a wide range of substrate materials, physical dimensions and surface morphologies. In addition, the present printing-based approach enables a low cost, high efficiency fabrication pathway for making integrated microelectronic devices and device arrays on large areas of substrates that is compatible with pre-exisiting high throughput printing instrumentation and techniques.

The advanced information technologies that shape the structure of modern society depend critically on the use of microelectronic devices, ones that involve ever increasing higher densities of integration. From the initial circuits (ICs) of the late 1950's, ones that incorporated fewer than 4 transistors, current state of the art ICs now integrate millions transistors in an essentially equivalent sized package. There has been an increased interest, however, in developing new device form factors, ones in which the capabilities of semiconductor devices are embedded in structure involving either large area and/or flexible materials supports using fabrication method that serve to in an attempt to decrease costs while maintaining high device performance levels. Such devices technologies could find wide application as active matrix pixel display drivers and components of RF identification tags. Recent reports detail the use of solution processing methods to construct models of such circuits, notably ones based on semiconductor nanowires (NWs) or networked nanotubes. Although functional devices prepared in this way are promising, they are generally characterized by significantly lower levels of device performance compared to conventional high temperature semiconductor processing approaches. For example, field effective mobilites ranging from ~2 $cm^2$/Vs and ~40 $cm^2$/Vs are reported for thin film transistors (TFTs) prepared using solution processing methods.

In one aspect, the present invention provides a "top down" fabrication strategy using microstructured single-crystalline silicon (μs-Si) ribbons harvested from silicon-on insulator wafers for use in ultra-high performance TFTs. This fabrication technique is compatible with respect to a range of useful semiconductor materials, and has been successfully adapted to other industrially useful semiconductor materials that include GaN, InP and GaAs.

In this example we demonstrate a number of important processing steps useful in the implementation of this technology, including fabrication methods which allow the selective transfer and accurate registration of silicon ribbons across large substrate areas, and versatile printing procedures applicable to both rigid (i.e. glass) and flexible plastic substrates. We specifically report here two methods that can be used to selectively remove μs-Si from an SOI wafer and subsequently transfer them in patterned forms onto a plastic substrate. The processes, for convenience referred to have as Method I (FIG. 37A) and Method II (FIG. 37B), use different mechanisms of adhesive bonding to affect the printing-based pattern transfer of the μs-Si. Method I exploits physical bonding between a molded Sylgard 3600 poly(dimethylsiloxane) (PDMS) stamp (a new experimental, high modulus PDMS product provided by the Dow Corning Corp.) and μs-Si objects. Method II uses a recently developed masterless soft-lithography technique to chemically bond the μs-Si to a PDMS coated substrate.

Figure 37A:
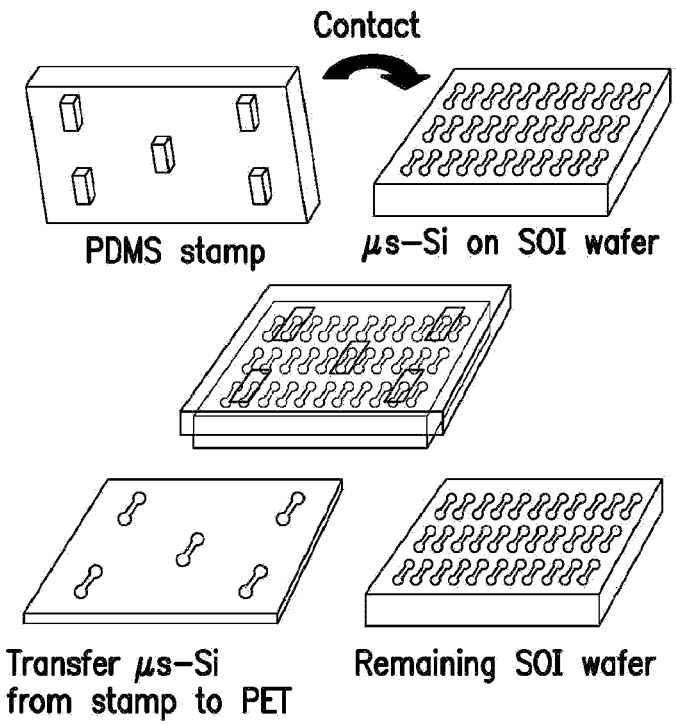
FIG. 37A provides a schematic diagram showing a processing method of the present invention (Method I) for patterning μs-Si elements onto a plastic substrate.

FIG. 37A provides a schematic diagram showing a processing method of the present invention (Method I) for patterning μs-Si elements onto a plastic substrate. In the present example, the plastic substrate comprised a poly(ethyleneterepthalate) (PET) sheet. A peanut shaped photoresist pattern is developed on top of a SOI substrate using standard photolithography techniques. Plasma etching, followed by resist stripping, yields μs-Si "peanuts" that are supported on top of a buried oxide layer. The sample is then etched incompletely using HF to give undercut peanuts held only by a residual oxide layer present at the dumbbell ends of the μs-Si. The SOI wafer is then laminated with a hard 3600 PDMS stamp molded with features corresponding to the latent image of the desired pattern transfer. The raised features of the stamp correspond to regions where μs-Si is removed selectively from the SOI surface due to strong autoadhesion to the PDMS. The stamp, after pealing it away from the SOI wafer, is then placed in contact with a poly(ethyleneterepthalate) (PET) sheet coated with polyurethane (PU) that had been partially cured using a UV lamp. A bar coating technique is used to deposit the PU adhesion level to ensure a uniform coating thickness over the large area of the (600 $cm^2$) plastic substrate. The μs-Si on the stamp is then placed in contact with the PU coated side of the plastic sheet, a second UV/Ozone exposure is then preformed from the PET side of the sandwich to fully cure the PU and enhance its bonding to the μs-Si. Pealing the stamp from the plastic substrate results in the detachment of the microstructured silicon from the PDMS, thus completing the transfer to the PU coated substrate.

Figure 37B:
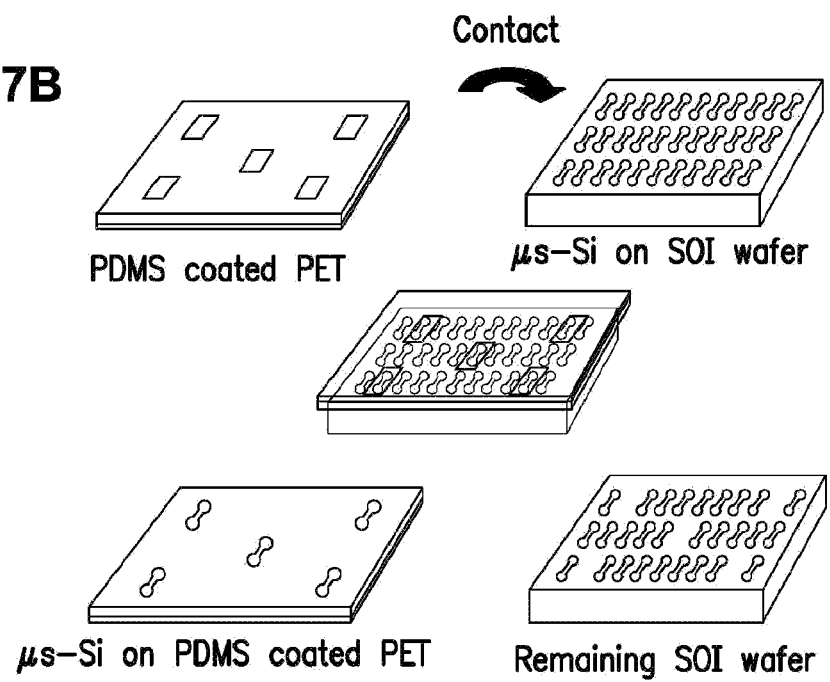
FIG. 37B provides a schematic diagram illustrating an alternative processing method of the present invention (Method II) for patterning μs-Si elements onto a plastic substrate.

FIG. 37B provides a schematic diagram illustrating an alternative processing method of the present invention (Method II) for patterning μs-Si elements onto a plastic substrate. In the present example, the plastic substrate comprised a poly(ethyleneterepthalate) (PET) sheet. This recently reported Decal Transfer Lithography (DTL) technique effects the pattern transfer using a flat, unmolded PDMS slab that is photochemically treated to provide spatially modulated strengths of adhesion. An UV/Ozone (UVO) treatment is patterned across the surface of a slab of conventional Sylgard 184 PDMS using a microreactor photomask to pattern the UVO modification with high spatial resolution. After exposure, the photochemically modified PDMS coated PET is placed in contact with a peanut presenting SOI wafer and heated to 70° C. for 30 minutes. The fabrication of the peanut shapes on the SOI wafer followed the same procedures of Method I (see FIG. 37A), with the addition of evaporating a thin film of $SiO_2$ (5 nm) onto the surface after the HF etching step. This layer facilitates strong chemical bonding to the PDMS. After heating, the PDMS is pealed from the SOI, giving a patterned transfer of μs-Si to the UVO modified regions of the PDMS.

Figure 38A:
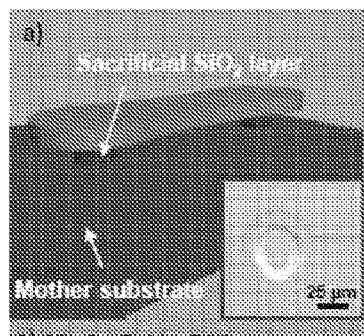
FIG. 38A shows the design of the so-called peanut shaped μs-Si objects used in methods of the present invention. Inset optical image in FIG. 38A shows the optimized HF etching condition where the buried oxide under the channel is removed while a sacrificial $SiO_2$ portion remains.
Figure 38B:
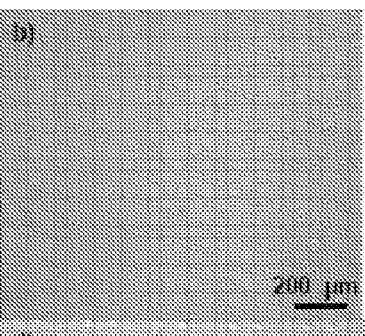
FIG. 38B shows an example of lost of this order when the Si objects are overetched in HF solution.

FIG. 38A shows the design of the so-called peanut shaped μs-Si objects used in methods of the present invention. Inset optical image in FIG. 38A shows the optimized HF etching condition where the buried oxide under the channel is removed while a sacrificial SiO2 portion remains. The peanut shape is particularly beneficial because its ends are slightly wider than the body of the structure. Upon etching the underlying oxide layer in an HF solution, the timing can be optimized such that the oxide layer under the center is completely removed while a sacrificial portion of $SiO_2$ still remains at either end (the dumbbell region seen in the inset image of FIG. 38A). It is this residual $SiO_2$ layer that holds the μs-Si in its original position. Without this oxide bridge layer, the order of the μs-Si created on the SOI wafer by photolithography is susceptible to lost. FIG. 38B shows an example of lost of this order when the Si objects are overetched in HF solution. As shown in FIG. 38B, Si objects to start to float in the HF solution when the sample was over etched in HF solution. When the μs-Si is removed from the SOI wafer by either Method I or II, fracture occurs at the edges of the sacrificial region.

Figure 38C:
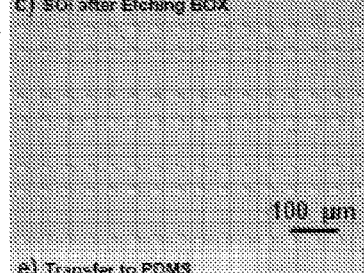
FIGS. 38C, 38D, 38E and 38F shows a series of micrographs that depicts the progression of each step of the μs-Si transfer as effected using Method I.
Figure 38D:
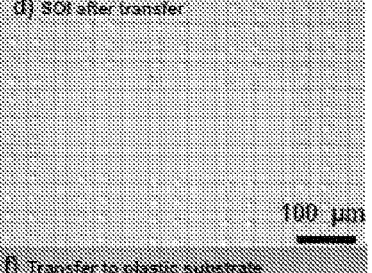
Figure 38E:
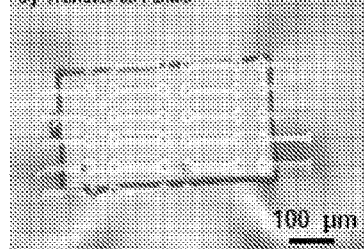
Figure 38F:
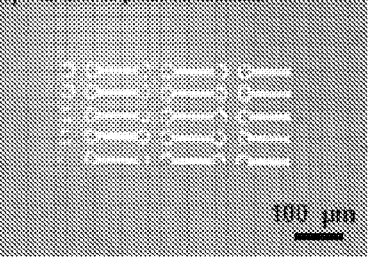

FIGS. 38C, 38D, 38E and 38F shows a series of micrographs that depicts the progression of each step of the μs-Si transfer as effected using Method I. FIG. 38C shows the μs-Si on the SOI wafer after optimized undercut HF etching. FIG. 38D shows the SOI wafer after the PDMS stamp removed a portion of the μs-Si. As shown in FIG. 38D, the PDMS stamp removes a portion of the μs-Si, thereby leaving the neighboring regions intact on the SOI. Since the unused microstructured silicon objects on the SOI wafer are retained at their original positions, they can be picked up by a stamp and transferred in subsequent printing steps (as discussed below). FIG. 38E shows μs-Si structures transferred onto the PDMS stamp. The missing center of each end of the μs-Si ribbons reveals the pattern of the fracture occurs during the transfer of the microstructured silicon from the SOI to PDMS stamp. FIG. 38F shows a representative result for a second transfer of the μs-Si (this time from the PDMS stamp to the PU coated plastic substrate) wherein the μs-Si that adhered to the PU support on the plastic.

Figure 39A:
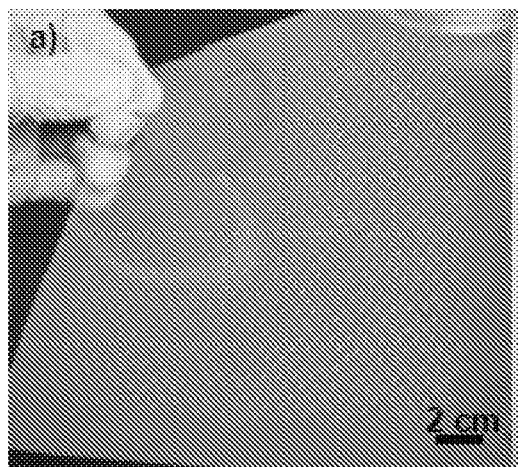
FIGS. 39A and 39B provide optical images of the selective transfer of the μs-Si onto PU/PET sheet by 3600 PDMS stamp.
Figure 39B:
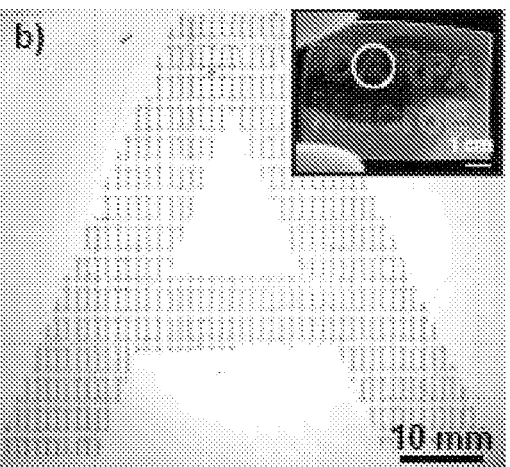

Multiple transfers are possible from a small PDMS stamp to a larger plastic surface. FIGS. 39A and 39B provide optical images of the selective transfer of the μs-Si onto PU/PET sheet by 3600 PDMS stamp. As shown in FIG. 39A, a large area (15×15 cm) transfer where the μs-Si was sparsely transferred onto a plastic substrate by multiple transfers using a 8×8 cm stamp. Each pixel in the image is of the same configuration as that shown in FIG. 38F and follows the same protocol described for FIGS. 38C-38E. The inset of FIG. 39B shows a more complex molded form, a "DARPA macroE" lettering composed of peanut μs-Si objects smaller in size than those highlighted in FIGS. 38C-38E. The high pattern fidelity of the transfer is illustrated by the qualities of the objects defining the letter "A" (circle of inset image) as shown in FIG. 39B. These data demonstrate that only those areas directly touched by the stamp ultimately transfer to the plastic substrate. We note that this transfer is more difficult using conventional Sylgard 184 PDMS for two reasons. First, the Sylgard 184 sags when the separation distances between features exceeds twenty times the feature height. The examples shown here embrace such design rules and thus precludes high-fidelity transfers using the lower modulus polymer. Second, we also found that the Sylgard 184 sometimes does not have enough adhesive force to pickup every μs-Si peanut from the SOI wafer and defects are observed in some applications using stamps prepared form this polymer. The 3600 PDMS from Dow Corning does not sag appreciably even at an aspect ratios of 1:200 and, perhaps more importantly, its adhesion to the μs-Si objects is stronger than is that of the 184 PDMS.

Figure 39C:
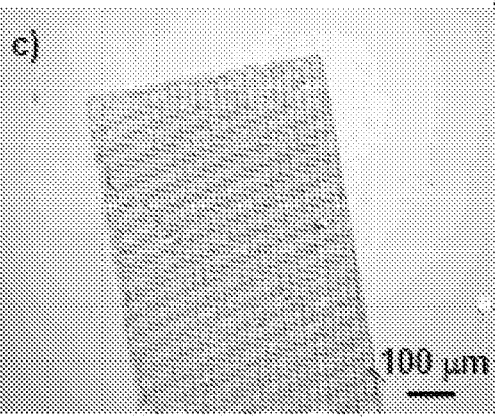
FIG. 39C is an optical micrograph of a section of a Sylgard 184 coated PET substrate to which the μs-Si has been chemically bonded and subsequently transferred. A higher magnification image of the μs-Si transferred in this way is shown in FIG. 39D.
Figure 39D:
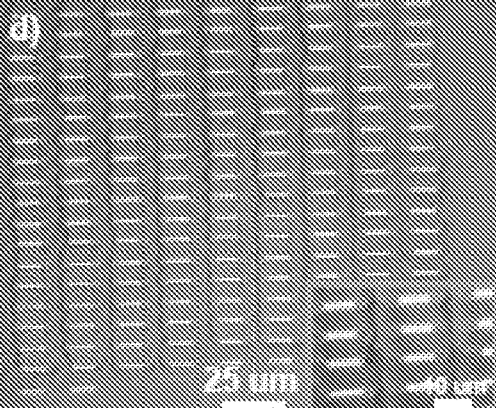

An example of a μs-Si transfer carried out using Method II is shown in FIG. 39C and 39D. FIG. 39C is an optical micrograph of a section of a Sylgard 185 coated PET substrate to which the μs-Si has been chemically bonded and subsequently transferred. A higher magnification image of the μs-Si transferred in this way is shown in FIG. 39D. It should be noted that the dimensions of the peanuts used in this demonstration are relatively small with ribbon widths of 25 μm. We found, interestingly, that these smaller features have a different fracture point when they are removed from the SOI wafer. In the blowup of FIG. 39D, one also notes that the PDMS surface is no longer flat. The reason for this is because of the fact that sections of the PDMS are in fact reciprocally transferred to the SOI, being ripped out of the bulk in contacting regions actived by the patterned UVO treatment, regions where the PDMS sagged and touched the wafer surface between the peanuts.

Figure 40A:
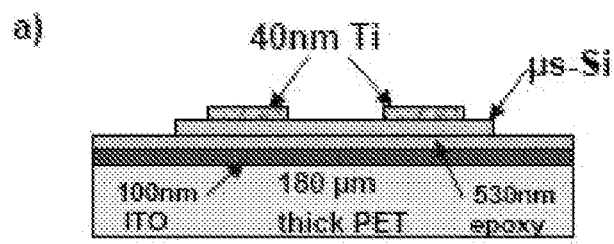
FIG. 40A illustrates an exemplary device geometry of a device fabricated using the peanut shaped μs-Si based on a transfer using Method I.
Figure 40B:
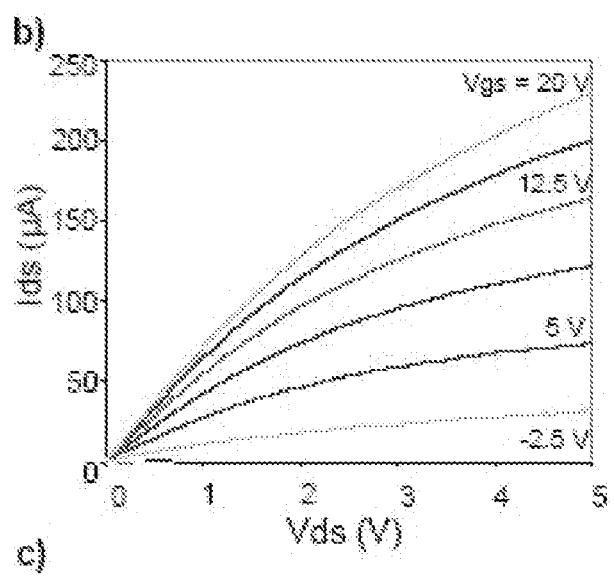
FIG. 40B provides I-V curves of μs-Si TFTs at a range of gate voltage (Vg=−2.5 V to 20 V).
Figure 40C:
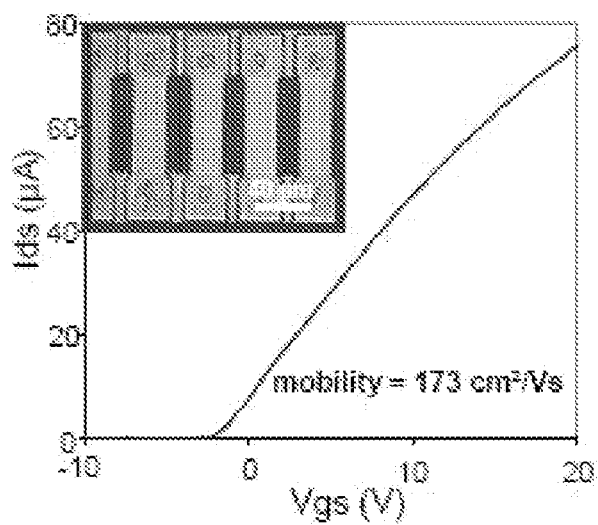
FIG. 40C shows the transfer characteristics, measured at a constant source-drain voltage (Vsd=1V), indicated the effective mobility was 173 cm$^2$/Vs. The inset in FIG. 40C shows an optical micrograph of actual device of the present invention.

FIG. 40A illustrates an exemplary device geometry of a device fabricated using the peanut shaped μs-Si based on a transfer using Method I. To construct these devices an Indium-Tin-Oxide (ITO) coated PET sheet is used as the substrate. The ITO served as the gate electrode and diluted SU-8 5 (measured capacitance=5.77 $nF/cm^2$) is employed as a gate dielectric. FIG. 40B provides I-V curves of μs-Si TFTs at a range of gate voltage (Vg=−2.5 V to 20 V). As shown in FIG. 40B, these plastic supported, peanut shaped μs-Si TFTs show an accumulation mode n-channel transistor behavior. The channel length of the device, as shown in the inset image of FIG. 40C, is 100 μm and the width of the device is 400 μm. FIG. 40C shows the transfer characteristics, measured at a constant source-drain voltage (Vsd=1V), indicated the effective mobility was 173 $cm^2/Vs$. The inset in FIG. 40C shows an optical micrograph of actual device of the present invention. The transfer characteristics indicated that the threshold voltage (Vth) is −2.5 V with an effective mobility was 173 $cm^2/Vs$. These values are consistent with the performance characteristics expected for a 100 nm thick bottom gate structure of this type.

The selective transfer methods described in this example provide an efficient route for transferring microstructured silicon from a SOI wafer to a flexible, macroelectronic system. Using these techniques, and in contrast with conventional solution casting methods, the microstructured silicon objects can be transferred from an SOI mother wafer with precise registration and utilized in ways that minimize waste. The mechanical properties of the new 3600 PDMS investigated in this work demonstrates that it has a number of important advantages as compared to the commercial Sylgard 184 PDMS resin, notably its dimensional stability and higher surface adhesion properties. The printing techniques also proved to be compatible with the construction of macroelectronic systems that incorporate high performance μs-Si thin film transistors.

Experimental

Method I

The fabrication of the μs-Si objects was carried out using a commercial SOI wafer (SOITEC, p-type, top Si thickness=100 nm, resistivity=13.5-22.5 ohm-cm, 145 nm buried oxide layer). Photolithography (Shipley 1805 resist) was used to pattern the SOI wafer into the desired peanut-shaped geometry (mid-section length: 200 μm, width: 25 μm, diameter of peanut: 50 μm). Dry etching (Plasmatherm RIE system, SF6 flow, 40 sccm, 50 mTorr, RF power=100 W, 45 sec) was then used to remove the exposed silicon. The underlying $SiO_2$ was then etched for 80 seconds in an HF (49%) solution. For the 3600 PDMS stamp of Method I, a specialty PDMS (Dow Corning, 3600, elastic modulus=8 MPa) and Sylgard 184 (Dow corning, elastic modulus=1.8 MPa) was mixed in a one to one ratio and cured using standard soft-lithographic patterning methods A UV source (ozone active mercury lamp, 173 μW/cm²) was used to cure the PU thin film adhesion layer (Norland optical adhesive, No. 73). These latter films were coated onto a PET substrate (180 μm in thickness, Mylar film, Southwall technologies) using a bar coating procedure (Meyer bar, RD specialties).

Method II

For Method II, the sizes of the peanut shapes used were smaller than the ones used in Method I (mid-section length: 10 μm, width: 2 μm, diameter of ends: 5 μm). A similar fabrication protocol was used to produce these structures with the exception that the RIE etching time was reduced to 25 seconds (to minimize sidewall etching) and the buried oxide layer was etched for 30 seconds in a concentrated (49%) HF solution. After the latter etching step, the sample was rinsed in a water bath and dried in an oven at 70° C. for 5 minutes. A 50 Å $SiO_2$ layer was then evaporated on top of the sample (Temescal FC-1800 Electron Beam Evaporator). To bind a thin layer of PDMS onto the PET substrate, a layer of PU was first cast by spinning onto the PET at 1000 rpm for 30 seconds and exposed to UVO (173 □W/cm²) for 4 minutes. A film of PDMS was then spuncast at 1000 rpm for 30 seconds onto the PU a cured thermally at 65° C. for three hours.

The selective area soft lithographic patterning procedure comprised placing the unpatterened PDMS side of the coated PET substrate in contact with the patterned side of the UVO photomask. The fabrication of this microreactor mask followed procedures described by Childs et. al. The pattern consisted of two interlocking rectangular arrays (1.2×0.6 mm). The PDMS was then irradiated through the UVO photomask for 3 minutes at a distance of ~3 cm from a mercury bulb (UVOCS T10×10/OES). After exposure, the PDMS stamp was pealed away from the UVO photomask, and the exposed PDMS face was placed into contact with the peanut-bearing SOI wafer. After heating at 70° C. for 30 minutes, tweezers were used to slowly peal the PDMS away, removing segments of the μs-Si in registry with the areas of irradiation.

Device Fabrication

SU-8 5 with 66% (v) SU-8 2000 thinner was spun onto the ITO side of a coated PET sample at 3000 rpm for 30 seconds. The SU-8 epoxy was then precured at 60° C. on a hot plate for ~1 minute. The PDMS stamp (Method I) with the μs-Si on its surface was then brought into contact with the epoxy layer for 30 seconds and peeled back to transfer the μs-Si to the epoxy. The SU-8 dielectric was then fully cured at 115° C. for 2 minutes, exposed to UV for 10 seconds, and postbaked at 115° C. for 2 minutes. Metal for titanium contacts (40 nm) was then added by e-beam evaporation, with the source-drain area patterned using standard photolithographic methods in conjunction with etching using a 1% HF solution.

EXAMPLE 11

Bendable GaAs Metal-Semiconductor Field Effect Transistors Formed With Printed GaAs Wire Arrays on Plastic Substrates The fabrication methods of the present invention are versatility with respect to the materials that can be assembled and integrated into useful functional devices and device components. Particularly, the present methods are applicable to fabrication of semiconductor based microelectronic and macroelectronic devices using a range of high quality semiconductor materials, including non-silicon materials. To demonstrate this capability of the present methods bendable metal-semiconductor field-effect-transistors (MESFETs) having GaAs microwires were fabricated by present methods and evaluated with respect to their electrical and mechanical attributes.

Field effect transistors formed with high quality, single crystalline semiconductor nano- and microstructures on large area, mechanically flexible plastic substrates are of great interest for a wide range of applications in displays, sensors, medical devices and other systems. A number of approaches have been demonstrated to transfer high quality semiconductor materials (e.g., Si nanowires, microribbons, platelets, etc.) onto plastic substrates for mechanically flexible metal-oxide-semiconductor field-effect-transistors (MOSFETs). The methods of the present invention are useful for fabricating bendable metal-semiconductor field-effect-transistors (MESFETs) on plastic substrates using GaAs microwires (a class of material that we refer to as microstructured GaAs, or μs-GaAs) that have integrated ohmic source/drain contacts. In these methods, high quality bulk GaAs wafers provide the starting material for 'top down' fabrication procedures to form the micro/nanowires. In addition, transfer printing techniques using elastomeric stamps integrate well ordered arrays of these wires with plastic substrates. Electrical and mechanical measurements of MESFETs formed in this way demonstrate that good performance and excellent bendability is achievable using the present methods.

FIG. 41 provides a schematic illustration of the major steps for fabricating, on flexible plastic substrates (poly(ethylene terephthalate) (PET)), MESFETs that use arrays of single crystalline GaAs wires with expitaxial n-type channel layers, and integrated ohmic contacts of AuGe/Ni/Au. A (100) semi-insulating GaAs (SI-GaAs) wafer with an epitaxial Si-doped n-type GaAs layer (concentration of $4.0 \times 10^{17}/cm^3$, IQE Inc., Bethlehem, Pa.) provides the source material for generating the microwires. Photolithography and metallization via electron-beam (and/or thermal) evaporation generates arrays of narrow metal stripes (with width of 2 μm and spacing of 13 μm) comprising conventional multilayer stacks, i.e., AuGe (120 nm)/Ni (20 nm)/Au (120 nm) for ohmic contacts. Annealing the wafer at elevated temperature (i.e., 450° C. for 1 min) in a quartz tube with flowing $N_2$ forms ohmic contacts to the n-GaAs.

Defining the metal stripes along the (0 $\bar{1}$ $\bar{1}$) crystalline orientation of GaAs enables microwires (with integrated ohmic contacts) to be generated using a top down fabrication approach. As shown in processing step i in FIG. 41, a pattern of photoresist is defined on top of the metal stripes (3 μm widths); the openings between these lines lie between adjacent metal stripes. These openings allow etchant ($H_3PO_4$ (85 wt %):$H_2O_2$ (30 wt %):$H_2O$=1:13:12 in volume) to diffuse to the GaAs surface to etch GaAs anisotropically. The photoresist protects the interface between ohmic stripes and GaAs from exposure. The anisotropic etching generates reverse mesas and undercuts along the surface of GaAs, resulting in the formation of GaAs wires with triangular cross section and narrow width released from mother wafer. The undercut yields GaAs wires with widths down to micrometer and/or nanometer length scales by controlling the geometry of the resist and the etching time. Each wire has two ohmic stripes separated by a gap that defines the channel length of the resultant MESFET. As shown in processing step ii in FIG. 41, contacting a flat, elastomeric stamp of poly(dimethylsiloxane) (PDMS) to the photoresist coated GaAs wires forms a van der Waals bond between the hydrophobic surfaces of the PDMS and the photoresist. As shown in processing step iii in FIG. 41, this interaction enables removal of all of the GaAs wires from the wafer to the surface of the PDMS when the stamp is peeled back from the mother wafer. This transfer process preserves the lithographically defined spatial organization (i.e. aligned arrays) of the wires. The PDMS stamp with GaAs wires is then laminated against a PET sheet covered with a thin layer of liquid polyurethane (PU, NEA 121, Norland Products Inc., Cranbury, N.J.), a kind of photocurable polymer.

As shown in processing step iv in FIG. 41, curing the PU, peeling off the PDMS stamp and removing the photoresist by $O_2$ reactive ion etching (RIE, Uniaxis 790, Plasma-Therm Reaction Ion Etching System) leaves the ordered GaAs wires with exposed ohmic stripes embedded on the surface of the PU/PET substrate. In the transfer printing process, the photoresist serves not only as an adhesive layer but also as a protective film to prevent the surfaces of the GaAs wires and ohmic contacts from being contaminated. As shown in processing step v in FIG. 41, further lithographic processing on the PU/PET substrate defines electrodes (250 nm Au) that connect the ohmic stripes to form the source and drain, and for gate electrodes (Ti (150 nm)/Au (150 nm)). The resultant arrays of MESFETs are mechanically flexible due to the bendability of PU/PET sheet (thickness of ~200 μm) and the GaAs wires (widths and thicknesses less than 5 μm).

Figure 42C:
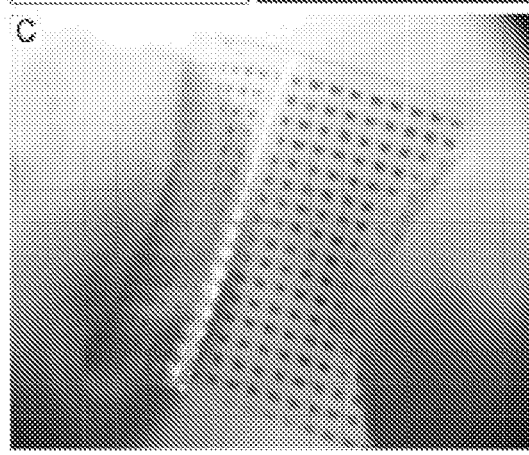
FIG. 42C shows the image of a 2 cm×2 cm PET sheet with hundreds of transistors, clearly demonstrating its flexibility.

FIG. 42A presents a schematic showing a cross section view of the geometry of a GaAs wire based MESFET on a plastic substrate (PU/PET). The source/drain electrodes form ohmic contacts to the n-GaAs layer. The gate electrode forms a Schottky contact to this layer. The strong interaction between the cured PU and the side walls of the GaAs wires bonds the wires to the PU/PET substrate. In this geometry and with the processing approach described previously, the active n-GaAs layer (i.e., the transistor channel) never contacts any polymeric materials other than photoresist. The Ti/Au gate electrode forms a Schottky contact with the n-GaAs surface; the barrier allows one to apply a relatively negative voltage (i.e., <0.5 V) to modulate the flow of current between the source and drain electrodes, as in a conventional MESFET. FIG. 42B shows a representative image of two GaAs wire based MESFETs on plastic each of which uses an array of ten GaAs wires, fabricated according to the process flow diagram of FIG. 41. The wires have well-aligned orientation and uniform widths of ~1.8 μm. Au pads with widths of 150 μm and lengths of 250 μm connect the ohmic stripes on ten GaAs wires to form source and drain electrodes for each individual MESFET. A Ti/Au stripe with width of 15 μm and deposited in the 50-μm gap (transistor channel) between source and drain electrodes provides the gate electrode. These stripes connect to a larger metal pad for probing. The contrast difference between the metal on the wires and that on the plastic is likely due to surface roughness on the PU generated during RIE etching of the photoresist. FIG. 42C shows the image of a 2 cm×2 cm PET sheet with hundreds of transistors, clearly demonstrating its flexibility. Multiple printing steps and/or wire fabrication runs may be used to generate large numbers of wires patterned over large areas on plastic substrates. Various parameters, such as the widths of the GaAs wires, the widths of the source/drain electrodes, the channel and gate lengths are adjusted easily to yield MESFETs with a range of desired output characteristics.

Figure 43A:
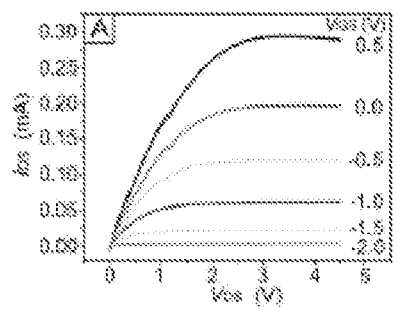
FIGS. 43A, 43B and 43C present results from a GaAs MESFET with a channel length of 50 μm, a gate length of 15 μm, similar to the one shown in FIG. 42B.
Figure 43B:
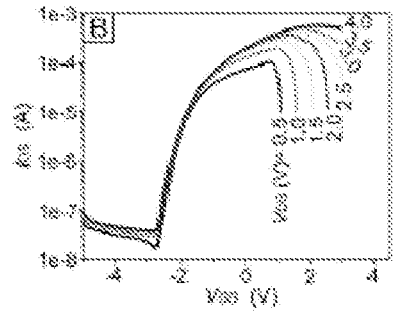
Figure 43C:
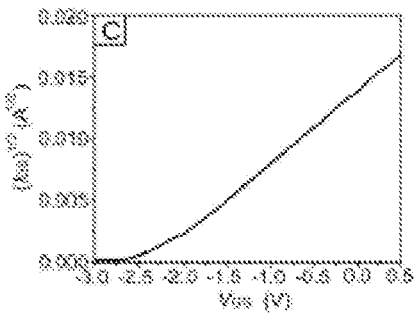

The DC performance of the transistors was characterized to evaluate their electrical and mechanical properties. FIGS. 43A, 43B and 43C present results from a GaAs MESFET with a channel length of 50 μm, a gate length of 15 μm similar to the one shown in FIG. 42B. FIG. 43A shows the current-voltage (between drain and source electrodes) curves at gate voltages between 0.5 to −2.0 V with steps of 0.5 V. The $I_{DS}$-$V_{DS}$ characteristics are comparable to conventional wafer based MESFETs built with n-type GaAs layer and standard techniques, i.e., $I_{DS}$ saturates in the regions of high $V_{DS}$ and $I_{DS}$ decreases with decrease of gate voltage. In the linear region, the channel resistance at $V_{GS}$=0 V is $R_{channel}$=6.4 kΩ. FIG. 43B shows the transfer characteristics (i.e., $I_{DS}$ vs. $V_{GS}$) of a GaAs MESFET of the present invention measured at different $V_{DS}$. All of the curves have minima at the same gate voltage, i.e., −2.65 V. The drop of $I_{DS}$ at high positive gate voltages is due to the leakage current from gate to source that develops through the Schottky contact in this regime. FIG. 43C shows the transfer curve at $V_{DS}$=4 V, plotted as $(I_{DS})^{1/2}$ vs. $V_{GS}$, clearly showing a linear relationship as expected for a MESFET. The pinch-off voltage and transconductance at $I_{DS}$=0.19 mA and $V_{DS}$=4 V are $V_p$=2.65 V and $g_{m0}$=168 μS, respectively. These characteristics indicate that the transistors fabricated on PET substrates resemble the behavior of typical GaAs MESFETs fabricated on wafers by traditional approach.

Mechanical flexibility represents an important parameter of devices on plastic substrates for many of the target applications that are being considered. We tested the transistors by bending the supporting PET sheet. FIGS. 44A and 44B show gate-modulated current-voltage characteristics of a GaAs wire based MESFET on a flexible PET substrate (A) before bending; (B) after bending to a bend radius of 8.4 mm. These figures compare the performance of a transistor before and after the substrate was bent to a radius of 8.4 mm, i.e., corresponding surface stain of 1.2% (tensile in this case) for the 200 μm thick substrate. The results indicate that the transistor can withstand these high strains without failure. In fact, the saturated current at $V_{GS}$=0 V, increases by ~20% in this case. FIG. 44C shows the gate-modulated current-voltage characteristics of the GaAs wire based MESFET after relaxing the bent substrate to its flat, unbent state. A comparison of FIG. 44C and FIG. 44A indicates that after releasing the strain, i.e., such that the substrate becomes flat again, the transistor recovers the performance of its original state. FIG. 44D shows the variation of $I_{DS}$ at $V_{DS}$=4 V and $V_{GS}$=0 V in 3 cycles in terms of bending (with different surface strains)/unbending, indicating that these MESFETs survive multiple bending cycles that cause the tensile strain at the device to vary between 0% and 1.2%, without significant change of their performance (<20%). The systematic changes observed with strain may be related to the fact that mechanical strain causes displacement of crystalline lattice of GaAs wires and their distribution of energy levels.

This example describes an approach that involves (i) generation of ohmic contacts by high temperature annealing on GaAs wafers, (ii) production of GaAs micowires with these integrated ohmic contacts by anisotropic chemical etching, (iii) dry transfer printing of these wires onto plastic substrates with an elastomeric stamp, and (iv) fabrication of high quality MESFETs by low temperature processing of these wires on plastics, to yield the flexible GaAs MESFETs on plastic substrates. The intrinsic properties of GaAs (e.g. high mobilities), the ability to make the MESFETs with short gate lengths and the straightforward paths for integrating these devices into complex circuits (potentially with other transistors built using similar approaches but with other semiconductors) indicate a use for achieving high frequency response for advanced communication, space and other systems. These advantages as well as the remarkably good mechanical flexibility of these devices make GaAs wire MESFETs interesting for flexible macroelectronic systems.

In summary, Micro/nanowires of GaAs with integrated ohmic contacts have been prepared from bulk wafers by metal deposition and patterning, high temperature annealing and anisotropic chemical etching. These wires provide a unique type of material for high performance devices that can be built directly on a wide range of unusual device substrates, such as plastic or paper. In particular, transfer printing organized arrays of these wires at low temperatures onto plastic substrates yield high quality, bendable metal-semiconductor field effect transistors (MESFETs). Electrical and mechanical characterization of devices on poly(ethylene terephthalate) illustrates the level performance that can be achieved. These results indicate promise for this approach to high speed flexible circuits for emerging applications in consumer and military electronic systems.

EXAMPLE 12

Device Configurations Using Printable Semiconductor Elements

FIG. 45 provides a schematic diagram illustrating an exemplary device configuration of the present invention for a P type bottom gate thin film transistor on a plastic substrate. As shown in FIG. 45, the P type bottom gate thin film transistor comprises a silicon printable semiconductor element with doped contact regions, an indium tin oxide bottom gate electrode, an epoxy dielectric layer and source and drain electrodes. The plastic substrate is a poly(ethylene terephthalate) (PET) sheet. Also provided in FIG. 45 are current-voltage characteristics typical of these devices for a range of gate voltages.

FIG. 46 provides a schematic diagram illustrating an exemplary device configuration of the present invention for a complementary logic gate on a plastic substrate. As shown in FIG. 46, the complementary logic gate comprises a P-type thin film transistor and a N-type thin film transistor, each having printable semiconductor elements and provided on a poly(ethylene terephthalate) (PET) sheet.

FIG. 47 provides a schematic diagram illustrating an exemplary device configuration of the present invention for a top gate thin film transistor on a plastic substrate. As shown in FIG. 47, the top gate thin film transistor comprises a silicon printable semiconductor element with doped contact regions, a $SiO_2$ dielectric layer and gate, source and drain electrodes. The plastic substrate is a poly(ethylene terephthalate) (PET) sheet having a thin epoxy layer to facilitate transfer and assembly of the thin film transistors and components thereof. Also provided in FIG. 47 are current-voltage characteristics typical of these devices for a range of gate voltages.

We claim:

1. A stretchable semiconductor element comprising:
a prestrained elastic substrate having a supporting surface; and
a printable single crystalline semiconductor structure provided in a curved conformation having a curved surface with at least one concave region and at least one convex region, wherein said curved surface is continuously bonded to said supporting surface of said prestrained elastic substrate, said semiconductor structure comprising a bent structure under strain resulting from application of a force arising from the bonding between said curved surface of said semiconductor structure and said supporting surface of the prestrained elastic substrate.

2. The stretchable semiconductor element of claim 1 wherein said single crystalline inorganic semiconductor structure has a curved external surface opposite said curved surface bonded to said supporting surface of said prestrained elastic substrate.

3. The stretchable semiconductor element of claim 1 wherein said curved surface has a plurality of convex regions.

4. The stretchable semiconductor element of claim 1 wherein said curved surface has a plurality of concave regions.

5. The stretchable semiconductor element of claim 1 wherein said curved surface has a contour profile characterized by a periodic wave.

6. The stretchable semiconductor element of claim 1 wherein said curved surface has a contour profile characterized by an aperiodic wave.

7. The stretchable semiconductor element of claim 1 wherein said semiconductor structure comprises a bent ribbon having a contour profile characterized by a periodic wave extending the length of said ribbon.

8. The stretchable semiconductor element of claim 7 wherein said bent ribbon has a width selected over the range of about 5 microns to about 50 microns and a thickness selected over the range of about 50 nanometers to about 500 nanometers.

9. The stretchable semiconductor element of claim 1 wherein said prestrained elastic substrate comprises poly (dimethylsiloxane).

10. The stretchable semiconductor element of claim 1 wherein said prestrained elastic substrate has a thickness equal to about 1 millimeter.

11. The stretchable semiconductor element of claim 1 wherein said semiconductor structure is an inorganic semiconductor material.

12. The stretchable semiconductor element of claim 1 wherein said semiconductor structure comprises single crystalline silicon.

13. The stretchable semiconductor element of claim 1 wherein the concentration of heavy metal impurities in said semiconductor structure is less than 1 part per billion atoms.

14. A stretchable electrical circuit comprising:
a prestrained elastic substrate having a supporting surface; and
an electrical device comprising a plurality of integrated device components; said
electrical device provided in a curved conformation having a curved surface with at least one concave region and at least one convex region, wherein said curved surface is continuously bonded to said supporting surface of said prestrained elastic substrate, said plurality of integrated device components comprising a bent structure under strain resulting from application of a force arising from the bonding between said curved surface of said electrical device and said supporting surface of the prestrained elastic substrate, wherein said plurality of integrated device components includes a single crystalline semiconductor structure provided in said bent structure.

15. The stretchable electrical circuit of claim 14 wherein said integrated device components are selected from the group consisting of:
a semiconductor element;
a dielectric element;
an electrode;
a conductor element; and
a doped semiconductor element.

16. The stretchable electrical circuit of claim 14 wherein said curved surface has a contour profile characterized by a periodic wave.

17. The stretchable electrical circuit of claim 14 wherein said curved surface has a contour profile characterized by an aperiodic wave.

18. The stretchable semiconductor element of claim 1 wherein said single crystalline semiconductor is a material selected from the group consisting of: Si, Ge, diamond, SiC, SiGe, AlSb, AlAs, AlN, AlP, BN, GaSb, GaAs, GaN, GaP, InSb, InAs, InN, InP, $Al_xGa_{1-x}As$, CsSe, CdS, CdSe, CdTe, ZnO, ZnSe, ZnS, HgS, PbS, ZnTe, CuCl, PbS, PbTe, SnS, PbI2, $MoS_2$, GaSe, CuG, $Cu_2O$, AlGaAs, AlInAs, AlInP, GaAsP, GaInAs, GaInP, AlGaAsSb, AlGaInP, and GaInAsP.

19. The stretchable semiconductor element of claim 1 wherein said single crystalline semiconductor is doped with a p-type dopant material or is doped with a n-type dopant material.

20. The stretchable semiconductor element of claim 1 wherein said single crystalline semiconductor is a high purity semiconductor having oxygen impurities less than about 5 to 25 parts per million atoms.

21. The stretchable semiconductor element of claim 1 wherein said single crystalline semiconductor is a high purity semiconductor having carbon impurities less than about 1 to 5 parts per million atoms.

22. The stretchable semiconductor element of claim 1 wherein said single crystalline semiconductor is a high purity semiconductor having heavy metal impurities less than or equal to about 1 part per million atoms.

23. The stretchable semiconductor element of claim 1 wherein said single crystalline semiconductor is a high purity semiconductor having heavy metal impurities less than or equal to about 100 parts per billion atoms.

24. The stretchable semiconductor element of claim 1 wherein said single crystalline semiconductor is a high purity semiconductor having heavy metal impurities less than or equal to about 1 part per billion atoms.

25. The stretchable semiconductor element of claim 1 further comprising a one or more device components operationally connected to said single crystalline semiconductor structure, said one or more device components selected from the group consisting of a dielectric layer, an electrode and an additional semiconductor structure.

26. The stretchable electrical circuit of claim 14 wherein said bent structure under strain comprises a thin film transistor.

27. The stretchable electrical circuit of claim 14 wherein said bent structure under strain comprises a printable thin film transistor.

28. The stretchable electrical circuit of claim 14 wherein said bent structure under strain comprises an array of thin film transistors.

29. The stretchable electrical circuit of claim 14 wherein said single crystalline semiconductor structure of the electrical device is an inorganic semiconductor material.

30. The stretchable electrical circuit of claim 14 wherein said single crystalline semiconductor is a material selected from the group consisting of: Si, Ge, diamond, SiC, SiGe, AlSb, AlAs, AlN, AlP, BN, GaSb, GaAs, GaN, GaP, InSb, InAs, InN, InP, $Al_xGa_{1-x}As$, CsSe, CdS, CdSe, CdTe, ZnO, ZnSe, ZnS, HgS, PbS, ZnTe, CuCl, PbS, PbTe, SnS, $PbI_2$, $MoS_2$, GaSe, CuG, $Cu_2O$, AlGaAs, AlInAs, AlInP, GaAsP, GaInAs, GaInP, AlGaAsSb, AlGaInP, and GaInAsP.

31. The stretchable electrical circuit of claim 14 wherein said single crystalline semiconductor is doped with a p-type dopant material or is doped with a n-type dopant material.

32. The stretchable electrical circuit of claim 14 wherein said single crystalline semiconductor is a high purity semiconductor having oxygen impurities less than about 25 parts per million atoms.

33. The stretchable electrical circuit of claim 14 wherein said single crystalline semiconductor is a high purity semiconductor having carbon impurities less than about 5 parts per million atoms.

34. The stretchable electrical circuit of claim 14 wherein said single crystalline semiconductor is a high purity semiconductor having heavy metal impurities less than or equal to about 100 parts per billion atoms.

35. The stretchable electrical circuit of claim 14 wherein said single crystalline semiconductor is a high purity semiconductor having heavy metal impurities less than or equal to about 1 part per billion atoms.

36. The stretchable electrical circuit of claim 14 wherein said electrical device has a net thickness less than about 10 microns.

37. The stretchable electrical circuit of claim 14 wherein said electrical device is selected from the group consisting of a transistor, a diode, a light emitting diodes, a laser, an organic light emitting diode, a microelectromechanical system and a nanoelectromechanical system.

38. The stretchable semiconductor element of claim 1 wherein said strain is larger than 0.5%.

39. The stretchable semiconductor element of claim 1 wherein said strain is larger than 1%.

40. The stretchable semiconductor element of claim 1 wherein said strain is larger than 3%.

41. The stretchable semiconductor element of claim 1 wherein said strain is less than 30%.

42. The stretchable semiconductor element of claim 1 wherein said strain is less than 10%.

43. The stretchable semiconductor element of claim 1 wherein said strain is less than 1%.

44. The stretchable electrical circuit of claim 14 wherein said plurality of integrated device components includes a dielectric layer provided in said bent structure.

45. The stretchable electrical circuit of claim 14 wherein said plurality of integrated device components includes a conducting layer provided in said bent structure.

46. The stretchable electrical circuit of claim 14 wherein said plurality of integrated device components includes an additional semiconductor layer provided in said bent structure.

47. The stretchable electrical circuit of claim 14 wherein said plurality of integrated device components includes an electrode or electrical contact provided in said bent structure.

48. The stretchable electrical circuit of claim 14 wherein said strain is larger than 0.5%.

49. The stretchable electrical circuit of claim 14 wherein said strain is larger than 1%.

50. The stretchable electrical circuit of claim 14 wherein said strain is larger than 3%.

51. The stretchable electrical circuit of claim 14 wherein said strain is less than 30%.

52. The stretchable electrical circuit of claim 14 wherein said strain is less than 10%.

53. The stretchable electrical circuit of claim 14 wherein said strain is less than 1%.

54. A stretchable electronic device comprising:
- a prestrained elastic substrate having a supporting surface; and
- a thin film transistor comprising a plurality of integrated device components including a single crystalline semiconductor structure, an electrode and a dielectric layer; said thin film transistor provided in a curved conformation having a curved surface with at least one concave region and at least one convex region, wherein said curved surface is continuously bonded to said supporting surface of said prestrained elastic substrate, said thin film transistor comprising a bent structure under strain resulting from application of a force arising from the bonding between said curved surface of said thin film transistor and said supporting surface of the elastic substrate.

55. The stretchable electronic device of claim 54 wherein said curved surface has a contour profile characterized by a periodic wave.

56. The stretchable electrical device of claim 54 wherein said strain is larger than 0.5%.

57. The stretchable electrical device of claim 54 wherein said strain is larger than 1%.

58. The stretchable electrical device of claim 54 wherein said strain is larger than 3%.

59. The stretchable electrical device of claim 54 wherein said strain is less than 30%.

60. The stretchable electrical device of claim 54 wherein said strain is less than 10%.

61. The stretchable electrical device of claim 54 wherein said strain is less than 1%.

* * * * *